United States Patent
Hofmeister et al.

(10) Patent No.: US 10,335,945 B2
(45) Date of Patent: Jul. 2, 2019

(54) SUBSTRATE TRANSPORT APPARTATUS WITH MULTIPLE MOVABLE ARMS UTILIZING A MECHANICAL SWITCH MECHANISM

(71) Applicant: Brooks Automation, Inc., Chelmsford, MA (US)

(72) Inventors: Christopher Hofmeister, Hampstead, NH (US); Alexander G. Krupyshev, Chelmsford, MA (US); Krysztof A. Majczak, Beverly, MA (US); Martin Hosek, Lowell, MA (US); Jay Krishnasamy, Billerica, MA (US)

(73) Assignee: Brooks Automation, Inc., Chelmsford, MA (US)

(*) Notice: Subject to any disclaimer, the term of this patent is extended or adjusted under 35 U.S.C. 154(b) by 376 days.

(21) Appl. No.: 14/305,715

(22) Filed: Jun. 16, 2014

(65) Prior Publication Data
US 2014/0294551 A1    Oct. 2, 2014

Related U.S. Application Data

(62) Division of application No. 12/117,415, filed on May 8, 2008, now Pat. No. 8,752,449.
(Continued)

(51) Int. Cl.
*B25J 9/04* (2006.01)
*B25J 9/10* (2006.01)
(Continued)

(52) U.S. Cl.
CPC ............... *B25J 9/106* (2013.01); *B25J 9/126* (2013.01); *H01L 21/67742* (2013.01);
(Continued)

(58) Field of Classification Search
CPC .......... H01L 21/67742; H01L 21/67766; B25J 9/042; B25J 9/043; B25J 9/044; B25J 9/045; B25J 9/126
(Continued)

(56) References Cited

U.S. PATENT DOCUMENTS 5,054,831 A   10/1991  Ting et al.
5,187,996 A   2/1993   Torii et al.
(Continued)

FOREIGN PATENT DOCUMENTS

DE    19831578    6/1999
EP    0827814     3/1998
(Continued)

OTHER PUBLICATIONS

Tawain IPO Search Report, Patent Application No. 097116939, dated Dec. 11, 2013.

*Primary Examiner* — Anna M Momper
*Assistant Examiner* — Brendan P Tighe
(74) *Attorney, Agent, or Firm* — Perman & Green, LLP; Colin C. Durham

(57) ABSTRACT

A substrate transport apparatus including a frame, a drive section connected to the frame and including at least one independently controllable motor, at least two substrate transport arms connected to the frame and comprising arm links arranged for supporting and transporting substrates, and a mechanical motion switch coupled to the at least one independently controllable motor and the at least two substrate transport arms for effecting the extension and retraction of one of the at least two substrate transport arms while the other one of the at least two substrate transport arms remains in a substantially retracted configuration.

16 Claims, 82 Drawing Sheets

Related U.S. Application Data

(60) Provisional application No. 60/916,781, filed on May 8, 2007.

(51) Int. Cl.
| | | |
|---|---|---|
| *B25J 9/12* | (2006.01) | |
| *H01L 21/677* | (2006.01) | |
| *H01L 21/687* | (2006.01) | |
| *B25J 11/00* | (2006.01) | |

(52) U.S. Cl.
CPC ...... *B25J 11/0095* (2013.01); *H01L 21/68707* (2013.01); *Y10S 414/141* (2013.01); *Y10S 901/15* (2013.01); *Y10S 901/21* (2013.01); *Y10S 901/23* (2013.01); *Y10S 901/27* (2013.01); *Y10T 74/20305* (2015.01); *Y10T 74/20317* (2015.01); *Y10T 74/20329* (2015.01)

(58) Field of Classification Search
USPC ......... 414/744.2, 744.3, 744.5, 744.6, 744.7; 901/15, 17
See application file for complete search history.

(56) References Cited

U.S. PATENT DOCUMENTS

| | | | |
|---|---|---|---|
| 5,534,761 | A | 7/1996 | Crippa |
| 5,975,834 | A | 11/1999 | Ogawa et al. |
| 6,052,913 | A | 4/2000 | Kaneko et al. |
| 6,276,892 | B1 | 8/2001 | Haraguchi et al. |
| 6,339,969 | B1 | 1/2002 | Salcudean et al. |
| 6,364,599 | B1 | 4/2002 | Suwa et al. |
| 6,485,250 | B2 | 11/2002 | Hofmeister |
| 6,525,803 | B2 | 2/2003 | Kwan et al. |
| 6,634,484 | B2 | 10/2003 | Gattrell et al. |
| 6,705,177 | B2 | 3/2004 | Okuno et al. |
| 6,742,977 | B1 | 6/2004 | Okayama et al. |
| 7,040,852 | B2 | 5/2006 | Mori et al. |
| 7,086,822 | B2 | 8/2006 | Maeda |
| 7,578,649 | B2 * | 8/2009 | Caveney ............ B25J 9/042 414/744.1 |
| 7,837,425 | B2 | 11/2010 | Saeki et al. |
| 2001/0036398 | A1 | 11/2001 | Hofmeister |
| 2002/0114690 | A1 | 8/2002 | Ishigame |
| 2002/0144782 | A1 | 10/2002 | Okuno et al. |
| 2003/0223853 | A1 * | 12/2003 | Caveney ............ B25J 9/042 414/744.5 |
| 2004/0001750 | A1 | 1/2004 | Kremerman |
| 2005/0191155 | A1 | 9/2005 | Sakiya |
| 2005/0232744 | A1 * | 10/2005 | Minami ............ B25J 9/107 414/744.1 |
| 2005/0262959 | A1 | 12/2005 | Angeles et al. |
| 2006/0182536 | A1 | 8/2006 | Rice et al. |
| 2006/0203216 | A1 | 9/2006 | Kwan et al. |
| 2006/0210387 | A1 | 9/2006 | Saeki et al. |
| 2006/0263177 | A1 | 11/2006 | van der Meulen |
| 2006/0269384 | A1 | 11/2006 | Kiaie et al. |
| 2007/0020081 | A1 | 1/2007 | Gilchrist et al. |

FOREIGN PATENT DOCUMENTS

| | | |
|---|---|---|
| EP | 1249318 | 10/2002 |
| EP | 1463106 | 9/2004 |
| EP | 1464455 | 10/2004 |
| EP | 1657743 | 5/2006 |
| GB | 2376679 | 12/2002 |
| JP | 01093958 | 4/1989 |
| JP | 02031443 | 2/1990 |
| JP | 02093881 | 4/1990 |
| JP | 03050752 | 3/1991 |
| JP | 03152051 | 6/1991 |
| JP | 03136264 | 11/1991 |
| JP | 04014635 | 1/1992 |
| JP | 04015029 | 1/1992 |
| JP | 04044989 | 2/1992 |
| JP | 04119554 | 4/1992 |
| JP | 04235549 | 8/1992 |
| JP | 05040923 | 2/1993 |
| JP | 05096076 | 4/1993 |
| JP | 05319550 | 12/1993 |
| JP | 06007347 | 1/1994 |
| JP | 06026819 | 2/1994 |
| JP | 06120861 | 4/1994 |
| JP | 07005435 | 1/1995 |
| JP | 07260455 | 10/1995 |
| JP | 09131680 | 5/1997 |
| JP | 00072248 | 3/2000 |
| JP | 2000072248 | 3/2000 |
| JP | 00133696 | 5/2000 |
| JP | 2000133696 | 5/2000 |
| JP | 2002361577 | 12/2002 |
| JP | 2003152005 | 5/2003 |
| JP | 2003170384 | 6/2003 |
| JP | 2005229087 | 8/2005 |
| JP | 2005297072 | 10/2005 |
| JP | 20066159318 | 6/2006 |
| JP | 2008135630 | 6/2008 |
| KR | 1020050092278 | 9/2005 |
| KR | 100582697 | 5/2006 |
| WO | 1987007078 | 11/1987 |
| WO | 2003043077 | 5/2003 |
| WO | 2003047820 | 6/2003 |
| WO | 2003101677 | 12/2003 |
| WO | 2004113205 | 12/2004 |
| WO | 2005002804 | 1/2005 |
| WO | 2005004227 | 1/2005 |
| WO | 2005004230 | 1/2005 |
| WO | 2005008769 | 1/2005 |
| WO | 2006006554 | 1/2006 |
| WO | 2006137370 | 12/2006 |
| WO | 2007008797 | 1/2007 |
| WO | 2008140728 | 11/2008 |

* cited by examiner

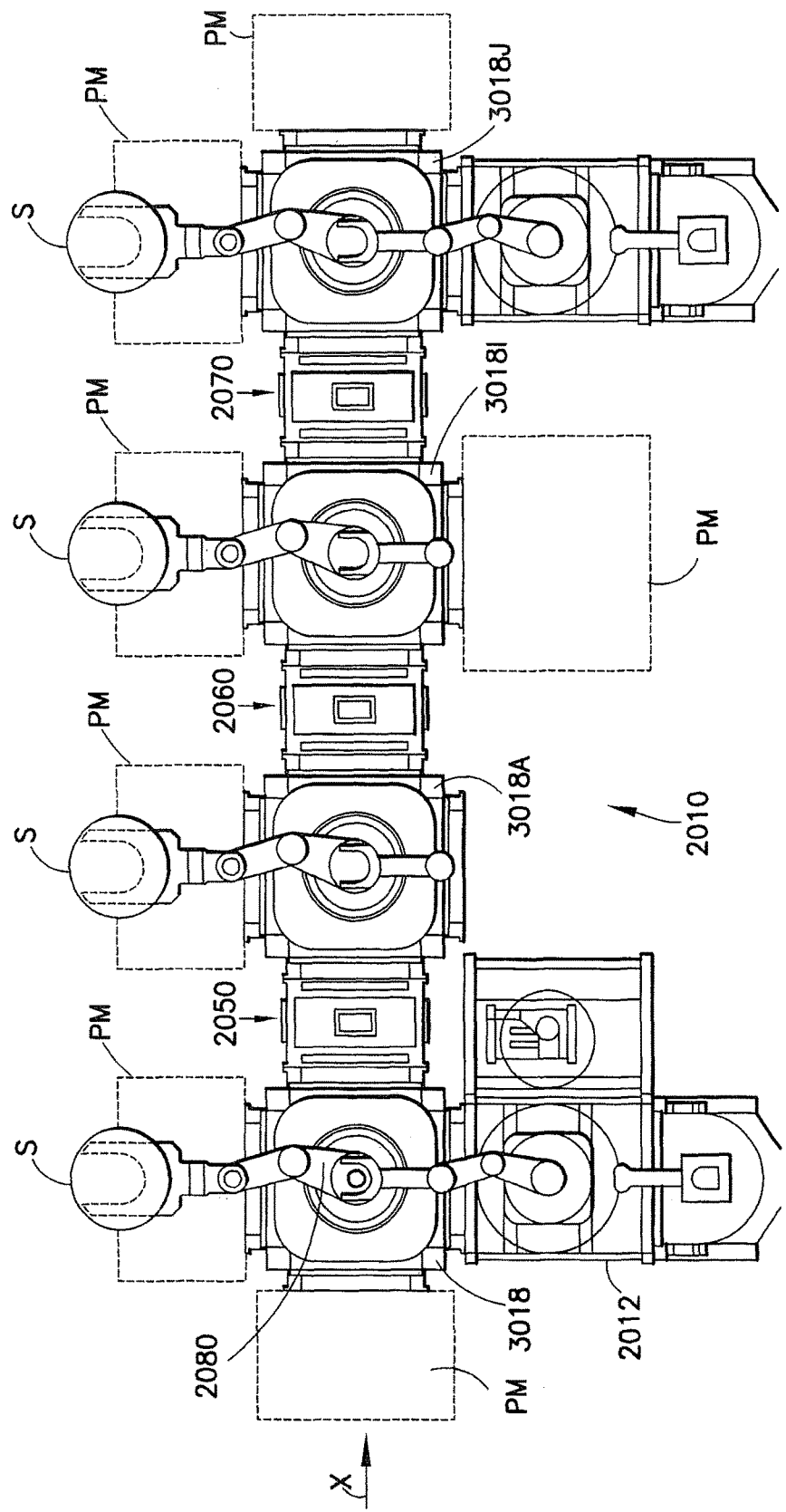

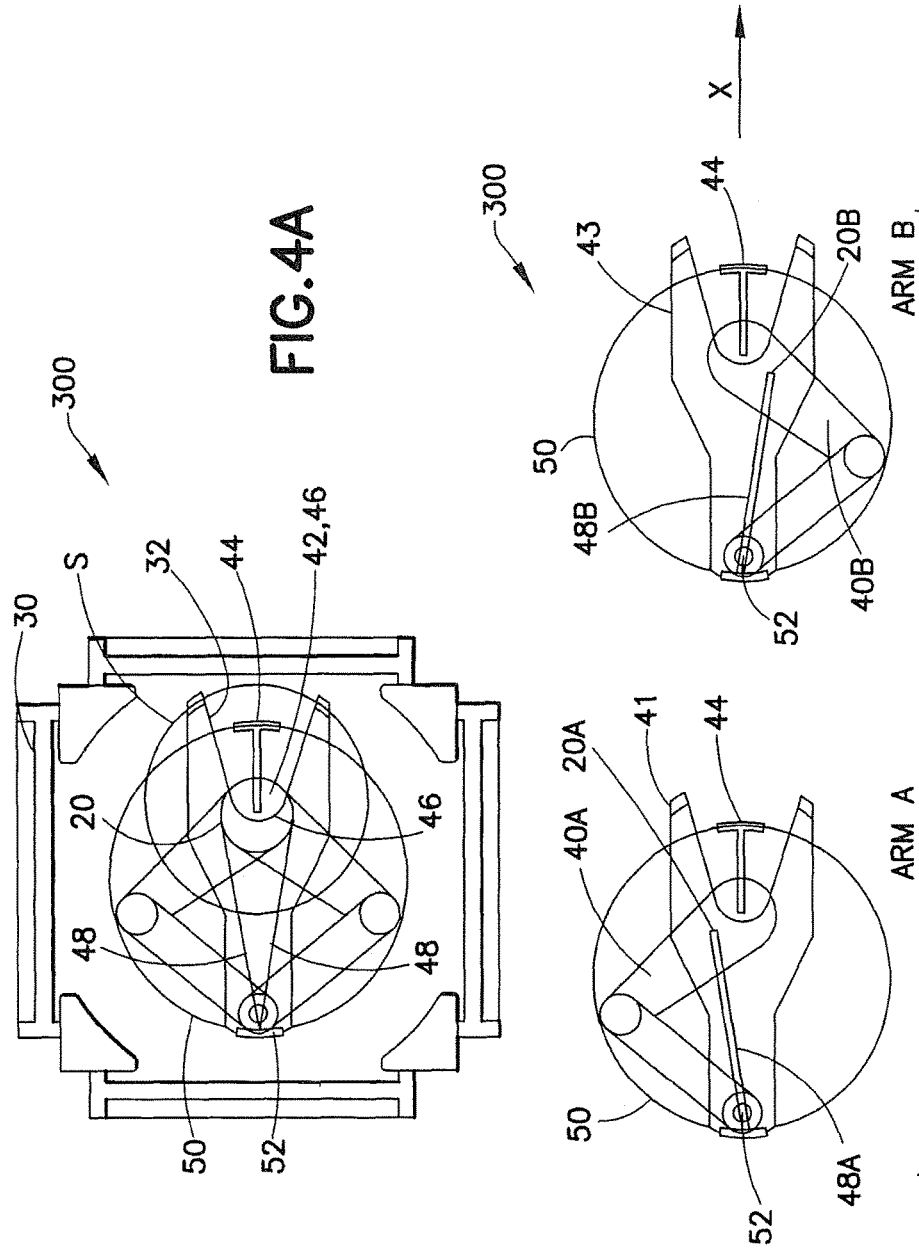

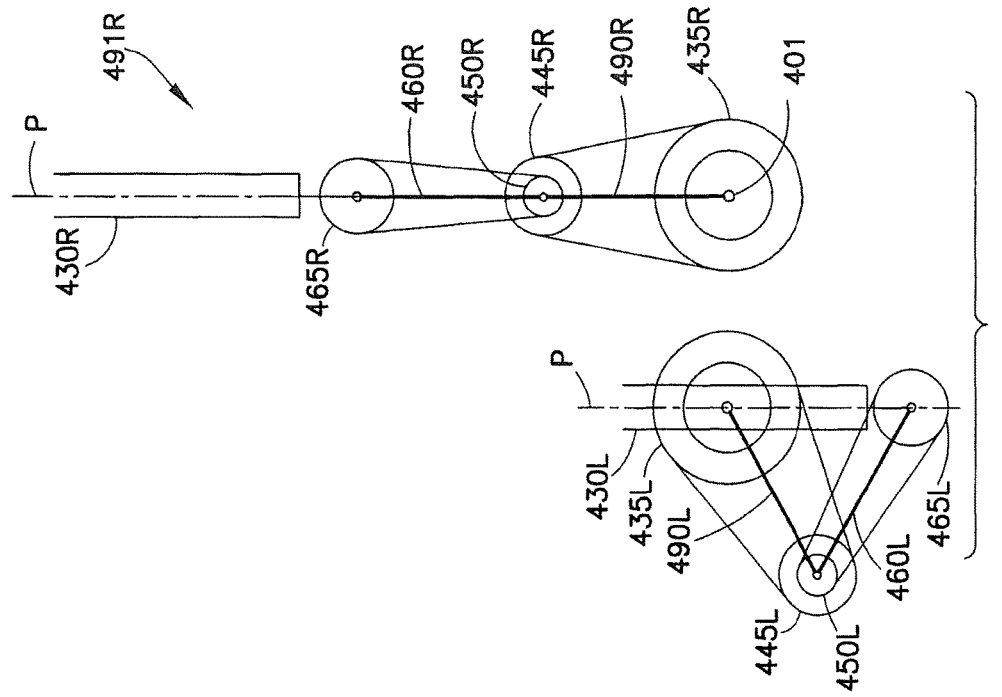
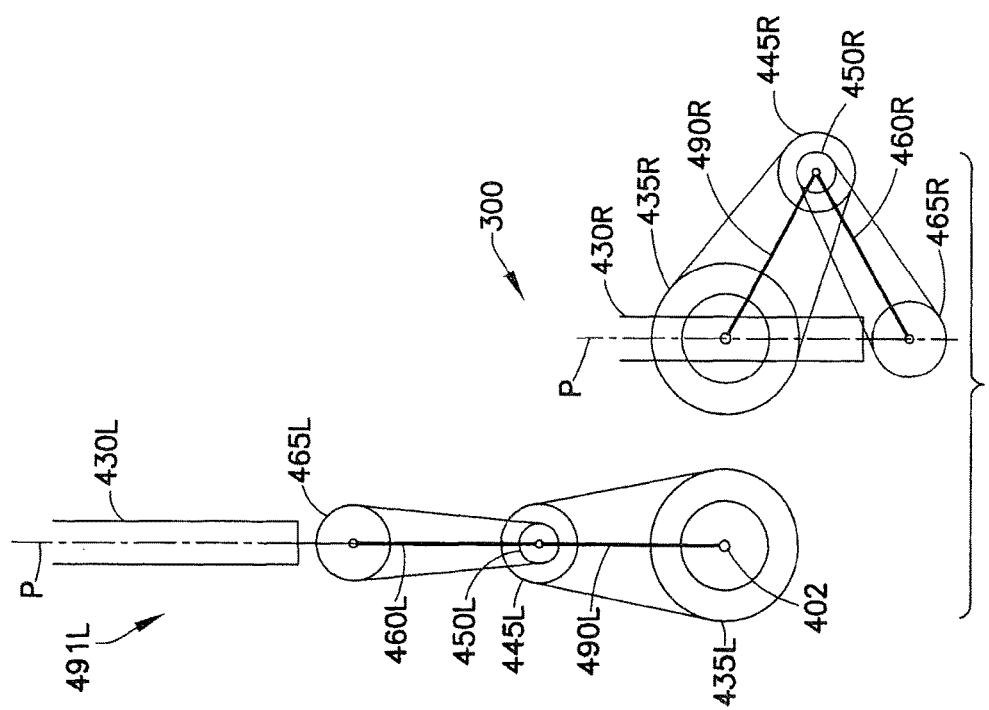

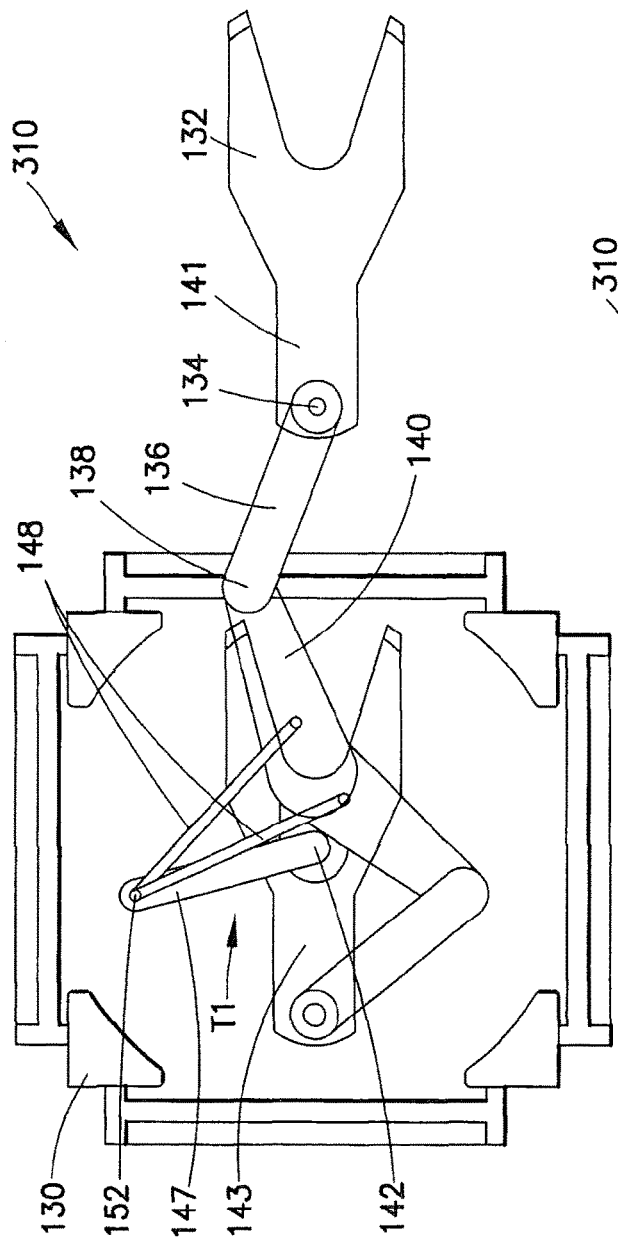
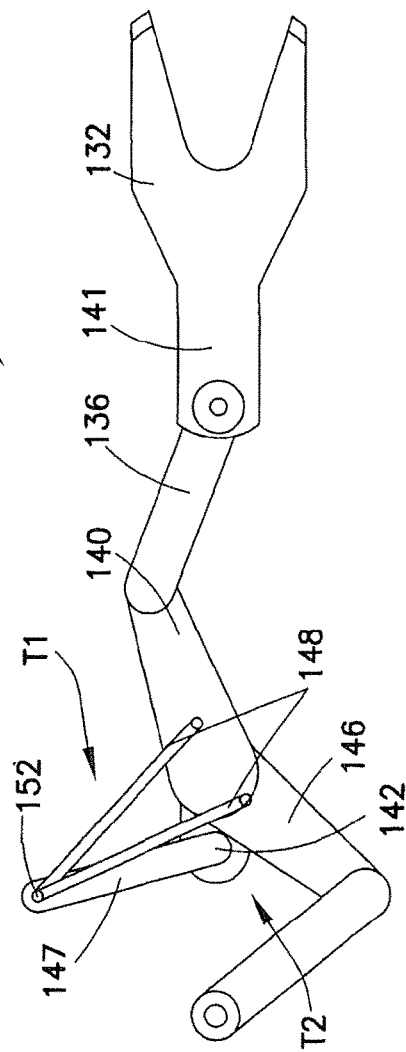
FIG.10A
FIG.10B

PRINCIPLE OF OPERATION
ROTATION-> T2=T1
ARM A:PICK/PLACE->T1(T2 FIXED)
ARM B:PICK/PLACE->T2(T1 FIXED)

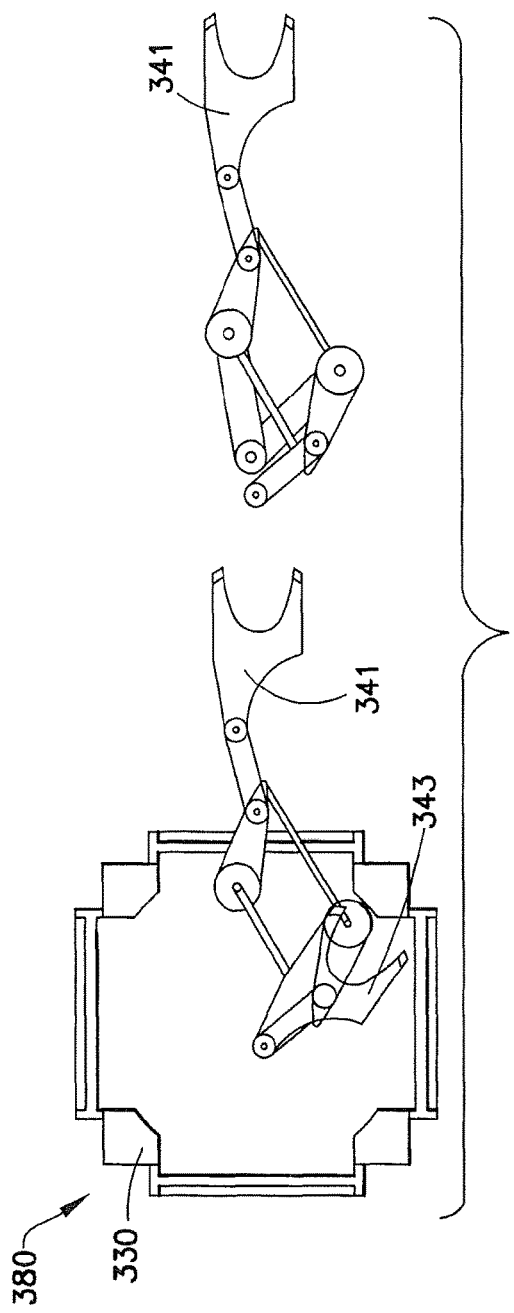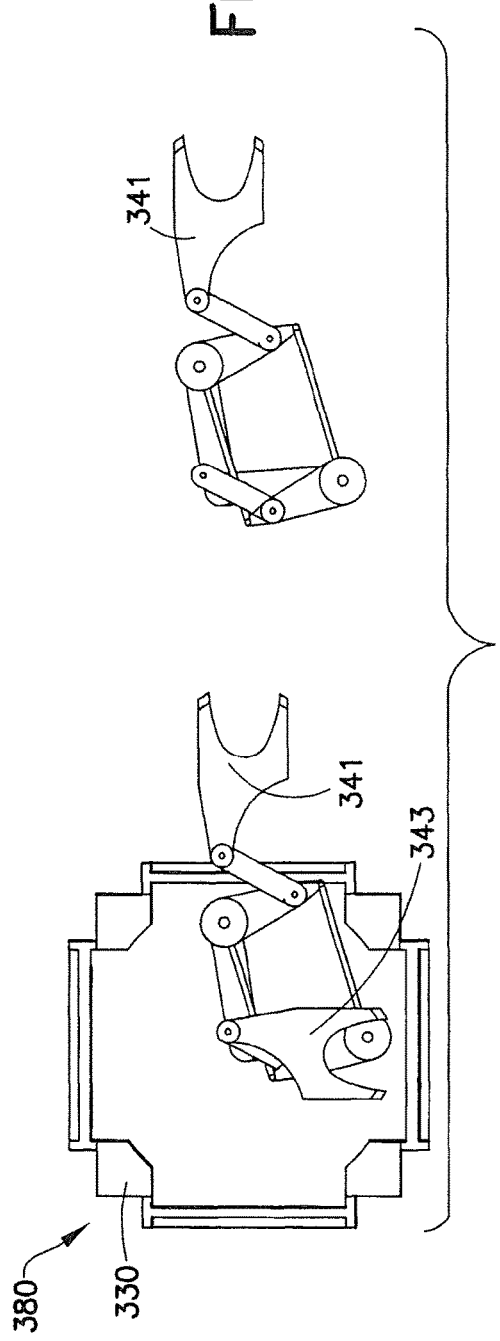

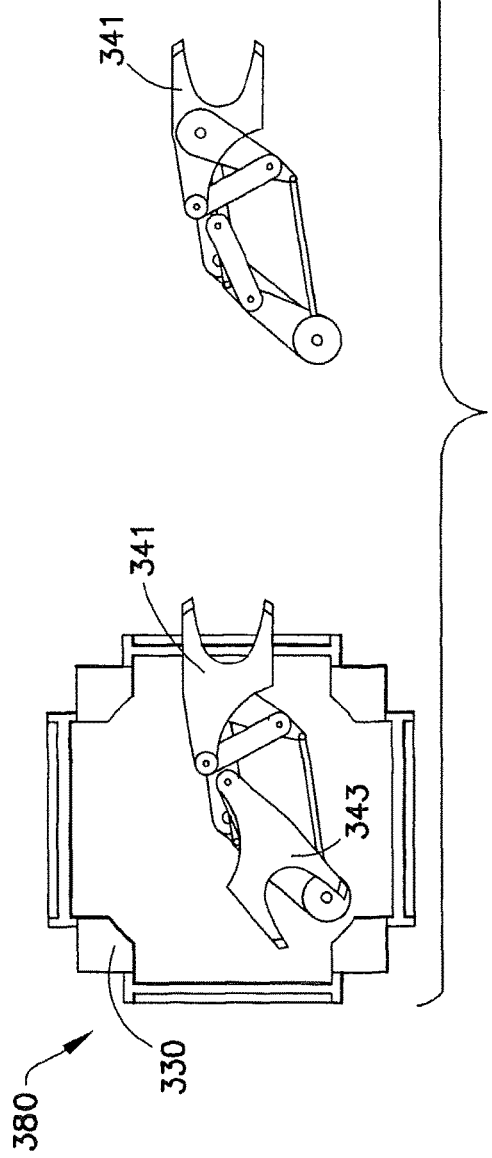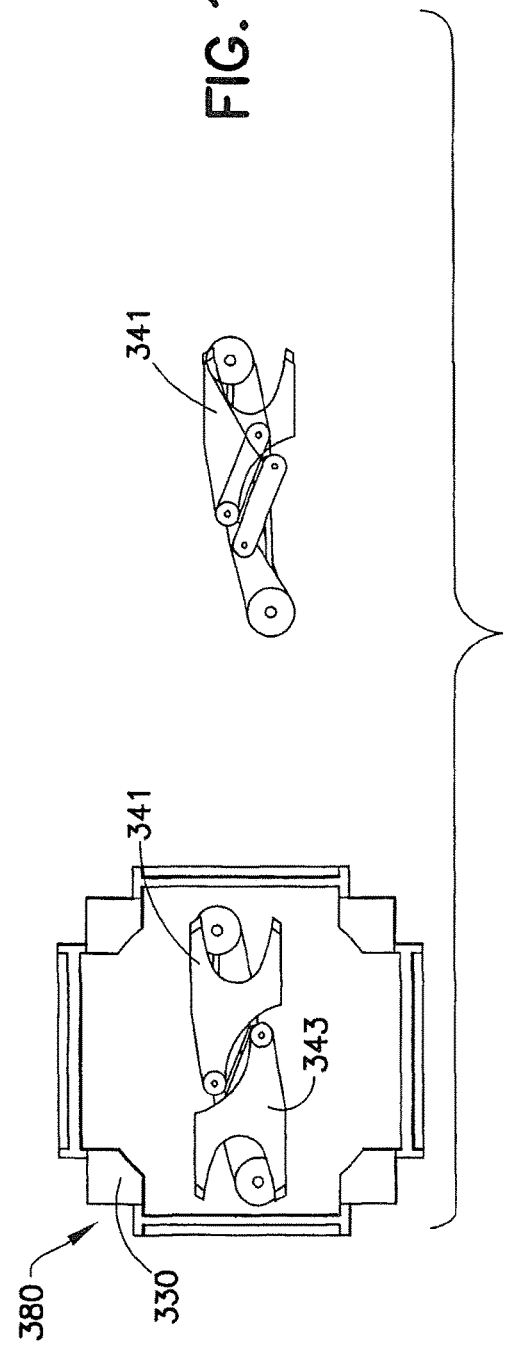

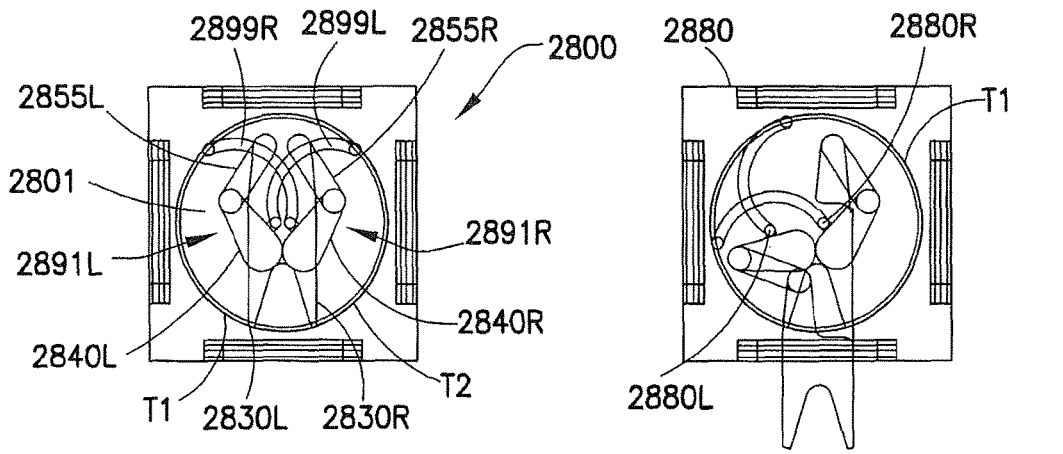
FIG.20A
FIG.20D
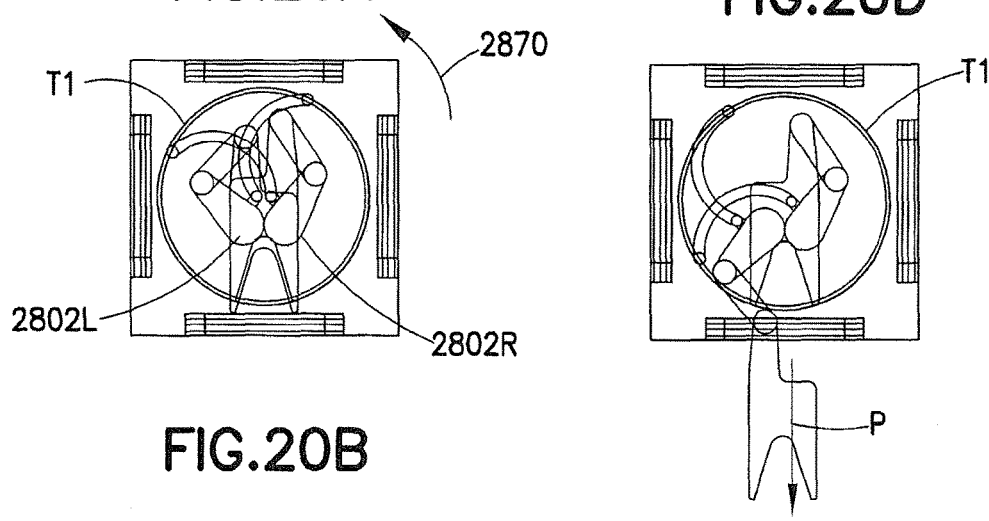
FIG.20B
FIG.20E
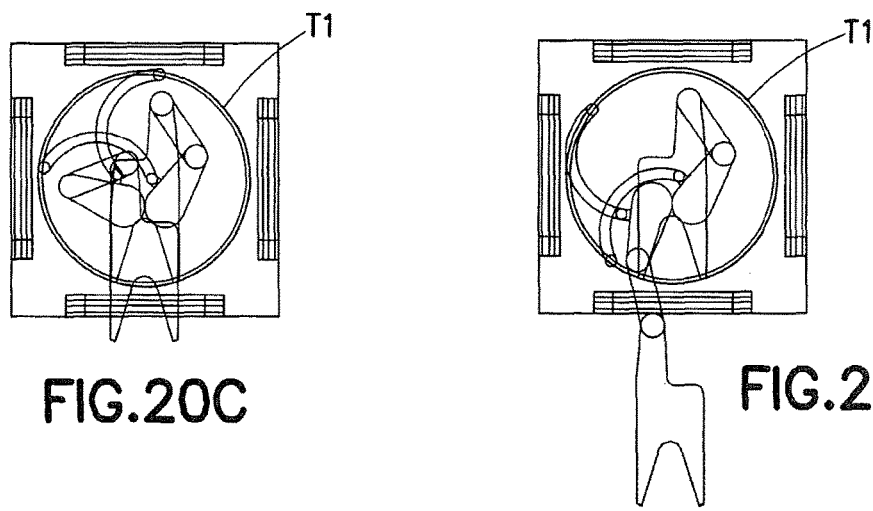
FIG.20C
FIG.20F

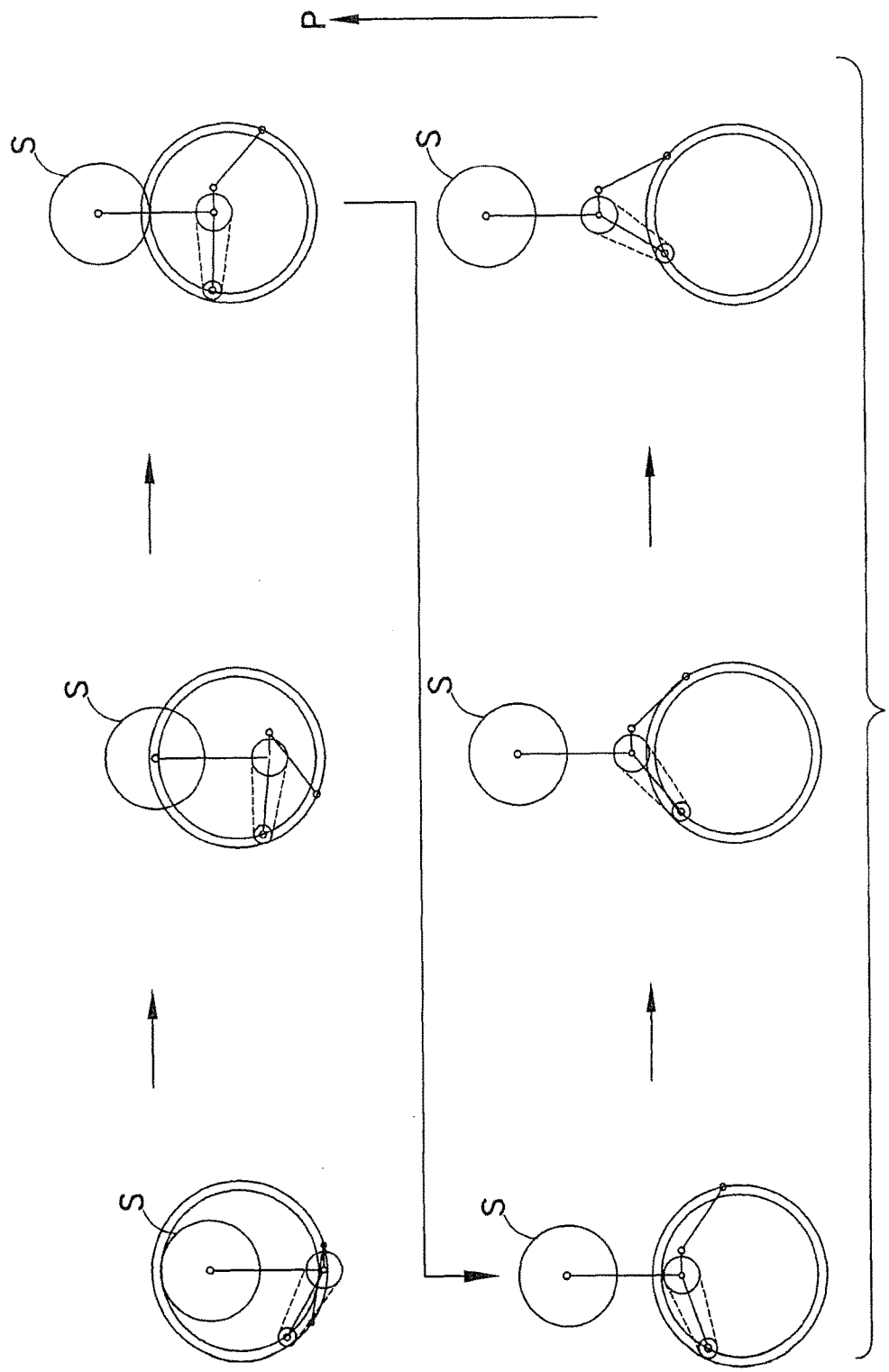

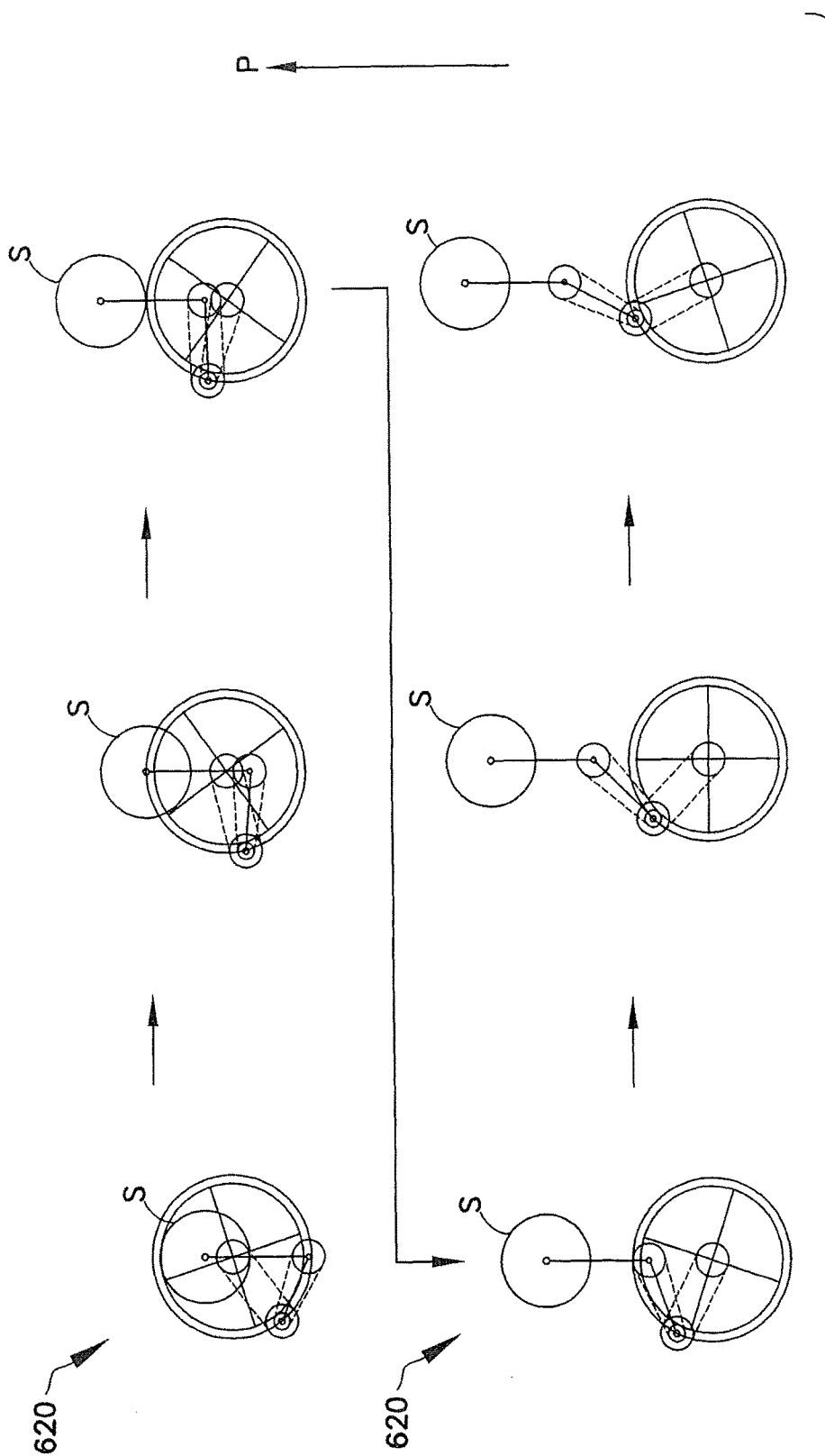

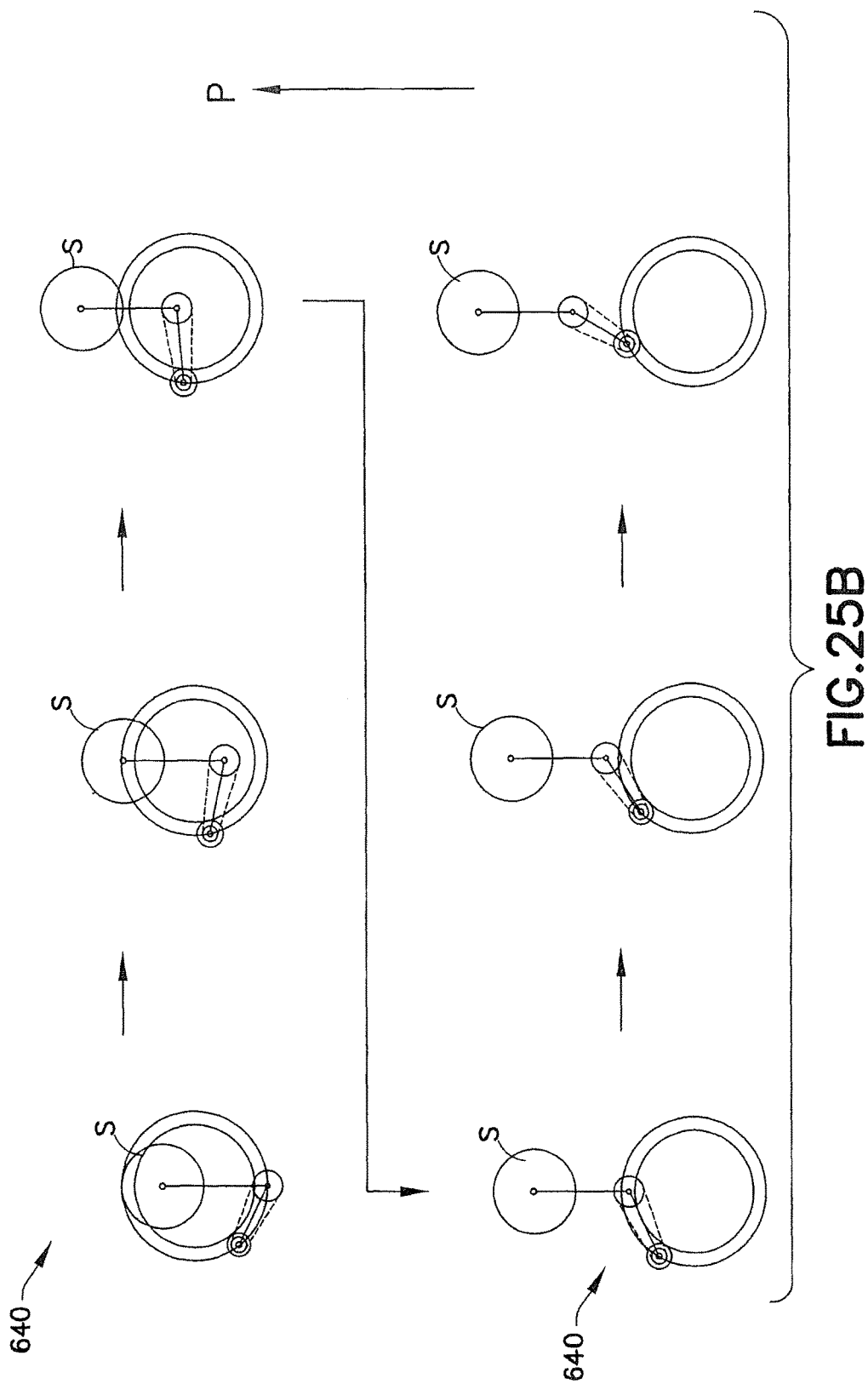

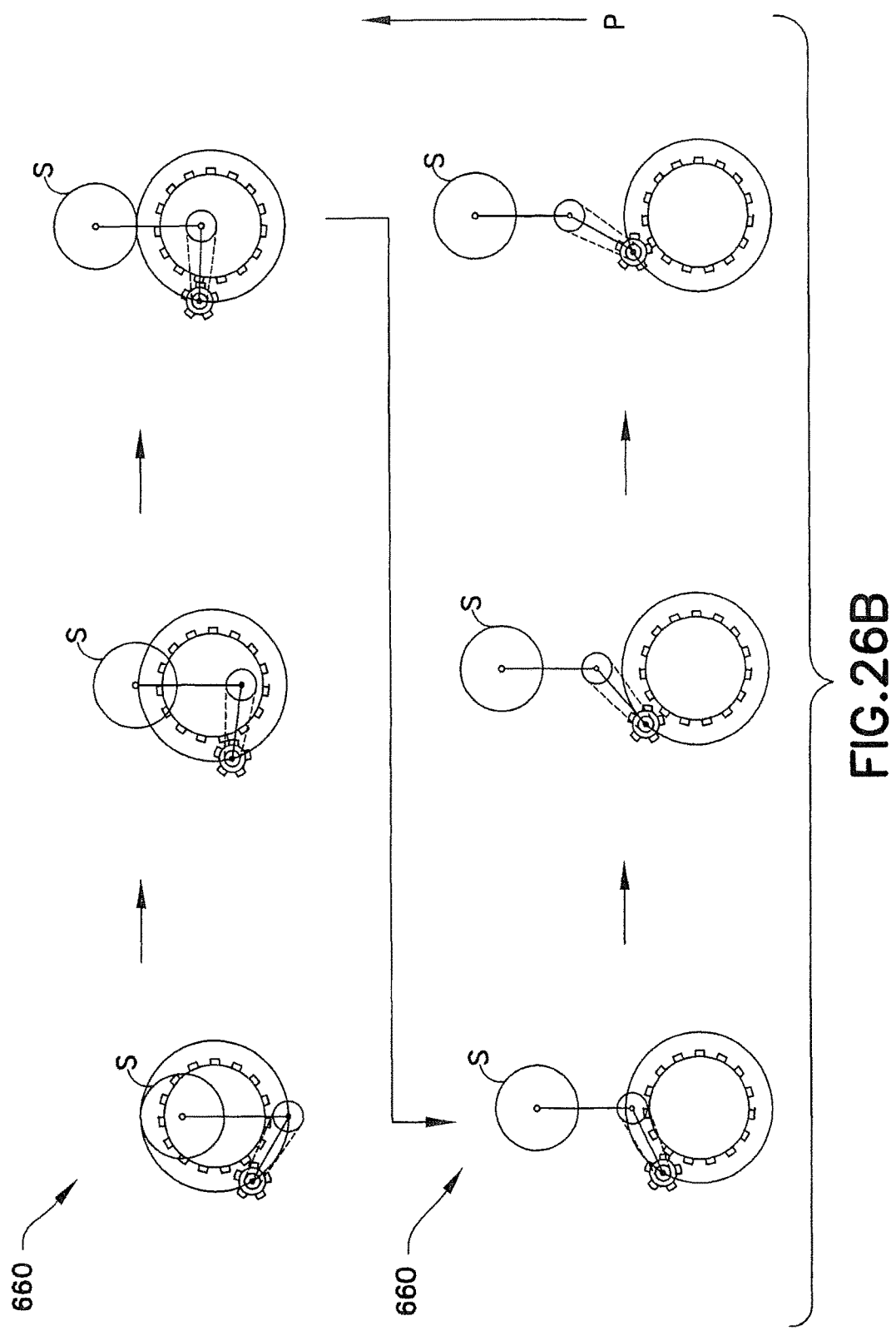

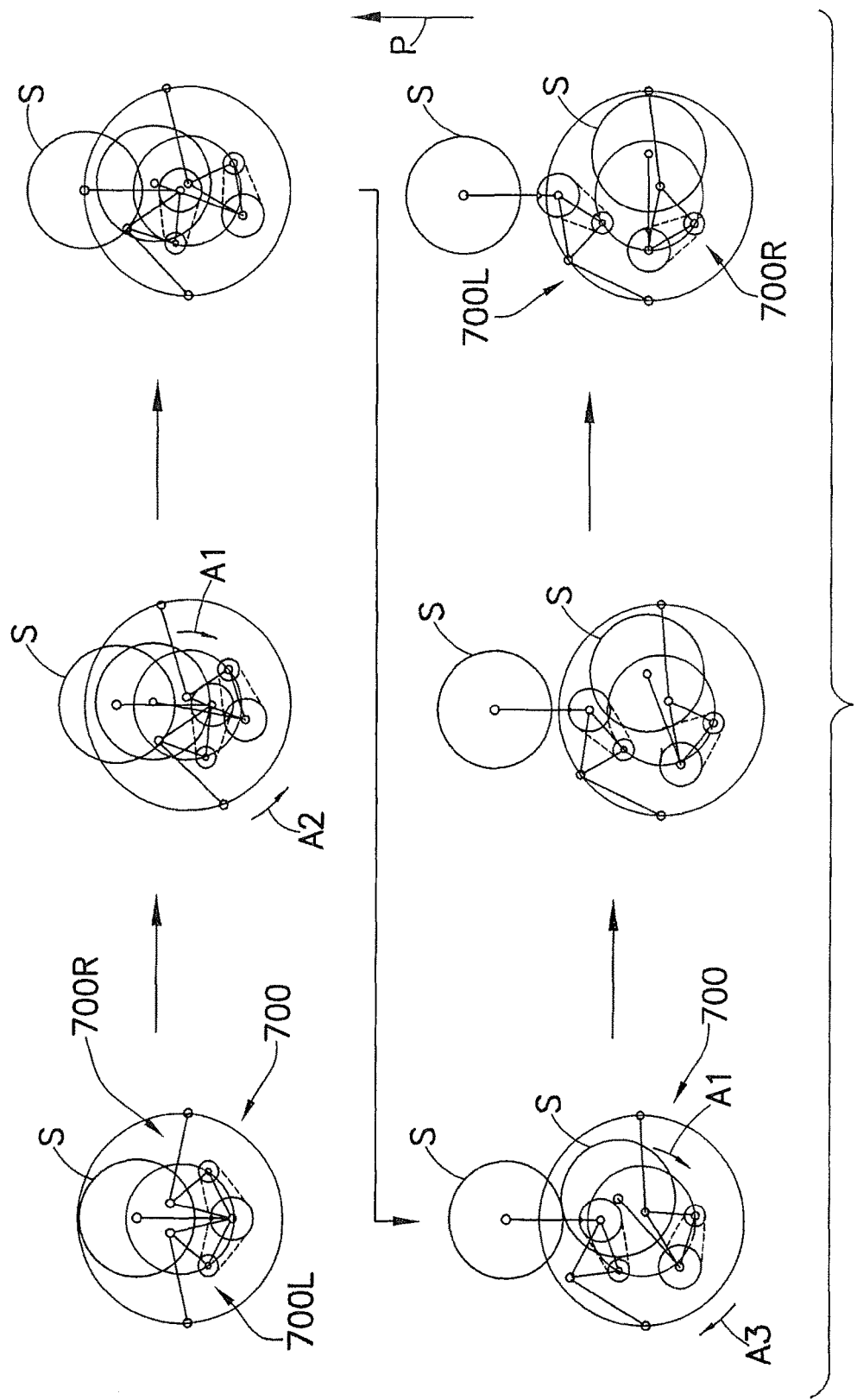

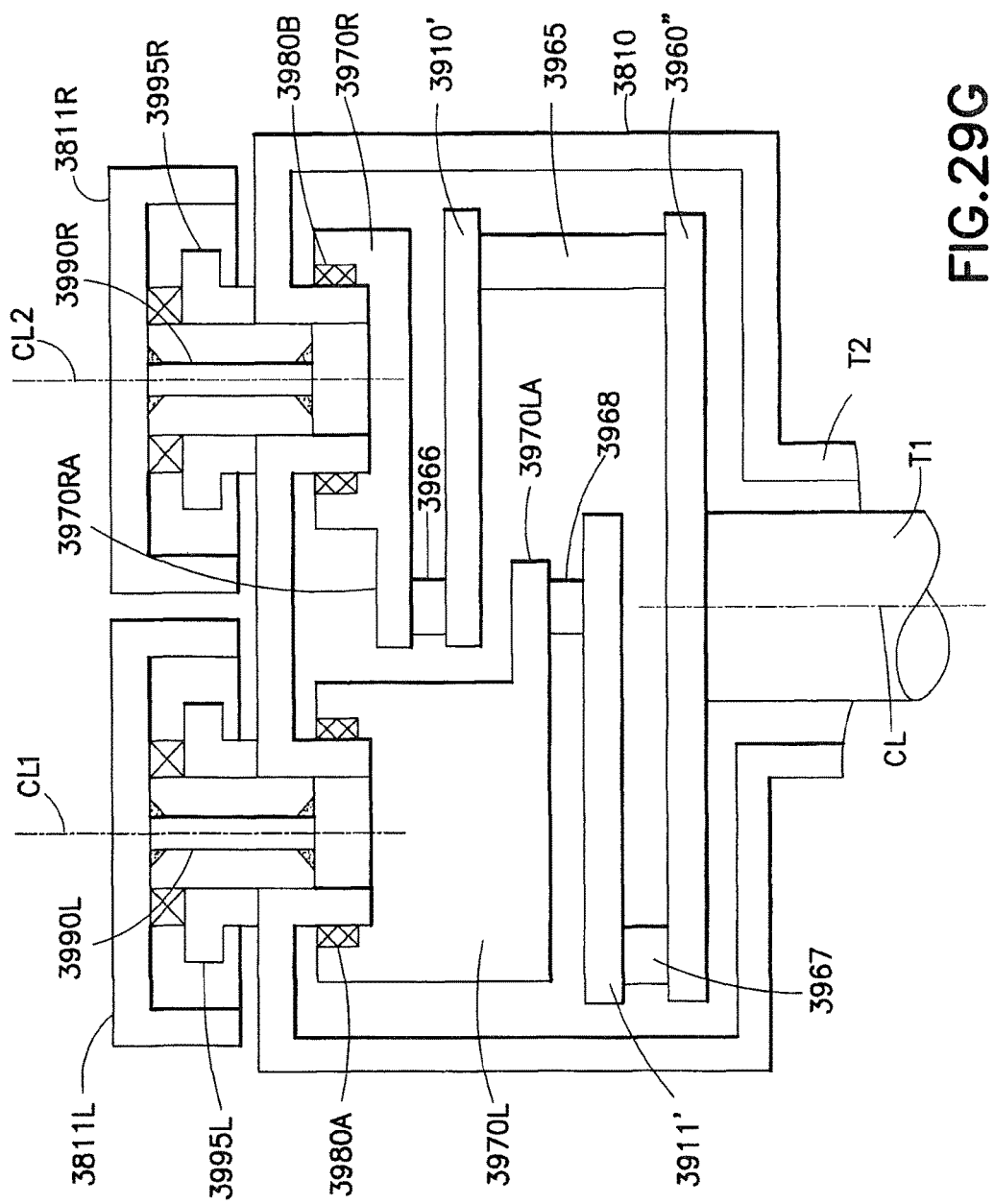

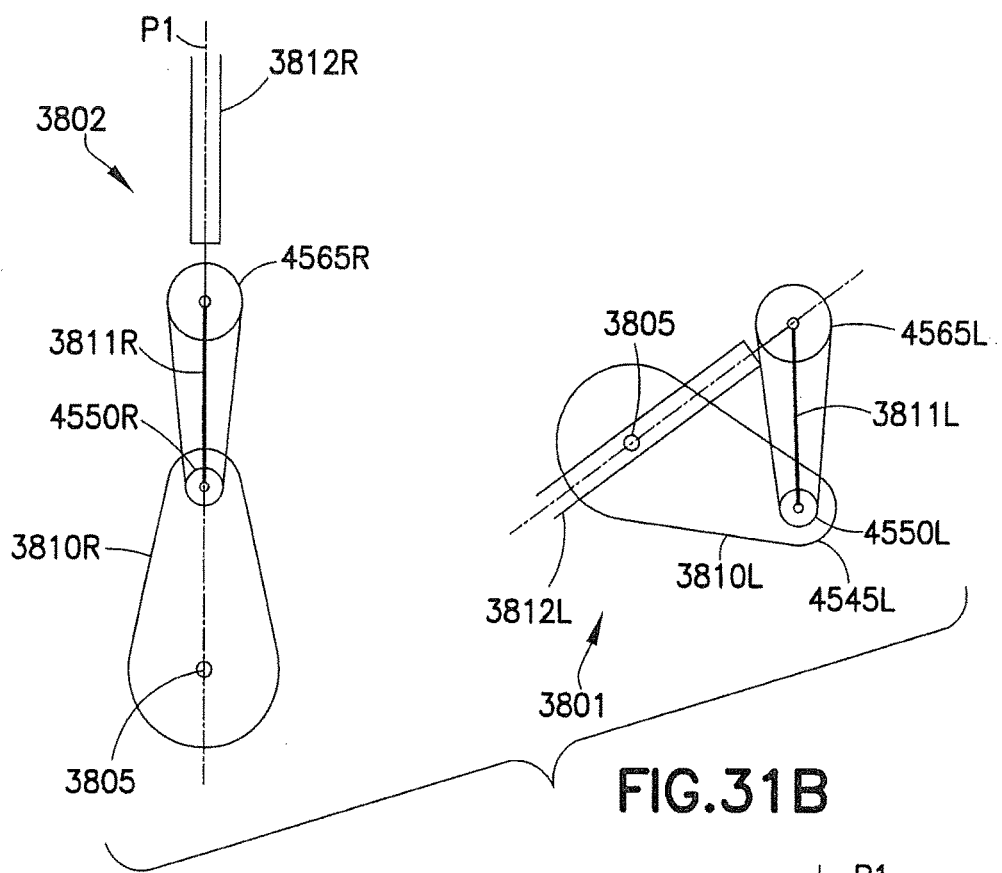
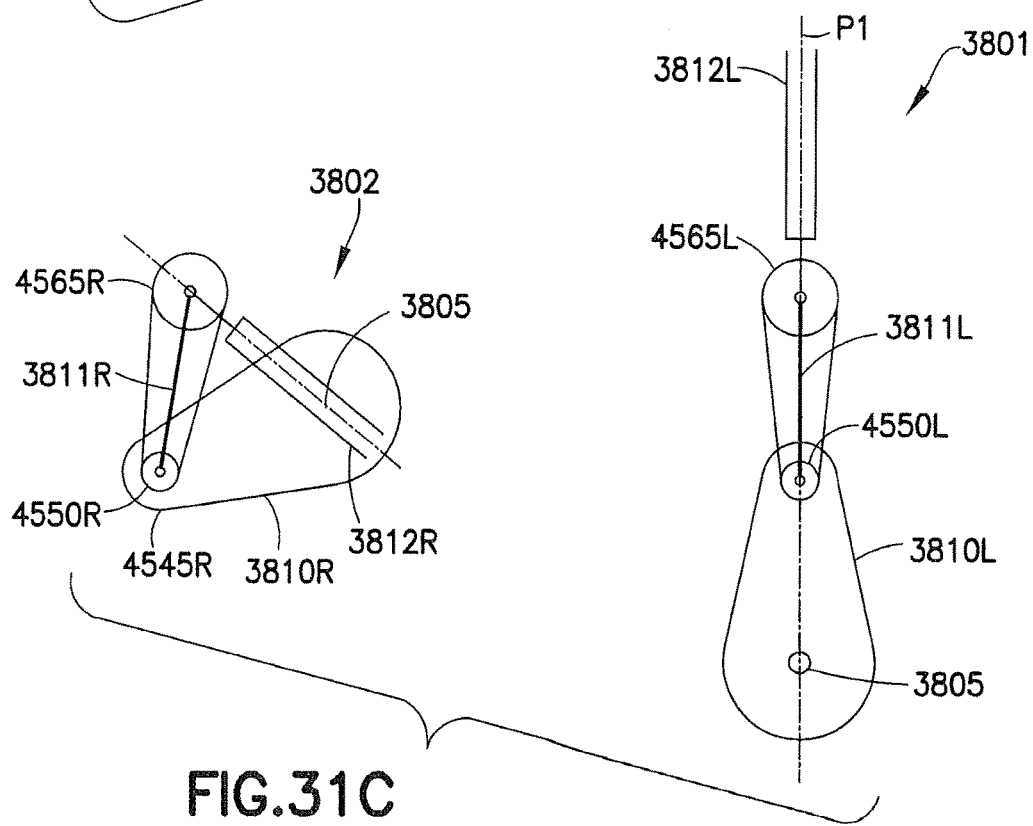
FIG.31B
FIG.31C

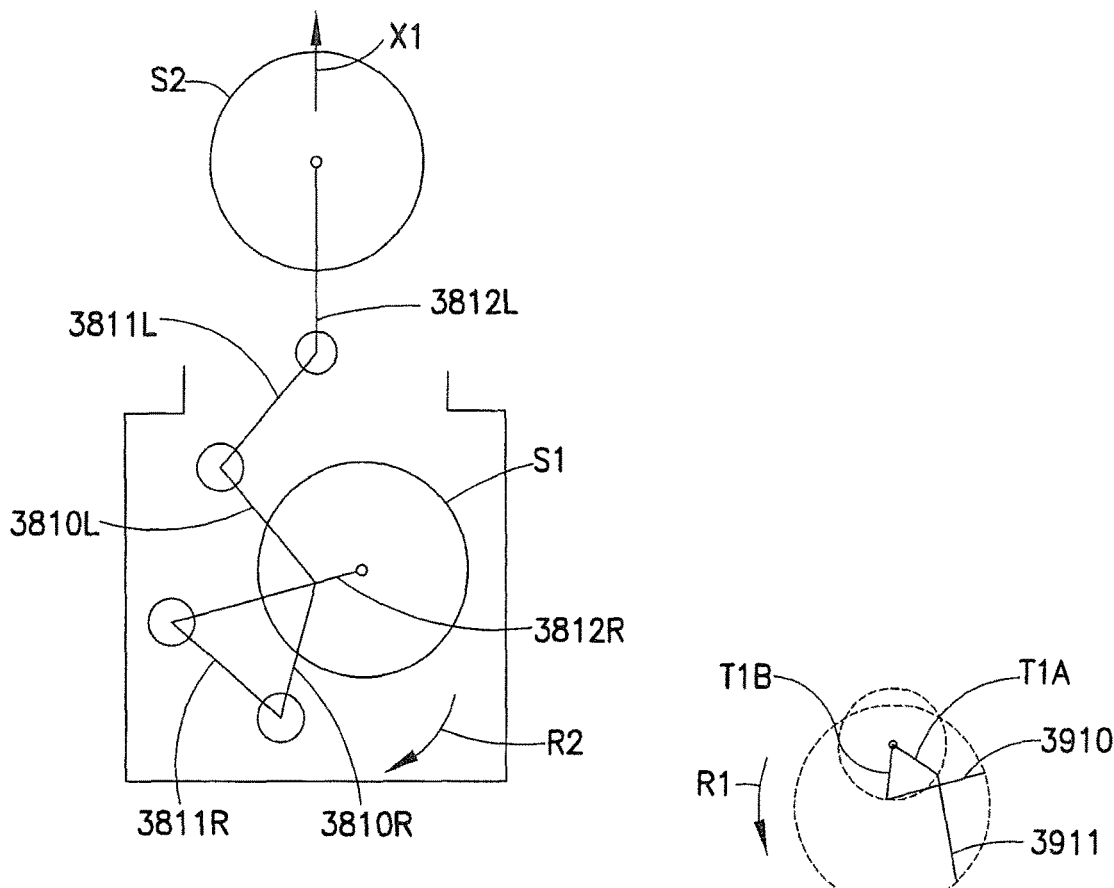
FIG.35A
FIG.35B
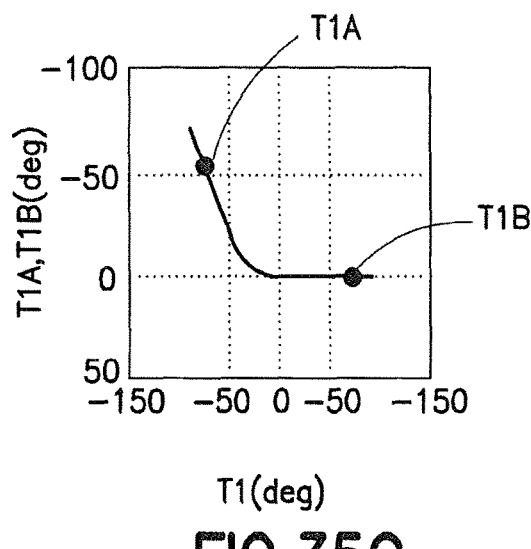
FIG.35C

SUBSTRATE TRANSPORT APPARTATUS WITH MULTIPLE MOVABLE ARMS UTILIZING A MECHANICAL SWITCH MECHANISM

CROSS REFERENCE TO RELATED APPLICATION(S)

This application is a divisional of U.S. patent application Ser. No. 12/117,415, filed on May 8, 2008 (Now U.S. Pat. No. 8,752,449) which claims the benefit of U.S. Provisional Patent Application No. 60/916,781, filed on May 8, 2007, and is related to U.S. Provisional Patent Application No. 60/916,724 filed on May 8, 2007, the disclosures of which are incorporated by reference herein in their entirety.

BACKGROUND

1. Field

The disclosed embodiments relate to a substrate transport apparatus and, more particularly, to substrate transport apparatus with multiple movable arms utilizing a mechanical switch mechanism.

2. Brief Description of Related Developments

In conventional multiple arm substrate transport apparatus, the arms or linkages of the transports are actuated by a complex arrangement of three or more motors, which for example may be configured in a coaxial manner and coupled to the linkages through concentrically arranged hollow shafts for providing the transport with movement having three degrees of freedom. Typically the outermost shaft may be coupled to a hub for rotating the multiple arms about, for example, a central axis of rotation. Two inner shafts, for example, may be connected to a respective one of the multiple arms through independent belt and pulley arrangements. As may be realized, the larger the number of motors employed for effecting movement of the transport, the greater the burden on the control system controlling the motion of the transport. Also, the larger number of motors employed increases the potential for motor failure as well as the cost of the transport.

The conventional multiple arm transport apparatus may be used in transport chambers or other substrate processing equipment where the transport apparatus and its drive system are located within and/or partially below the chamber/equipment so that the space available for other substrate processing components (e.g. vacuum pumps, etc.) is limited or otherwise constrained in some way. In conventional systems this may cause an increase in the size of the transport chamber to allow for mounting, for example, vacuum pumps at locations other than the bottom of the chamber/equipment. This results in incremental costs.

Conventional non-coaxial side-by-side dual SCARA (Selective Compliant Articulated Robot Arm) arms are offered for sale by several companies; the UTW and UTV series of robots by MECS Korea, Inc., the RR series of robots by Rorze Automation, Inc. and the LTHR, STHR and SPR series of robots by JEL Corp. An example of a side-by-side dual arm SCARA transfer device can be found in U.S. Pat. No. 5,765,444.

An exemplary configuration of a conventional non-coaxial side-by-side dual arm robot is shown in FIGS. 1 and 1A. The robot is built around a pivoting hub, which carries two SCARA arms or linkages. The left linkage has an upper arm, a forearm and an end effector coupled in series through revolute joints. A belt and pulley arrangement is used to constrain the motion of the left arm so that rotation of the upper arm with respect to the hub produces rotation of the forearm in the opposite direction (e.g. clockwise upper arm rotation causes counterclockwise forearm rotation). Another belt and pulley arrangement is used to maintain radial orientation of the end effector. The right linkage may be a mirror image of the left arm. The end effectors of the left and right arms move in different horizontal planes to allow for unrestricted motion of the two linkages of the robot. As can be seen in FIGS. 1B-1D, by rotating the left and right upper arms the respective linkages can be extended independently in a common radial direction with respect to the pivot point of the hub.

In the conventional side-by-side robots as shown in FIGS. 1, 1A-D, the robot arms or linkages are actuated by a complex arrangement of three (or more) motors, which for example may be configured in a coaxial manner, coupled to the robot through hollow shafts to provide the robot with movement having three degrees of freedom. The outermost shaft may be coupled to the hub, while the two inner shafts may be coupled to the upper arms of the left and right linkages through independent belt and pulley arrangements. As may be realized, the larger the number of motors employed for effecting movement of the robot arm, the greater the burden on the control system controlling robot motion. Also, the larger the number of motors employed increases the potential for motor failure as well as the cost of the robot.

The conventional side-by-side robots as shown in FIGS. 1A-D are used in transport chambers where the robot and drive section are located within the chamber so as to substantially prevent or at best encumber and limit the space envelope available for mounting of other components to the chamber such as atmosphere control systems (e.g. vacuum pumps to the bottom of the transport chamber). In conventional systems this may cause an increase in the size of the transport chamber for mounting of vacuum pumps at locations other than the bottom of the chamber. This results in incremental costs.

It would also be advantageous to have a robot manipulator with independently movable arms with reduced complexity, containment area and improved reliability and cleanliness of the robotic system.

SUMMARY

In one exemplary embodiment, a substrate transport apparatus is provided. The substrate transport apparatus includes a frame, a drive section connected to the frame and including at least one independently controllable motor, at least two substrate transport arms connected to the frame and comprising arm links arranged for supporting and transporting substrates, and a mechanical motion switch coupled to the at least one independently controllable motor and the at least two substrate transport arms, the mechanical motion switch including a pivoting member rotatably driven by the at least one independently controllable motor about a first axis, a first and second connecting links, each connecting link being rotatably coupled at one end to the pivoting member and rotatably coupled at a second opposite end to a respective drive link, the respective drive links being distinct from the arm links of the at least two substrate transport arms, the respective drive links being rotatably coupled to the frame about a second and third axis located side-by-side from each other and spaced apart from the first axis, each drive link being drivingly coupled to a respective upper arm link of the arm links of the at least two substrate transport arms for effecting the extension and retraction of one of the at least two substrate transport arms while the other one of the at least two substrate transport arms remains in a substantially retracted configuration.

In accordance with another exemplary embodiment a substrate transport apparatus is provided. The substrate transport apparatus includes a drive section and a SCARA arm operably connected to the drive section to move the SCARA arm, the SCARA arm comprising an upper arm and at least two forearms movably mounted on the upper arm and capable of holding a substrate thereon, wherein the upper arm is a substantially rigid link, and a mechanical motion switch located inside the upper arm and being operably connected to the drive section, the mechanical motion switch being operated by but one motor of the drive section and configured to selectably effect rotation of one of the at least two forearms substantially independent of other ones of the at least two forearms.

In accordance with still another exemplary embodiment, a substrate transport apparatus is provided. The substrate transport apparatus includes a frame, a drive section connected to the frame and including at least one independently controllable motor, at least two substrate transport arms connected to the frame and comprising arm links arranged for supporting and transporting substrates, and a compact mechanical motion switch coupled to the at least one independently controllable motor and the at least two substrate transport arms, the mechanical motion switch including a pivoting member rotatably driven by the at least one independently controllable motor about a first axis, a first and second drive link distinct from the arm links of the at least two substrate transport arms, each drive link being rotatably coupled at one end to the pivoting member at a respective first joint and rotatably coupled at a second opposite end to a respective upper arm link of the at least two substrate transport arms at a respective second joint, where the first drive link crosses over the second drive link, and wherein a distance between the first axis and the respective first joint is substantially equal to a distance from the respective first joint to the respective second joint.

BRIEF DESCRIPTION OF THE DRAWINGS

The foregoing aspects and other features of the disclosed embodiments are explained in the following description, taken in connection with the accompanying drawings, wherein:

FIGS. 2A-2D illustrate exemplary processing apparatus incorporating features in accordance with an exemplary embodiment disclosed herein;

FIGS. 4A-C illustrate schematic views of a transport chamber module and the substrate transport apparatus with the drive portion shown in FIGS. 3A-B and FIG. 4D is a schematic partial elevation view of the transport chamber and transport apparatus;

FIGS. 9A-D illustrate other schematic views of the arm portions of the substrate transport apparatus in different positions;

FIGS. 10A-B illustrate schematic views of the substrate transport apparatus in accordance with another exemplary embodiment;

FIGS. 18A-D illustrate other schematic views of the transport chamber module and substrate transport apparatus, wherein one of the two arms is shown in four different extensional positions respectively;

FIGS. 20A-20L illustrate other schematic views of a transport chamber module and a substrate transport apparatus, wherein each of the two arms is shown in five different extensional positions respectively;

FIGS. 23A-B illustrate a kinetic diagram and a phased motion radial extension diagram of a single end effector arm with independently actuated coaxial rings driven by a linkage;

FIGS. 24A-B illustrate a kinetic diagram and a phased motion radial extension diagram of a single end effector arm with independently actuated coaxial rings driven by straight bands;

FIGS. 25A-B illustrate a kinetic diagram and a phased motion radial extension diagram of a single end effector arm with independently actuated coaxial rings driven by crossed bands;

FIGS. 26A-C illustrate a kinetic diagram, a phased motion radial extension diagram of a single end effector arm with independently actuated coaxial rings driven by a magnetic coupling and a schematic diagram of a magnetic coupling;

FIGS. 27A-B illustrate a kinetic diagram and a phased motion radial extension diagram of a dual end effector arm with independently actuated coaxial rings driven by a linkage;

FIGS. 29A-29G illustrate a transport apparatus in accordance with the exemplary embodiments in different configurations;

FIGS. 31A-31C show schematic illustrations of a coupling system of a transport apparatus in accordance with an exemplary embodiment;

FIGS. 32A-32D, 33A-33D, 34A-34D, 35A-35D and 36A-36D show schematic illustrations of an exemplary operation of a transport apparatus in accordance with an exemplary embodiment;

DETAILED DESCRIPTION OF THE EXEMPLARY EMBODIMENT(S)

Figure 1:
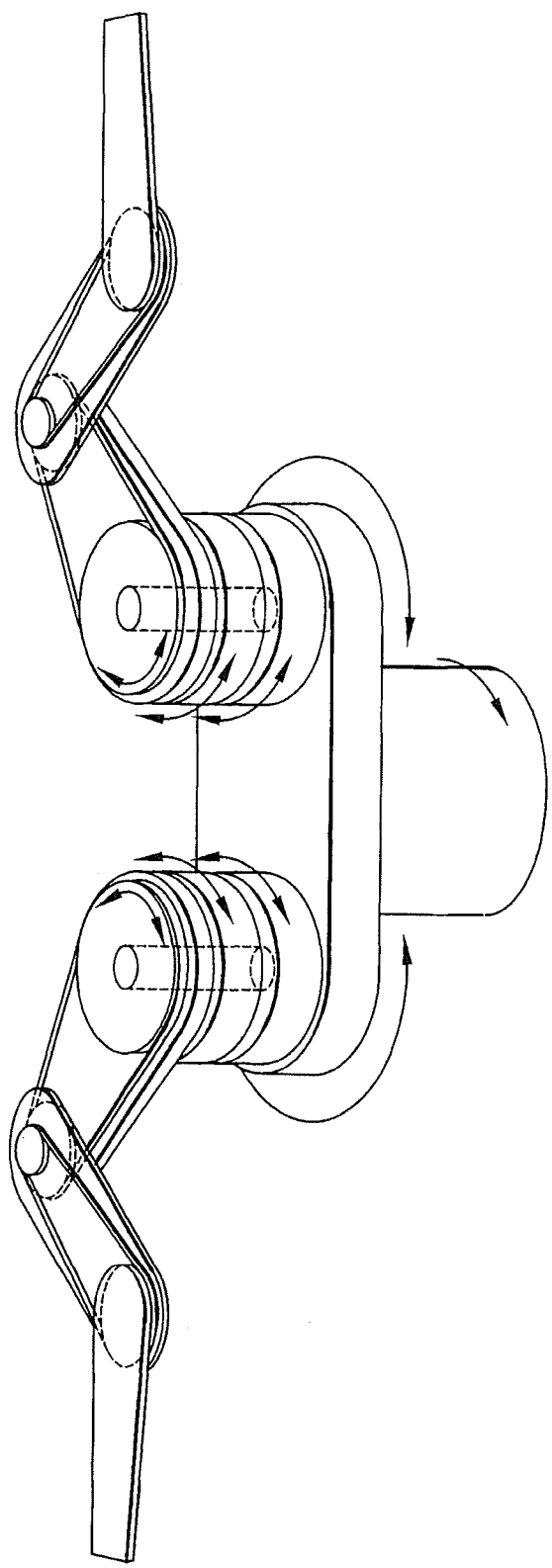
FIGS. 1 and 1A-D illustrate a conventional substrate transport apparatus with multiple moveable arms.
Figure 1A:
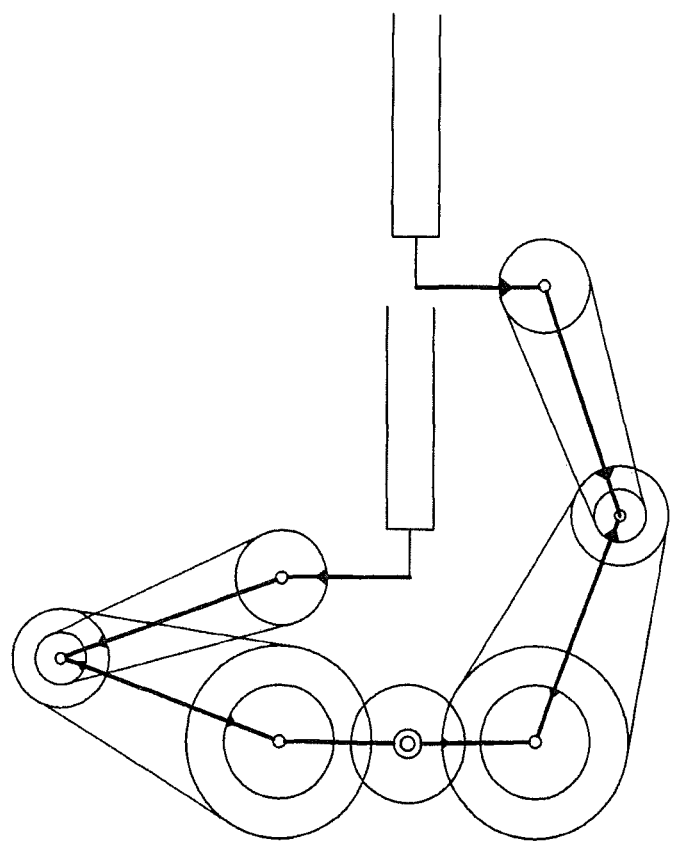
Figure 1D:
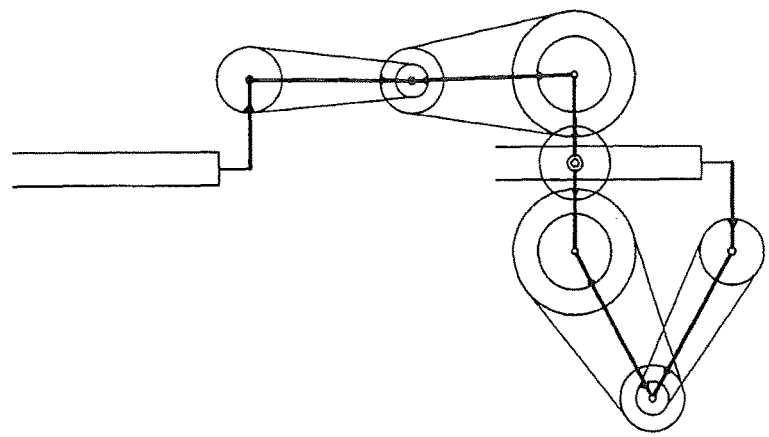
Figure 1C:
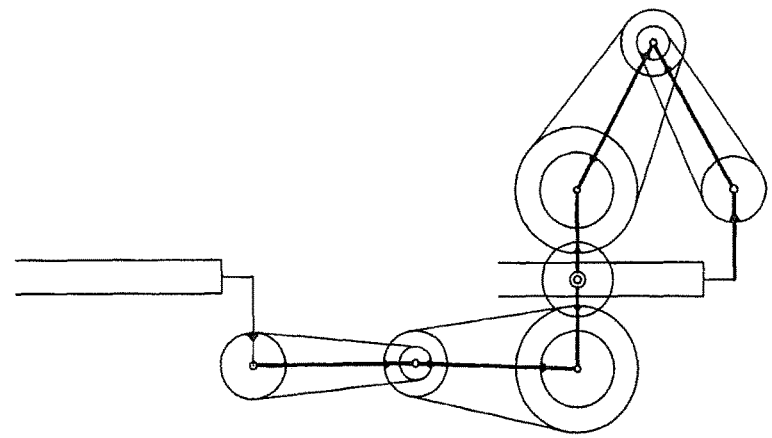
Figure 1B:
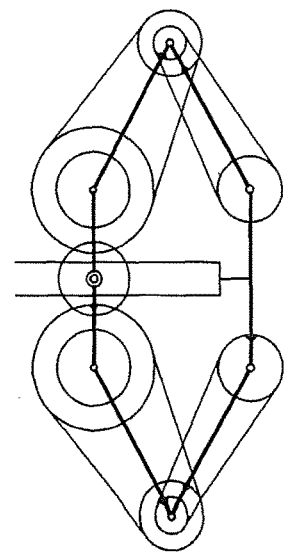

Although the embodiments disclosed will be described with reference to the embodiments shown in the drawings, it should be understood that the embodiments disclosed can be embodied in many alternate forms of embodiments. In addition, any suitable size, shape or type of elements or materials could be used.

Provided is a substrate transport apparatus with a manipulator having independently movable arms that utilize a mechanical switch mechanism to allow the two or more arms to have combined rotational and independent pick/place motion (e.g. each arm has two or more degrees of freedom with at least one degree of freedom of each arm substantially independent of the degrees of freedom of the other arms) with as few as two independently controllable motors. The drive for the two or more arms may be for example integrated into the vacuum transport chamber walls, which allows integration of vacuum system components (vacuum pumps, gauges, and valves) to the bottom of the chamber. In one exemplary embodiment, the shoulders of the arms may be positioned off center (closer to the processing station), resulting in articulated arms that have a SEMI (Semiconductor Equipment and Materials International) reach of the robot, but smaller than conventional arms.

Referring to FIGS. 2A-2D, there are shown a schematic views of substrate processing apparatus or tools incorporating features of the exemplary embodiments as disclosed further herein.

Figure 2A:
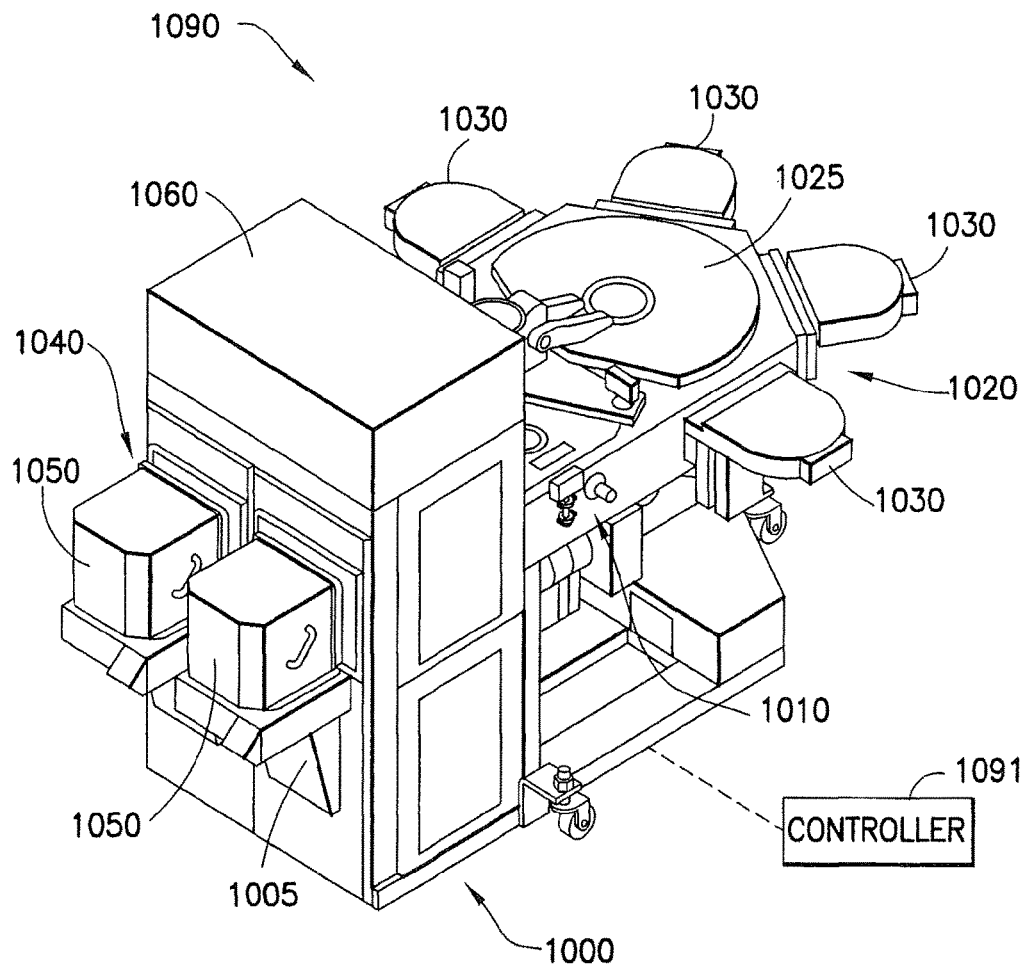
Figure 2B:
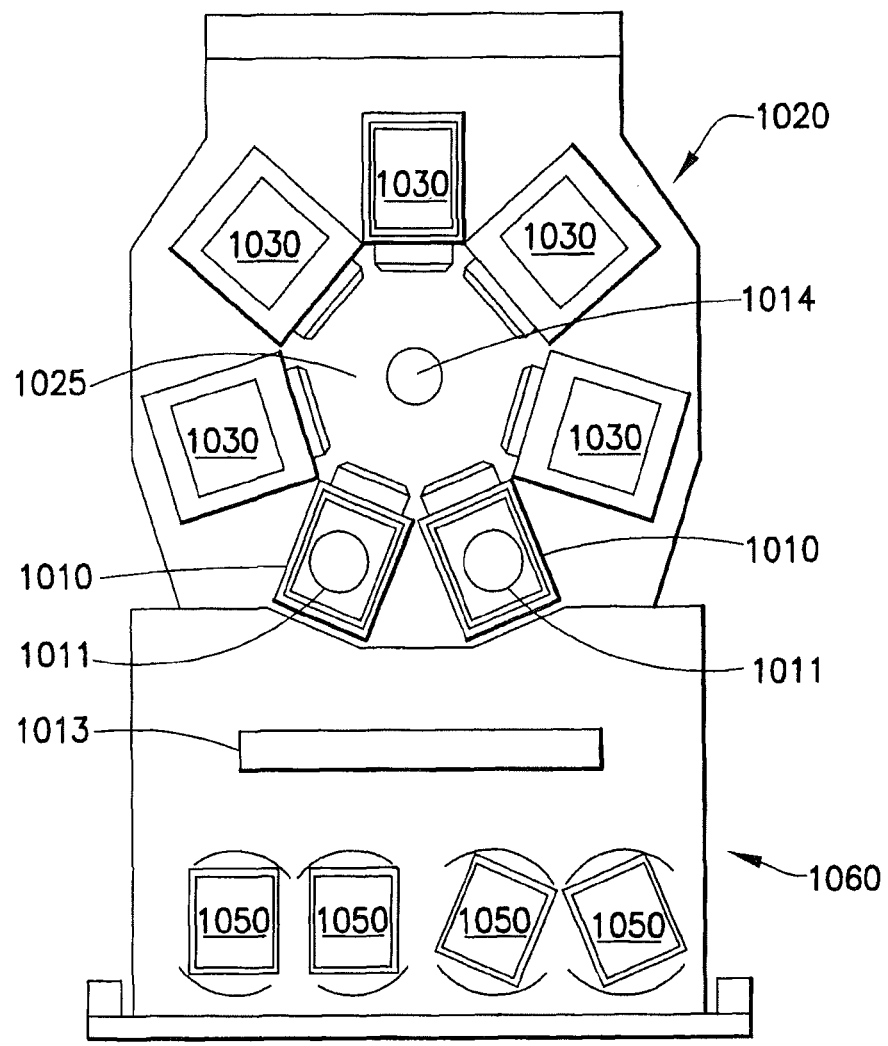

Referring to FIGS. 2A and 2B, a processing apparatus, such as for example a semiconductor tool station 1090 is shown in accordance with an exemplary embodiment. Although a semiconductor tool is shown in the drawings, the embodiments described herein can be applied to any tool station or application employing robotic manipulators. In this example the tool 1090 is shown as a cluster tool, however the exemplary embodiments may be applied to any suitable tool station such as, for example, a linear tool station such as that shown in FIGS. 2C and 2D and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 1090 generally includes an atmospheric front end 1000, a vacuum load lock 1010 and a vacuum back end 1020. In alternate embodiments, the tool station may have any suitable configuration. The components of each of the front end 1000, load lock 1010 and back end 1020 may be connected to a controller 1091 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In alternate embodiments, any suitable controller and/or control system may be utilized.

In the exemplary embodiments, the front end 1000 generally includes load port modules 1005 and a mini-environment 1060 such as for example an equipment front end module (EFEM). The load port modules 1005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In alternate embodiments, the load port modules may be configured as 200 mm wafer interfaces or any other suitable substrate interfaces such as for example larger or smaller wafers or flat panels for flat panel displays. Although two load port modules are shown in FIG. 2A, in alternate embodiments any suitable number of load port modules may be incorporated into the front end 1000. The load port modules 1005 may be configured to receive substrate carriers or cassettes 1050 from an overhead transport system, automatic guided vehicles, person guided vehicles, rail guided vehicles or from any other suitable transport method. The load port modules 1005 may interface with the mini-environment 1060 through load ports 1040. The load ports 1040 may allow the passage of substrates between the substrate cassettes 1050 and the mini-environment 1060. The mini-environment 1060 generally includes a transfer robot 1013 as will be described in greater detail below. In one embodiment the robot 1013 may be a track mounted robot such as that described in, for example, U.S. Pat. No. 6,002,840, the disclosure of which is incorporated by reference herein in its entirety. The mini-environment 1060 may provide a controlled, clean zone for substrate transfer between multiple load port modules.

The vacuum load lock 1010 may be located between and connected to the mini-environment 1060 and the back end 1020. The load lock 1010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 1010 may also include an aligner 1011 for aligning a fiducial of the substrate to a desired position for processing. In alternate embodiments, the vacuum load lock may be located in any suitable location of the processing apparatus and have any suitable configuration.

The vacuum back end 1020 generally includes a transport chamber 1025, one or more processing station(s) 1030 and a transfer robot 1014. The transfer robot 1014 will be described below and may be located within the transport chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transport chamber 1025 to allow substrates to be passed from the transport chamber 1025 to the processing stations 1030 and vice versa.

Referring now to FIG. 2C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. patent application Ser. No. 11/442,511, previously incorporated herein by reference. Each transport chamber module 3018, 3019A, 3018I, 3018J includes a substrate transport 2080 as will be described in greater detail below for transporting substrates throughout the processing system 2010 and into and out of, for example, processing modules PM. As may be realized, each chamber module may be capable of holding an isolated or controlled atmosphere (e.g. N2, clean air, vacuum).

Figure 2D:
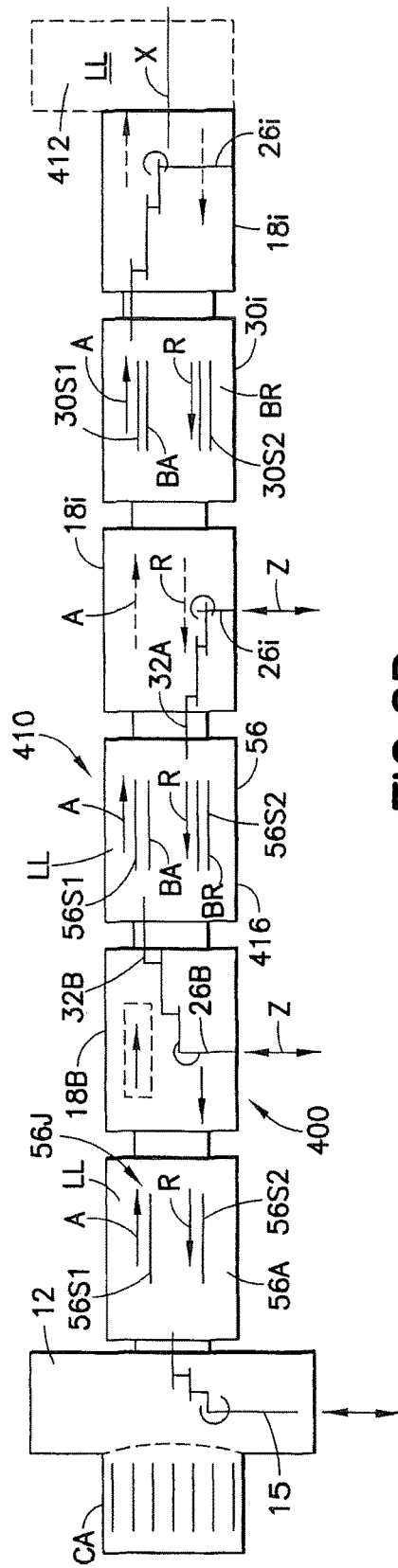

Referring to FIG. 2D, there is shown a schematic elevation view of an exemplary processing tool 410 such as may be taken along longitudinal axis X of the linear transport chamber 416. In the exemplary embodiment shown in FIG. 2D, tool interface section 12 may be representatively connected to the transport chamber 416. In this exemplary embodiment, interface section 12 may define one end of the tool transport chamber 416. As seen in FIG. 2D, the transport chamber 416 may have another workpiece entry/exit station 412 for example at an opposite end from interface station 12. In other alternate embodiments, other entry/exit stations for inserting/removing workpieces from the transport chamber may be provided. In the exemplary embodiment, interface section 12 and entry/exit station 412 may allow loading and unloading of workpieces from the tool. In alternate embodiments, workpieces may be loaded into the tool from one end and removed from the other end. In the exemplary embodiment, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56B and workpiece stations forming the transport chamber 416 shown in FIG. 2D is merely exemplary, and in alternate embodiments the transport chamber may have more or fewer modules disposed in any desired modular arrangement. In the embodiment shown, station 412 may be a load lock. In alternate embodiments, a load lock module may be located between the end entry/exit station (similar to station 412) or the adjoining transport chamber module (similar to module 18i) may be configured to operate as a load lock. As also noted before, transport chamber modules 18B, 18i have one or more corresponding transport apparatus 26B, 26i located therein. The transport apparatus 26B, 26i of the respective transport chamber modules 18B, 18i may cooperate to provide the linearly distributed workpiece transport system 420 in the transport chamber. In this embodiment, the transport apparatus 26B may have a general SCARA arm configuration as will be further defined herein (though in alternate embodiments the transport arms may have any other desired arrangement). In the exemplary embodiment shown in FIG. 2D, the arms of the transport apparatus 26B may be arranged to provide what may be referred to as fast swap arrangement allowing the transport to quickly swap wafers from a pick/place location as will also be described in further detail below. The transport arm 26B may have a suitable drive section for providing each arm with three (3) (e.g. independent rotation about shoulder and elbow joints with Z axis motion) degrees of freedom from a simplified drive system compared to conventional drive systems. As seen in FIG. 2D, in this embodiment the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30*i* with arm 26*i* (in module 18*i*) and between station 30*i* and station 412 with arm 26*i* in module 18*i*. This process may be reversed in whole or in part to move the workpiece(s) in the opposite direction. Thus, in the exemplary embodiment, workpieces may be moved in any direction along axis X and to any position along the transport chamber and may be loaded to and unloaded from any desired module (processing or otherwise) communicating with the transport chamber. In alternate embodiments, interstitial transport chamber modules with static workpiece supports or shelves may not be provided between transport chamber modules 18B, 18*i*. In such embodiments, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 2D is described in U.S. patent application Ser. No. 11/442,511, previously incorporated by reference in its entirety.

Figure 3A:
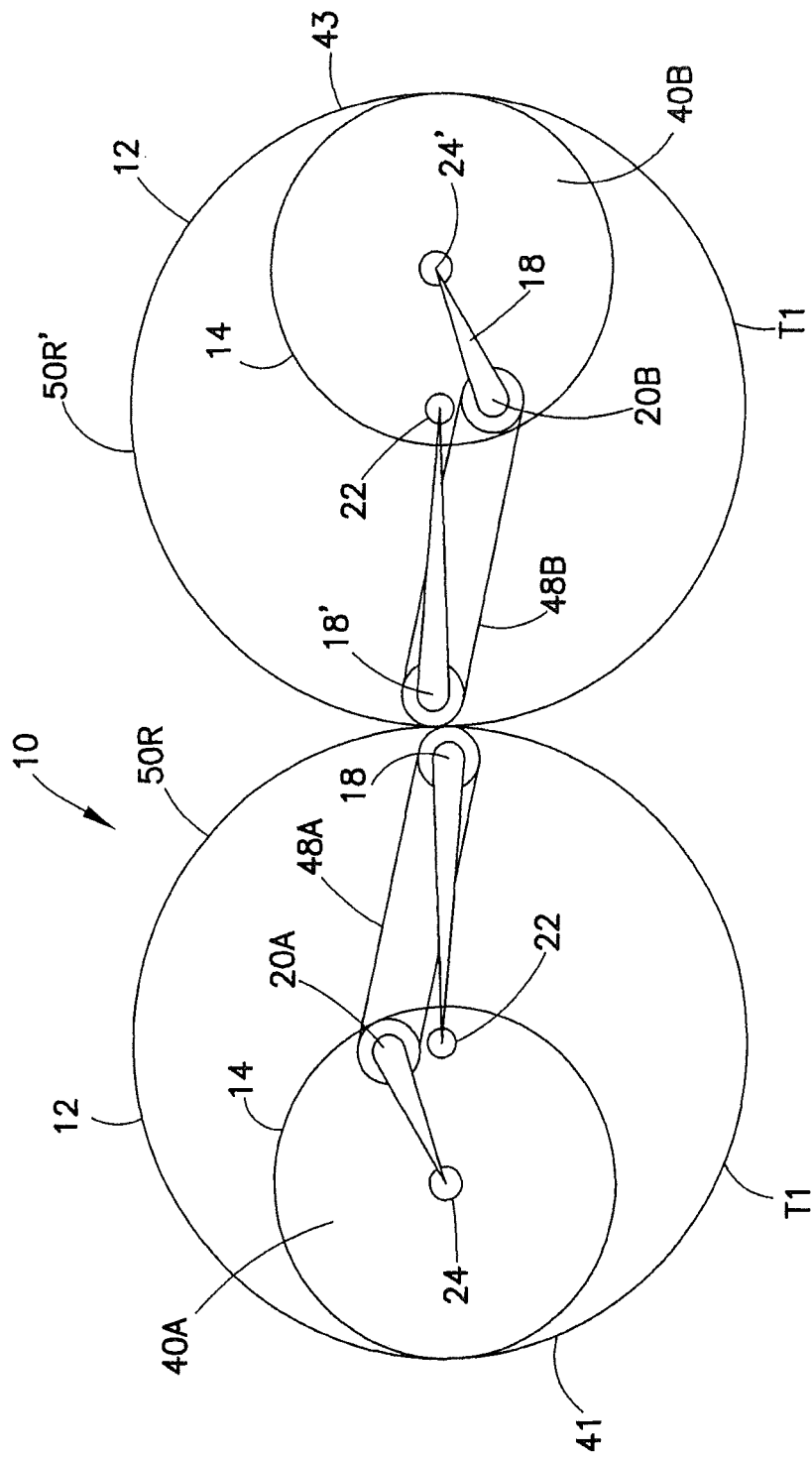
FIGS. 3A-B are schematic views of a drive portion of a transport apparatus of the processing apparatus in FIG. 2 in which the figures depict different positions of the transport apparatus in accordance with exemplary embodiments.
Figure 3B:
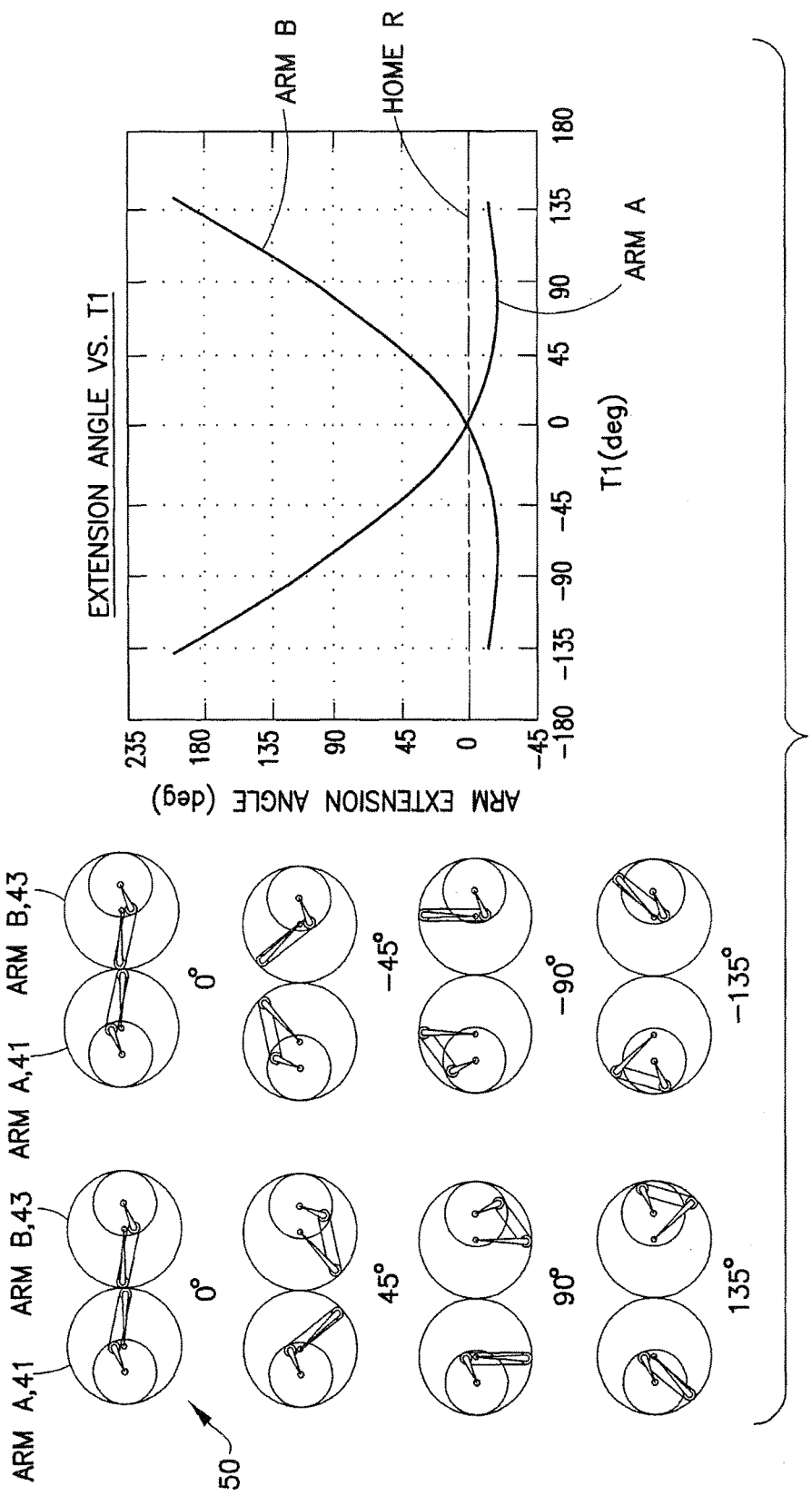
Figure 4C:
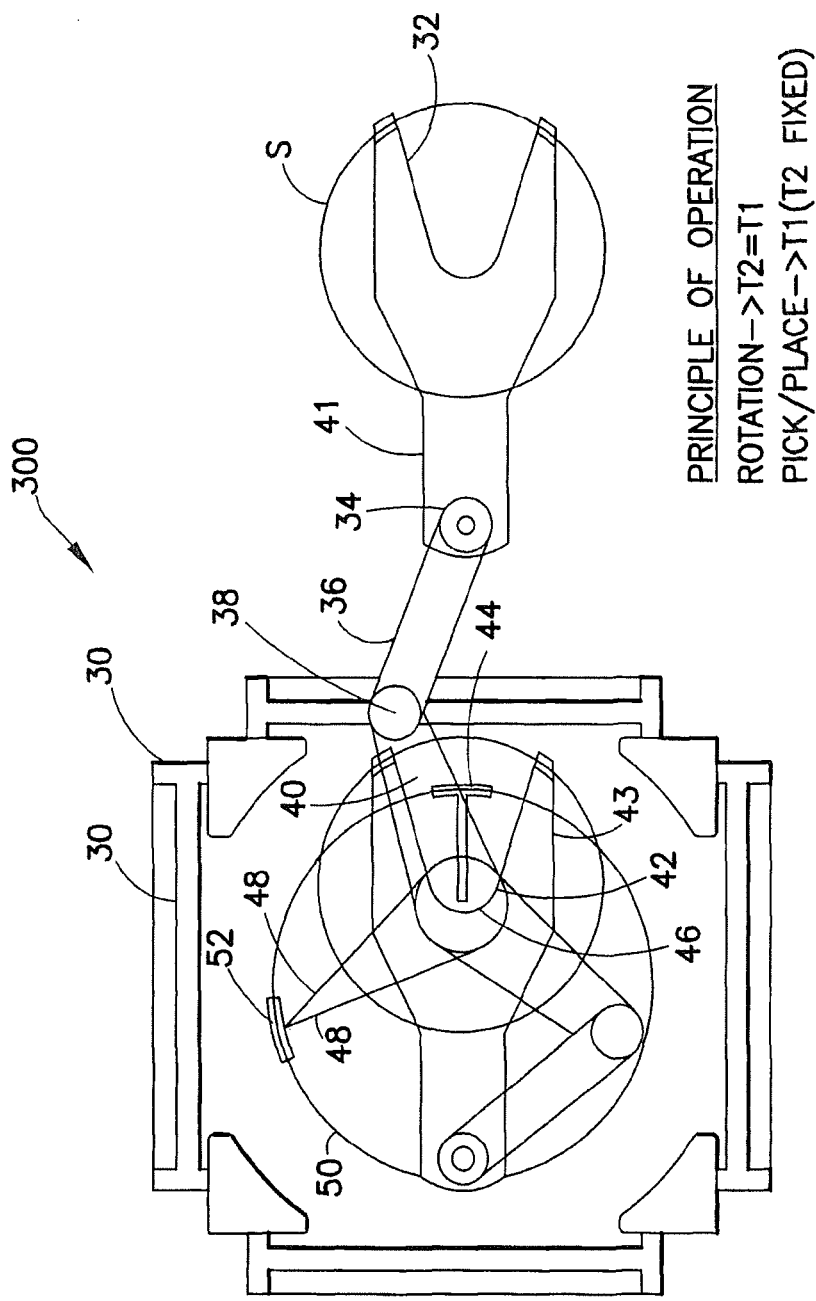

Referring to FIGS. 4A-C, a substrate transport apparatus 300, having for example dual same side SCARA arms and incorporating a mechanical switch mechanism (see also FIGS. 3A-B). The transport chamber 30 may be generally similar to chamber modules 18B, 18*i* shown in FIG. 2. As seen best in FIGS. 4B and C, the transport apparatus may include independently articulated arms A and B, and is located within a transport chamber 30. In FIG. 4B, the dual same side SCARA arms are indicated as Arm A 41 and Arm B 43 with the transport chamber not shown. The substrate for transport is indicated by S and is positioned on a forked shaped end effector 32. The end effector may be of an alternative shape including, but not limited to, paddle shaped. One end effector is shown for example purposes, and in alternate embodiments the arm(s) may have any number of end effectors. The substrate S is representative and may be of any size, and shape such as a 200 mm, 300 mm, 450 mm or larger semiconductor wafer, a reticle or pellicle or panel for flat screen displays. As noted before, each arm may have for example a SCARA arrangement, though in alternate embodiments the transport arms may have any other desired arrangement. In the exemplary embodiment the transport arms are generally similar, though in alternate embodiments the arms may be different. The end effector 32 is pivotally connected at wrist joint 34, to a forearm 36 for each Arm A 41 and B 43. The forearm 36 is pivotally connected at an elbow joint 38, to an upper arm 40 for each of Arm A 41 and Arm B 43. In the exemplary embodiment, the upper arm 40, for Arm A 41 and B 43, are in turn mounted to a common base rotor 42 for the T2 motor 44 via the arm shoulder joint 46.

Figure 4D:
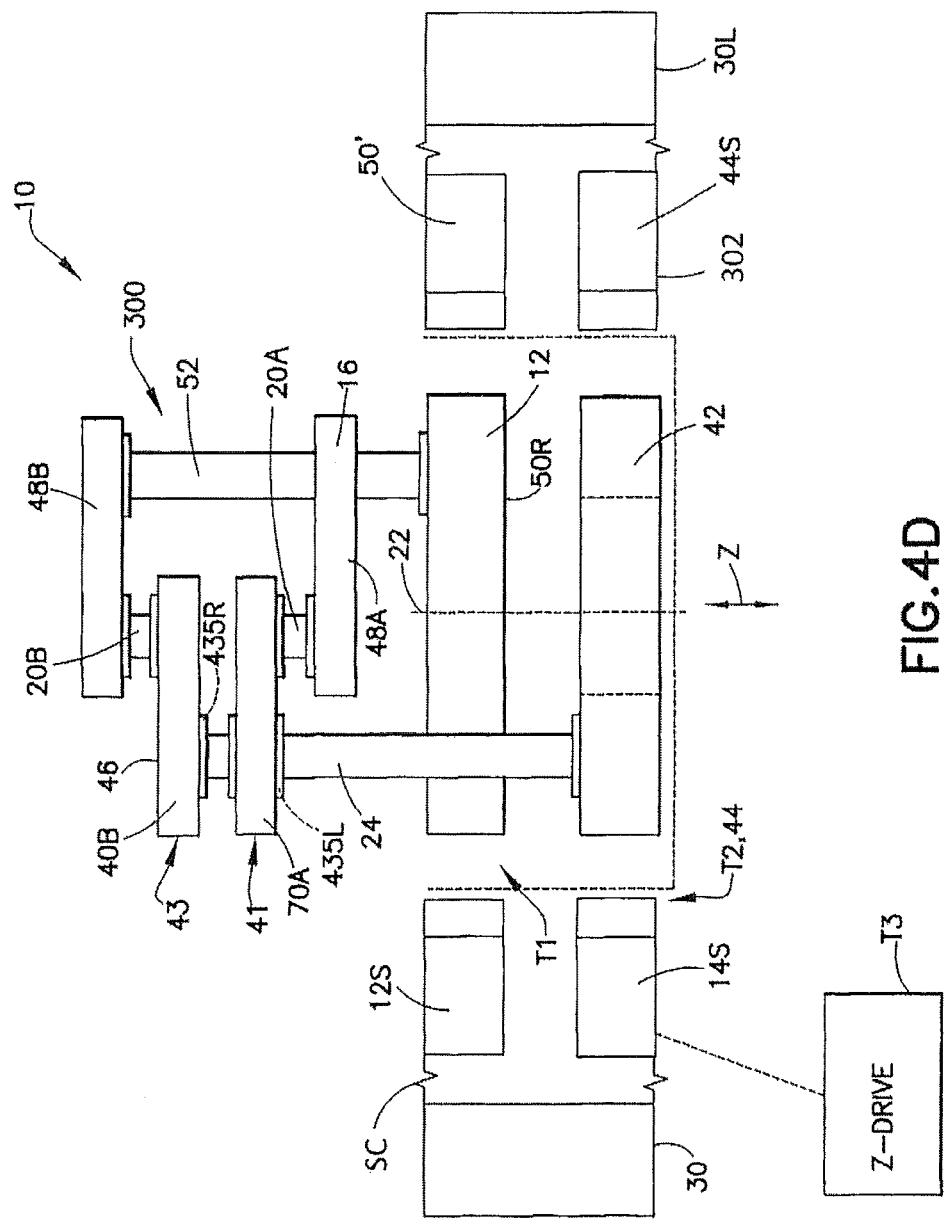
Figure 4E:
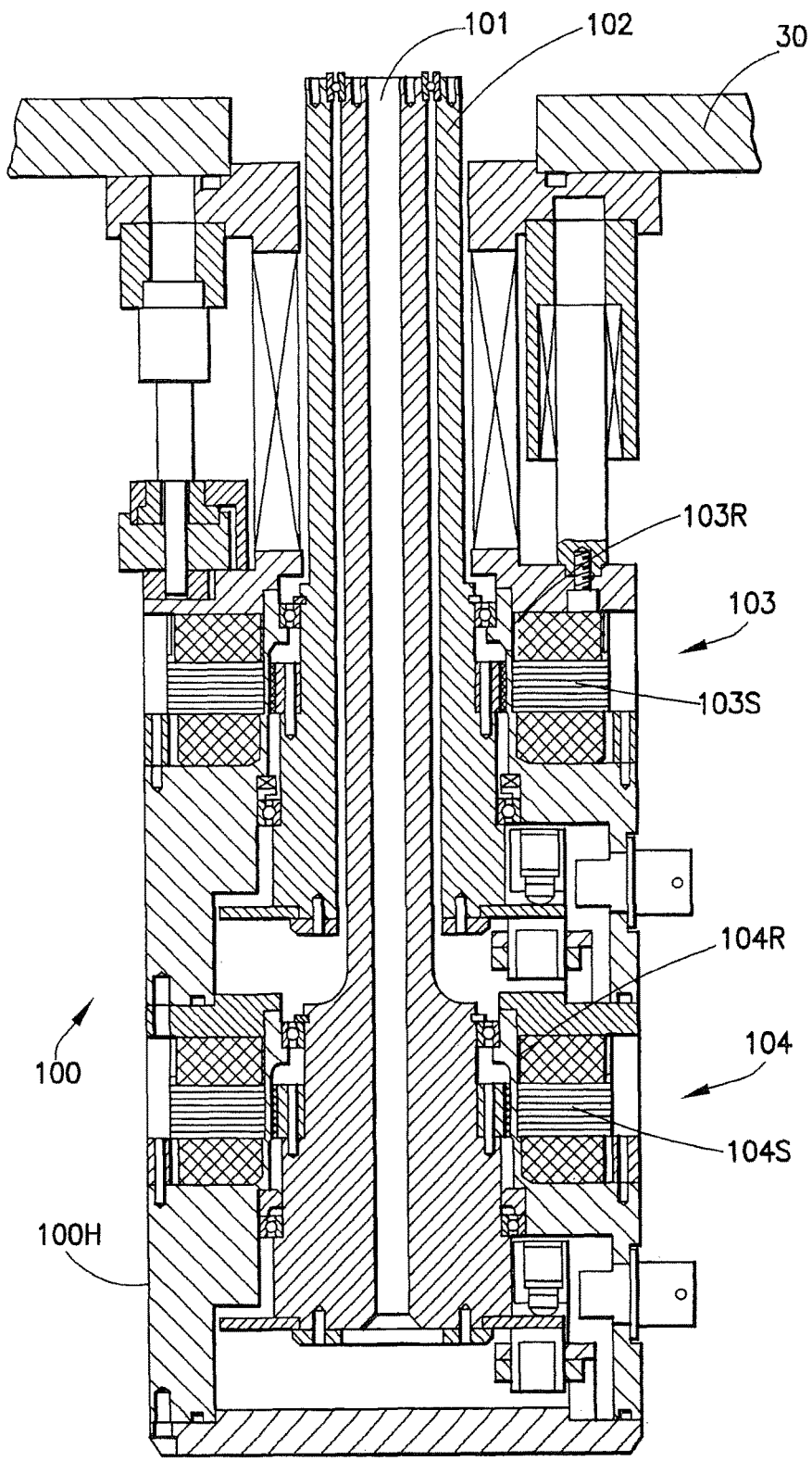
FIG. 4E is a schematic sectional view of a portion of a drive section in accordance with an exemplary embodiment.

FIG. 4D is a schematic partial elevation view of the transport chamber 30 and drive section of transport apparatus 300. As seen in FIG. 4D, in the exemplary embodiment, the T1, T2 motors may be any suitable type of motors and may be incorporated within the wall structure of the chamber 30. For example the T1, T2 motors may be brushless DC motors (though any other suitable motors may be used), with stator coils integrated into walls and isolated from the internal atmosphere of the chamber 30. In other exemplary embodiments the drive may be a bearing drive system located at least partially below the chamber 30 as shown in FIG. 4E and as will be described in greater detail below. In alternate embodiments the drive may be a combination of, for example, the bearing drive system and the drive located in the chamber walls. In other alternate embodiments, the drive may be any combination of the drive systems disclosed herein and any suitable conventional drive system.

Referring again to FIG. 4D, the motors may be housed in a common section 302 that is capable of Z axis motion, as shown in FIG. 4D, hence providing the arms with Z motion. A suitable flexible seal SC (such as a bellows seals may connect the drive belt to the adjoining wall structure to maintain the isolatable atmosphere in the transport chamber module. The drive section, may be operably connected to a suitable Z-drive T3 illustrated substantially in FIG. 4D. The Z-drive may be of any suitable type, such as including windings (not shown) in the stator capable of moving the rotors 42, 50R in the Z direction. The Z-drive windings may also provide, in addition to Z location control, Z-stability for the motor rotors and arms holding the rotors and arms in a desired Z-location. The motors may be self bearing in both radial and Z-directions, or may have passive radial and Z bearing systems such as permanent magnets or mechanical bearings or a combination thereof for Z and radial bearing. In alternate embodiments, the Z-drive may include a Z-drive motor powering a lead screw connected to the section 302 to effect Z-motion of the transport arms. In the exemplary embodiments, the shoulder joint 46 of the arms 41, 43 is coaxial, the respective upper arms 40A, 40B pivoting about a common shaft 24 that may be offset from the rotor axis of rotation 22. In alternate embodiments, the arms may be mounted with offset shoulder joints, each rotating about a corresponding axis of rotation that are substantially parallel to each other. In the exemplary embodiments, the motor rotors 42, 50R are shown as being located on one side, such as in the bottom wall 30L, of the chamber 30 for example purposes, though in alternate embodiments the rotors may be disposed in one or more of the transport chamber walls, such as one rotor on top (above the transport arms) and one on the bottom (below the arms). In the exemplary embodiment, the rotors may have a generally hollow ring structure, for reduced weight. In alternate embodiments, the rotors may have any suitable shape and configuration.

As seen best in FIGS. 4B, 4D a crank link 48 connects the upper arm 40A, B for each arm A 41 and B 43 to a revolute joint 52 on the rotor 50R of T1 motor 50. As depicted in FIGS. 4 A-D, the two crank links share a common convergent or pivot (e.g. shaft) 52 on the rotor 50R of motor T1. As seen best in the plan views illustrated in FIGS. 4A and 4B, the locations of the revolute joints 20A, 20B of each link 48A, 48B to the respective upper arms 40A, 40B, are for example on substantially opposite sides of the X axis, along which the end effectors 32 of each arm is extended/retracted. In order to effect extension of Arm A 41 or Arm B 43 (e.g. for pick and place of a substrate S on the end effector 32), the T1 motor 50 may be rotated while the T2 motor 44 is stationery. When the T1 motor is rotated in one direction, one arm extends or retracts while the second arm practically does not move due to what may be called a mechanical switch or lost motion system that develops motion of one arm from another, generated by a common motor without physically decoupling the arms from the motor (see also FIGS. 3A-B). FIG. 4C depicts Arm A 41 in an extended position beyond the confines of the transport chamber 30 while Arm B is retracted within the transport chamber 30. This movement of Arm A 41 allows for a substrate S to be picked up and placed in a storage chamber or processing station. In order to effectuate rotation of the arms, both the T2 motor 44 and the T1 motor 50 are rotated to the same degree. The T1 motor 50 and T2 motor 44 have independent drive shafts which necessitates that the center of rotation of T1 is offset from T2.

Referring now to FIGS. 3A-B, the principle of operation of the mechanical switch mechanism 10 for arm motion disclosed herein will be described when used in a same side dual arm configuration. FIG. 3A-B depict the mechanical switch mechanism 10 of the same side dual SCARA arm configuration shown in FIGS. 4A-4D. As may be realized, the lines and connections thereof to the respective arms 40A, 40B and common motor T1, rotor 50R are substantially mirror images of each other, and may be represented as shown in FIGS. 3A-3B for clarity to illustrate its operation. As noted before mechanical switch mechanism 10 may include upper arms 40A, 40B, in the exemplary embodiment sharing common revolute joint 24, but shown as circular members (with diameter 14) on opposing revolute joints 24, 24', T1 motor rotor 50R, shown as opposing circular members with diameters 12) on (common) axis of rotation 22. These members may be linked together with crank links 48A, 48B at revolute joints 18, 18' joints 20A, 20B (to respective upper arms) located on each side of the links 48A, 48B. Non-limiting exemplary bearings 18, 20 include needle type, ball bearing type or bushing type. In the exemplary embodiment the center of rotation 22 of the rotor 50, 50' and the center of rotation (e.g. shoulder joint) of the (upper arms) circle 40A, 40B, 24, 24' may be offset with respect to one another in the exemplary embodiment. Thus as seen best in FIG. 3A, in the exemplary embodiment, each arm 41, 43 may have a corresponding crank link 48A, 48B coupling the circle (T1) representing the motor rotor 50R, 50R' with the smaller circle (T2) representing in the example the upper arms 40A, 40B of the corresponding arms. In alternate embodiments, the link coupling motor and articulated arm may be joined to any other desired section of the arm.

The resultant motions of the arms A, B (41, 43) effected by motor T1 (50) via the mechanical switch 10 are substantially depicted in FIG. 3B by way of example, when T1 rotates between 0 and −135 degrees (counterclockwise), Arm A (41) is changing extension angle or rotating (about shoulder 24). In contrast, Arm B (43) is practically not moving. However, when T1 rotates between 0 and +135 degrees (clockwise), Arm B is changing extension angle or rotating (about shoulder 24) and Arm A is practically not moving. The relative motions illustrating the operation of the switch in the exemplary embodiment, are also depicted graphically in the graph of FIG. 3B which plots the extension angle of Arms A and B versus the rotation angle and direction of T1. As noted previously, in the exemplary embodiment, the two crank links 48A, 48B may be attached opposite of the axis of symmetry so when T1 rotates in one direction, one link and arm combination are substantially locked, causing arm rotation with T1 and the other link and arm combination is substantially released or free thus not undergoing movement with T1. Correspondingly, when T1 rotates in the opposite direction, the previously locked arm releases to rotate with T1 while substantially the previously free arm substantially locks to rotate with T1. This allows for independent extension of the two arms (depending on the direction and degree of rotation) from but one motor T1. As may be realized and as will be described in greater detail below, when both T1 and T2 rotate together, the two arms rotate relative to for example transport chamber 30 (e.g. about center of rotation 22), as a unit.

As may be realized from FIGS. 3A, and 4A-D, in the exemplary embodiment, the T1, T2 motors 42, 50 may be rotary motors (such as brushless DC motors as noted before) that are coupled to the respective arms A, B (41, 43) via what may be referred to as a shaft less drive coupling system. In the exemplary embodiment shown, the stators 50S, 44S of the T1, T2 motors may be generally linearly distributed such as in a generally arcuate manner substantially around and proximate the periphery of the transport chamber 30. The diameter of the T1, T2 motors may be maximized relative to the space envelope of the transport chamber, which as may be realized may be minimized to the space envelope circumscribing the clearances for the motions of the arms A, B and wafers on the one or more end effector(s) of the arms. As may be realized, in the exemplary embodiment, the T1 motor, for example, operates to impart a force on the arms A, B that is eccentric to the shoulder axis of rotation (e.g. revolute joint 24) hence, by way of example the T1 motor 50 output imparts a leverage force in the arms A, B that pivots the arms about a fulcrum defined for example by shoulder joint 24. The coupling system between arms and motor 50, that includes the previously described mechanical switch 10, causes a resultant force to be applied by motor 50 to the arms that is eccentric to shoulder axis of rotation. In alternate embodiments, the motors and couplings delivering power from the motors to the arms may have any other suitable arrangement.

Figure 5A:
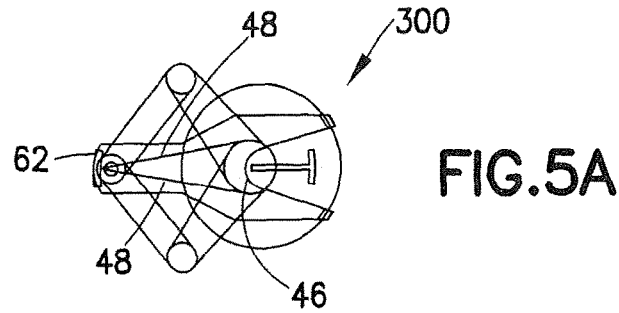
FIGS. 5A-D illustrate schematic views of the substrate transport apparatus in FIGS. 4A-4C shown in four different extensional positions respectively.
Figure 5B:
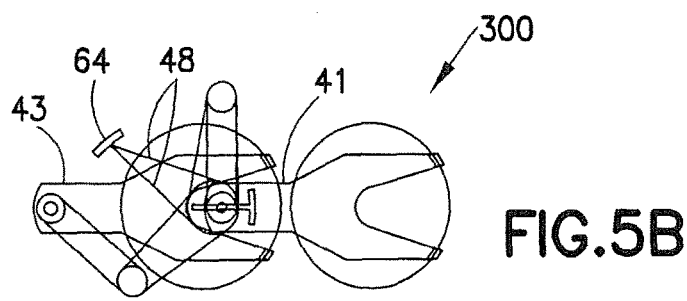
Figure 5C:
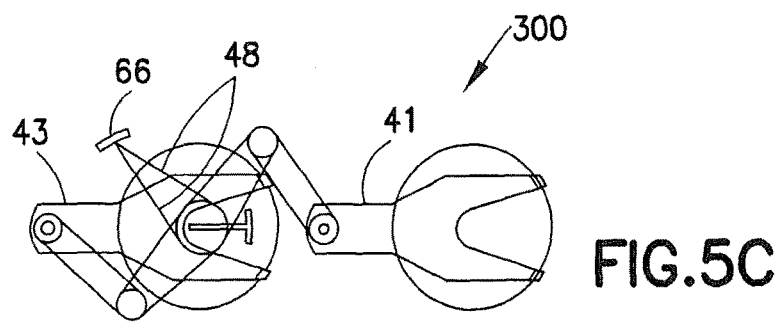
Figure 5D:
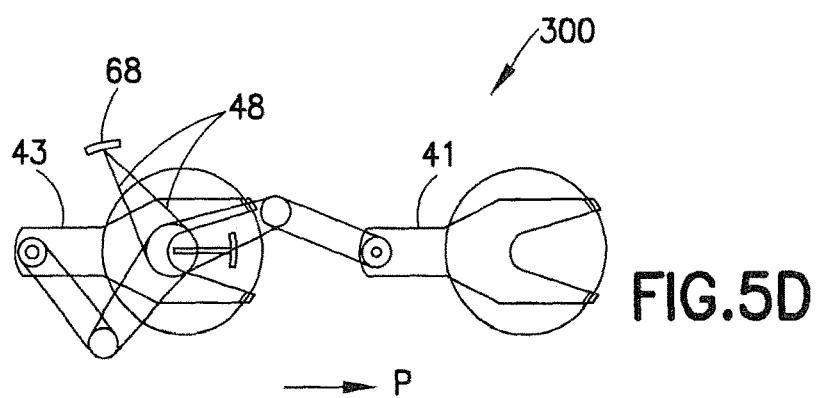

Referring now to FIGS. 5A-D, the extensional movement of Arm A 41 is depicted in four different extensional positions for the substrate transport apparatus 300 with dual same side SCARA arms incorporating the mechanical switch mechanism disclosed herein. In FIG. 5A, the two crank links 48 connecting the arm shoulder joints 46 on the T2 motor mounting plate 44 to the T1 motor 50 substantially converge at revolute joint 62 (similar to joint 52 in FIG. 4D) along the circumference of T1 50 as noted before, in alternate embodiments, the links may be joined to the T1 motor rotor at offset revolute joints. As rotor 50R of T1 motor 50 is rotated in the clockwise direction, the crank links 48A, 48B also rotate along the circumference of T1 from position 62 to point B 64 in FIG. 5B, which in turn causes Arm A 41 to extend outward toward the right while Arm B 43 remains essentially fixed in the retracted position. As T1 50 is further rotated in the clockwise direction, the crank links 48 further rotate along the circumference of T1 to point C 66 in FIG. 5C, which in turn causes Arm A 41 to further extend outward toward the right while Arm B 43 still remains essentially fixed in the retracted position. As T1 50 is further rotated in the clockwise direction, the crank links 48 further rotate along the circumference of T1 to point D 68 in FIG. 5D, which in turn causes Arm A 41 to further extend outward toward the right while Arm B 43 still remains essentially fixed in the retracted position. To retract Arm A 41, the direction of T1 50 is reversed along points C 66, B 64, and A 62. In an alternative embodiment, the two crank links 48 for the two arms 41, 43 need not converge on the same point on the circumference of T1 50.

Figure 6A:
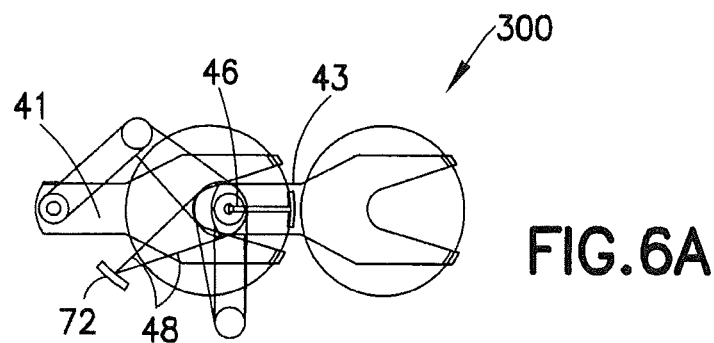
FIGS. 6A-C illustrate other schematic views of the substrate transport apparatus shown in another three different extensional positions respectively.
Figure 6B:
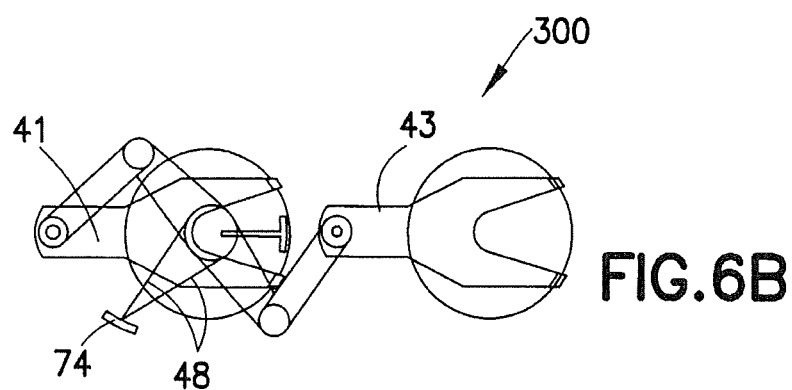
Figure 6C:
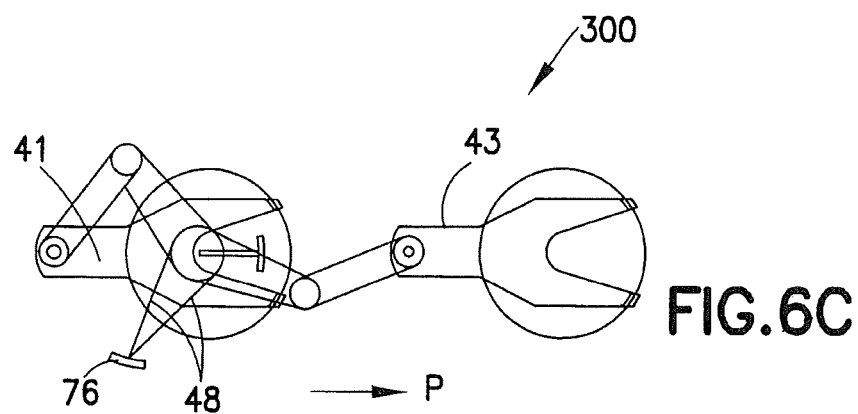

Referring to FIGS. 6A-C, the extensional movement of Arm B 43 is depicted in three different extensional positions for the substrate transport apparatus 300 with dual same side SCARA arms incorporating the mechanical switch mechanism disclosed herein. In FIG. 6A, the two crank links 48 connecting the arm shoulder joints 46 (supported on the T2 motor rotor 44) to the T1 motor by way of example 50 are positioned for example at point E 72 along the circumference of T1 motor 50. As T1 motor 50 is rotated in the counterclockwise direction, the crank links 48 also rotate along the circumference of T1 to point F 74 in FIG. 6B, which in turn causes Arm B 43 to extend outward toward the right while Arm A 41 remains essentially fixed in the retracted position. As T1 50 is further rotated in the counterclockwise direction, the crank links 48 further rotate along the circumference of T1 to point G 76 in FIG. 6C, which in turn causes Arm B 43 to further extend outward toward the right while Arm A 41 still remains essentially fixed in the retracted position. To retract Arm B 43, the direction of T1 50 is reversed along points F 74, and E 72.

Figure 7A:
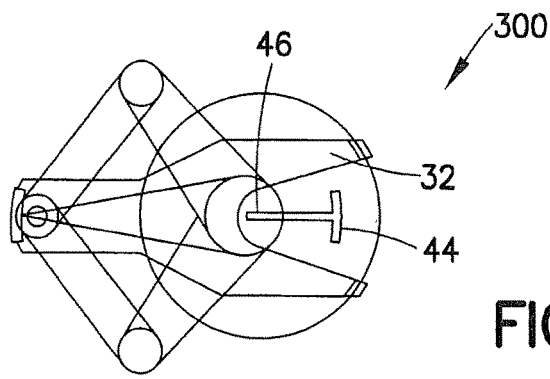
FIGS. 7A-E illustrate still other schematic views of the substrate transport apparatus shown in yet another five different rotational positions respectively.
Figure 7B:
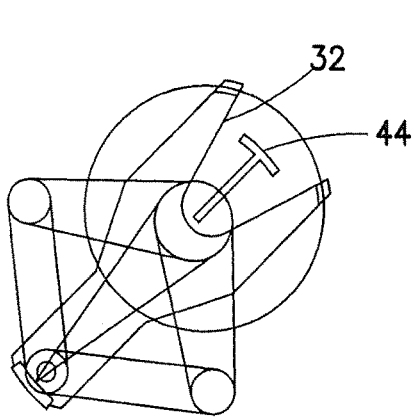
Figure 7D:
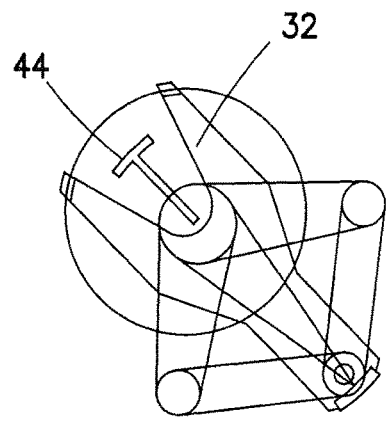
Figure 7C:
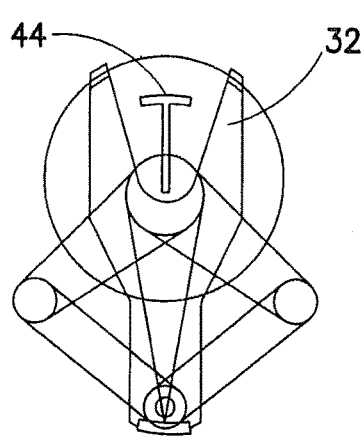
Figure 7E:
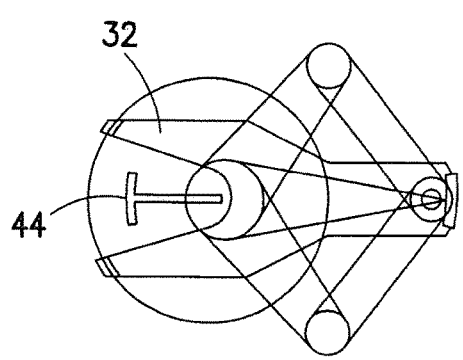

Referring to FIGS. 7A-E, the rotational movement of Arm A 41 and Arm B 43 are depicted in five different rotational positions for the substrate transport apparatus 300 In FIG. 7A, the end effector(s) 32 are pointing along the positive x-axis. When both the T1 and T2 motors 50, 44 are rotated in the same direction in equal amounts, Arms A and B, 41, 43 will correspondingly rotate as a unit about axis of rotation 22 in the same direction along the continuum shown in FIGS. 7B, 7C, 7D and 7E.

Figure 8A:
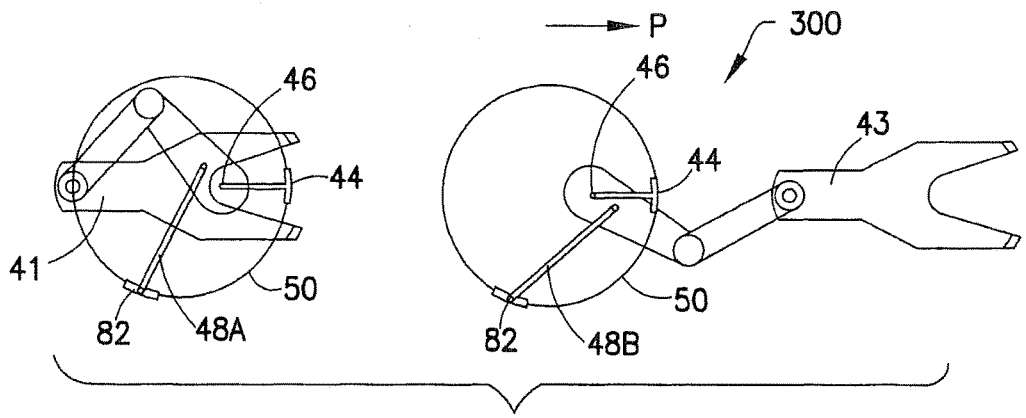
FIGS. 8A-C illustrate schematic views of respective arm portions of the substrate transport apparatus showing the respective arm portions in three different corresponding extension/retraction positions.
Figure 8B:
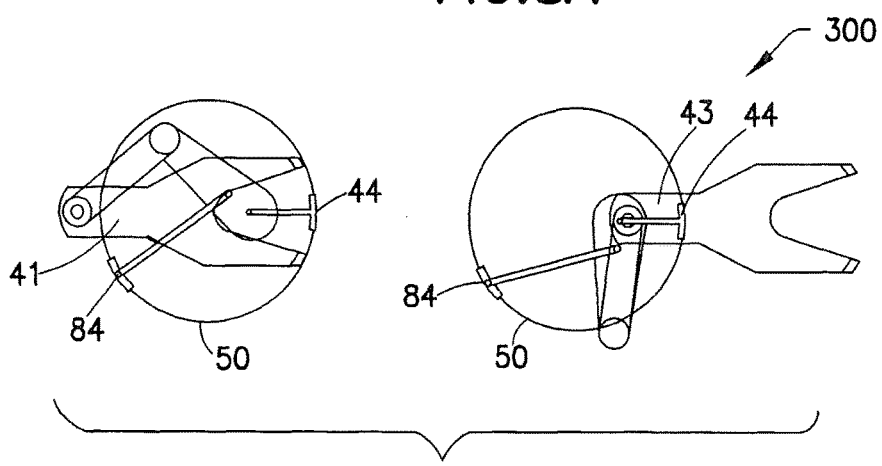
Figure 8C:
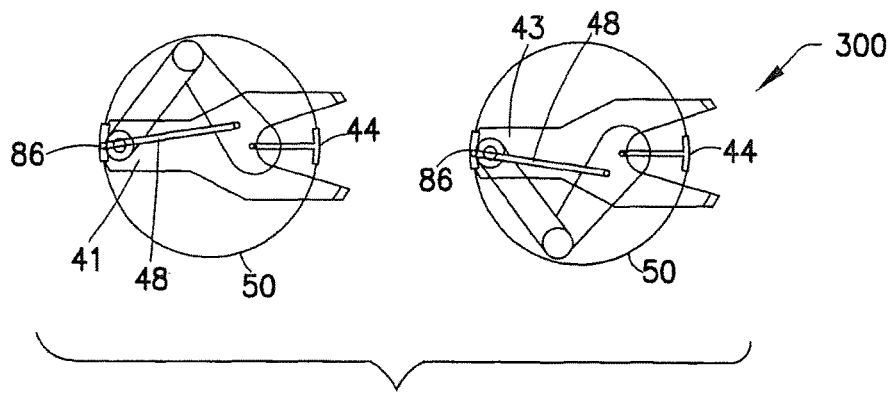

Referring now to FIGS. 8A-C, the extension/retraction movement of Arm B 43 in the exemplary embodiment is depicted in three different exemplary positions alongside with the corresponding positions of arm A 41. As may be realized, in the embodiment shown in FIG. 8A arm B is in an extended position and in FIG. 8C arm 8 is retracted. In FIG. 8A, the revolute joint for the two crank links 48 connecting the arm shoulders 42 on the T2 motor mounting plate 44 to the T1 motor 50 is located at point H 82 along the circumference of T1 motor 50. As T1 motor 50 is rotated, for example in the clockwise direction, the crank links 48 also rotate along the circumference of T1 to point 184 in FIG. 8B, which in turn causes Arm B 43 to retract inward toward the left while Arm A 41 remains essentially stationary in the retracted position. As T1 50 is further rotated in the clockwise direction, the crank links 48 further rotate along the circumference of T1 to point J 86 in FIG. 8C, which in turn causes Arm B 43 to further retract inward toward the right while Arm A 41 still remains essentially fixed in the retracted position.

The operation illustrated in FIGS. 5A-D, 6A-C, 7A-E and 8A-C enables but two motors (T1 and T2) to effectuate both substantially independent extension/retraction of each arm and rotation of the dual same side SCARA arms via the mechanical switch mechanism described herein. In comparison, standard dual same side SCARA arms require three (3) motors to effectuate the extension/retraction and rotation of the two arms. Hence, the mechanical switch mechanism disclosed herein allows for the elimination of one (1) motor and the corresponding cost savings and space reduction benefits.

Figure 9A:
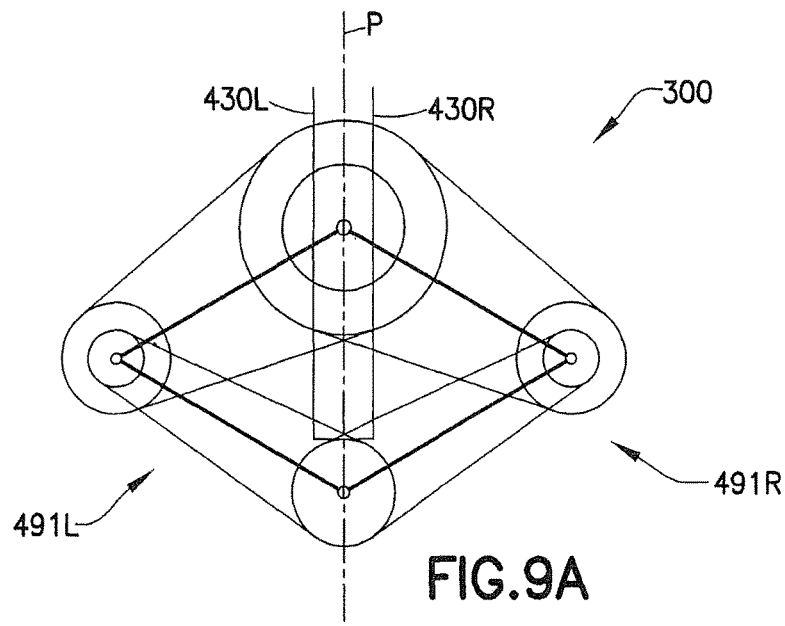
Figure 9B:
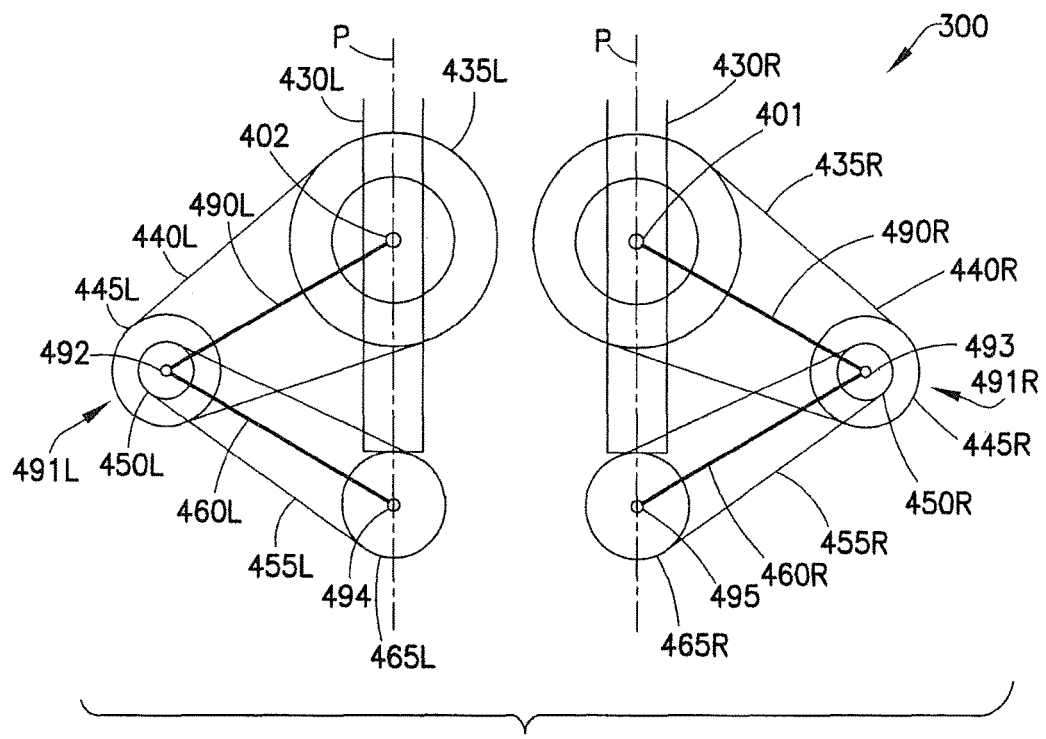

As may be realized, the end effector, forearms and upper arms are linked by a synchro system so that rotation of the upper arm about the revolute joint at the shoulder generate relative movement between upper arm and forearms and between forearms and end effector so that the arm extension retraction causes end effector travel along an axis of travel such as along axis P shown in FIG. 9A. FIGS. 9A-C illustrate an exemplary synchro system for the dual same side SCARA arms or arm assemblies in three different extensional positions in accordance with an exemplary embodiment that will be described below. The substrate transport apparatus 300 may include a drive section (T1 and T2 motors not shown), a coupling system between the drive section, and arms or arm assemblies 491L, 491R. In this example, the substrate transport 300 is shown having two SCARA arm assemblies, but in alternate embodiments the substrate transport may have any suitable configuration with any suitable number and/or configuration of arm assemblies. The drive section and coupling system, as previously described in FIGS. 3-8 includes or defines what is referred to here as a mechanical switch mechanism that enables two drive motors (T1 and T2) of the drive section to effect extension/retraction and rotation of more than one SCARA arm substantially independent of each other. The T1 and T2 motors may be constructed from two stacked rings (rotors) coupled with stator windings integrated in the transport chambers walls, possibly external to the vacuum, which may allow mounting of the vacuum system components to the bottom of the transport chamber. In addition, positioning of the upper arm shoulder off center of the transport chamber provides SEMI reach with significantly smaller arms than with respect to prior art SCARA arm design.

Referring again to FIGS. 9A-C, in the exemplary embodiment the arms 491L, 491R are substantially similar to arms A, B 41, 43 of the transport apparatus 300 and include an upper arm member 490L, 490R, a forearm member 460L, 460R and an end effector 430L, 430R connected to each other through respective revolute joints 492, 493, 494, 495. In alternate embodiments, the arms may have more or fewer articulations. In the exemplary embodiment the upper arms 490L, 490R pivot about revolute joints 402, 401 (e.g. shoulder joint 24, see FIG. 4A-4D). The proximate ends of the upper arms 490L, 490R are pivotally joined to the links 422L, 422R of the coupling system through revolute joints 404, 406 as previously described. The distal ends of the upper arms 490L, 490R may for example be pivotally joined to respective proximate ends of the forearms 460L, 460R at revolute joints 492, 493. In the exemplary embodiment, the distal ends of the forearms 460L, 460R may be pivotally joined to the end effectors 460L, 460R at revolute joints 494, 495. The end effectors 460L, 460R may have a longitudinal axis running from the front of the end effector to the back of the end effector. The longitudinal axis of the end effectors may be aligned with a path of extension and retraction P of the arms as previously described in FIGS. 3-8. In alternate embodiments, the arms may have any desired configuration relative to the axis of extension/retraction P.

In this exemplary embodiment the links 48A, 48B (See FIGS. 3-8) of the coupling system may be incorporated into or are part of the upper arms 490L, 490R respectively so that links 423L, 423R form a portion or extension of their respective arm as previously described. In alternate embodiments, the arms may be configured to include the upper arm portions 423L, 423R in any suitable manner. As also noted before, the revolute joints 402, 401 (mounted to motor T2) may be the pivot points of the upper arms 490L, 490R respectively. In other alternate embodiments, the upper arm portions 423L, 423R may be connected to a pulley or disk that is mounted to the upper arm so that as the respective disk rotates around point 402 or 401 thereby rotating a respective upper arm 491L, 491R. In still other alternate embodiments, the upper arm portions may depend from any portion of the arm for imparting torque to the upper arm. As may be realized, the relationship or orientation of the upper arm portions 423L, 423R to the rest of the upper arm as shown in FIGS. 9A-C is merely exemplary and the upper arm portions 423L, 423R may have any suitable relationship/orientation to the upper arm.

In the exemplary embodiment shown, the arms 491L, 491R may also include a belt and pulley system for driving the forearm. For example, pulleys 435L, 435R may be coupled to a (stationary) fixture or hub at joints 402, 401 (for example fixed to post 24; see FIG. 4D) so that as the upper arms rotate, their respective pulleys 435L, 435R remain stationary relative to the apparatus frame (e.g. upper arm motion effects relative movement between upper arm and corresponding pulley). A second (idler) pulley 445L, 445R may be coupled to the forearms 460L, 460R about joints 492, 493. The pulleys 435L, 445L and 435R, 445R may be connected by any suitable belt or bands 440L, 440R so that as the upper arms rotate 490L, 490R, relative motion with pulleys 435L, 435R causes the pulleys 445L, 445R to be drivingly rotated via the belts. In alternate embodiments, the pulleys may be connected by one or more metal bands that may be pinned or otherwise fixed to the pulleys. In other alternate embodiments, any suitable flexible band may connect the pulleys. In still other alternate embodiments, the pulleys may be connected in any suitable manner or any other suitable transmission system may be used. The pulleys 435L, 435R, 445L, 445R may be configured so that the movement of the arm members is constrained so that rotation of the upper arms 490L, 490R about joints 402, 401 produces desired rotation of a respective one of the forearms 460L, 460R in the opposite direction. For example, to achieve this rotational relationship the ratio of the radii for pulleys 450L, 450R to pulleys 445L, 445R may be a 2:1 ratio.

In the exemplary embodiment, a second belt and pulley arrangement including pulleys 450L, 450R, 465L, 465R and belts 455L, 455R may be provided to drive the end effectors 430L, 430R so that the radial orientation or longitudinal axis of the end effectors 430L, 430R along the common path of travel P is maintained as the arms 491L, 491R are extended and retracted. The pulleys 450L, 450R may be coupled to their respective upper arm 490L, 490R about joints 492, 493 and the pulleys 465L, 465R may be coupled to their respective end effectors 430L, 430R about joints 494, 495. In this example the ratio of pulleys 450L, 450R to pulleys 465L, 465R may be a 1:2 ratio. As can be seen in FIGS. 9A-C, pulleys 450L, 450R in the exemplary embodiment are mounted in line with a respective one of the pulleys 445L, 445R about joints 492, 493 so that when the pulleys 445L, 445R are rotated with the forearms 460L, 460R the pulleys 450L, 450R remain stationary with respect to their respective upper arms 490L, 490R. Any suitable belt 455L, 455R may connect a respective pair of the pulleys so that as the forearms 460L, 460R are rotated the pulleys 465L, 465R are drivingly rotated. In alternate embodiments, the pulleys may be connected by one or more metal bands that may be pinned or otherwise fixed to the pulleys. In other alternate embodiments, any suitable flexible band may connect the pulleys. In still other alternate embodiments, the pulleys may be connected in any suitable manner.

The end effectors 430L, 430R may be coupled to a respective forearm at revolute joint 494, 495. The end effectors 430L, 430R may be drivingly coupled to a respective one of the pulleys 465L, 465R so that as the arms are extended or retracted the end effectors 430L, 430R stay longitudinally aligned with the common path of travel P as can be seen in FIGS. 9B, 9C. It may be realized that the belt and pulley systems described herein may be housed within the arm assemblies 491L, 491R so that any particles generated may be contained within the arm assemblies. A suitable ventilation/vacuum system may also be employed within the arm assemblies to further prevent particles from contaminating the substrates. In alternate embodiments, the synchronization systems may be located outside of the arm assemblies. In other alternate embodiments, the synchronization systems may be in any suitable location.

Still referring to FIGS. 9A-C the operation of the substrate transport apparatus 300 is as was previously described in FIGS. 3-8 utilizing the mechanical switch mechanism disclosed herein. As can be seen in FIG. 9A, the substrate transport 300 is at its initial or neutral position with both arms 491L, 491R in a retracted position. The coupling system and a portion of the arms may be located within a housing suitably configured to prevent particles generated by moving parts of the substrate transport from contaminating the substrates. For example slots may be provided in the housing for the arms to pass where any openings between the slots and the arms are sealed with a flexible seal. In alternate embodiments, the housing may have any suitable configuration to prevent substrate contamination from particulates that may be generated from moving parts of the transport. In other alternate embodiments, the coupling system may not be within a housing. In FIG. 9B, arm 491L is in the extended position while arm 491R is in its retracted position. In FIG. 9C, arm 491R is in the extended position while arm 491L is in its retracted position. The extension and retraction of arms 491L, 491R are effectuated using the drive and mechanical switch coupling system previously described in FIGS. 3-8.

Referring now to FIGS. 9C-D, rotation of the upper arm 490L causes stationary pulley 435L to drive pulley 445L via belt 440L so that as the arm is extended the forearm 430L is rotated by substantially an equal amount in the opposite direction about revolute joint 492. Rotation of the forearm 490L in turn causes pulley 450L to drive pulley 465L via belt 455L so that the end effector rotates about point 494. Rotation of the end effector about point 494 is such that the radial orientation or longitudinal axis of the end effector 430L is maintained along the common path of travel P as the arm 491L is extended and retracted. Thus, as described above with respect to FIGS. 9A-C, the rotation of the forearm 430L is slaved to the rotation of the upper arm 490L about point 492 and the rotation of the end effector 430L is slaved to the rotation of the forearm 460L about point 494. As a result the arm 491L is extended radially while the arm 491R remains substantially stationary in its retracted position. Retraction of the arm 491L occurs in a substantially opposite manner.

Rotation of the upper arm 490R causes stationary pulley 435R to drive pulley 445R via belt 440R so that as the arm is extended the forearm 460R is rotated an equal amount in the opposite direction about revolute joint 493. Rotation of the forearm 460R in turn causes pulley 450R to drive pulley 465R via belt 455R so that the end effector 430R rotates about point 495. Rotation of the end effector 430R about point 495 is such that the radial orientation or longitudinal axis of the end effector 430R is maintained along the common path of travel P as the arm 491R is extended and retracted. Thus, as described above with respect to arm 491L, the rotation of the forearm 460R is slaved to the rotation of the upper arm 490R about point 493 and the rotation of the end effector 430R is slaved to the rotation of the forearm 460R about point 495. As a result the arm 491R is extended radially while the arm 491L remains substantially stationary in its retracted position. Retraction of the arm 491R occurs in a substantially opposite manner.

As may be realized, in the exemplary embodiment the end effectors 430L, 430R may travel along a common path of travel P, the end effectors may be configured in such a way so as to be in different planes along the path of travel P. In alternate embodiments, the arms 491L, 491R may be configured to be at different heights so that the end effectors can travel along the common path P. In other alternate embodiments, the transport may have any suitable configuration for allowing multiple end effectors to travel along a common path of travel. In yet other alternate embodiments, the end effectors may travel along different paths that may be generally parallel or angled relative to each other. The paths may be located in the same plane. The illustrated motions of the linkages of the coupling system are merely exemplary and in alternate embodiments the linkages may be arranged to provide and undergo any desired range of motion switching from driving the arms independently of each other.

In accordance with another exemplary embodiment, the substrate transport apparatus, with dual same side SCARA arms and the mechanical switch mechanism, may be powered from a drive section with a coaxial drive shaft assembly. For example, as can be seen in FIG. 4E, the drive system 100 may have coaxial inner and outer drive shafts 101, 102 driven by motors 104, 103 respectively. The motors 103, 104 may each have a rotor 103R, 104R attached to their respective drive shaft 102, 101 and a stator 103S, 104S for driving the rotor, the stator 103S, 104S being stationarily connected to a housing 100H of the drive system 100. In alternate embodiments the drive system may not be coaxial. It is noted that the housing 100H of the drive system 100 may be coupled to chamber 30 (FIG. 4A) so that at least part of the drive system housing 100H forms part of the interior of the chamber 30. In one embodiment, the rotors 103R, 104R may be located within the atmosphere of the chamber 30 while the stators 103S, 104S are suitably isolated from the chamber atmosphere. Suitable examples of the coaxial drive 100 may be substantially similar to that described in U.S. Pat. Nos. 5,720,590, 5,899,658, 5,813,823, and 6,485,250 and/or Patent Publication Number 2003/0223853, which are incorporated herein by reference in their entirety. In alternate embodiments, any suitable drive section may be employed such as for example a non-coaxial drive assembly or a magnetic drive assembly.

The drive section may be housed within a housing of the substrate transport to prevent contamination or damage to the substrates from any particles that may been generated from the moving parts of the drive section. In this example, as noted above, the coaxial drive assembly may have an inner and outer drive shaft 101, 102. The outer drive shaft 102 may be connected to a housing of the substrate transport so that when the outer drive shaft 102 is rotated the arms 491L, 491R of the substrate transport apparatus are rotated about an axis of rotation of the outer drive shaft 102. The inner drive shaft 101 may be connected to the coupling system at rotation point 42 so that when the inner drive shaft 101 is rotated the coupling system will rotate or pivot about an axis of rotation (i.e. rotation point 42) of the inner drive shaft 101. In the exemplary embodiment, the outer drive shaft 102 may be connected to the motor rotor (generally analogous to the T1 motor powering arm extension/retraction) of the substrate transport apparatus so that when the outer drive shaft is rotated the dual arms may be independently extended/retracted in a similar manner to that previously described and shown in FIGS. 3-8. As may be realized the inner drive shaft 101 of the coaxial drive assembly may also rotate in the same direction and at substantially the same speed as the outer drive shaft to keep the arms of the transport apparatus from extending or retracting as the arms of the substrate transport apparatus are rotated substantially as a unit. The inner drive shaft 101 may be connected to a hub assembly (somewhat analogous to motor T2) via a coupling system at rotation point 42 so that when the inner drive shaft 101 is rotated the coupling system will rotate or pivot about an axis of rotation (i.e. rotation point 42) of the inner drive shaft.

Referring now to FIGS. 10A-B, a substrate transport apparatus 310 with dual same side SCARA arms incorporating the mechanical switch mechanism with a coaxial drive assembly is depicted. In FIG. 10A, the transport apparatus with a coaxial drive assembly including Arms A 141 and Arm B 143 are located within a transport chamber 130. In FIG. 10B, the dual same side SCARA arms are indicated as Arm A 141 and Arm B (only a portion of which is shown for clarity) with the transport chamber (also not shown). The arms and transport chamber are substantially similar to arms A, B in transport chamber 30 described previously. Similar features are similarly numbered. The substrate for the transport 310 is not shown, but would be positioned on an end effector 132. In this example the end effector 132 is shown as having a forked shape but in alternate embodiments the end effector may be of an alternative shape including, but not limited to, paddle shaped. The end effector 132 is pivotally connected to a wrist or pivot joint 134, which in turn is connected to a forearm 136 for each Arm A 141 and B 143. The forearm 136 is pivotally connected to an elbow or pivot joint 138, which in turn is connected to an upper arm 140 for each of Arm A 141 and Arm B 143. The upper arm 140 for Arm A 141 and B 143 are in turn mounted to a common base or mounting plate 142 for the T1 and T2 motors 150, 144 via their respective arm shoulder joints 146. The center of the coaxial drive assembly for the T1 and T2 motors is also the center of the common base or mounting plate 142. In this embodiment, an extension arm 147 extends radially outward from the coaxial drive shaft for T1 motor 150. In addition, a crank link 148 connects the arm shoulder joints 146 for each of Arm A 141 and B 143 to a revolute joint 152 on the extension arm 147 or motor T1. As depicted in FIGS. 10A-B, in the exemplary embodiment the two crank links 148 may share a common pivot point 152 offset from the center of the coaxial drive assembly 142 though in alternate embodiments the links may be joined to motor T1 at offset revolute joints.

Referring again to FIGS. 10A-B, in order to effectuate extension of Arm A 141 or Arm B 143 for pick and place of a substrate S on the end effector 132, the T1 motor 150 is rotated while the T2 motor 144 is stationery. When the T1 motor is rotated in one direction, one arm extends or retracts while the second arm practically does not move in a similar manner to that previously described in FIGS. 3A-B. FIG. 10A depicts Arm A 141 in an extended position for example beyond the confines of the transport chamber 130 while Arm B may be retracted within the transport chamber 130. This movement of Arm A 141 allows for a substrate S to be picked up and placed in a storage chamber or processing station. In order to effectuate pure rotation of the arms, both the T2 motor 144 and the T1 motor 150 are rotated to the same degree. This maintains the crank links 148 for Arm A 141 and Arm B stationary relative to one another so as to not exert a torque on one of the two arms to effectuate extension or retraction. In this embodiment including a coaxial drive assembly, T1 and the arm shoulder joints 146 rotate about a common axis of rotation.

Figure 11A:
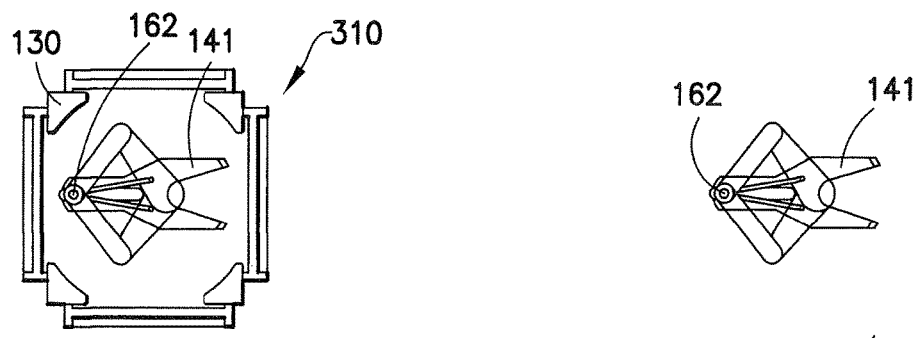
FIGS. 11A-D illustrate schematic views of the substrate transport apparatus in FIGS. 10A-10B showing the two arms of the apparatus in four different extensional positions respectively.
Figure 11B:
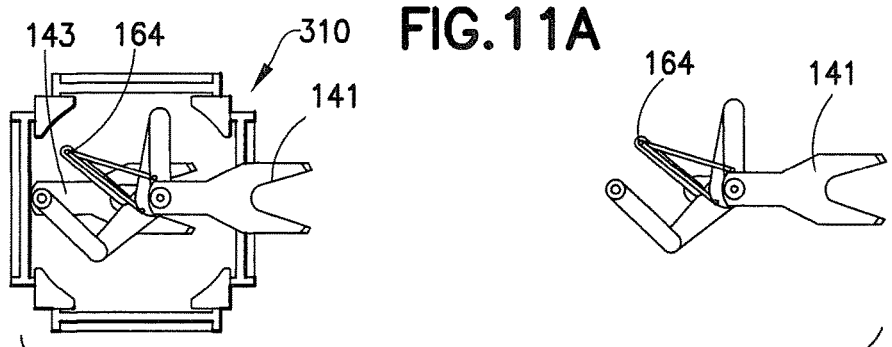
Figure 11C:
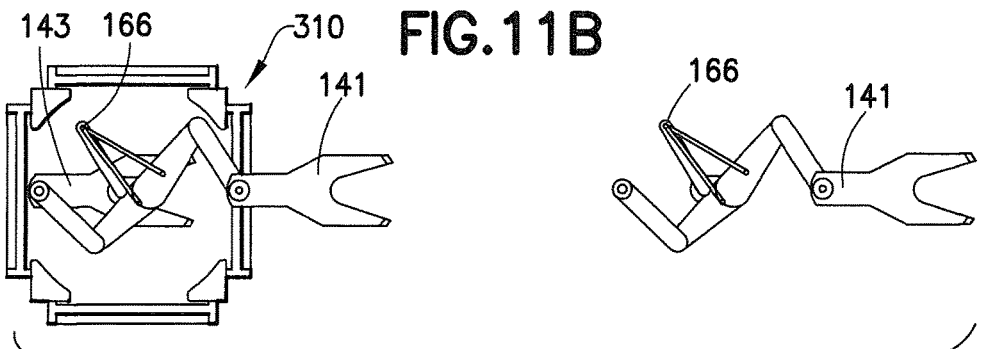
Figure 11D:
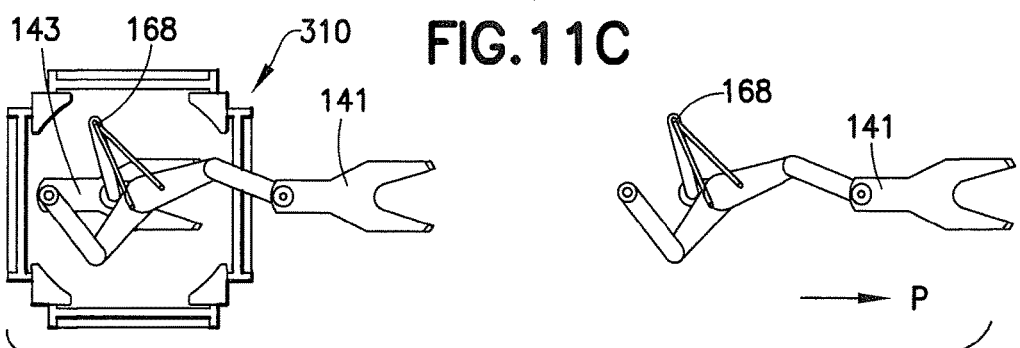

Referring now to FIGS. 11A-D, the extensional movement of Arm A 141 is depicted in four different extensional positions for the substrate transport apparatus 310 with dual same side SCARA arms incorporating the mechanical switch mechanism with a coaxial drive assembly disclosed herein. In FIG. 11A, the two crank links 148 and extension arm 147 connecting the arm shoulder joints 146 on the T2 motor mounting plate 144 to the T1 motor 150 converge at point A 162 along the circumference of T1 150. As T1 150 is rotated in the clockwise direction, the crank links 148 and extension arm 147 also rotate along the circumference of T1 to point B 164 in FIG. 11B, which in turn causes Arm A 141 to extend outward toward the right (P direction) while Arm B 143 remains essentially fixed in the retracted position. As T1 150 is further rotated in the clockwise direction, the crank links 148 and extension arm 147 further rotate along the circumference of T1 150 to point C 166 in FIG. 11C, which in turn causes Arm A 141 to further extend outward toward the right while Arm B 143 still remains essentially fixed in the retracted position. As T1 150 is further rotated in the clockwise direction, the crank links 148 and extension arm 147 further rotate along the circumference of T1 to point D 168 in FIG. 11D, which in turn causes Arm A 141 to further extend outward toward the right while Arm B 143 still remains essentially fixed in the retracted position. To retract Arm A 141, the direction of T1 150 is reversed along points C 166, B 164, and A 162. In an alternative embodiment, the two crank links 148 for the two arms 141, 143 need not converge on the same point of the extension arm 147 to T1 150.

In accordance with another exemplary embodiment of the substrate transport apparatus disclosed herein, a bisymmetric SCARA arm drive arrangement as can be seen in FIGS. 12A-12B and 13A-13C may be utilized in place of a dual same side SCARA arm drive arrangement as was previously described in FIGS. 3-11. In a bisymmetric SCARA arm drive arrangement, two or more arms of the substrate transport apparatus may be arranged and/or oriented in different or opposite directions relative to each other. The substrate transport apparatus with a bisymmetric SCARA arm design utilizing a mechanical switch mechanism similar to that previously described allows for arm A and arm B to be positioned in the same plane and to correspondingly have a smaller envelope of motion. In turn, this may allow for the minimization of transport chamber volume, which in turn may decrease the possibility of substrate cross-contamination. Similar to the embodiments previously described for dual same side arms, with a bisymmetric arm arrangement utilizing the mechanical switch mechanism, independent extension/retraction and rotation of arm A and arm B may be effectuated with as few as two motors (T1 and T2). The T1 and T2 motors may again be constructed from two stacked rings (rotors) coupled with stator windings integrated in the transport chambers walls, possibly external to the vacuum, which may allow mounting of the vacuum system components to the bottom of the transport chamber. In addition, positioning of the upper arm shoulder off center of the transport chamber provides SEMI reach with significantly smaller arms than with respect to prior art SCARA arm design.

Referring again to FIGS. 12A-B, there is shown respectively a schematic plan view of transport apparatus 320 having what may be referred to for example purposes only as a bisymmetric SCARA arm arrangement and a mechanical switch mechanism for substantially independent arm motion and a graph plotting the respective arm motions relating to motor displacement. The mechanical switch mechanism may be generally similar to that described previously, and may include two or more links 247, 248 respectively connected by revolute joints on corresponding arm sections (e.g. upper arms of the SCARA arms). In the exemplary embodiment, each motor, such as T1 motor 250 and T2 motor 244, has a link 247, 248 pivotally connected thereto (e.g. link 248 to T1 motor and link 247 to T2 motor).

In the exemplary embodiment shown, one crank link 247 connects the Arm B 241 elbow joint 238 to T2 244. The other crank link 248 connects the Arm A 244 elbow joint 238 to T1 250. T1 and T2 250, 244 may be motors substantially similar to that described before shown in FIG. 4D. In the exemplary embodiment, each SCARA arm is joined, via a corresponding revolute joint 246A, 246B at for example the shoulder joint to a respective rotor of the T1, T2 motors. As seen best in FIG. 12A, in the exemplary embodiment, revolute joint 246A (of arm A) is fixed to the T2 motor rotor, and the link 248 joined at one end to upper arm 240A (of arm A) is joined to the T1 motor rotor. Conversely, the shoulder joint 246B of arm B is fixed to the T1 motor rotor, and the link 247 is pinned at the T2 motor rotor.

Figure 12A:
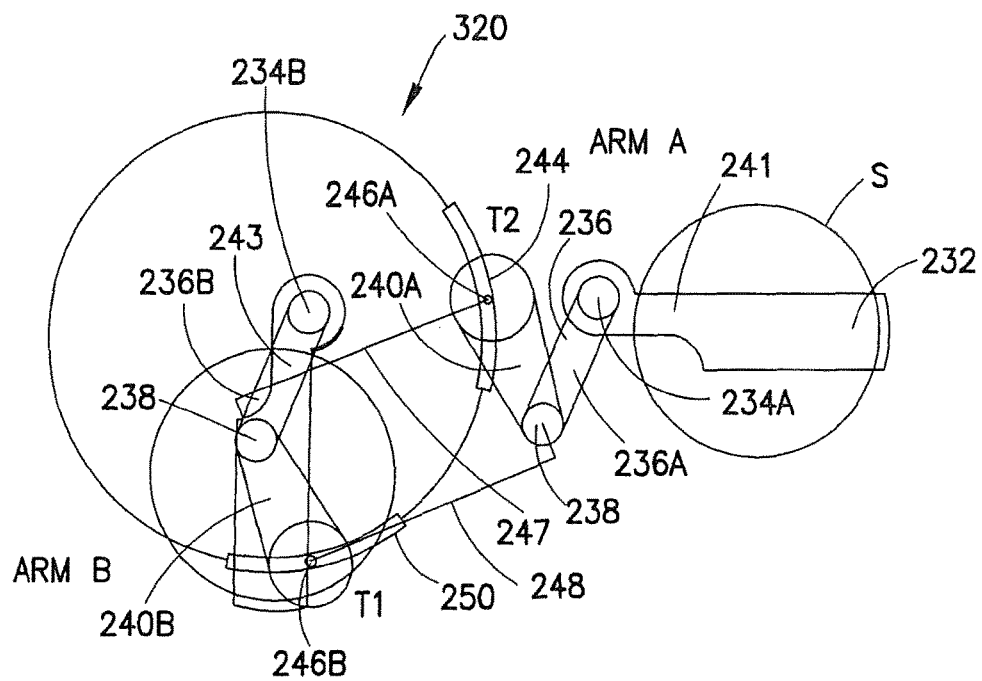
FIGS. 12A-B are respectively a schematic view of another portion of a transport apparatus in accordance with another exemplary embodiment, and a graph illustrating motion of the transport apparatus.

In the exemplary embodiment shown in FIG. 12A, the dual bisymmetric SCARA arms are indicated as Arm A 241 and Arm B 243 with the transport chamber not shown. The substrate for the transport 320 is indicated by S and is positioned on end effector 232. The end effector may be of any suitable shape including, but not limited to, fork and paddle shaped. The end effector 232 A, B is pivotally connected to a wrist joint 234 A, B, which in turn is connected to a forearm 236 A, B for each Arm A 241 and B 243. The forearm 236 is pivotally connected to an elbow joint 238, which in turn is connected to an upper arm 240 for each of Arm A 241 and Arm B 243. As noted before, the upper arm(s) 240 A, B for Arm A 241 and B 243 are in turn respectively mounted to a corresponding rotor(s) 244, 250 for the T1, T2 motor(s) via respective arm shoulder joint(s) 246 A, B. As previously described, one crank link 247 connects the Arm B 243 elbow joint 238 to T2 244. The other crank link 248 connects the Arm A 241 elbow joint 238 to T1 250.

In order to effectuate extension of Arm A 241 or Arm B 243 for pick and place of a substrate S on the end effector 232, the T1 motor 250 is rotated while the T2 motor 244 is stationery. Utilizing this type of switch type mechanism, by way of example when T1 250 rotates in one direction and when T2 244 is stationary, it effectuates extension and retraction of one arm. More particularly, when either the T1 or T2 motors are rotated causing relative movement between T2 and T1 motors in one direction, one arm extends or retracts while the second arm practically does not move due to the mechanical switch mechanism. When the relative movement of T2 244 and T1 250 motor is in the opposite direction, it effectuates extension of the other arm positioned opposite to the first arm. More particularly, when the T2 motor is rotated in the opposite direction, the second arm extends or retracts while the first arm practically does not move due to the principle of operation of the mechanical switch mechanism. In the embodiment shown, the respective revolute joints (e.g. shoulder joint 246 A, B and link pivots) on the corresponding rotors 250, 244 are depicted as being substantially coaxial for example purposes only, and in alternate embodiments the shoulder joint and link pivots on each rotor may be offset from each other. In order to effectuate rotation of the arms 241, 243 substantially as a unit, both the T2 motor 244 and the T1 motor 250 are rotated to the same degree.

Figure 12B:
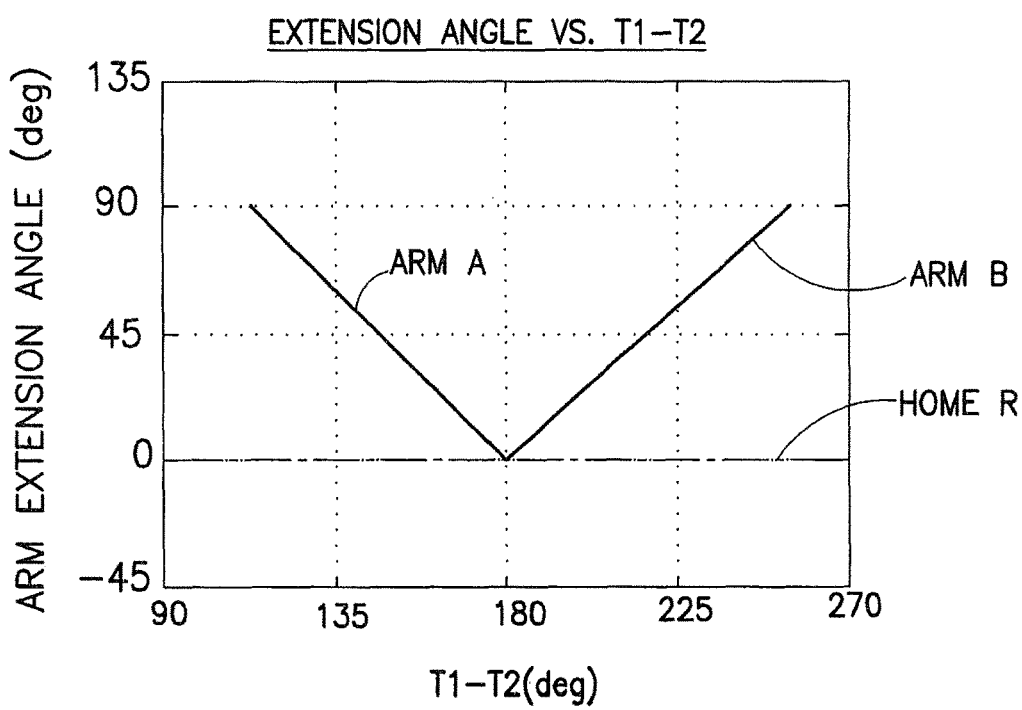

Referring to FIG. 12B, the principle of operation of the mechanical switch mechanism is depicted graphically, which plots the extension angle of Arms A and B versus the difference in rotation angle between T1 and T2. There is a linear relationship between arm extension angle and the difference between T1 and T2 for the arm that extends/retracts. While one arm extends/retracts, the other arm practically does not extend/retract. Again with the mechanical switch mechanism used with dual bisymmetric SCARA arms, the two crank links 247, 248 are attached opposite of the axis of symmetry so when T1 rotates in one direction, one arm physically locks and the other arm is free to rotate with T1. Correspondingly, when T1 rotates in the opposite direction, the previously locked arm releases and is free to rotate with T1 while the previously free arm physically locks. This allows for independent extension of the two arms depending on the direction and degree of rotation of T1. In addition, when both T1 and T2 rotate together, the two arms rotate as opposed to extend.

Figure 13A:
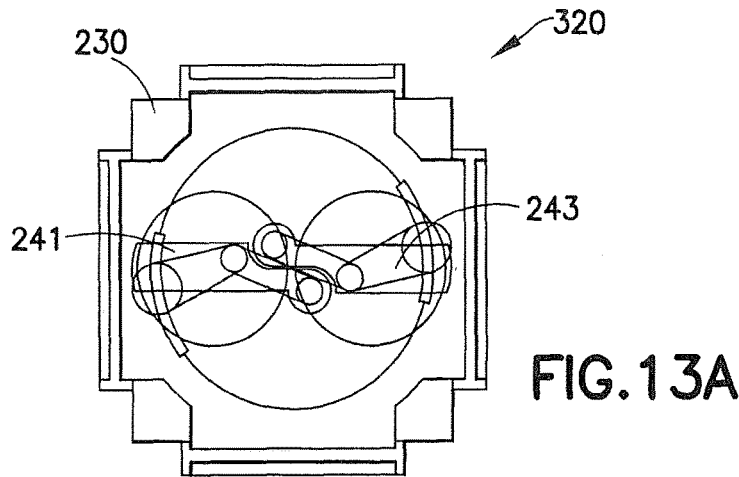
FIGS. 13A-C illustrate schematic views of the transport chamber module and substrate transport apparatus of FIGS. 12A-B.
Figure 13B:
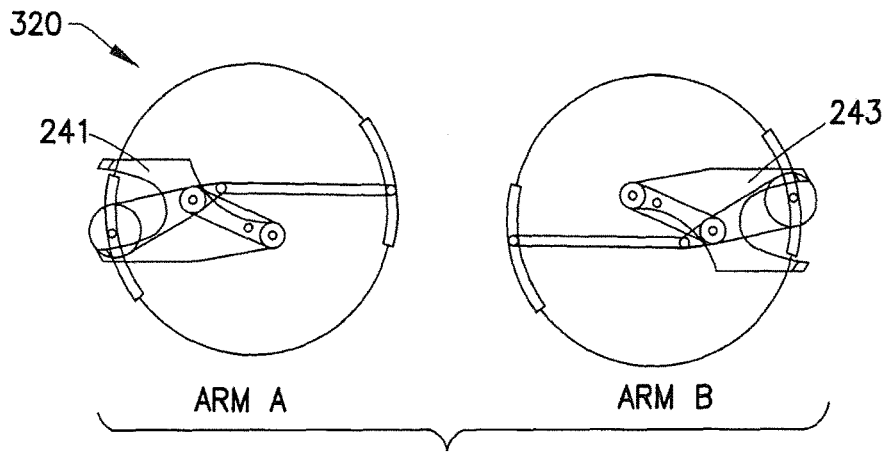
Figure 13C:
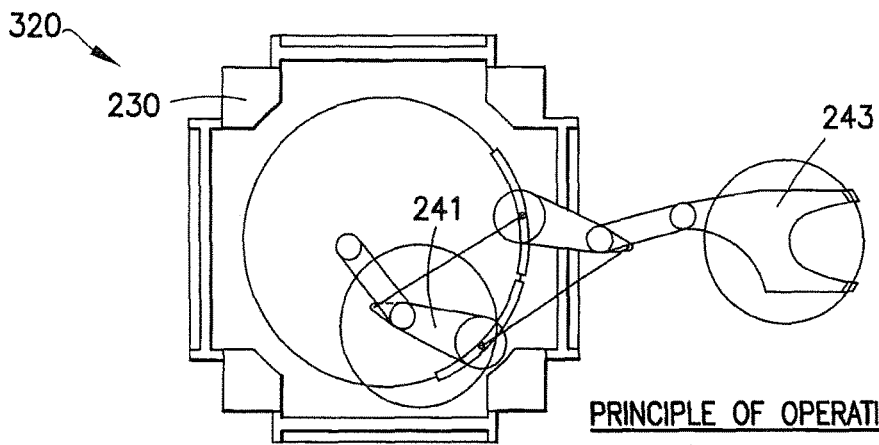

Referring now also to FIG. 13A-C, the substrate transport apparatus 320 with dual bisymmetric SCARA arms incorporating the mechanical switch mechanism of FIGS. 12A-B is depicted. In FIGS. 13A and C, the transport apparatus including Arms A and B is located within a transport chamber 230. In FIG. 13B, the dual bisymmetric SCARA arms are indicated as Arm A 241 and Arm B 243 with the transport chamber not shown.

Figure 14A:
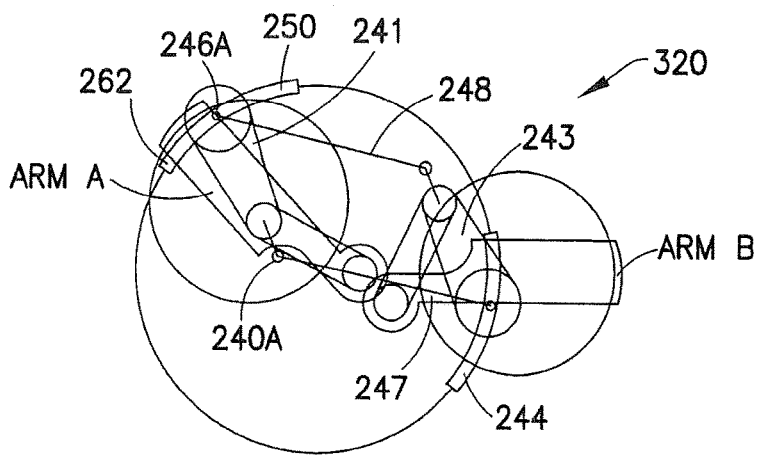
FIGS. 14A-C illustrate schematic views of the substrate transport apparatus shown in three different extensional positions respectively.
Figure 14B:
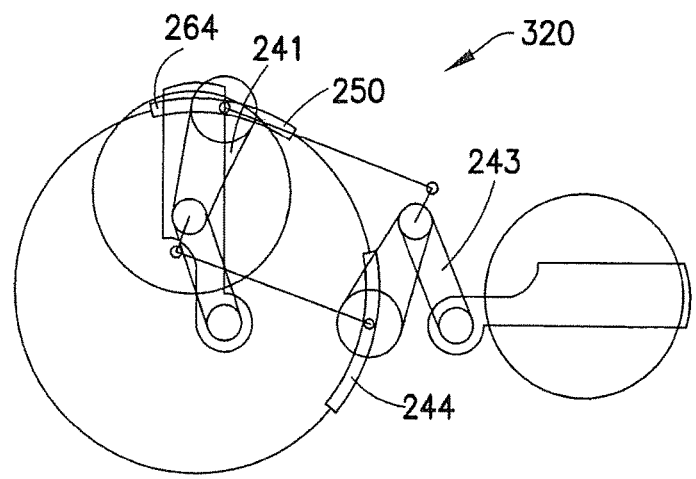
Figure 14C:
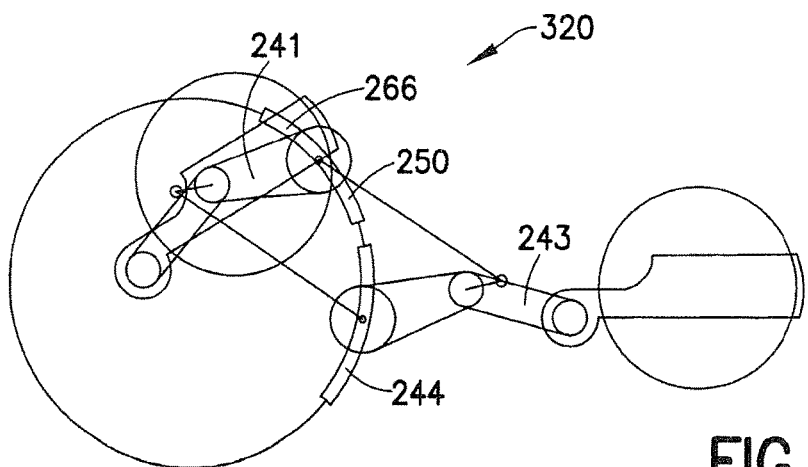

Referring now to FIGS. 14A-C, the extensional movement of Arm B 243 is depicted in three different extensional positions for the substrate transport apparatus 320 with dual bisymmetric SCARA arms incorporating the mechanical switch mechanism disclosed herein. In FIG. 14A, arm B 243 is shown slightly extended while arm A 241 is shown fully retracted with the crank link 248 effectuating arm B 243 movement at point A 262 along T1 250. As depicted in FIG. 14 B, as T1 250 is rotated in the clockwise direction (relative to T2 motor rotor 244), the crank link 248 connected to the T1 rotor 250 moves with the circumference of the T1 rotor 250, which in turn causes Arm B 243 to extend outward toward the right while Arm A 241 remains essentially in the retracted position (but may be rotated as shown with rotation of rotor 250). Correspondingly, the crank link 247 (for effectuating arm A 241 movement) is released at revolute joint 240 A causing no rotational motion of upper arm 240A about shoulder joint 246A. As depicted in FIG. 14 C, as T1 250 is further rotated in the clockwise direction, the crank link, 248 connected to the T1 rotor 250 further moves along with T1 250, which in turn causes Arm B 243 to further extend outward toward the right while Arm A 241 still remains essentially fixed in the retracted position. Correspondingly, the crank link 248 effectuating arm B 243 movement moves from point B 264 to point C 266 along T1 250. To retract Arm B 243, the direction of T1 250 is reversed along points C 266, B 264, and A 262.

Figure 15A:
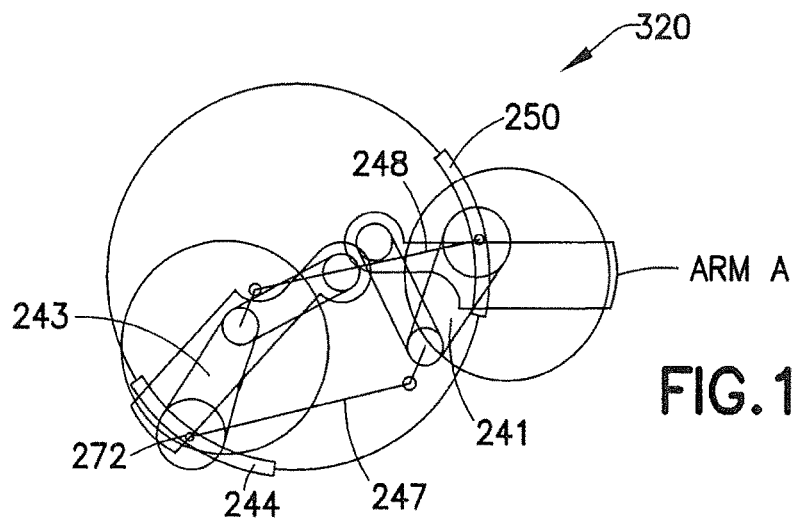
FIGS. 15A-C illustrate other schematic views of the substrate transport apparatus shown in another three different extensional positions respectively.
Figure 15B:
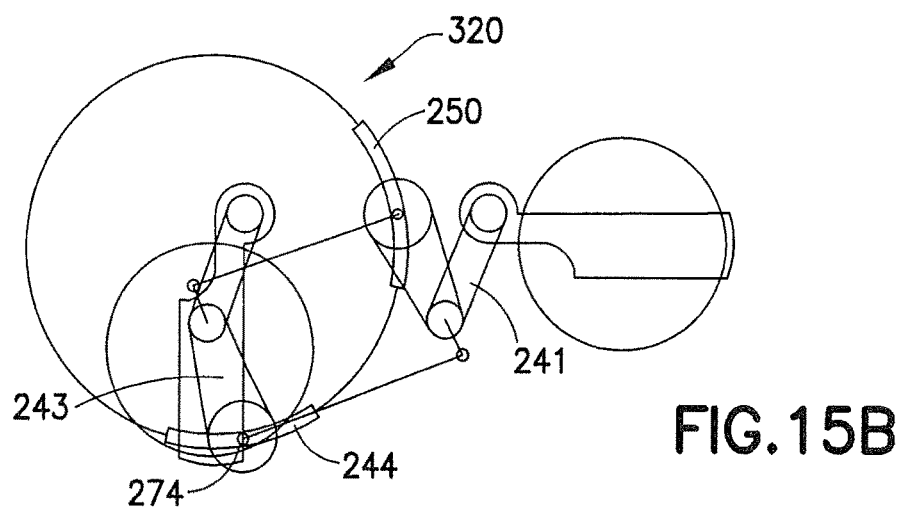
Figure 15C:
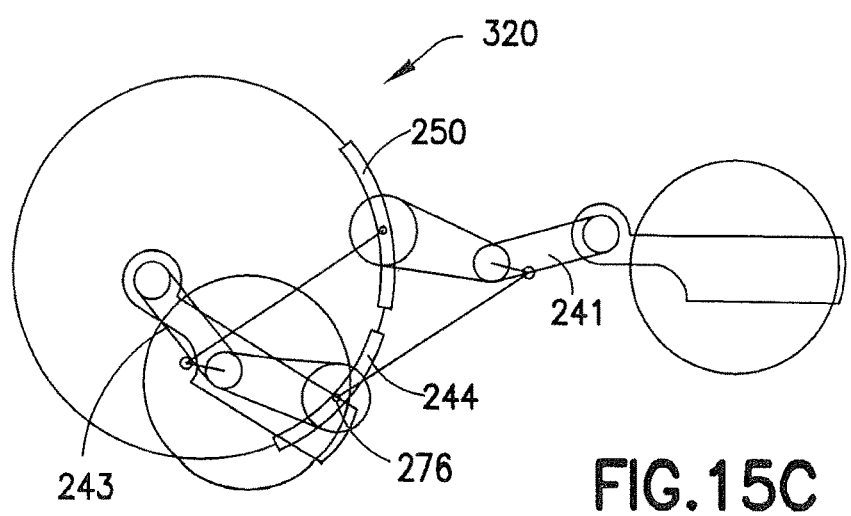

Referring to FIGS. 15A-C, the extensional movement of Arm A 241 is depicted in three different extensional positions for the substrate transport apparatus 320 with dual bisymmetric SCARA arms incorporating the mechanical switch mechanism disclosed herein. As may be realized, the transport apparatus shown in FIGS. 15A-15C may be rotated 180 degrees from the orientation of the apparatus illustrated in FIGS. 14A-14C (such as for example when effecting a swap from a substrate holding station). In FIG. 15A, arm A 241 is shown slightly extended while arm B 243 is shown fully retracted with the crank link 247 effectuating arm A 241 movement at point D 272 along T1 250. As depicted in FIG. 15 B, as the T2 rotor 244 is rotated relative to the T1 rotor 250 in the counterclockwise direction, the crank link 247, connected to the T2 rotor 244 also moves with the circumference of the T2 244 rotor, which in turn causes Arm A 241 to extend outward toward the right while Arm B 243 remains essentially fixed in the retracted position (the crank link 248 being released). Correspondingly, the crank link 247 effectuating arm A 241 movement moves from point D 272 to point E 274 along T2 244. As depicted in FIG. 15 C, as T2 244 is further rotated in the counterclockwise direction, the crank link 247 connected to the T2 rotor 244 further rotates along the circumference of T2 244, which in turn causes Arm A 241 to further extend outward toward the right while Arm B 243 still remains essentially fixed in the retracted position. Correspondingly, the crank link 247 effectuating arm A 241 movement moves from point E 274 to point F 276 along T2 244. To retract Arm A 241, the direction of T2 244 is reversed along points F 276, E 274, and D 272.

Figure 16A:
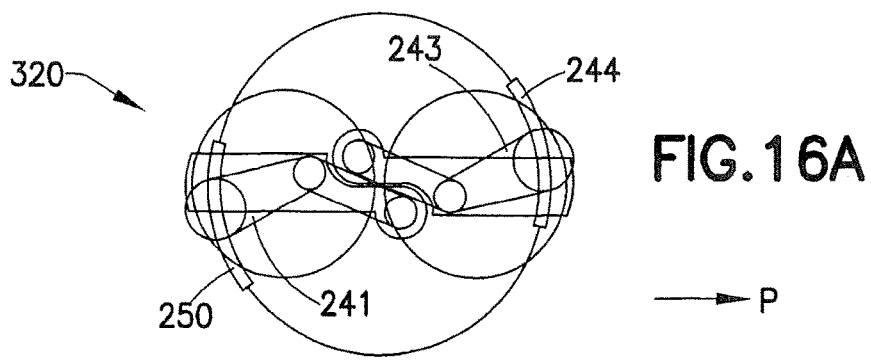
FIGS. 16A-D illustrate still other schematic views of the substrate transport apparatus shown in four other different positions respectively.
Figure 16B:
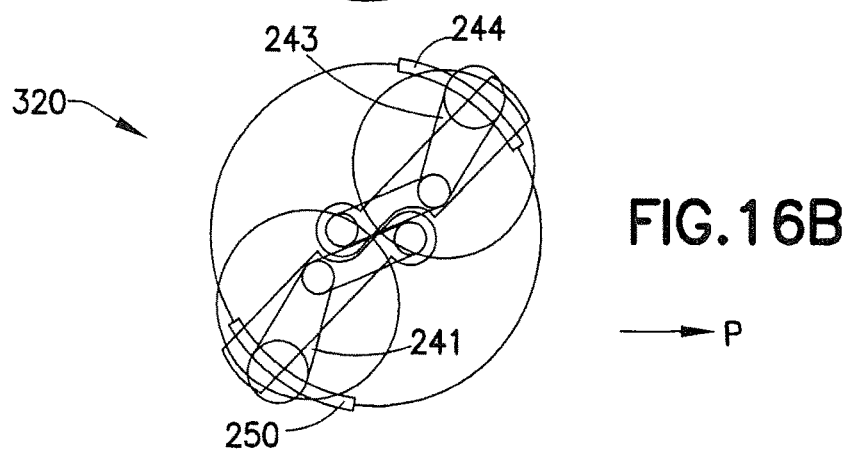
Figure 16C:
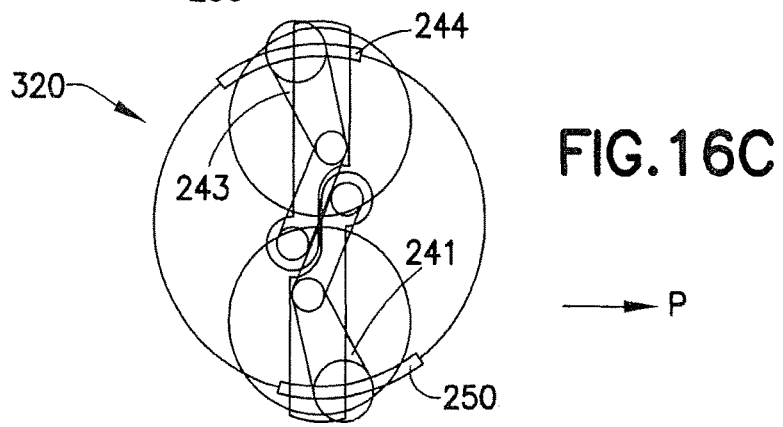
Figure 16D:
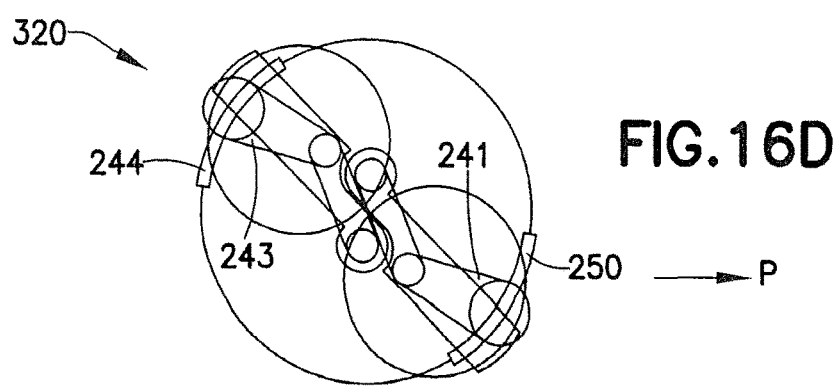

Referring to FIGS. 16A-D, the rotational movement of Arm A 241 and Arm B 243 are depicted in four different rotational positions for the substrate transport apparatus 320 with dual bisymmetric SCARA arms incorporating the mechanical switch mechanism disclosed herein. In FIG. 16A, the two arms 241, 243 are pointing in opposite directions along P. When both the T1 and T2 motors 250, 244 are rotated in the same direction (for example in the counterclockwise direction) in an equal amounts, Arms A and B, 241, 243 will correspondingly rotate in, for example (depending on which direction T1 and T2 are rotated), the counterclockwise direction along the continuum shown in FIGS. 16B, 16C, and 16D. In another example, where T1 and T2 are rotated in a clockwise direction in equal amounts, Arms A and B, 241, 243 will correspondingly rotate in, for example, the clockwise direction in a manner substantially opposite the counterclockwise rotation shown in FIGS. 16B, 16C, and 16D (i.e. the sequence of rotation would be from FIG. 16D to 16A rather than from 16A to 16D).

In another exemplary embodiment of the substrate transport apparatus with dual bisymmetric SCARA arms utilizing the mechanical switch mechanism disclosed herein, a coaxial drive shaft assembly may be used for coupling the T1 and T2 motors to the SCARA arms and mechanical switch. Hence in this embodiment, the center of rotation of T1 and T2 may be substantially the same. The coaxial drive may be substantially similar to that described above with respect to FIG. 4E. The outer drive shaft 102 may be connected to the T1 motor rotor of the substrate transport apparatus so that when the outer drive shaft 102 is rotated the dual arms may be independently extended/retracted based on the principle of operation of the mechanical switch previously described in FIGS. 12-16. As may be realized the inner drive shaft 101 of the coaxial drive may also rotate in the same direction and at the same speed as the outer drive shaft 102 to keep the arms of the transport apparatus from extending or retracting as the arms of the substrate transport apparatus are rotated. The inner drive shaft 101 is connected to the T2 hub assembly via a coupling system at rotation point 242 so that when the inner drive shaft 101 is rotated the coupling system will rotate or pivot about an axis of rotation (i.e. rotation point 242) of the inner drive shaft 101 to effectuate rotation of T2.

Figure 17A:
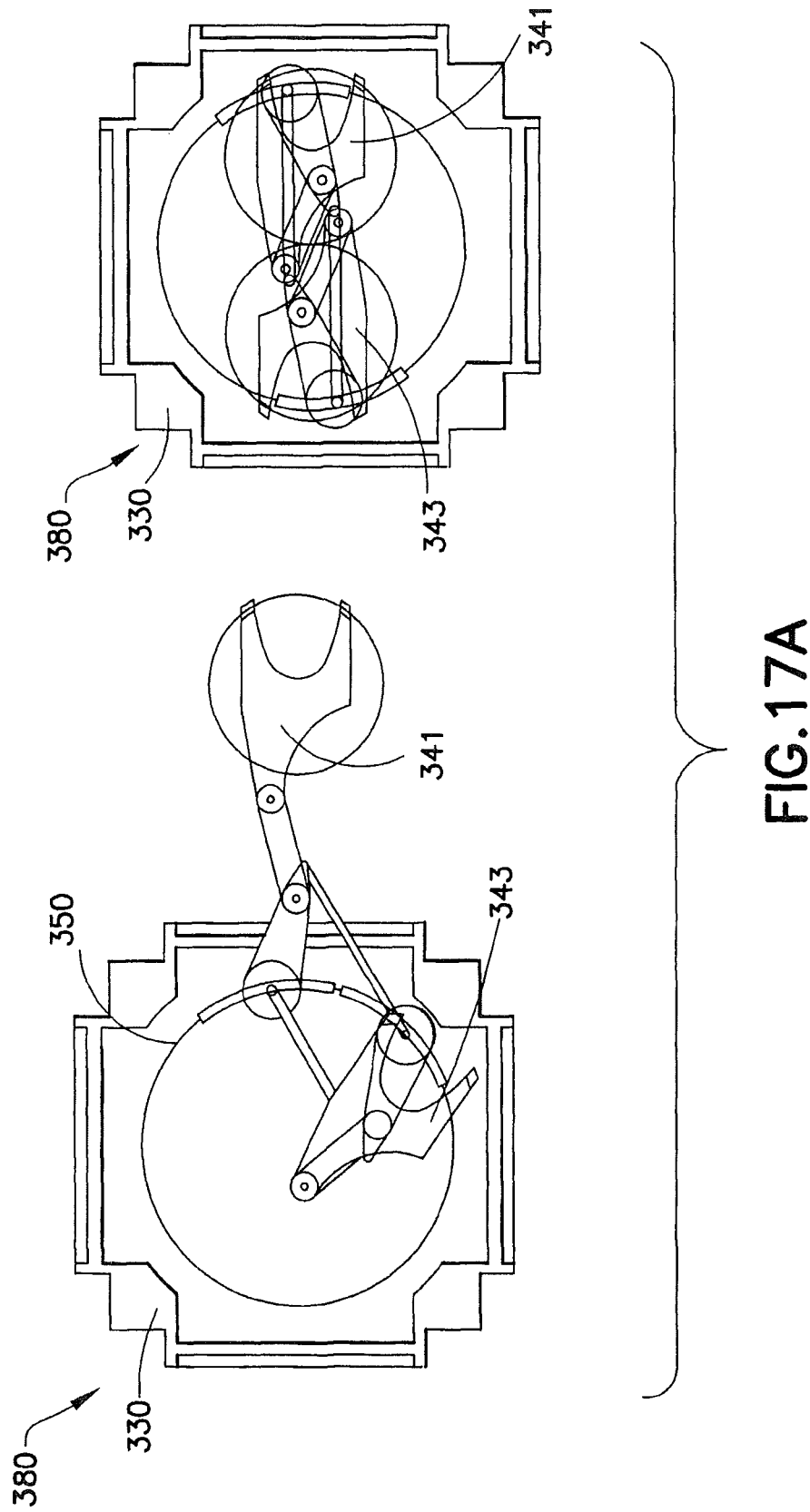
FIGS. 17A-C illustrate yet other schematic views of the transport chamber module and substrate transport apparatus.
Figure 17B:
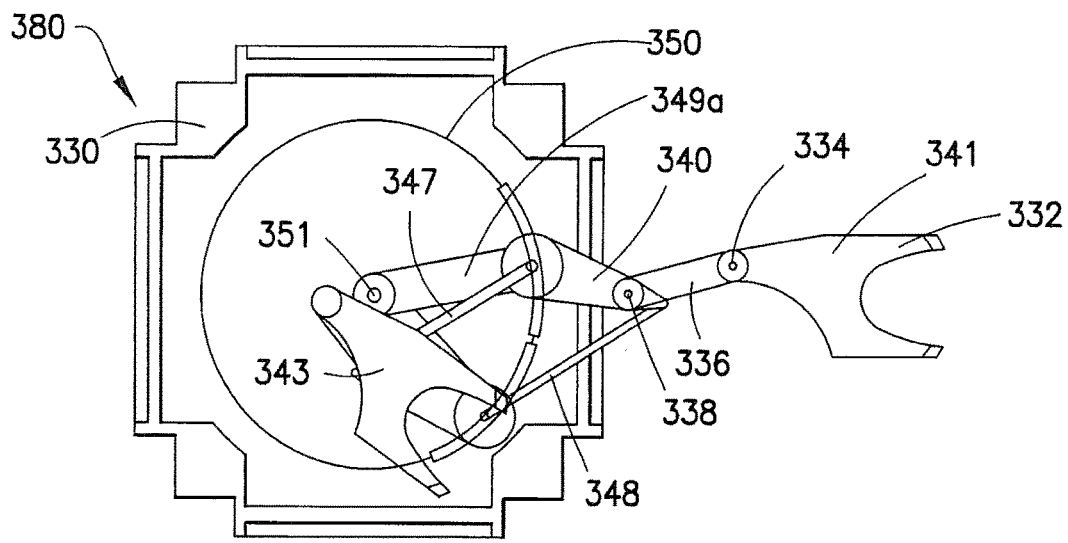
Figure 17C:
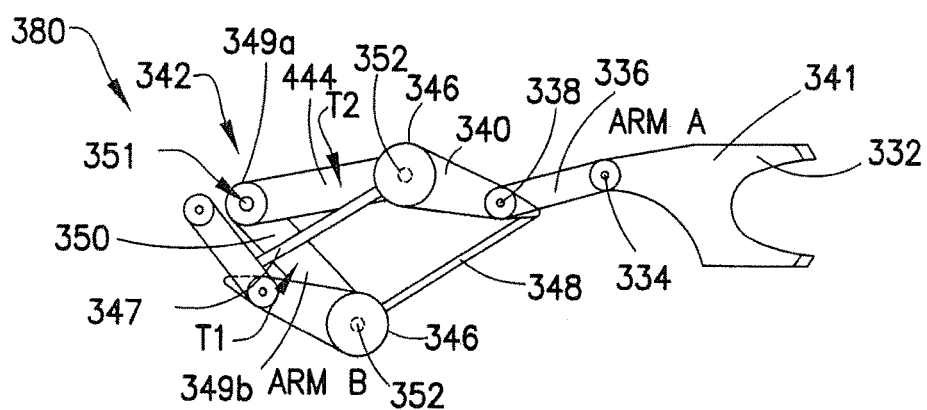

Referring now to FIGS. 17A-B, a substrate transport apparatus 380 with dual bisymmetric SCARA arms incorporating the mechanical switch mechanism with a coaxial drive assembly is depicted. In FIG. 17A-B, the transport apparatus 380 with a coaxial drive assembly including Arms A 341 and Arm B 343 are located within a transport chamber 330. In this example, the coaxial drive assembly may include stators integrated into the chamber 330 walls as described above with respect to FIGS. 3A, and 4A-D. In other embodiments the coaxial drive may be similar to that shown in FIG. 4E. In FIG. 17C, the dual bisymmetric SCARA arms are indicated as Arm A 341 and Arm B (not shown) with the transport chamber (also not shown). The substrate S for transport is shown positioned on the forked end effector 332 in FIG. 17A, but is not shown in FIG. 17B-C. The end effector 332 may again be of an alternative shape including, but not limited to, paddle shaped. The end effector 332 is pivotally connected to a wrist or pivot joint 334, which in turn is connected to a forearm 336 for each Arm A 341 and B 343. The forearm 336 is pivotally connected to an elbow or pivot joint 338, which in turn is connected to an upper arm 340 for each of Arm A 341 and Arm B 343. The upper arm 340 for Arm A 341 and B 343 are in turn mounted to a common base or mounting plate 342 for the T1 and T2 motors 350, 344 via their respective arm shoulder joints 346. The center of the coaxial drive assembly for the T1 and T2 motors is also the center of the common base or mounting plate 342. In this embodiment, two extension arms 349a, 349b extend radially outward from the coaxial drive shaft for T1 and T2 motors 350, 444. In addition, two crank links 347, 348 connect the arm shoulder joints 346 for each of Arm A 341 and B 343 to a pivot point 352 (shown in dashed lines in FIG. 17C) on the extension arms 349a, 349b. The extension arms 349a, 349b connect the arm shoulder 346 to the center or axis of rotation 351 of T1 350 and T2 444. As depicted in FIGS. 17B-C, the two extension arms emerge from different shafts, but have the same axis of rotation 351. The two crank links 347, 348 do not share a common convergent or pivot point, but are offset from the center of the coaxial drive assembly 351.

Referring again to FIGS. 17B-C, in order to effectuate extension of Arm A 341 or Arm B 343 for pick and place of a substrate S on the end effector 332, the T1 motor 350 is rotated while the T2 motor 344 is stationary. When the T1 motor is rotated in one direction, one arm extends or retracts while the second arm practically does not move due to the principle of operation previously described in FIGS. 12A-B. In particular, to extend arm A 341, T1 350 is rotated counterclockwise which causes crank link 348 to rotate the upper arm 340 of arm A 341 in the counterclockwise direction, which in turn causes arm A 341 to extend. FIG. 17 B depicts Arm A 341 in an extended position beyond the confines of the transport chamber 330 while Arm B 343 is retracted within the transport chamber 330. This movement of Arm A 341 allows for a substrate S to be picked up and placed in a storage chamber or processing station. In order to effectuate rotation of the arms substantially as a unit, both the T2 motor 344 and the T1 motor 350 are rotated in the same direction and to the same degree. This maintains the crank links 347, 348 and extension arms 349a,b for Arm A 341 and Arm B 343 stationary relative to one another so as to not exert a torque on one of the two arms to effectuate extension or retraction. In this embodiment including a coaxial drive assembly, T1 and T2 rotate about a common axis of rotation 351.

Referring now to FIGS. 18A-D, the retractional movement of Arm A 341 is depicted in four different retractional positions (A through D) for the substrate transport apparatus 380 with dual bisymmetric SCARA arms incorporating the mechanical switch mechanism with a coaxial drive assembly disclosed herein.

The principle of operation of the substrate transport apparatus 380 with dual bisymmmetric SCARA arms incorporating the mechanical switch mechanism with a coaxial drive assembly as described in FIGS. 17-18 is based on the two crank links being attached opposite of the axis of symmetry so when T1 rotates in one direction, one arm physically locks and the other arm is free to rotate with T1. Correspondingly, when T1 rotates in the opposite direction, the previously locked arm releases and is free to rotate with T1 while the previously free arm physically locks. This allows for independent extension of the two arms depending on the direction and degree of rotation of T1. In addition, when both T1 and T2 rotate together, the two arms rotate together substantially as a unit as opposed to extend. Hence, the principle of operation of the substrate transport apparatus 380 with dual bisymmetric SCARA arms incorporating the mechanical switch mechanism with a coaxial drive assembly as described in FIGS. 17-18 is the same as the substrate transport apparatus 320 (FIGS. 13-16) with dual bisymmetric SCARA arms incorporating the mechanical switch mechanism with independent drive assemblies for T1 and T2

Figure 19A:
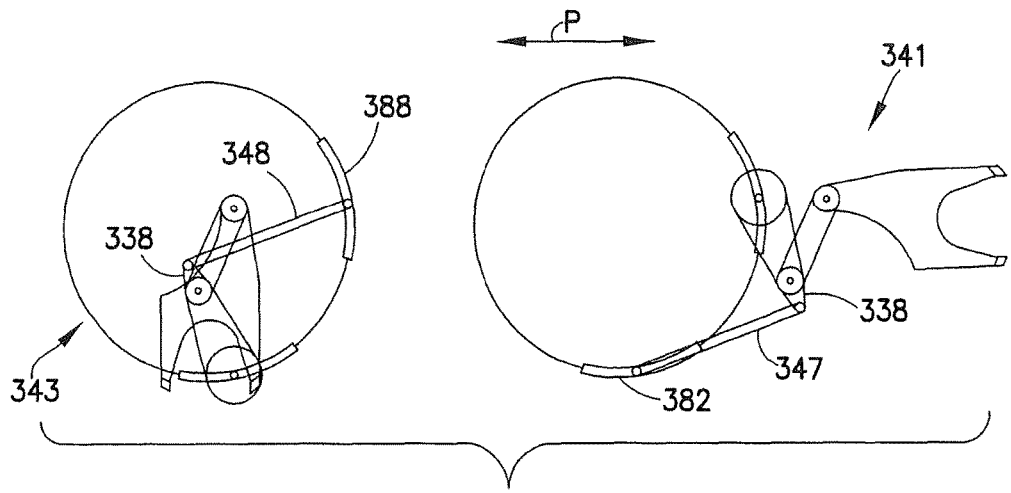
FIGS. 19A-C illustrate other schematic views of the substrate transport apparatus with dual bisymmetric SCARA arms in accordance with another exemplary embodiment, wherein one of the two arms is shown in three different extensional positions respectively.
Figure 19B:
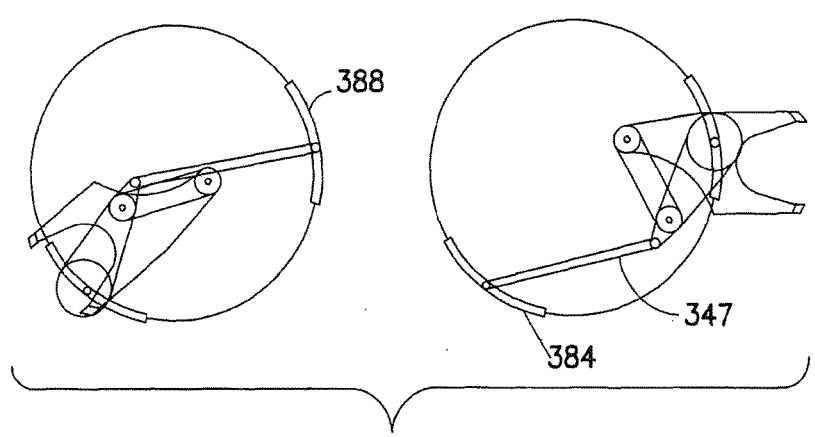
Figure 19C:
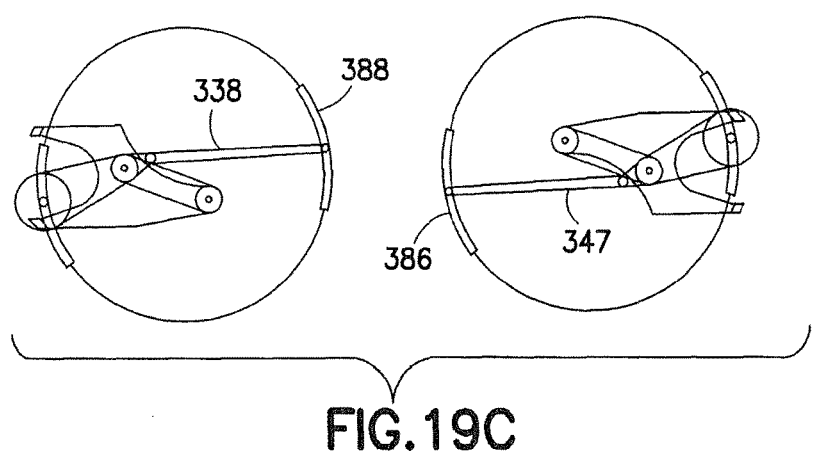

Referring now to FIGS. 19A-C, the retractional movement of Arm A 341 is depicted in three different positions (A through C) for the substrate transport apparatus 380 with dual bisymmetric SCARA arms incorporating the mechanical switch mechanism with a coaxial drive assembly disclosed herein. Arm B 343 is depicted on the left side of the schematics and Arm A 341 on the right side of the schematics. In FIG. 19A, arm A 341 is shown extended while arm B 343 is shown fully retracted with the crank link 347 effectuating arm A 341 movement at point A 382 along T1 350. As depicted in FIG. 15 B, as T1 350 is rotated in the clockwise direction, the crank link 347 connected along the circumference of T1 350 and the elbow joint 338 of arm A 341 also rotates in the clockwise direction along the circumference of T1 350 to point B 384 along T1 350. This in turn causes Arm A 341 to retract inward in the P direction while Arm B 343 remains essentially fixed in the retracted position. The crank link 348 connected along the circumference of T1 to the elbow joint 338 of arm B 343 remains fixed at point D 388 on the circumference of T1, which locks this arm in place. As depicted in FIG. 15 C, as T1 350 is further rotated in the clockwise direction, the crank link 347 connected along the circumference of T1 350 and the elbow joint 338 of arm A 341 further rotates in the clockwise direction along the circumference of T1 350 to point C 386 along T1 350. This in turn causes Arm A 341 to further retract fully inward in the P direction while Arm B 343 remains essentially fixed in the fully retracted position. Again, the crank link 348 connected along the circumference of T1 to the elbow joint 338 of arm B 343 remains fixed at point D 388 on the circumference of T1, which keeps this arm locked in place.

Figure 20G:
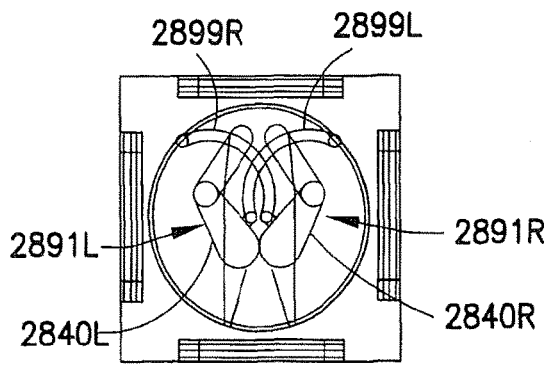
Figure 20J:
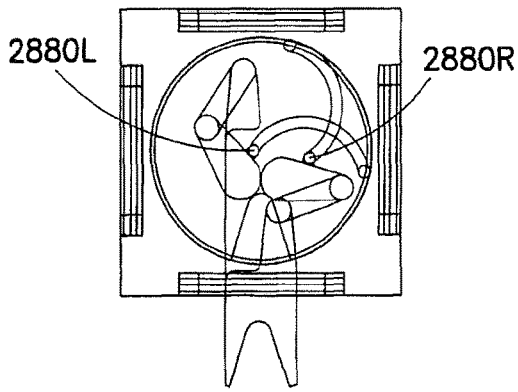
Figure 20H:
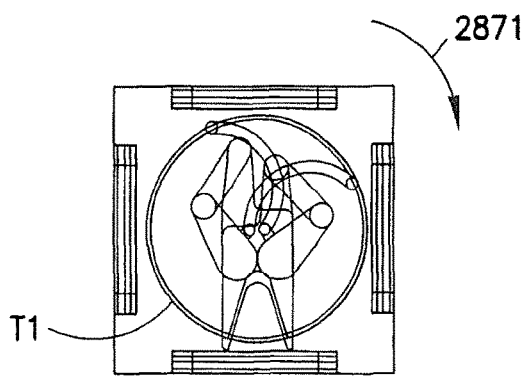
Figure 20K:
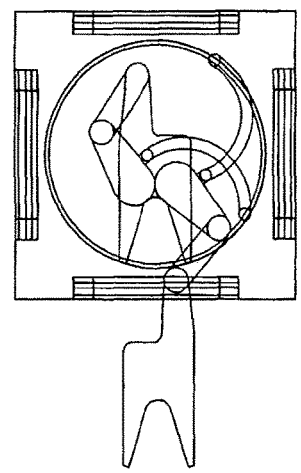
Figure 20I:
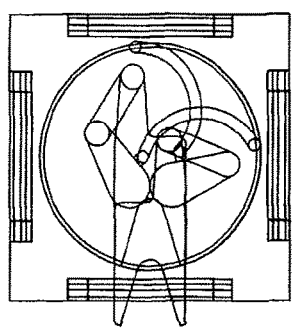
Figure 20L:
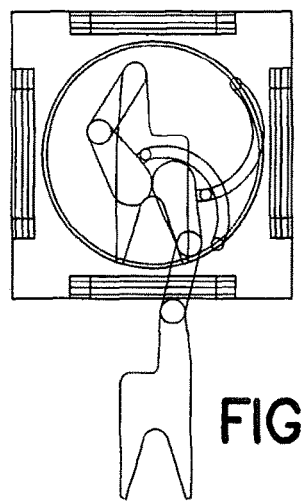

Referring now to FIGS. 20A-20L another substrate transport apparatus 2800 is shown in accordance with an exemplary embodiment. In this example, the transport apparatus 2800 includes a first and second arm 2891L, 2891R, each having an upper arm 2840L, 2840R, forearm 2855L, 2855R, and end effector 2830L, 2830R. The arms 2891L, 2891R may be substantially similar to those described above with respect to FIGS. 9A-9B. In alternate embodiments, the arms 2891L, 2891R may have any suitable configuration. The shoulders 2802L, 2802R of each of the arms may be rotatably coupled to a mounting platform 2801 or any other suitable mounting structure. The shoulders may be mounted on the plate 2801 in a side by side arrangement as can be seen in FIG. 20A. In alternate embodiments the shoulders 2802L, 2802R may be mounted in a coaxial arrangement. The mounting platform 2801 may be fixedly coupled to drive motor T2 so that as drive motor T2 rotates (along with drive motor T1) clockwise or counter-clockwise the arms 2891L, 2891R with motor T2 substantially as a unit to change an angular orientation of the path of extension and retraction with respect to, for example, a transfer chamber housing 2880. The upper arms 2840L, 2840R of each arm 2891L, 2891R may be connected to drive motor T1 through connecting links 2899L, 2899R. In this example, the connecting links 2899L, 2899R are shown as having a curvilinear shape but in alternate embodiments the connecting links 2899L, 2899R may have any suitable shape for connecting the arms 2891L, 2891R to the drive motor T1. The arms 2891L, 2891R may be connected to drive motor T1 in any suitable manner for extending and retracting each of the arms. The motors T1, T2 may be any suitable type of motors and may be incorporated within the wall structure of the chamber 30 as described above with respect to FIG. 4D. In alternate embodiments, the drive section may employ a coaxial drive shaft assembly. In still other alternate embodiments the motors T1, T2 may have any suitable configuration, such as for example a non-coaxial drive assembly or a magnetic drive assembly.

Referring to FIGS. 20A-20F another exemplary embodiment of a dual same side SCARA arm is shown. The arms 2891L, 2891R may be substantially similar to those described above with respect to FIGS. 4A-4C. However, in this exemplary embodiment, the coupling between the arms and the drive section includes arcuate links 2899L, 2899R which are coupled at one end to a respective arm 2891L, 2891R and at the other opposite end to but one drive motor T1 of the drive section. In this example the drive motors T1, T2 are shown as being shaftless drives integrated into the walls of the chamber as described above with respect to FIG. 4D but in alternate embodiments the drives may be any suitable drives including, but not limited to, those described herein.

As can be seen in FIGS. 20A-20F, the extension of arm 2891L is shown in several extensional positions. As can be seen in the figures, as the T1 motor rotates in a counter-clockwise direction from the neutral position shown in FIG. 20A, the arm 2891L is extended while the arm 2891R remains in a substantially retracted position. As the motor T1 is rotated in a counter-clockwise direction (the direction of arrow 2870) as shown in FIGS. 20B-20F the connecting link 2899L pushes on the upper arm 2840L causing the upper arm to rotate about its shoulder axis also in a counter-clockwise direction. The pushing effect of the connecting link 2899L on the upper arm 2840L may be by virtue of the shape of the connecting link 2899L. In alternate embodiments the pushing effect of the connecting link 2899L may be provided in any suitable manner. Because the forearm 2855L and end effector 2830L are slaved to the upper arm 2840L, as the upper arm rotates the forearm 2855L and end effector 2830L are extended along path P. As can be seen in the Figures as motor T1 rotates in the counter-clockwise direction the connecting link 2899R pivots about its coupling 2880R with the upper arm 2840R in a counter-clockwise direction without imparting any substantial motion to the upper arm 2840R (i.e. the arm 2891R remains in a retracted position). Retraction of the arm 2891L is performed in a manner substantially opposite that described above such that connecting link 2899L pulls the upper arm 2840L in a clockwise direction thereby retracting the arm 2891L from the position shown in FIG. 20F to the position shown in FIG. 20A.

Referring to FIGS. 20G-20J, extension of the arm 2891R may be performed in a manner substantially similar to the extension of arm 2891L. For example, as the arm 2891R is retracted and the motor T1 is rotated in a clockwise direction (the direction of arrow 2871) to the neutral position shown in FIG. 20G, the connecting link 2899R begins pushing on the upper arm 2840R while the connecting link 2899L begins to rotate about its coupling 2880L with upper arm 2840L. As the motor T1 continues to rotate in a clockwise direction the arm 2891R is extended from the retracted position shown in FIG. 20G to the extended position shown in FIG. 20L. Because connecting link 2899L is free to rotate about coupling 2880L, motor T1 can rotate to extend arm 2891R without imparting any substantial movement to arm 2891L. Retraction of arm 2891L can be performed in a manner substantially opposite to that described above with respect to its extension.

As noted above, when only the T1 motor is rotated in a clockwise or counter-clockwise direction, one of the arms 2891L, 2891R are extended or retracted. When both the T1 and T2 motors are rotated in the same direction at substantially the same rate, both arms 2891L, 2891R are rotated as a unit to change the direction of extension and retraction P of the arms with respect to the, for example the transfer chamber housing 2880.

Figure 21A:
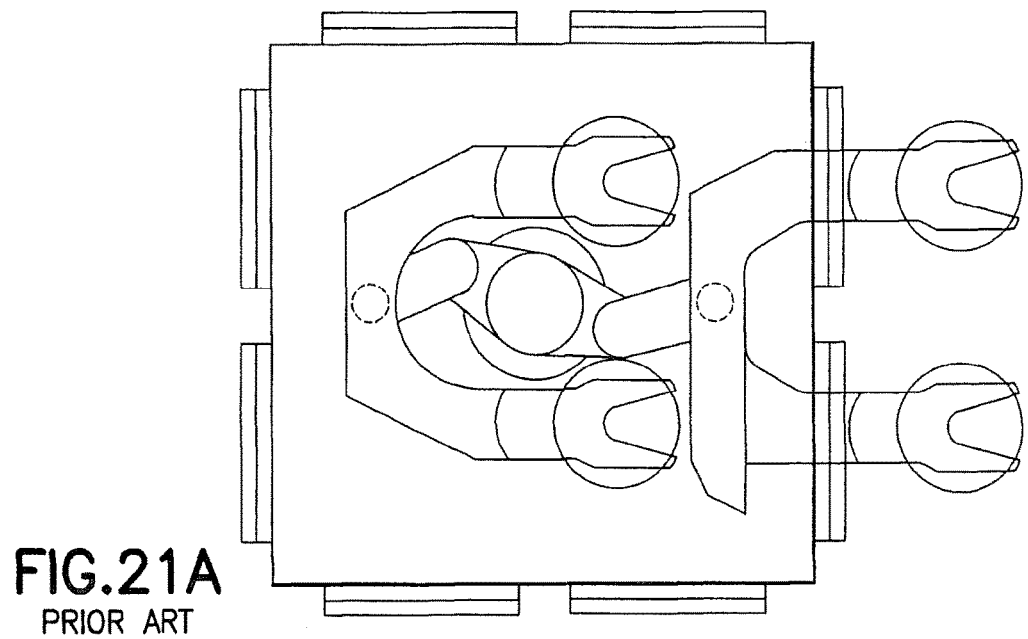
FIG. 21A illustrates a conventional transport apparatus.

Referring to FIG. 21A, there is shown a schematic plan view of a conventional transport apparatus with a two-by-two same side SCARA arm configuration. As may be realized, in this conventional configuration, three or more motors may be employed to effectuate independent extension/retraction of each arm and rotation of the four SCARA arms. It is noted that the dual end effectors located on each arm in FIG. 21A may be incorporated onto the transport apparatus described above with respect to FIGS. 4A-4B so that the mechanical switch with minimized number of drive motors can be utilized with the two-by-two same side SCARA arm configuration.

Figure 21B:
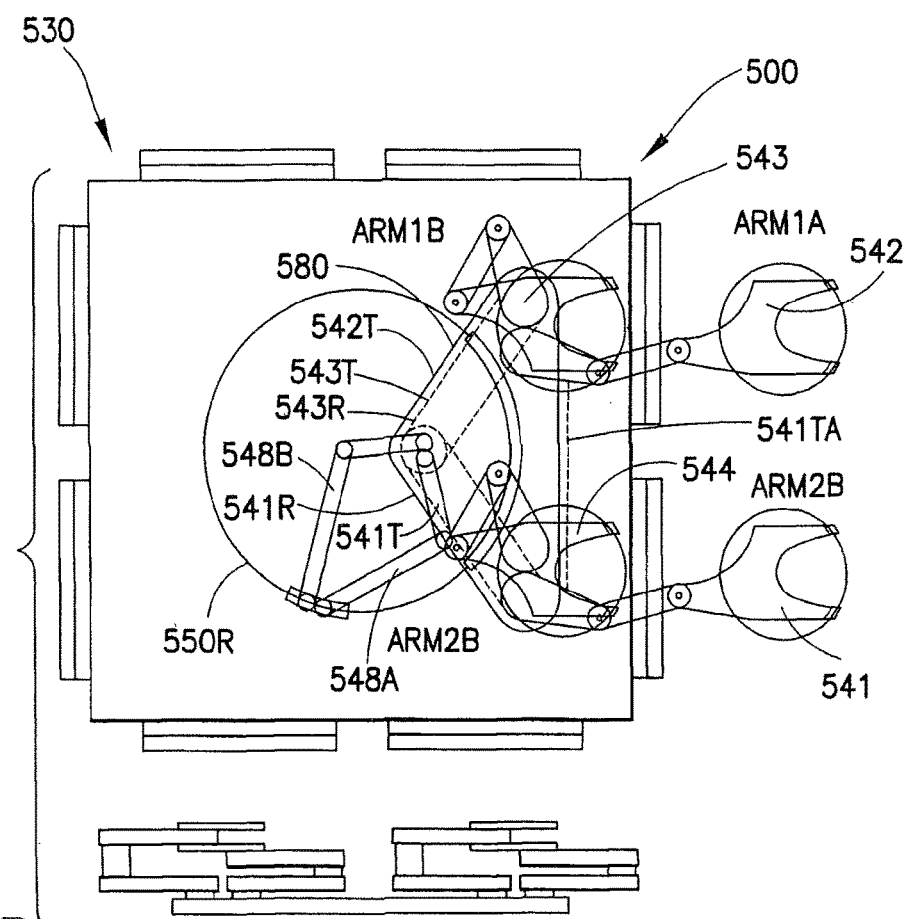
FIG. 21B illustrates a schematic view of another transport chamber module and of substrate transport apparatus in accordance with another exemplary embodiment.

Referring now to FIG. 21B there is shown another exemplary embodiment of a substrate transport apparatus with double dual same side SCARA arm (e.g. a two by two SCARA arm (total of four arms) assembly) utilizing the mechanical switch mechanism disclosed herein. Hence a total of four arms may be configured within the substrate transport apparatus 500. In contrast to conventional apparatus such as shown in FIG. 21A, in the embodiment shown in FIG. 21B, the two by two same side SCARA arm configuration for a substrate transport apparatus 500 utilizing the mechanical switch mechanism disclosed herein uses but two motors to effectuate independent extension/retraction of each pair of arms and rotation of the four SCARA arms. In FIG. 21B, arm 1A 541 may be coupled to arm 2A 542 via any suitable transmission 541TA (such as belt/pulley system) and arm 1B 543 may be coupled to arm 2B 544 via another suitable transmission (not shown). The transport apparatus may be at least partly housed within a transport chamber 530. The SCARA arms and mechanical switch may be generally similar to that previously described and depicted in FIGS. 3-11 for the dual same side arm configuration (similar features are similarly numbered, and arm motions may be effected in a similar manner to that previously described. The T1 and T2 motors may be generally similar to T1 and T2 motors having two stacked rings (rotors) 550R, 544, respectively coupled with stator windings integrated in the transport chamber 530, and for example external to the vacuum or chamber atmosphere. In alternate embodiments, the drive section for the double SCARA arms may employ a coaxial drive shaft assembly. In other alternate embodiments, any suitable drive section may be employed such as for example a non-coaxial drive assembly or a magnetic drive assembly. The drive section may be housed within a housing of the substrate transport to prevent contamination or damage to the substrates from any particles that may have been generated from the moving parts of the drive section. In comparison to the conventional design of FIG. 21A, the double SCARA arm drive utilizing the mechanical switch mechanism depicted in FIG. 21B provides for positioning of the upper arm shoulders for example off center of the transport chamber, which correspondingly provides for station reach with significantly smaller and hence lighter arms.

As best seen in FIG. 21B, in the exemplary embodiment linkages 548A, 548B may be employed to define a mechanical switch generally similar to the mechanical switch described previously. As noted before, corresponding arms of each arm pair (e.g. A arms 541, 542, B arms 543, 544) are coupled, and hence the description below will refer generally to but one arm (e.g. A arm 541, B arm 543) of each arm pair. As seen in FIG. 21B, in the exemplary embodiment, the corresponding arm pairs 541, 544, 542, 543 may be mounted with the shoulder joints offset from each other, though in alternate embodiments, the shoulder joints may be coaxial. In the exemplary embodiment, the arm pairs may be mounted on a support platform 580 that is substantially fixed to one motor (e.g. T2 motor rotor 544). The support platform shown has an exemplary configuration and in alternate embodiments the support platform may have any suitable shape, for example may be integrated with the motor rotor. Z-support and motion may be provided in a manner as described previously. As seen in FIG. 21B, linkages 548A, 548B may be connected by revolute joints (in the embodiment shown the joints are offset though in alternate embodiments the joints may have a common axis of rotation) to the rotor of the T1 motor. In the exemplary embodiment, linkages 548A, 548B may be articulated each having first and second or crank link sections joined by a revolute joint. The crank link section of linkages 548A, 548B in the exemplary embodiment may be connected to the support platform 580 by revolute joints 541R, 543R. The crank link section of the linkages may be respectively coupled with a suitable transmission 541T, 543T (such as a belt/pulley system) to the corresponding upper arm of arms 541, 543. Hence, the crank link of linkage 548A is coupled via transmission 541T to the upper arm of A arm 541, and crank link of linkage 548B is coupled via transmission 543T to the upper arm of B arm 543. The crank links of linkages 548A, 548B are respectively free to rotate about corresponding revolute joints 541R, 543R. By way of example, in the exemplary embodiment, counter clockwise rotation of T1 rotor 550R causes linkage 548A to articulate so that crank link of linkage 548A is rotated about revolute joint 541R hence causing extension/retraction of the A arm 541, 542 via transmission(s) 541T. The other linkage 548B is substantially released so that articulation results in little or substantially no rotation of the corresponding crank link about revolute joint 545R, and hence substantially no movement of the B arm 543. Conversely, clockwise motion of the T1 motor rotor 550R, from an initial position causes extension of the B arm 543, 544 from each arm pair.

Figure 22A:
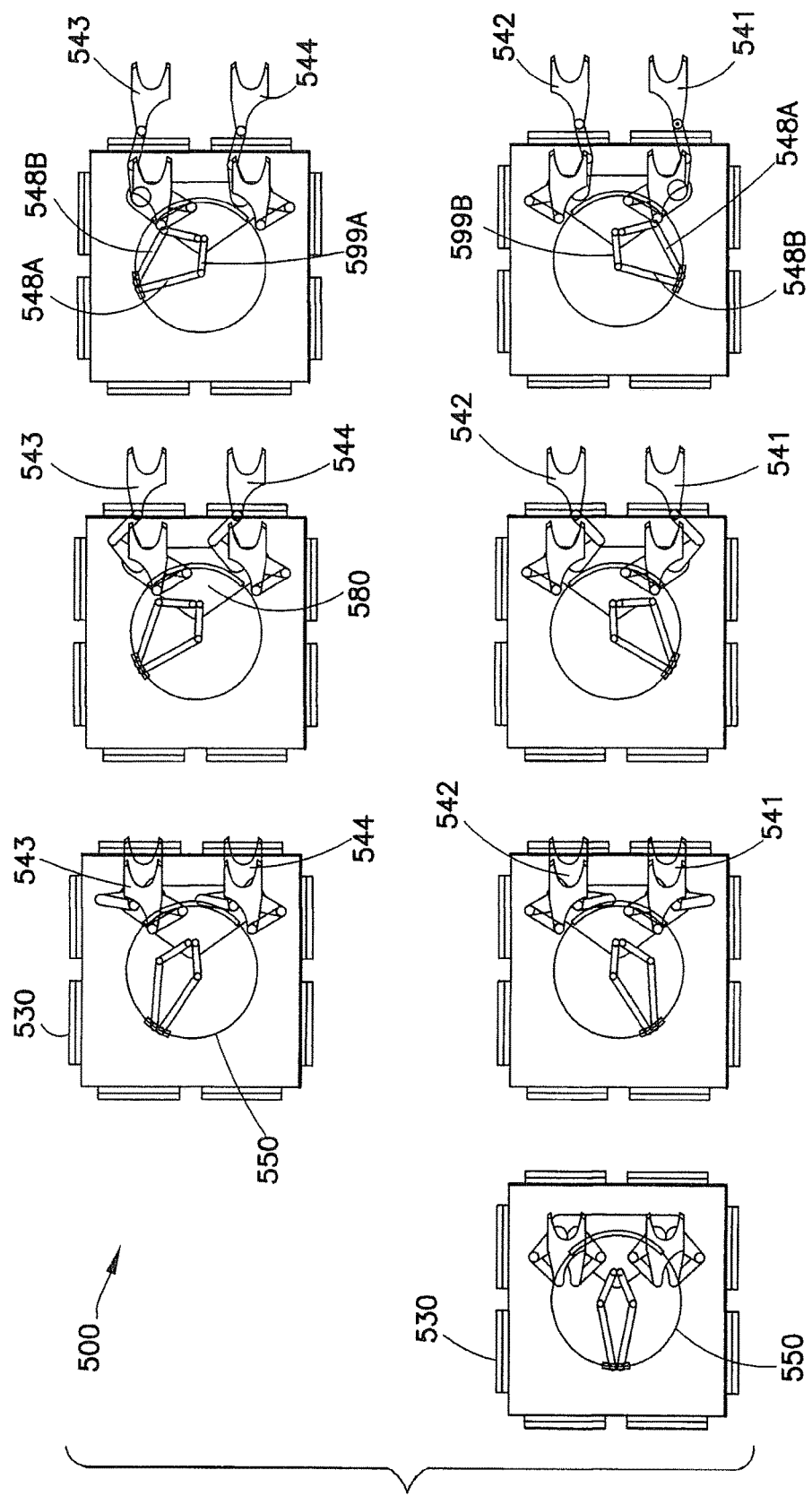
FIGS. 22A-B illustrate schematic views of the substrate transport apparatus in FIGS. 20A-B in eight different rotational positions.

Referring now to FIG. 22A, the extensional and retractional movement of the four arms are depicted in seven different extensional positions for the substrate transport apparatus 500 with double dual (two by two) same side SCARA arms incorporating the mechanical switch mechanism disclosed herein. Referring to the bottom row of schematics in FIG. 22A, the extensional movement of two of the arms (Arm 1A 541 and Arm 2A 542) along the direction P is illustrated as the point 595 of the crank links 548A, 548B moves along T1 550 in the counter-clockwise direction based on counter-clockwise rotation of T1 550. As T1 550 rotates counter-clockwise, the articulation of linkage 548A causes link 599A to rotate about revolute joint 541R. Rotation of link 599A about revolute joint 541R in turn causes rotation of transmission 541T for extending arm 541. As noted above, arm 541 is coupled to arm 542 via transmission 541TA such that as arm 541 extends/retracts, arm 542 extends/retracts with arm 541. As can be seen in FIG. 22A when arms 541, 542 are extended the link 599B of linkage 548B remains substantially rotationally fixed relative to, for example the support platform 580 such that arms 543, 544 remain in a substantially retracted position. Referring to the top row of schematics in FIG. 22A, the extensional movement of the other two arms (Arm 1B 543 and Arm 2B 544) along the P direction is illustrated as the point 595 of the crank links 548A, 548B move along T1 550 in the clockwise direction based on clockwise rotation of T1 550. As T1 550 rotates clockwise, the articulation of linkage 548B causes link 599B to rotate about revolute joint 543R. Rotation of link 599B about revolute joint 543R in turn causes rotation of transmission 543T for extending arm 543. As noted above, arm 543 is coupled to arm 544 via a suitable transmission such that as arm 543 extends/retracts, arm 544 extends/retracts with arm 543. As can also be seen in FIG. 22A, as arms 543, 544 are extended link 599A of linkage 548A remains substantially rotationally fixed with respect to, for example, the support platform 580 such that arms 541, 542 remain in a substantially retracted position.

Figure 22B:
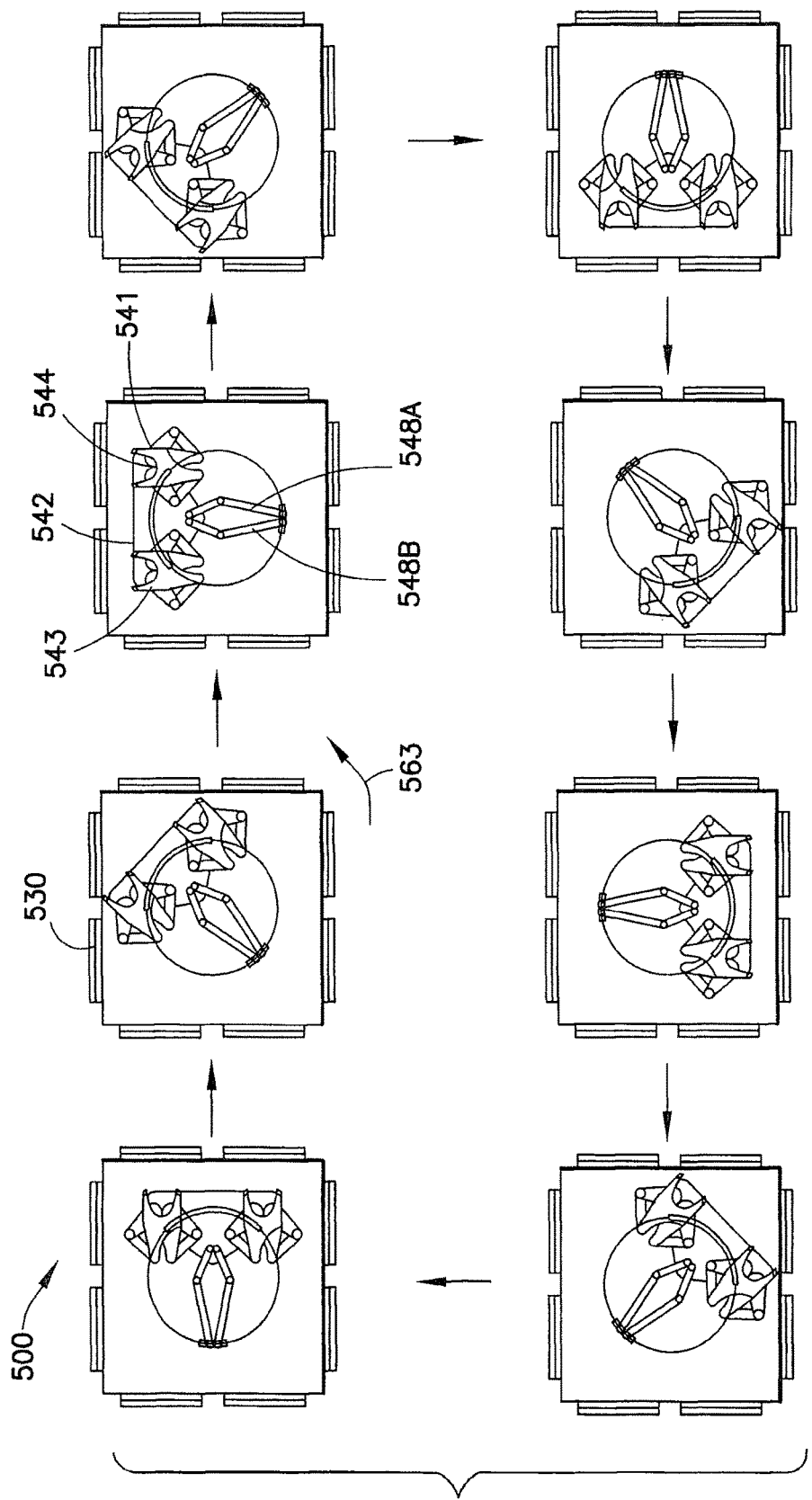

Referring now to FIG. 22B, a counter-clockwise rotational movement of the four arms 541-544 is depicted in eight different rotational positions for the substrate transport apparatus 500 with double dual (two by two) same side SCARA arms incorporating the mechanical switch mechanism disclosed herein. For exemplary purposes only the position of the transport apparatus 500 shown in the upper left corner of FIG. 22B will be referred to as the start position with respect to the rotation of the arms 541-544. In alternate embodiments, the start position for the rotation of the arms may be any suitable rotational orientation of the apparatus. As can be seen in FIG. 22B the transport arms are rotated as a unit by operating both the T1 and T2 motors such that they rotate in the same direction at substantially the same speed. In this example both the T1 and T2 motors are rotated in a counter-clockwise direction (i.e. the direction of arrow 563). When the motors T1, T2 are rotated in the same direction and at substantially the same speed, no relative motion is introduced between, for example, the support platform 580 and the linkages 548A, 548B. As such, the linkages 548A, 548B remain substantially in the same orientation throughout the rotation of the arms 541-544 as a unit without imparting any substantial extension or retraction of the arms 541-544.

It should be understood that the substrate transport apparatus utilizing the mechanical switch mechanism disclosed herein is not limited to use with SCARA arms, which for example may include an upper arm, a band driven forearm and a band driven end effector. It should also be understood that the same side or bisymmetric SCARA arms described above may be of alternative designs and configurations.

In accordance with another exemplary embodiment, the transport apparatus may have a general SCARA arm arrangement that may incorporate a pair of independently actuated coaxial rings exposed at the circumference of the transport chamber. For example, the structural role of the upper arm is assumed directly by one of the actuation rings (motor rotors similar to motors 214, 50R shown in FIG. 4D). The second independently actuated coaxial ring is coupled to the arm by a coupling mechanism. Non-limiting, exemplary coupling mechanisms linking the second independently actuated coaxial ring coupled to the arm include a mechanical link (including one or more revolute joints), a band drive, a crossed band drive, and a magnetic coupling. The independently actuated coaxial rings may be, for example, two independent motor rotor rings, which may be concentric with one another. One or more pins may be attached to each of the coaxial rings for attaching revolute joints for the linkages connected to the two coaxial rings. The rotation and extension of the arm may be effected by the relative motion of one coaxial ring relative to the other coupled coaxial ring. This configuration shall be referred to herein, for description purposes only, as an arm with actuation rings. The arm with the actuation ring design may include one or two arms linked to the circumference of one coaxial ring. Various embodiments of this arm with the actuation ring design may be provided for through differing mechanical designs for the actuation of the remaining arm linkages. In single arm embodiments, both a left hand configuration and right hand configuration of the arm may be provided for. The pair of independently actuated coaxial rings may have the same or different diameters. The pair of independently actuated coaxial rings may also rotate in the same horizontal plane as depicted in FIGS. 23-28 or may rotate in two different horizontal planes adjacent to one another (for example, on top of each other or side by side to each other). The linkage type and configuration between the two independently actuated coaxial rings will vary depending upon the relative diameter and the relative position of the two coaxial rings.

The arm with the actuation ring design may provide for one or more of the following non-limiting advantages: reduced complexity, lower cost, reduced size, improved utilization of torque and improved resolution. The arm with the actuation rings design eliminates one link and joint, including two pulleys and bands for each end effector. The arm with the actuation rings design also allows for the elbow joint of the arm to remain within the vacuum chamber as the arm extends, and hence for example the end effector or the end effector and wrist joint may pass through the slot valve to provide desired reach pursuant to the SEMI standard. The arm with the actuation rings design may for example also provide for a 1:1 pulley ratio though any suitable pulley ratio may be used. Various embodiments of this arm with the actuation ring design may be provided for through differing mechanical designs for the actuation of the remaining arm linkages for both single and dual end effector arms, which will be described in further detail below. It is noted that the housing, such as a vacuum or transfer chamber housing, for enclosing the transport apparatus described below with respect to FIGS. 23A-28B is omitted from the figures for clarity purposes only.

Figure 23A:
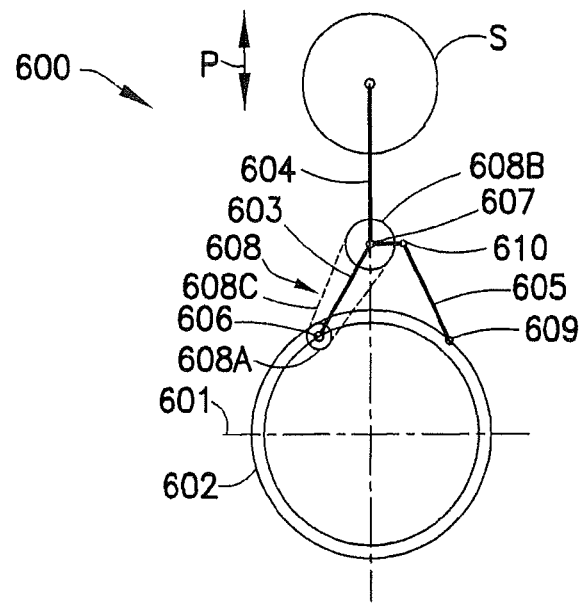

Referring now to FIG. 23A, a single end effector arm 600 with actuation rings driven at least in part by, for example, a linkage is illustrated. In this embodiment, the arm 600 is installed on a pair of independently actuated coaxial rings 601 and 602. The arm 600 includes a primary linkage 603, an end effector 604 and a secondary linkage 605. The two linkages 603, 605 may be symmetrical or non-symmetrical depending upon their length and position along the circumference of the coaxial rings 601, 602. A substrate S is shown on the end effector 604 for exemplary purposes. The primary linkage 603 is coupled to one coaxial ring 601 through revolute joint 606. End effector 604 is coupled to the primary linkage 603 through revolute joint 607, and constrained to point radially along the path of extension/retraction P by band arrangement 608. The band arrangement may include a first pulley 608A and a second pulley 608B and band 608C. The first pulley 608A may be drive pulley that is fixedly coupled to the first coaxial ring at joint 606 such that as the ring 601 rotates the pulley rotates along with the ring without any relative motion between the two. The second pulley 608B may be a driven pulley that is fixedly coupled to the end effector 604 at joint 610 such that when the pulley 608 rotates the end effector 604 rotates with it. As can be seen in FIG. 23A, the pulleys 608A, 608B may have for example a 1:2 ratio so that as the arm 600 is extended/retracted the end effector 604 longitudinally remains along the path of travel P. In alternate embodiments, the pulleys may have any suitable ratio depending on a desired path of travel of the substrate and/or end effector. The band 608C connecting the two pulleys 608A, 608B may be any suitable band arrangement, including but not limited to, one or more metal bands coupled to each of the pulleys (e.g. by pins or other suitable fastening device) and toothed bands. In alternate embodiments the band arrangement may have any suitable configurations. In still other alternate embodiments, the end effector 604 may be constrained to move along a predetermined path, such as path P, in any suitable manner. Secondary linkage 605 is coupled to the other coaxial ring 602 and end effector 604 through revolute joints 609 and 610 respectively.

The arm 600 may be rotated as a unit by rotating the coaxial rings 601 and 602 equally in the same direction. The arm 600 may be radially extended by moving coaxial rings 601 and 602 simultaneously in opposite directions. The symmetry of the primary linkage and the secondary linkage 603, 605 may determine the amount of rotation or extension of the arm 600 relative to the rotation of the two coaxial rings 601, 602. Referring now to FIG. 23B, the radial extension of the single end effector arm 600 with actuation rings driven by a linkage with substrate S thereon is depicted in phased form in six different positions along the P direction. Beginning with the upper left diagram in FIG. 23B for exemplary purposes only, as coaxial ring 601 rotates in the clockwise direction and coaxial ring 602 rotates in a counterclockwise direction by equal amounts, the linkage 603 pulls on the end effector at revolute joint 607 while the linkage 605 pushes on the end effector at revolute joint 610 causing a radial extension of the arm 600. As the coaxial rings continue to rotate in opposite directions the linkage 603 reaches a point where it begins to push on the end effector at revolute joint 607 as can be seen in the upper right diagram of FIG. 23B such that throughout the rest of the extension motion both linkages 603, 605 are pushing the end effector through its path of extension as can be seen in the bottom row of diagrams in FIG. 23B. As described above the movement of the end effector is constrained by the band arrangement 608 such that it is longitudinally aligned with path P during extension and retraction. For example, as the coaxial ring 602 rotates clockwise the linkage 603 rotates counterclockwise relative to its pivot point 606 and the ring 601. The band arrangement 608 in turn causes pulley 608B to rotate clockwise (based on the relative motion between the linkage 603 and ring 601) such that the end effector remains longitudinally aligned with the path of travel P (e.g. the rotation of the end effector about joint 607 counters the rotation of the linkage 603 about joint 606). As may be realized the retraction of the arm 600 can be effected in a manner substantially opposite that described above with respect to the extension of the arm 600.

Figure 24A:
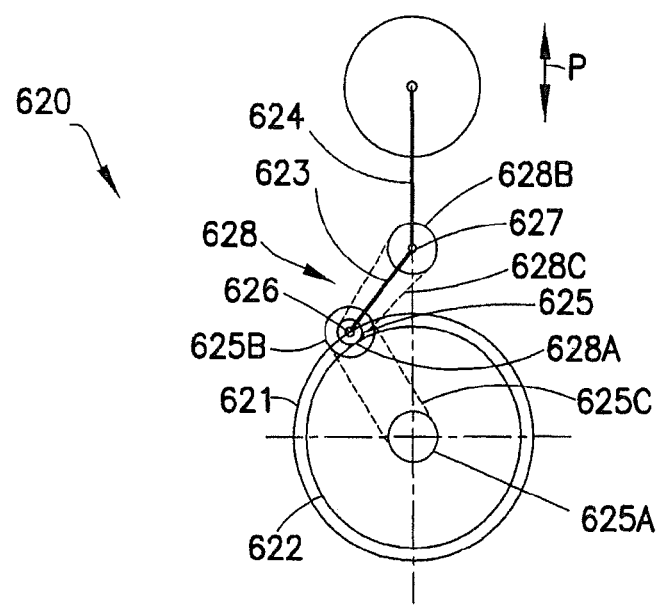

Referring now to FIG. 24A, a single end effector arm 620 with actuation rings driven, for example, at least in part by straight bands is illustrated. In this embodiment, the arm 620 is again installed on a pair of independently actuated coaxial rings 621 and 622. The two actuation rings 621, 622 may be concentric with respect to each other as depicted in FIG. 24. The arm includes a linkage 623, an end effector 624 and a straight band drive 625. A substrate S is shown on the end effector 624 for exemplary purposes. Linkage 623 is connected at one end to both the coaxial ring 621 through revolute joint 606 and to the other coaxial ring 622 through the band drive 625. In this exemplary embodiment, the straight band drive 625 includes a first drive pulley 625A, a second driven pulley 625B and a belt 625C. The belt may be substantially similar to the belt described above with respect to FIG. 23A. The pulleys 625A, 625B in this example have a 1:1 ratio such that the rotation of the coaxial ring 622 is transferred to the arm linkage 623 without any reduction or increase in rotational speed. The drive pulley 625A may be fixedly mounted to the coaxial ring 622 such that as the coaxial ring rotates the pulley 625A rotates with it. In this example, the drive pulley 625A is mounted substantially at the center of the inner actuation ring 622, which may be in the form of a wheel. In alternate embodiments, the drive pulley 625A may be mounted at a location other than the center of the inner actuation ring 622. The driven pulley 625B may be fixedly mounted to the arm linkage 623 about revolute joint 628.

The end effector 624 is coupled to linkage 623 through revolute joint 627 and constrained to point radially by band arrangement 628. The band arrangement 628 includes a first drive pulley 628A, a second driven pulley 628C and band 628C. The band arrangement 628 may be substantially similar to the band arrangement 608 described above with respect to FIG. 23A. In alternate embodiments the band arrangement may have any suitable configurations. In still other alternate embodiments, the end effector 624 may be constrained to move along a predetermined path, such as path P, in any suitable manner.

The arm 620 may be rotated as a unit by rotating coaxial rings 621 and 622 by substantially equal amounts in the same direction (e.g. clockwise rotation of rings 621, 622 produces a clockwise rotation of arm 620 about the center of rotation of the rings 621, 622). Radial extension of the arm 620 may be controlled by moving coaxial rings 621 and 622 simultaneously in opposite directions. In this example, to extend the arm 620 the rings 621, 622 may be rotated by equal amounts in opposite directions as the band drive 625 is has a 1:1 pulley ratio. As may be realized, in alternate embodiments the rings 621, 622 may be rotated in opposite directions by unequal amounts to extend the arm 620 depending on, for example, the ratio between the pulleys 625A, 625B. Referring now to FIG. 24B, the radial extension of the arm 620 with actuation rings 621, 622 driven by straight bands is depicted in phased form in six different positions along direction P. Beginning with the upper left diagram in FIG. 24B for exemplary purposes only, the arm 620 is shown in a substantially retracted configuration. As the ring 621 rotates clockwise and the ring 622 rotates counterclockwise the arm extends along path P. As can be seen in FIG. 24B, rotation of ring 621 causes revolute joint 628 to travel along the circumference of the ring 621 without introducing any relative motion between the ring 621 and drive pulley 628A. Rotation of the ring 622 in a counterclockwise direction causes band arrangement 625 to rotate the arm linkage 623 in a counterclockwise direction. The combined movement of ring 621 (moving the revolute joint) and ring 622 (rotating the arm linkage 623) causes the arm linkage 623 to extend. As described above, the end effector 624 is constrained so that it is longitudinally aligned with path of travel P during extension and retraction. The combined rotation of the rings 621, 622 in opposite directions produces relative movement between the linkage 623 and drive pulley 628 such that the linkage 623 is seen as rotating counterclockwise about joint 628. This relative movement causes band assembly 628 to rotate the end effector 624 in a clockwise direction such that the end effector 624 remains longitudinally aligned with path P during extension and retraction of the arm 620.

Figure 25A:
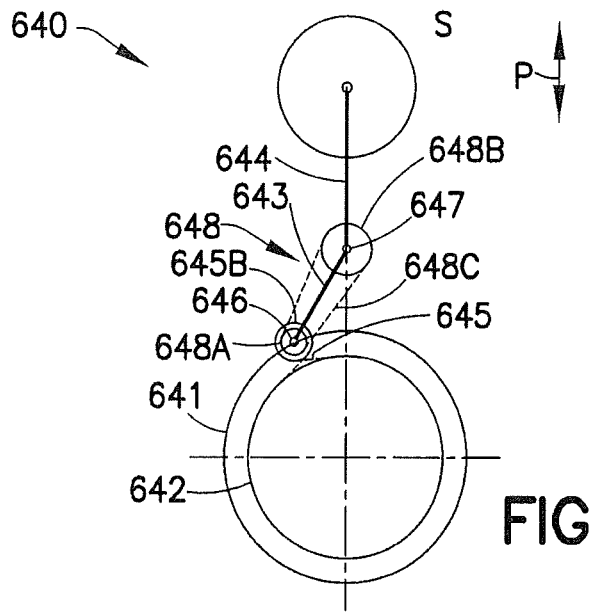

Referring now to FIG. 25A, a single end effector arm 640 with actuation rings driven at least in part by, for example crossed bands is illustrated. In this embodiment, the arm 640 is again connected to a pair of independently actuated coaxial rings 641 and 642. The two actuation rings 641, 642 may be concentric with respect to each other as depicted in FIG. 25A. The arm 640 includes a linkage 643, an end effector 644, a crossed band drive 645 and an end effector band arrangement 648. In alternate embodiments the arm 640 may have any suitable configuration. A substrate S is shown on the end effector 644 for exemplary purposes. Linkage 643 is connected at one end to both the coaxial ring 641 through revolute joint 646 and the other coaxial ring 642 through the crossed band drive 645. A driven pulley 645B may be fixedly coupled to the linkage 643 so that as the pulley 645B rotates the linkage 643 rotates with it about joint 646. In this example, the inner coaxial ring 645 may be configured as a drive pulley such that the crossed band drive 645 may be positioned along the periphery of the inner coaxial ring 642. In alternate embodiments the crossed band drive 645 may be positioned at another location where a wheel arrangement for the coaxial ring 642 may be utilized. In still other alternate embodiments the drive coupling between the coaxial ring 642 and linkage driven pulley 645B may not be a crossed band drive. For example, the drive band may couple ring 642 and drive pulley 645B in a manner substantially similar to that described above with respect to band 625C and FIG. 24A. The end effector 644 is coupled to the other end of the linkage 643 through revolute joint 647 and is constrained to point radially by band arrangement 648 so that as the arm is extended/retracted the end effector 644 remains longitudinally aligned with the path of travel P. In this example, the end effector is constrained through band arrangement 648. The band arrangement 648 may include a drive pulley 648A, a driven pulley 648B and band 648C. The band arrangement 648 may be substantially similar to band arrangement 608 described above with respect to FIG. 23A.

The arm 640 may be rotated as a unit by rotating coaxial rings 641 and 642 by substantially equal amounts in the same direction (e.g. clockwise rotation of rings 641, 642 rotates the arm 640 in a clockwise direction about, for example, a center of rotation of the rings). Radial extension of the arm 640 may be effectuated by moving coaxial rings 641 and 642 simultaneously in the same direction by unequal amounts. Referring now to FIG. 25B, the radial extension of the single end effector arm with actuation rings driven by crossed bands with substrate S thereon is depicted in phased form in six different positions along direction P. Beginning with the upper left diagram in FIG. 25B for exemplary purposes only, the arm 640 is shown in a substantially retracted configuration. As both coaxial rings 641, 642 are rotated simultaneously in the same direction (in this example the rings are rotated in a clockwise direction) by unequal amounts, the revolute joint 646 travels along, for example, the circumference of the ring 641. By rotating ring 642 at a different rate than ring 641 the crossed band 645 causes the arm linkage 643 to rotate in a counterclockwise direction relative to the revolute joint 646. The combined rotation of the rings 641, 642 causes the extension and rotation of the arm linkage 643 along the path of travel P. As described above the end effector 644 is constrained by band arrangement 648 such that as the linkage 643 extends the end effector remains longitudinally aligned with the path of travel in a manner substantially similar to that described above with respect to FIG. 23A. For example, as the arm linkage 643 rotates counterclockwise relative to the revolute joint 646, the band arrangement 648 is configured to rotate the end effector 644 clockwise relative to revolute joint 647. The rotation of the forearm 644 counteracts rotation of the linkage 643 and the forearm remains longitudinally aligned with the path of travel P as can be seen in FIG. 25B.

Figure 26A:
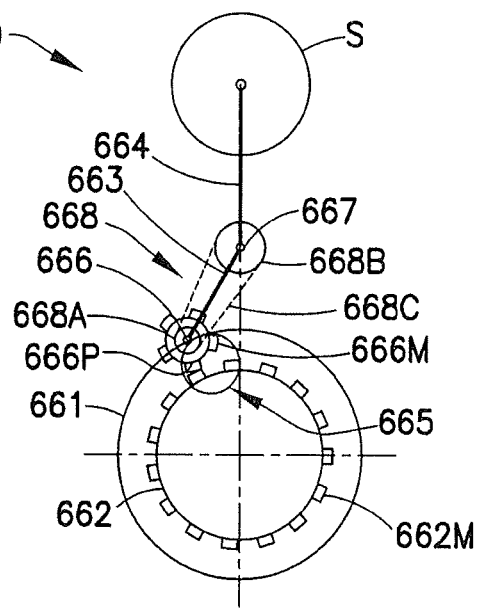

Referring now to FIG. 26A, a single end effector arm 660 with actuation rings driven at least in part by, for example, a magnetic coupling is illustrated. In this embodiment, the arm 660 is connected to a pair of independently actuated coaxial rings 661 and 662. The two actuation rings 661, 662 may be concentric with respect to each other as depicted in FIG. 25. The arm 660 includes a linkage 663, an end effector 664, a band arrangement 668 and a magnetic coupling 665. The linkage 663 may be rotatably coupled to ring 661 through revolute joint 666. A pulley 666P may fixedly coupled to the linkage 663 at joint 666 such that as pulley 666P rotates the linkage 663 rotates with it as will be described below. The end effector 664 is rotatably coupled to the linkage 663 by revolute joint 667. The end effector may be constrained to travel along the path of travel (e.g. extension/retraction) by band arrangement 668. The band arrangement includes a drive pulley 668A fixedly coupled to the ring 661, a driven pulley fixedly coupled to the end effector 664 and a band 668C. The band arrangement 668 may be substantially similar to band arrangement 608 described above with respect to FIG. 23A. It is noted that a substrate S is shown on the end effector 664 for exemplary purposes.

Figure 26C:
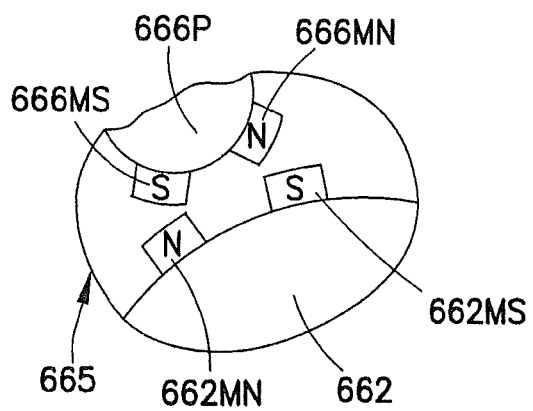

In this exemplary embodiment, the inner coaxial ring 622 includes magnets 662M located along its periphery. In alternate embodiments the magnets 662M may be positioned at another location where, for example, a wheel arrangement for the inner coaxial ring 662 is utilized. As described above, linkage 663 is connected to coaxial ring 661 through revolute joint 666. Pulley 666P, which is also rotatable about joint 666 may magnetically couple the linkage 663 to the inner coaxial ring 662. For example the pulley 666P, which is fixedly coupled to linkage 663, includes magnets 666M located around its periphery. The magnets may be arranged so that each magnet has a different polarity. For example, as can be seen in FIG. 26C the magnets 666M on the pulley 666P are arranged so that the polarity alternates in a north-south-north-south pattern as can be seen with respect to magnets 666MS, 666MN. As can be also be seen in FIG. 26C, the magnets on the inner coaxial ring 662 alternate in a similar manner as can be seen with respect to magnets 662MN, 662MS. As may be realized, the magnets on the pulley 666P and the magnets on the ring 662 may be arranged so that a magnets having a "north" polarity on the pulley 666P are mated with a magnets having a "south" polarity on the ring 662 as shown in FIG. 26C to form the magnetic coupling 665. In alternate embodiments, the magnets may have any suitable configuration such that a magnetic coupling is formed between the ring 662 and the linkage 663.

The arm 660 may be rotated as a unit by rotating coaxial rings 661 and 662 by substantially equal amounts in the same direction. Radial extension of the arm 660 may be controlled by rotating coaxial rings 661 and 662 simultaneously in the same direction by unequal amounts (e.g. clockwise rotation of rings 641, 642 rotates the arm 640 in a clockwise direction about, for example, a center of rotation of the rings). Referring now to FIG. 26B, the radial extension of the single end effector arm 660 with actuation rings driven by a magnetic coupling with substrate S thereon is depicted in phased form in six different positions along direction P. Beginning with the upper left diagram in FIG. 26B for exemplary purposes only, the arm 640 is shown in a substantially retracted configuration. As both coaxial rings 661, 662 are rotated simultaneously in the same direction (in this example the rings are rotated in a clockwise direction) by unequal amounts, the revolute joint 666 travels along, for example, the circumference of the ring 661. By rotating ring 662 at a different rate than ring 661 the magnetic coupling 665 causes the arm linkage 663 to rotate in a counterclockwise direction relative to the revolute joint 666. The combined rotation of the rings 661, 662 causes the extension and rotation of the arm linkage 663 along the path of travel P. As described above the end effector 664 is constrained by band arrangement 668 such that as the linkage 663 extends the end effector 664 remains longitudinally aligned with the path of travel P in a manner substantially similar to that described above with respect to FIG. 23A. For example, as the arm linkage 663 rotates counterclockwise relative to the revolute joint 666, the band arrangement 668 is configured to rotate the end effector 664 clockwise relative to revolute joint 667. The rotation of the forearm 664 counteracts rotation of the linkage 663 and the forearm remains longitudinally aligned with the path of travel P as can be seen in FIG. 26B.

Figure 27A:
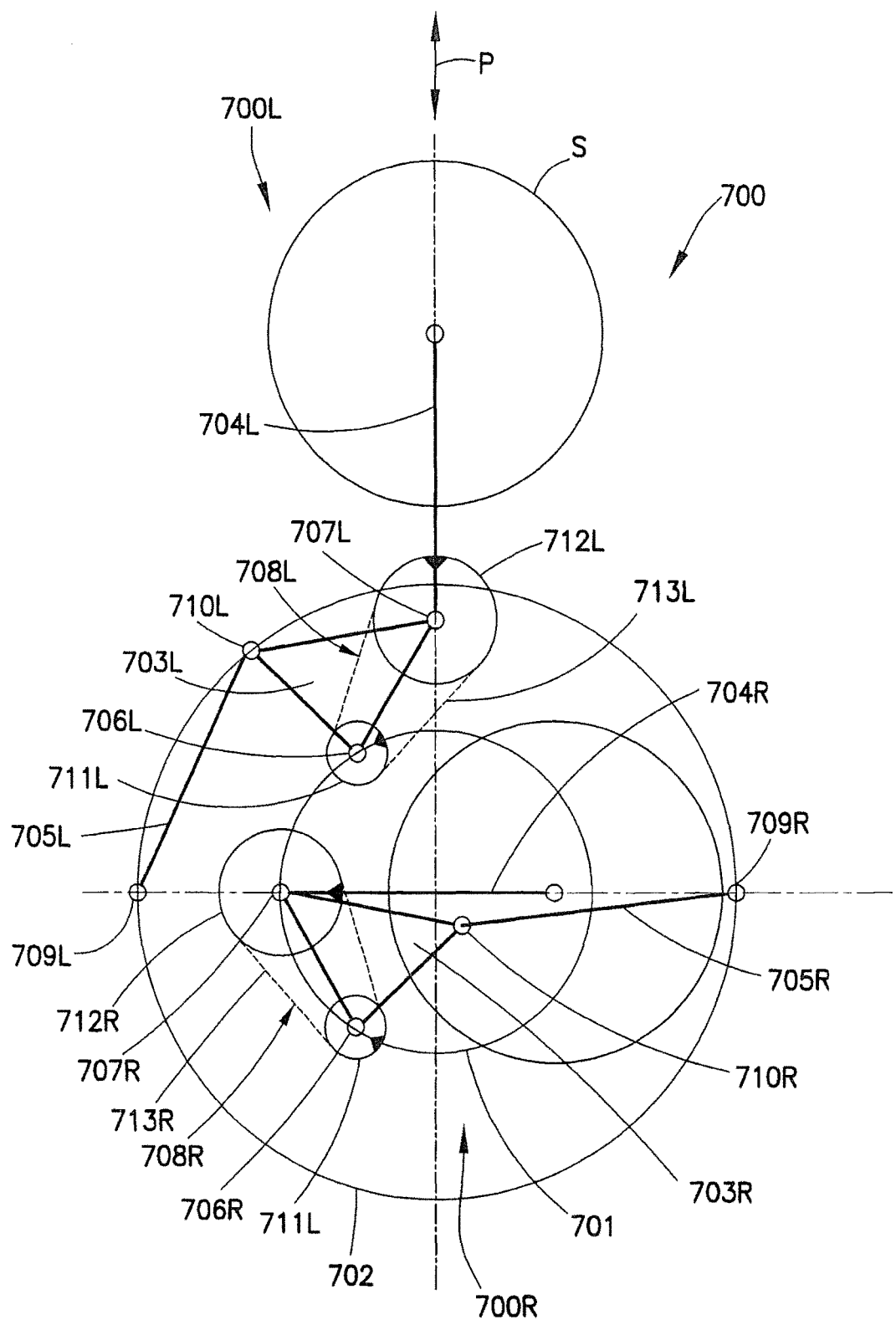

Referring now to FIG. 27A, a dual end effector arm arrangement 700 with actuation rings driven at least in part by, for example, a triangular multi-linkage is illustrated. In this embodiment, the dual end effector arm arrangement 700 is connected to a pair of independently actuated coaxial rings 701 and 702. The left hand side arm 700L includes a primary linkage 703L, an end effector 704L and a secondary linkage 705L. A substrate S is shown on the end effector 704L for exemplary purposes. The primary linkage 703L is coupled to ring 701 through revolute joint 706L. The arrangement of the triangular linkage 703L shown in FIG. 27A is merely exemplary and alternate embodiments the linkage may have any other suitable shape. End effector 704L is coupled to the primary linkage 703L through revolute joint 707L, and constrained to point radially by band arrangement 708L. The band arrangement 708L includes a drive pulley 711L that is fixedly coupled to ring 701 such that as ring 701 rotates the pulley 711L rotates with it without any relative motion between the two. Driven pulley 712L is fixedly coupled to the end effector 704L such that as the end effector 704L rotates the pulley 712L rotates with it. The pulleys 711L, 712L are coupled together by band 713L. The band arrangement and belt may be substantially similar to and operate in a substantially similar manner as band arrangement 608 in FIG. 23A so that as the arm is extended the rotation of the end effector 704L is slaved to the ring 711L and remains substantially longitudinally aligned with a path P as the arm 700L is extended and retracted. In alternate embodiments the end effector 712L can be slaved to the ring 711L in any suitable manner. Secondary linkage 705L is coupled at one end to coaxial ring 702 and at the other opposite end to primary linkage 703L through revolute joints 709L and 710L respectively.

Similarly, the right hand side arm 700R includes a primary linkage 703R, an end effector 704R, a band arrangement 708R and a secondary linkage 705R. The primary linkage 703R is coupled to coaxial ring 701 through revolute joint 706R. End effector 704R is coupled to the primary linkage 703R through revolute joint 707R, and constrained to point radially by band arrangement 708R. The band arrangement 708R includes a drive pulley 711R fixedly coupled to ring 701, a driven pulley 712R fixedly coupled to end effector 704R and a band 713R coupling the pulleys 711R, 712R. The band arrangement 708R may be substantially similar to band arrangement 708L described above. Secondary linkage 705R is coupled at one end to coaxial ring 702 and at the other opposite end to primary linkage 703R through revolute joints 709R and 710R respectively.

In this embodiment, by way of example, when one of the arms 700L or 700R extends radially, the other arm 700R or L rotates within a specified swing radius close to its retracted configuration. As may be realized, the arm 700 can be rotated as a unit by rotating coaxial rings 701, 702 in the same direction at substantially the same rotational speed (e.g. clockwise rotation of rings 701, 702 rotates the arms 700L, 700R in a clockwise direction about, for example, a center of rotation of the rings). One of the arms 700L or 700R may be extended by rotating, for example, ring 701 while ring 702 rotates a minimal amount. In alternate embodiments the ring 702 may remain substantially stationary or move any suitable amount to extend one of the arms. The arm 700L, 700R that is extended depends on the direction of rotation of ring 701 from the retracted or neutral position of the arms 700R, 700L. For example, in this exemplary embodiment, if both arms 700R, 700L are retracted and ring 701 is rotated clockwise, arm 700L will be extended while arm 700R is rotated in a substantially retracted configuration within a predetermined swing radius. If the ring 701 is rotated counterclockwise from the retracted position of the arms 700R, 700L, the arm 700R will be extended while arm 700L is rotated in a substantially retracted configuration within a predetermined swing radius.

Referring also to FIG. 27B, the radial extension of the left arm 700L of the dual end effector arm with actuation rings driven, at least in part, by a triangular multi-linkage with substrate S thereon is depicted in phased form in six different positions along direction P. Beginning with the upper left diagram in FIG. 27B, for exemplary purposes only, the left and right arms 700L, 700R are shown in a substantially retracted configuration. In this example, to extend arm 700L ring 701 is rotated in a clockwise direction (the direction of arrow A1) so that revolute joint travels along the circumference of ring 701. The ring 702 may initially rotate counterclockwise (in the direction of arrow A2) such that the secondary linkage 705L pulls on and rotates the primary linkage about revolute joint 706L in a counterclockwise direction. The ring 702 may continue to rotate in a counterclockwise direction until the ring 701 can maintain the counterclockwise rotation of the primary linkage 703L via its own rotation in the clockwise direction. Once the ring 701 is able to sufficiently rotate the primary linkage 703L in the counterclockwise direction, the ring 702 may rotate clockwise (in the direction of arrow A3) to obtain a maximized extension of the arm 700L. It is noted that secondary linkage 705L constrains the primary linkage 703L at revolute joint 710L to effect, in part, the rotation of the primary linkage 703L about revolute joint 706L during extension and retraction of the arm 700L. As described above, the rotation of the end effector 704L is slaved to the ring 701 through and arrangement 708L in a manner substantially similar to that described above with respect to FIGS. 23A and 23B so that as the arm is extended the end effector 704L remains substantially longitudinally aligned with the path of extension P.

Still referring to FIGS. 27A and 27B the rotation of arm 700R in a substantially retracted configuration (during the extension of arm 700L) will now be described. As the ring 701 rotates in the clockwise direction the revolute joint 706R travels along the circumference of the ring 701. As the revolute joint 706R is moved along the circumference of ring 701 the primary linkage 703R is constrained by secondary linkage 705R such that the secondary linkage 705R pulls on the primary linkage 703R at revolute joint 710R. The pulling action of the secondary linkage 703R via the rotation of ring 701 (and ring 702) causes rotation of the primary linkage 703R about revolute joint 706R in a clockwise direction such that there is little or no relative movement between the primary linkage 703R and the ring 701. Because there is little or substantially no relative movement between the primary linkage 703R and the ring 701 slaved end effector 704R of arm 700R remains in a substantially retracted position while the arm is rotated (clockwise) substantially about a center of rotation of the rings 701, 702 within a predetermined swing radius.

As described above, the direction of rotation of the rings 701, 702 from the retracted position of the arms as shown in the upper left diagram in FIG. 27B determines which arm is extended. As described above the simultaneous rotation of ring 701 in the direction A1 and ring 702 in the direction of A2 from the neutral position causes arm 700L to extend. Conversely, the rotation of the rings 701, 702 in the opposite manner from the neutral position causes the arm 700R to extend. The extension of arm 700R while arm 700L is rotated in a substantially retracted position is effected in substantially the same manner as described above with respect to the extension of arm 700L and rotation of arm 700R. As such, the links shown in FIGS. 27A, 27B are configured to transfer the extension motion from one arm to the other at the neutral or retracted position. For example, referring the lower right diagram of FIG. 27B, the arm 700L is shown in a substantially extended configuration. To retract the arm 700L the ring 701 is rotated in the direction of A2 (counterclockwise) and ring 702 is rotated in the direction of A1 (clockwise). The retraction of arm 700L, as can be seen in FIG. 27B occurs in a substantially opposite manner than that described above with respect to the extension of the arm 700L. When the arm 700L is retracted to the neutral position the rings 701, 702 may continue to rotate, such as during a fast substrate swap. During the continued rotation of the rings 701, 702 in opposite directions, the links 703L, 705L, 703R, 705R cause a transfer of extension motion so that arm 700R is extended while arm 700L rotates in a substantially retracted configuration within the predetermined swing radius. As may be realized, the extension of arm 700R while arm 700L is rotated in a substantially retracted position is effected in substantially the same manner as described above with respect to the extension of arm 700L and rotation of arm 700R.

Figure 28A:
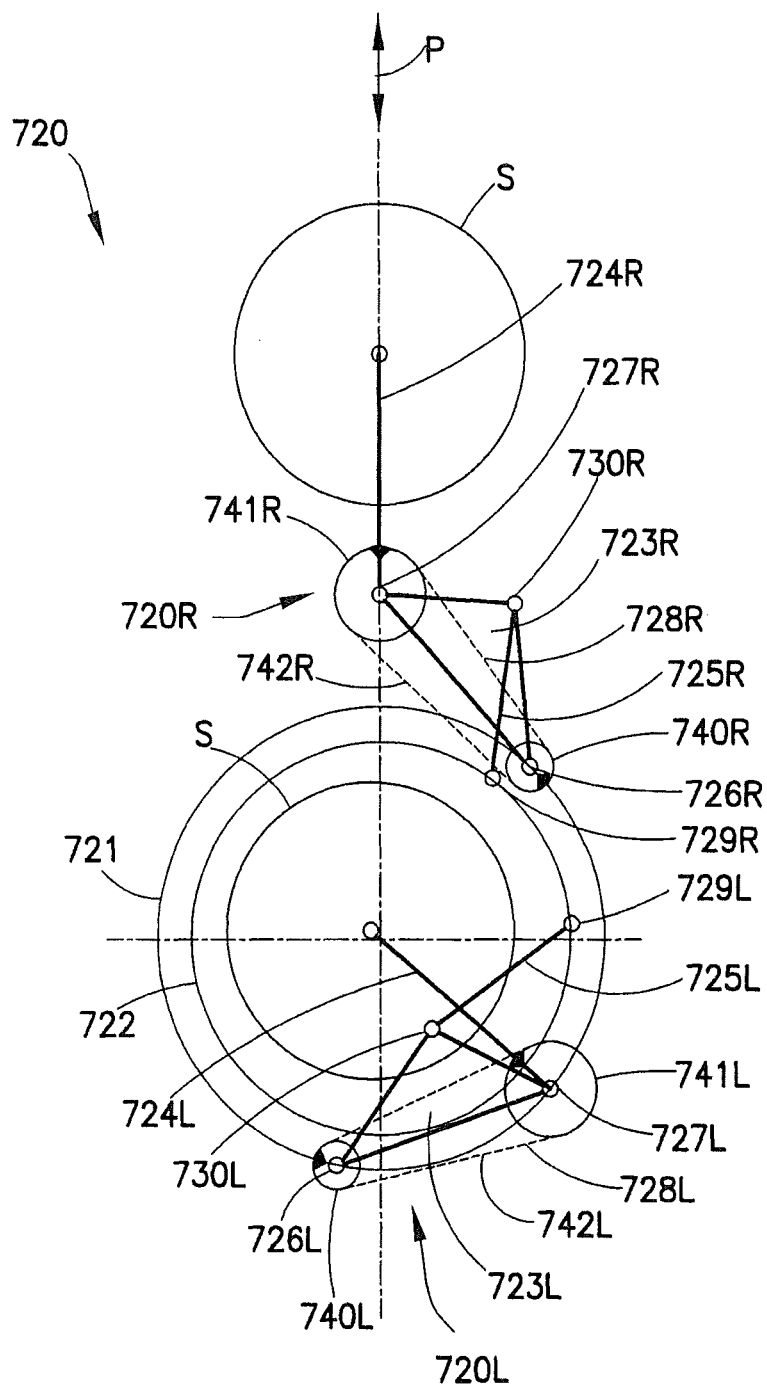
FIGS. 28A-B illustrate a kinetic diagram and a phased motion radial extension diagram of a dual end effector arm with independently actuated coaxial rings driven by a linkage with a different geometric configuration.

Referring now to FIG. 28A, a dual end effector arm arrangement 720 with actuation rings driven for example by a triangular multilinkage in a different geometric configuration with respect to FIGS. 27A-B is illustrated. This geometric configuration results in substantially different kinematic characteristics of the mechanism. In this embodiment, the dual end effector arm arrangement 720 is connected to a pair of independently actuated coaxial rings 721 and 722. The left hand side arm 720L includes a primary linkage 723L, an end effector 724L and a secondary linkage 725L. A substrate S is shown on the end effector 724 for exemplary purposes. The arrangement of the triangular linkage 723L shown in FIG. 28A is merely exemplary and alternate embodiments the linkage may have any other suitable shape. The primary linkage 723L is coupled to one coaxial ring 721 through revolute joint 726L. End effector 724L is coupled to the primary linkage 723L through revolute joint 727L, and constrained to point radially by band arrangement 728L. The band arrangement 728L includes a drive pulley 742L, a driven pulley 741L and belt 742L. The drive pulley 740L may be fixedly coupled to ring 721 such that as ring 721 rotates the pulley 742L rotates with it without any relative motion between the two. Driven pulley 741L may be fixedly coupled to the end effector 724L such that as the end effector 724L rotates the pulley 741L rotates with it. The pulleys 740L, 741L are coupled together by band 742L. The band arrangement and belt may be substantially similar to and operate in a substantially similar manner as band arrangement 608 in FIG. 23A so that as the arm is extended the rotation of the end effector 724L is slaved to the ring 721L and remains substantially longitudinally aligned with a path P as the arm 720L is extended and retracted. In alternate embodiments the end effector 724L can be slaved to the ring 721 in any suitable manner. Secondary linkage 725L is coupled at one end to the other coaxial ring 722 through revolute joint 729L and at the other opposite end to the primary linkage 723L through revolute joint 730L.

Similarly, the right hand side arm 720R includes a primary linkage 723R, an end effector 724R and a secondary linkage 725R. The primary linkage 723R is coupled to coaxial ring 721 through revolute joint 726R. End effector 724R is coupled to the primary linkage 723R through revolute joint 727R, and constrained to point radially by band arrangement 728R. The band arrangement 728R includes a drive pulley 740R fixedly coupled to ring 721, a driven pulley 741R fixedly coupled to end effector 724R and a band 742R coupling the pulleys 740R, 741R. The band arrangement 728R may be substantially similar to band arrangement 728L described above. Secondary linkage 725R is coupled at one end to coaxial ring 722 through revolute joint 729R and coupled at the other opposite end to primary linkage 723R through revolute joint 730R.

Figure 28B:
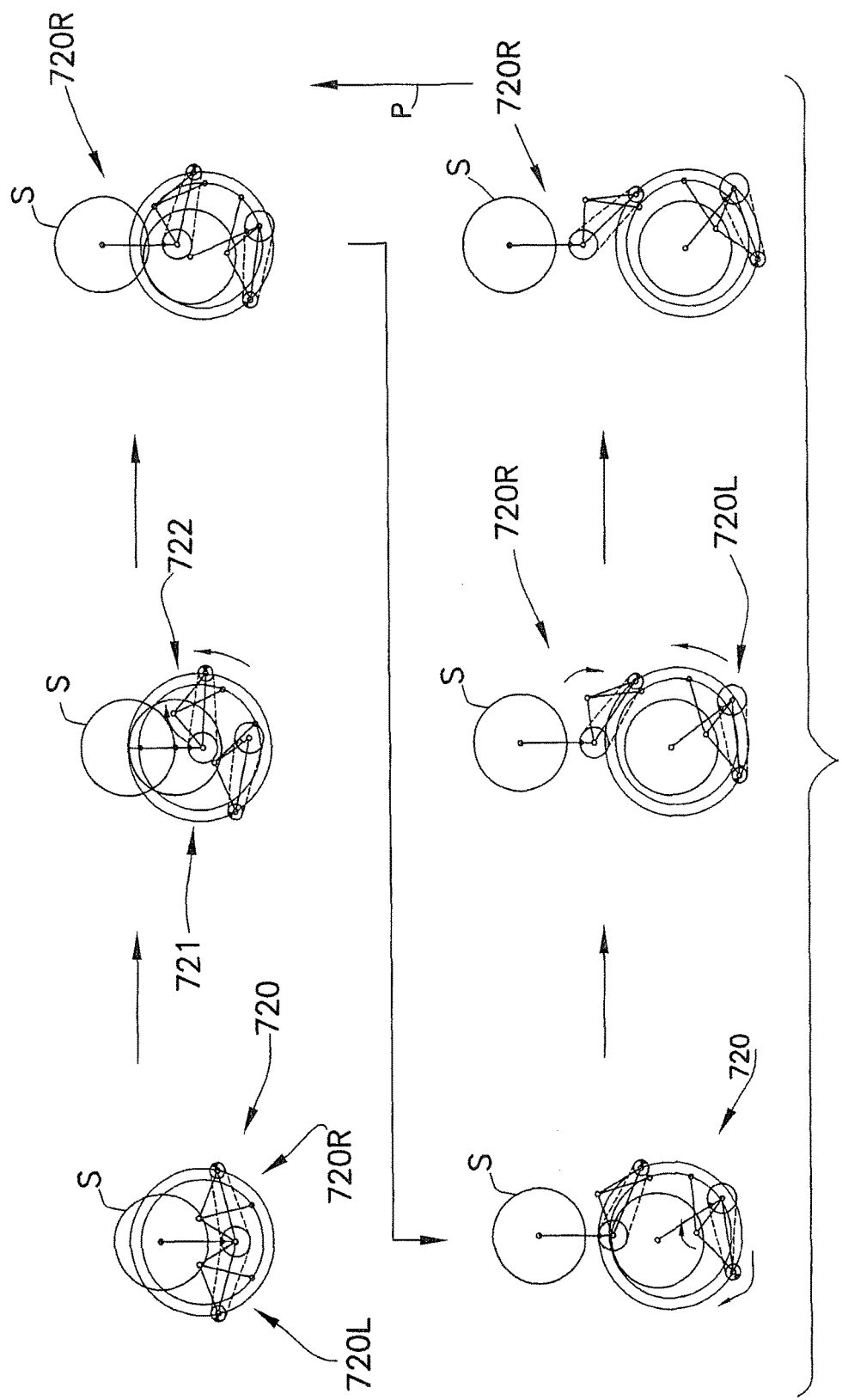

In this embodiment, by way of example, when one of the arms 720L or 720R extends radially, the other arm 720R or 720L rotates within a specified swing radius in substantially its folded or retracted configuration. Referring now to FIG. 28B, the radial extension of the left arm 720L of the dual end effector arm with actuation rings driven by a triangular multilinkage with substrate S thereon is depicted in phased form in six different positions along direction P. In this exemplary embodiment the dual arm assembly 720 can be rotated as a unit (i.e. bot arm rotate substantially about a center of rotation of the rings 721, 722) by rotating both coaxial rings simultaneously in the same direction by equal amounts. One of the arms 720R, 720L can be extended by rotating the rings 721, 722 in the same direction by unequal amounts. As may be realized the direction of rotation of the rings 721, 722 may determine which arm is extended as will be described in greater detail below.

In this example, the radial extension of arm 720R in the P direction will be described. Starting with the diagram in the upper left corner of FIG. 28B for exemplary purposes only, the arms 720L, 720R can be seen in, for example, a substantially retracted or neutral position. In this example, to extend arm 720R the rings 721, 722 are rotated counterclockwise by unequal amounts. As can be seen in FIG. 28B ring 722 rotates through a larger angle than ring 721 to extend arm 720R. In alternate embodiments, the arms may be configured so that ring 721 is rotated a greater distance than ring 722 to extend arm 720R. As the rings 721, 722 are rotated in the same direction by unequal amounts revolute joint 726R travels along the circumference of ring 721 thereby moving the primary link 723R in the direction of extension. Also, the greater rotational speed of ring 722 causes the secondary link 725R to push on the primary link 723R at revolute joint 730R. The pushing force exerted on the primary link 723R by secondary link 725R causes the primary link 723R to rotate about revolute joint 726R in a clockwise direction further extending the primary link 723R. As described above, band arrangement constrains the movement of the end effector such that as the primary link 723R is rotated about revolute joint 726R, the end effector 724R remains longitudinally aligned with the path of travel P to pick or place the substrate S at a predetermined location.

As can be seen in FIG. 28B, as the arm 720R is extended the arm 720L rotates within a specified swing radius substantially in its retracted configuration. As the ring 721 rotates in the counterclockwise direction the revolute joint 726L travels around the circumference of the ring 721. The faster rotation rate of ring 722 causes secondary link 725L to slightly pull on the primary link 723L at revolute joint 730L. The pulling force provided by the secondary link 725L causes the primary link to rotate about revolute joint 726L in a clockwise direction. As can be seen in FIG. 28B the configuration of the primary and secondary links 723L, 725L are such that the rotation of the primary link 723L is minimized so that the arm 720L rotates about the center of the rings 721, 722 in a substantially retracted configuration within a predetermined swing radius.

As described above, the direction of rotation of the rings from the retracted position of the arms as shown in the upper left diagram in FIG. 28B determines which arm is extended. As described above the counterclockwise rotation of the rings 721, 722 from the neutral position causes arm 720R to extend. Conversely, the rotation of the rings 721, 722 in the clockwise direction from the neutral position causes the arm 720L to extend. The extension of arm 720L while arm 720R is rotated in a substantially retracted position is effected in substantially the same manner as described above with respect to the extension of arm 720R and rotation of arm 720L. As such, the links shown in FIGS. 28A, 28B are configured to transfer the extension motion from one arm to the other at the neutral position. For example, referring the lower right diagram of FIG. 28B, the arm 720R is shown in a substantially extended configuration. To retract the arm 720R the rings 721, 722 are rotated in a clockwise direction by unequal amounts. The retraction of arm 720R, as can be seen in FIG. 28B occurs in a substantially opposite manner than that described above with respect to the extension of the arm 720R. When the arm 720R is retracted to the neutral position the rings 721, 722 may continue to rotate in the clockwise direction, such as during a fast substrate swap. This during the continued rotation of the rings 721, 722 in the clockwise direction, the links 723R, 725R, 723L, 725L cause a transfer of extension motion so that arm 720L is extended while arm 720R rotates in a substantially retracted configuration within the predetermined swing radius.

The single and dual end effector arms described above and depicted in FIGS. 23A-28B may have alternative configurations. For example, each of the end effector arms, which are depicted in their left hand configurations, may be alternatively depicted and described in their right hand version. Alternatively, the pair of independently actuated coaxial rings, which are exposed at the circumference of the chamber to carry the arms, may have different diameters and rotate in the horizontal plane as shown in FIGS. 23A-28B. Alternatively, the pair of independently actuated coaxial rings may have the same diameters and operate on top of each other in two parallel horizontal planes as opposed to being concentric with one another.

Referring now to FIGS. 29A-29D a schematic illustration of a substrate transport apparatus 3800 is shown in accordance with an exemplary embodiment. The transport 3800 has a radius arm configuration (e.g. the upper arm portions of each of the arms rotate about an axis as a unit) and includes a manipulator having independently moveable arms 3801, 3802 that are coupled to a mechanical switch mechanism to allow the two or more arms to have combined rotational and independent pick/place motion (e.g. each arm has two or more degrees of freedom with at least one degree of freedom of each arm substantially independent of the degrees of freedom of the other arms) with as few as two independently controllable motors as will be described in greater detail below.

The mechanical motion switch may be integrated into and/or housed by any suitable portion or portions of the transport 3800 such as, for example, the upper arm 3810 of the transport. At least a portion of the mechanical motion switch and/or a portion of the arms may be located within a housing suitably configured to prevent particles generated by moving parts of the substrate transport 3800 from contaminating the substrates S1, S2. For example slots may be provided in the housing for the arms 3801, 3802 to pass where any openings between the slots and the arms 3801, 3802 are sealed with a flexible seal. In alternate embodiments, the housing may have any suitable configuration to prevent substrate contamination from particulate that may be generated from moving parts of the transport 3800. In still other alternate embodiments the transport 3800 may include a suitable vacuum system for collecting any particulate created by the movement of the transport 3800. In other alternate embodiments, the mechanical motion switch may not be within a housing. It is noted that while the transport 3800 is shown in the Figures as having two arms, in alternate embodiments the transport 3800 may have more than two arms.

In one exemplary embodiment the transport apparatus 3800 includes a drive section 3806 (FIG. 30A) including two drive motors for driving a respective one of drive axes T1, T2. Examples of suitable drive sections 3806 include, but are not limited to, those described herein such as, for example, those described above with respect to FIGS. 3-8 and 10. In alternate embodiments, the transport can have any suitable drive section with more or less than two drive axes/motors and can be adapted to any suitable lost motion drive mechanism or mechanical motion switch.

Figure 29A:
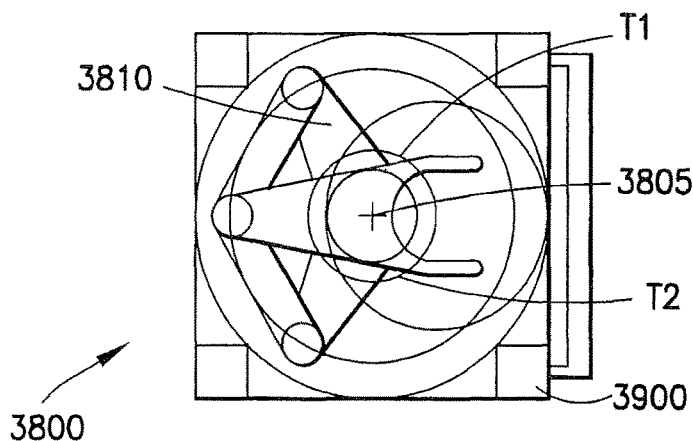
Figure 29B:
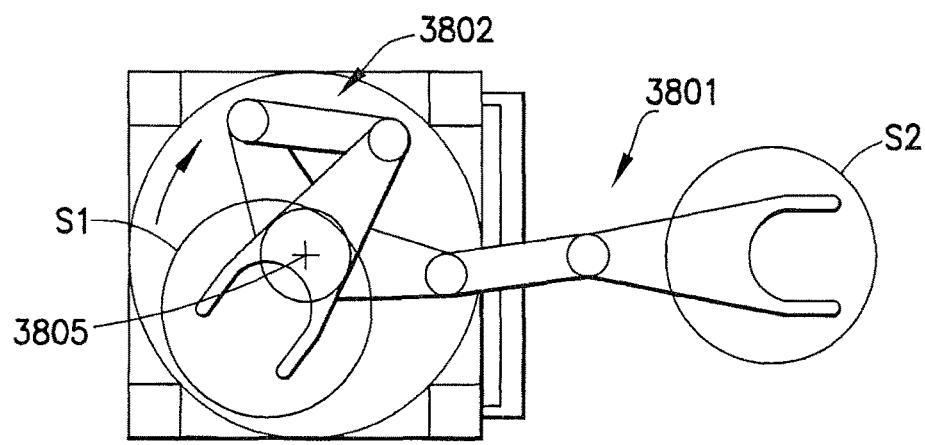
Figure 29C:
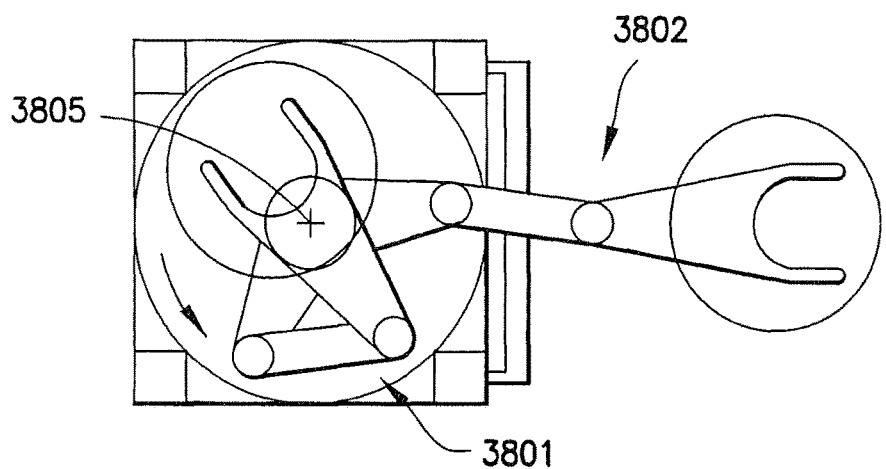
Figure 29D:
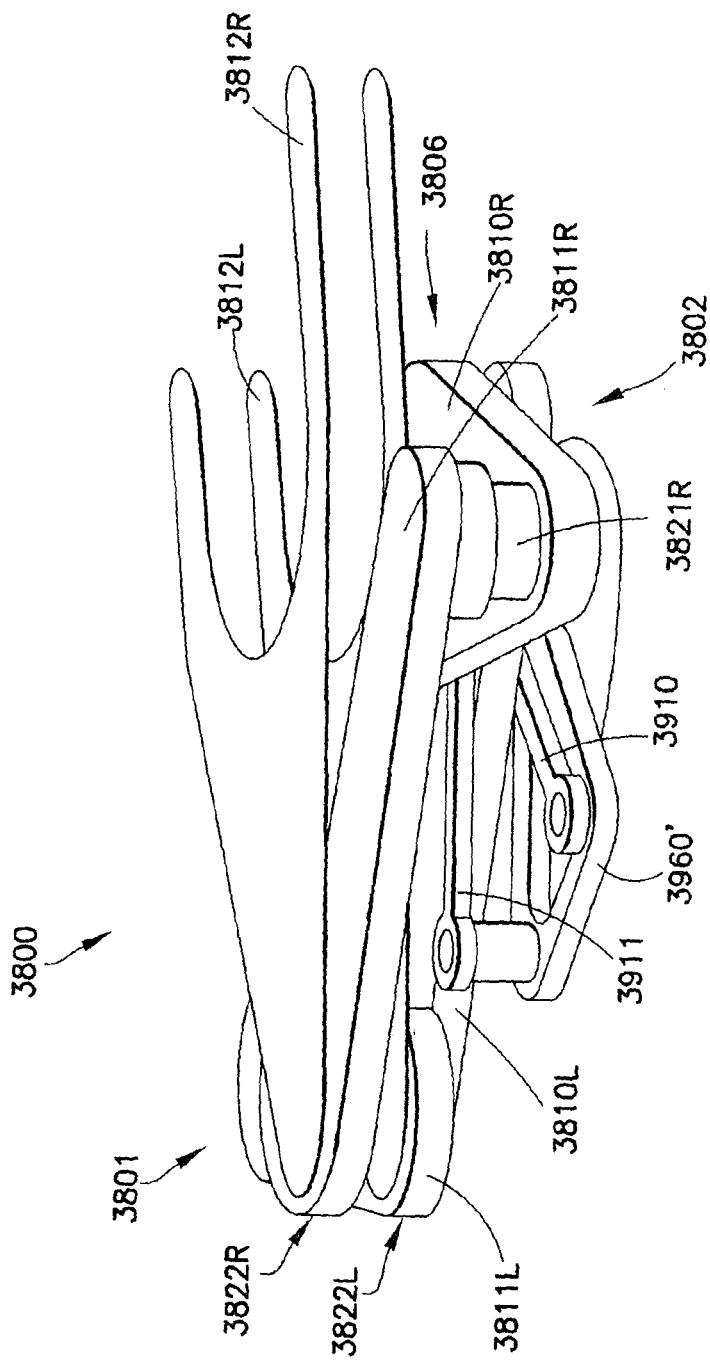

As will be described in greater detail below, rotation of drive axes T1, T2 in the same direction and at substantially the same speed results in rotation of the transport 3800 as a unit (e.g. both arms 3801, 3802 rotate together for changing a direction of extension and retraction of the arms) about a central axis of rotation 3805. Rotation of the drive axes T1, T2 in opposite directions results in the extension or retraction of one of the arms 3801, 3802 of the transport 3800 while the other one of the arms 3801, 3802 rotates about axis 3805 in a substantially retracted configuration as can be seen in FIGS. 29B and 29C. Having only two drive axes T1, T2 for effecting both the extension/retraction of the arms 3801, 3802 as well as rotation of the transport 3800 as a unit may reduce costs associated with the transport in addition to increasing the reliability of the transport. For example, having only two drive axes T1, T2 allows the number of drive motors, encoders and motor controls to be minimized. In alternate embodiments the transport apparatus 3800 may have more or less than two drive axes and any suitable number of encoders and/or motor controls.

As noted above, as few as two independently controllable motors may be used for driving axes T1, T2 of the transport apparatus 3800. In one embodiment, the motors may have any suitable configuration including, but not limited to, coaxial or side-by-side arrangements. Examples of suitable coaxial motor configurations can be found in U.S. Pat. Nos. 5,720,590, 5,899,658, 5,813,823, and 6,485,250 and/or Patent Publication Number 2003/0223853 the disclosures of which are incorporated by reference herein in their entirety. In another embodiment, the transport apparatus may have a shaftless coaxial drive system where the drive motors are integrated into the walls of, for example, a transport or vacuum chamber as described above with respect to FIGS. 3A and 4A-4D. For example, the stators of the T1, T2 drive axes may be generally linearly distributed such as in a generally arcuate manner substantially around and proximate the periphery of the transport chamber 3900. The diameter of the motors corresponding to the T1, T2 drive axes may be maximized relative to the space envelope of the transport chamber 3900, which as may be realized may be minimized to the space envelope circumscribing the clearances for the motions of the arms 3801, 3802 and substrates S1, S2 on one or more end effector(s) of the arms. As may be realized, in the exemplary embodiment, the T1 (or T2) drive axis, for example, operates to impart a force on the arms 3801, 3802 that is eccentric to the shoulder axis of rotation (e.g. revolute joint 3805) hence, by way of example the T1 drive axis output imparts a leverage force in the arms 3801, 3802 that pivots the arms about a fulcrum defined for example by shoulder joint 3805. Integrating the drive system in the walls of, for example, the transport or vacuum chambers allows, for example, the integration of vacuum system or other components (e.g. vacuum pumps, gauges, valves, etc.) to the bottom of the chamber.

As may be realized the drive of the transport apparatus 3800 may be a combination of the shaft driven and shaftless drive systems described above. As may also be realized, in one exemplary embodiment the drive motors may be coaxial with their respective drive axis T1, T2. In other exemplary embodiments the drive motors can be offset from their respective drive axis T1, T2 where a drive system (e.g. gears, belts and pulleys or other suitable drive members) transfer motor torque to the respective drive axis T1, T2.

Figure 30A:
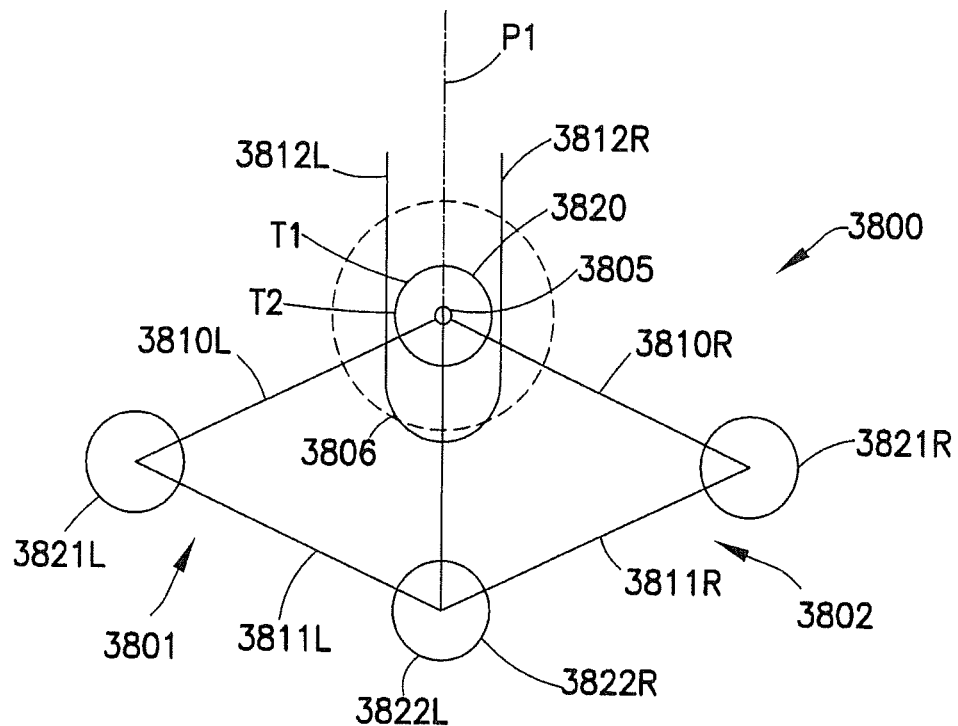
FIGS. 30A and 30B show a schematic illustration of a transport apparatus in accordance with an exemplary embodiment.
Figure 30B:
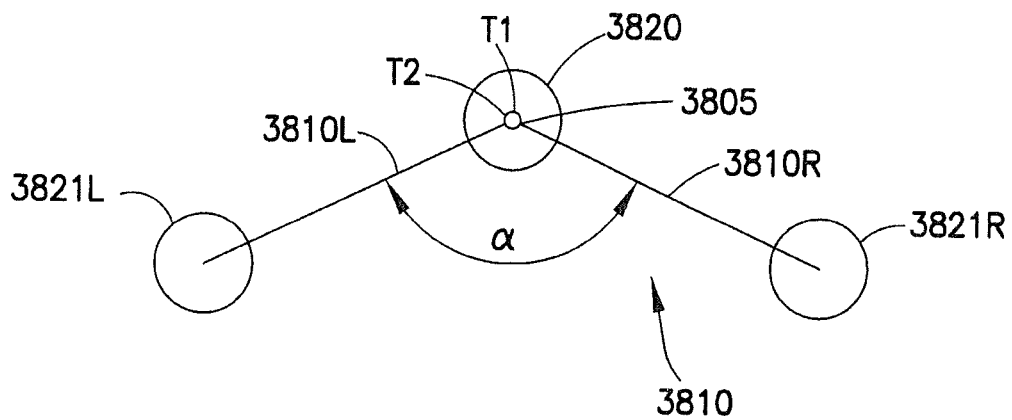

Referring also to FIGS. 30A and 30B, each arm 3801, 3802 of the transport 3800 includes an upper arm portion 3810L, 3810R, a forearm portion 3811L, 3811R and a substrate support portion or end effector 3812L, 3812R. In alternate embodiments, the arms may have more or fewer articulations. In this example the end effectors 3812L, 3812R are shown as forked shaped end effectors for transporting substrates of any size, and shape such as a 200 mm, 300 mm, 450 mm or larger semiconductor wafer, a reticle or pellicle or panel for flat screen displays. In alternate embodiments the end effector may be of an alternative shape including, but not limited to, paddle shaped. While each arm is shown having one end effector for example purposes only, in alternate embodiments each of the arms may have any number of end effectors that may be arranged, for example, side by side or stacked one above the other. In this exemplary embodiment the upper arm portions 3810L, 3810R are pivotally joined to the drive section 3806 at a shoulder joint 3820 located at the central axis of rotation 3805. In alternate embodiments the shoulder 3820 may be positioned off center (e.g. closer to a processing station) from rotational axis 3805 of the substrate transport 3800 enabling a Semiconductor Equipment and Materials International (SEMI) specified reach with arms that are smaller than conventional arms.

In this exemplary embodiment the upper arm portions 3810L, 3810R form a substantially rigid upper arm member 3810. In one embodiment the upper arm 3810 may have a substantially V-shaped or boomerang shaped profile as can be seen best in FIG. 29B. In alternate embodiments, the upper arm portions 3810L, 3810R may form any suitable shape including, but not limited to, U-shapes and rectangular shapes. The dimensions of the upper arm portions 3810L, 3810R and the angle $\alpha$ (FIG. 30B) formed by the upper arm portions 3810L, 3810R may be any suitable dimensions and angle that allow the arms 3801, 3802 to compactly fit within a transport chamber 3900 (FIG. 29) while providing a maximized reach or extension of the arm (e.g. the extension to containment ratio of the arm is maximized). In other exemplary embodiments the upper arm portions and their respective arms may form a double SCARA arm arrangement as will be described below. As can be seen best in FIG. 30B the upper arm 3810 is pivotally coupled to drive axis T2 at axis 3805 so that as the drive axis T2 rotates the upper arm 3810 rotates with it. The drive axis coupling between the upper arm 3810 and the drive axis T2 is located at any suitable point along the arm 3810 between the elbow joints 3821L, 3821R. As can be seen in FIG. 30B the elbow joints 3821L, 3821R are located substantially at opposite ends of the arm 3810. As noted above in this exemplary embodiment, the upper arm 3810 and the drive axis are joined at the shoulder joint 3820 for rotation about the axis 3805. In alternate embodiments the elbow joints 3821L, 3821R can be located at any suitable point(s) on the upper arm 3810.

In one exemplary embodiment, the upper arm member 3810 may be of a unitary construction (e.g. portions 3810L, 3810R are formed in a one-piece construction) so the elbow joints 3821L, 3821R are spatially fixed with respect to one another. In other exemplary embodiments the upper arm portions 3810L, 3810R may be separate links that are fixedly joined together using any suitable fasteners (e.g. welding, brazing, screws, adhesives, or any other suitable mechanical or chemical fastener) so that they rotate about the center of rotation 3805 as a unit. In still other embodiments the upper arm links 3810L, 3810R may be adjustably joined so the angle $\alpha$ is adjustable as described in greater detail in U.S. patent application Ser. No. 11/148,871, entitled "Dual Scara Arm" and filed on Jun. 9, 2005, the disclosure of which is incorporated by reference herein in its entirety. For example, the angle $\alpha$ may be adjusted by rotating one arm link 3810L, 3810R relative to the other arm link 3810L, 3810R about shoulder joint 3820, where when a predetermined angle $\alpha$ is reached the arm links 3810L, 3810R can be suitably locked together so they rotate as a unit about the shoulder 3820. In this example, the upper arm member 3810 is rotated about axis 3805 by a drive section motor corresponding to, for example, drive axis T2.

The forearm 3811L is pivotally coupled at elbow joint 3821L to upper arm portion 3810L while forearm 3811R is pivotally coupled at elbow joint 3821R to upper arm portion 3810R. The end effector 3812L is pivotally coupled at a wrist joint 3822L to forearm 3811L and end effector 3812R is pivotally coupled at wrist joint 3822R to forearm 3811R. Each of the end effectors 3812L, 3812R has a longitudinal axis running from the front of the end effector (the end distal from the wrist 3822L, 3822R) to the back of the end effector (the end proximate to the wrist 3822L, 3822R). In one exemplary embodiment, each arm 3801, 3802 may include an end effector coupling or drive system for driving its respective end effector 3812L, 3812R. The end effector coupling system may be any suitable coupling system. For example, the end effector coupling system may be a slaved system so that the rotation of the end effectors 3812L, 3812R about a respective wrist 3822L, 3822R depends, at least in part, on rotation of their respective upper arm portions 3810L, 3810R in a manner substantially similar to that described above with respect to, for example, FIGS. 9A-9D.

Figure 31A:
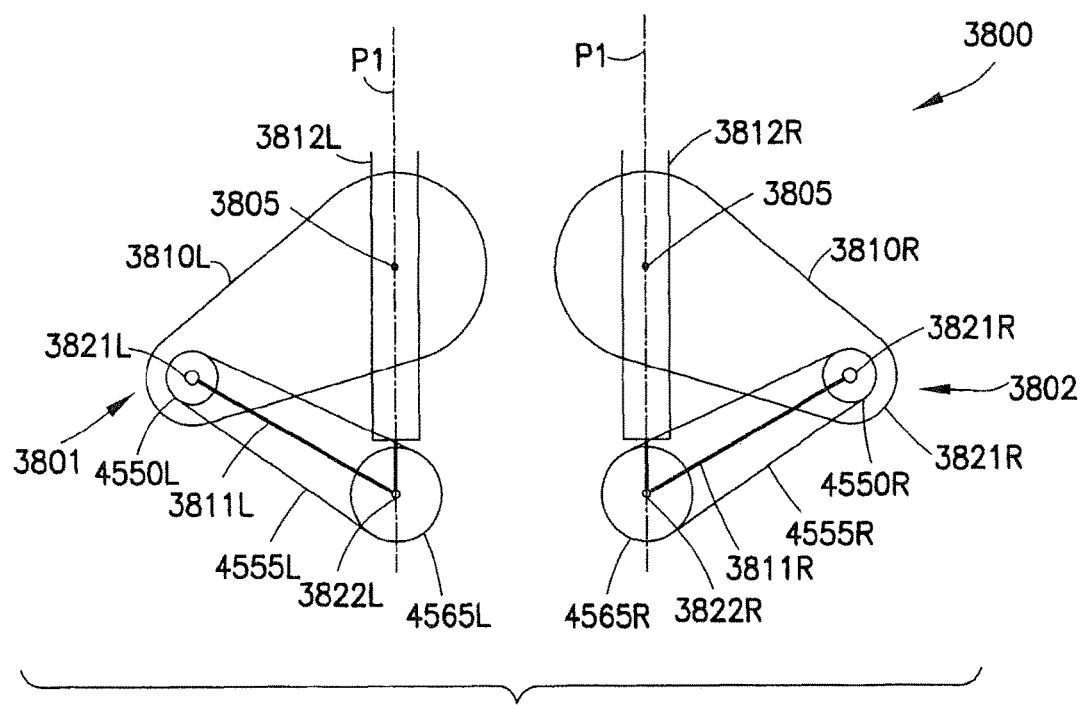

For exemplary purposes only, referring to FIGS. 31A-31C, the slaved configuration of the end effector coupling system will be described. It is noted that the arms 3801, 3802 are shown in FIGS. 31A-31C as having separate upper arms for exemplary purposes only. In the exemplary embodiment shown, the arms 3801, 3802 may include a belt and pulley system for driving the end effectors 3812L, 3812R. The belt and pulley system includes belts 4555L, 4555R and pulleys 4550L, 4550R, 4565L, 4565R. The pulleys 4550L, 4550R may be fixedly mounted to a respective upper arm portion 3810L, 3810R about elbow joints 3821L, 3821R. As the upper arm 3810 is rotated about axis 3805 and the forearms 3811L, 3811R are rotated about their respective elbow joint 3821L, 3821R (depending on which arm is being extended) the pulley 4550L, 4550R drivingly rotates a respective pulley 4565L, 4565R via the belt 4555L, 4555R for driving the end effector 3812L, 3812R so that the radial orientation or longitudinal axis of the end effector 3812L, 3812R along the common path of travel P1 is maintained as each of the arms 3801, 3802 are extended and retracted.

The pulleys 4565L, 4565R may be rotatably coupled to their respective forearms 3811L, 3811R while being fixedly coupled to their respective end effectors 3812L, 3812R about wrist joints 3822L, 3822R. In this example the ratio of pulleys 4550L, 4550R to pulleys 4565L, 4565R may be a 1:2 ratio so that as the forearms 3811L, 3811R rotate their respective end effector rotates in an opposite direction by a predetermined amount. In alternate embodiments the pulleys may have any suitable ratio for obtaining any suitable rotational characteristics of the end effectors relative to the forearm and/or upper arm. For exemplary purposes only, the end effector rotation about the wrist joint may be equal and opposite to the rotation of the forearm about the elbow joint. In alternate embodiments the forearms and end effectors may have any suitable rotational relationship(s). As can be seen in FIGS. 31A-31C, pulleys 4550L, 4550R are mounted about elbow joints 3821L, 3821R so that when the forearms 3811L, 3811R are rotated the pulleys 4550L, 4550R remain stationary with respect to their respective upper arm portions 3810L, 3810R. Any suitable belt 4555L, 4555R may connect a respective pair of the pulleys so that as the forearms 2811L, 2811R are rotated the pulleys 4565L, 4565R are drivingly rotated. In alternate embodiments, the pulleys may be connected by one or more metal bands that may be pinned or otherwise fixed to the pulleys. In other alternate embodiments, any suitable flexible band may connect the pulleys. In still other alternate embodiments, the pulleys may be connected in any suitable manner or any other suitable transmission system may be used.

The end effectors 3812L, 3812R may be coupled to a respective forearm at revolute joint 3822L, 3822R. The end effectors 3812L, 3812R may be drivingly coupled to a respective one of the pulleys 4565L, 4565R so that as one of the arms 3801, 3802 is extended or retracted the respective end effector 3812L, 3812R stays longitudinally aligned with the common path of travel P1 as can be seen in, for example, FIGS. 31B, 31C while the other arm remains in a substantially retracted configuration as will be described in greater detail below. It may be realized that the belt and pulley systems described herein may be housed within the arm assemblies 3801, 3802 so that any particles generated may be contained within the arm assemblies. A suitable ventilation/vacuum system may also be employed within the arm assemblies to further prevent particles from contaminating the substrates. In alternate embodiments, the synchronization systems may be located outside of the arm assemblies. In other alternate embodiments, the synchronization systems may be in any suitable location.

As may be realized, in the exemplary embodiment the end effectors 3812L, 3812R may travel along a common path of travel P1 and be configured in such a way so as to be in different planes along the path of travel P1. In alternate embodiments, the arms 3801, 3802 may be configured to be at different heights so that the end effectors can travel along the common path P1. In other alternate embodiments, the transport may have any suitable configuration for allowing multiple end effectors to travel along a common path of travel. In yet other alternate embodiments, the end effectors may travel along different paths that may be generally parallel or angled relative to each other. The paths may be located in the same plane. The illustrated motions of the linkages of the coupling system are merely exemplary and in alternate embodiments the linkages may be arranged to provide and undergo any desired range of motion switching from driving the arms independently of each other.

Figures 32A, 32B:
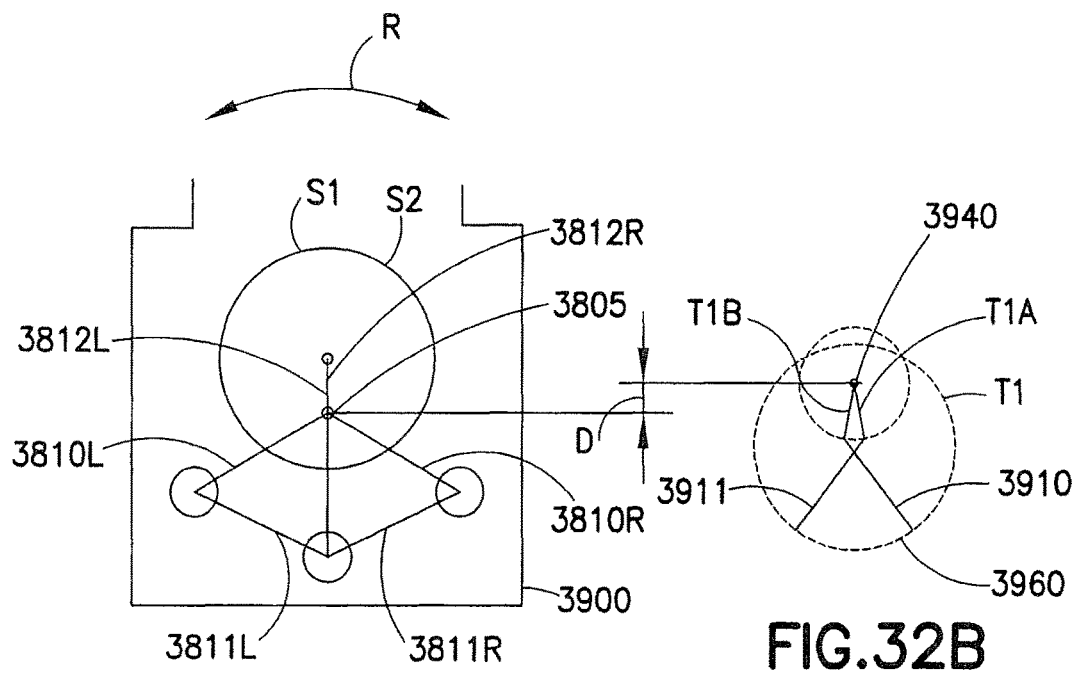
Figure 32C:
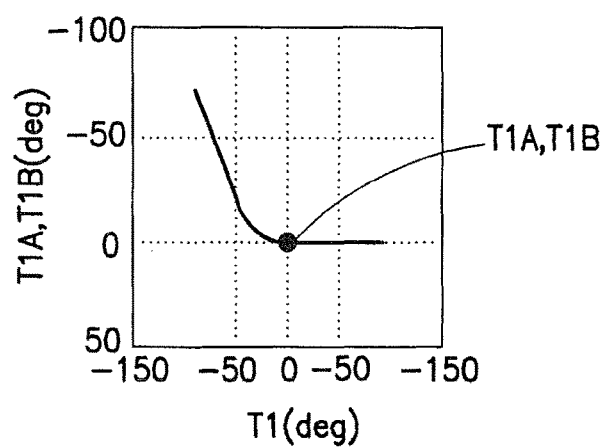

As noted above the arm drive section includes a mechanical motion switch that allows each of the arms 3801, 3802 to be extended and retracted while using a minimum number of drive axes T1, T2. It is noted that while the disclosed embodiments are described herein with respect to a coaxial drive system (i.e. center of rotation of T1 and T2 are substantially in line with each other), in alternate embodiments the drive axes T1, T2 may be located side by side or in any other suitable spatial configuration. It is noted that the drive motors for axes T1 and T2 may also be located coaxially or side by side and connected to drive axes T1, T2 in any suitable manner. For example, drive axis T2 may be located about the central axis of rotation 3805 while drive axis T1 is located at axis of rotation 3940 (FIG. 32B). The rotation of the drive links T1A, T1B can be achieved when the drive axis T1 is located at axis of rotation 3940 through suitable gearing, cams and/or belt and pulley systems so that the links T1A, T1B rotate as described herein using a single drive motor.

Referring to FIGS. 29D and 32A-32D, an exemplary mechanical motion switch will be described. In the exemplary embodiment shown in FIGS. 32A-32D the mechanical switch includes first drive links T1A, T1B, second drive links 3910, 3911 and connecting links 3920, 3921. In alternate embodiments, the mechanical switch may include any suitable number of links coupled to each other and/or to the transport arms in any suitable manner and/or configuration.

The first drive links T1A, T1B may be connected to drive axis T1 as will be described below. A first end of each of the drive links T1A, T1B may be pivotally connected to rotational axis 3940 in any suitable manner such that the links T1A, T1B are pivotable about axis 3940. In this exemplary embodiment the axis 3940 may be offset by any suitable distance D from the center of rotation 3805 of the transport 3800. In this example, the axis 3940 may lie substantially along the path of travel P1. In alternate embodiments the axis 3940 of the mechanical switch may not lie along the path of travel P1. In other alternate embodiments the mechanical switch may be configured so that the links T1A, T1B pivot about any suitable axis including, but not limited to axis 3805. The axis 3940 may be located on, for example, a base of the transport 3800 such that the axis remains rotationally fixed or stationary with respect to the axis 3805 as the arms 3801, 3802 are extended and retracted while at the same time being able to rotate about axis 3805 when the transport 3800 is rotated as a unit in the direction of arrow R.

As noted above, the mechanical switch may also include second drive links 3910, 3911. A first end of the drive link 3910 may be pivotally coupled to drive link T1B at revolute coupling 3931. A first end of the drive link 3911 may be pivotally coupled to drive link T1A at revolute coupling 3930. A second end of each of the drive links 3910, 3911 may be pivotally coupled to drive axis T1 in any suitable manner. For example in one exemplary embodiment, the drive links 3910, 3911 may be pivotally coupled to a drive platform that may have any suitable shape and configuration. For exemplary purposes the drive platform is shown as a disk shaped member 3960 in FIG. 32B and as a triangular shaped member 3960' in FIG. 29D that is coupled to drive axis T1. In alternate embodiments the drive links 3910, 3911 may be coupled to the drive axis through any suitably shaped member for transferring torque generated by the drive axis T1 to the second ends of the drive links 3910, 3911 such that the second ends rotate about axis 3805. It is noted that the drive links T1A, T1B, 3910, 3911 can have any suitable dimensions (e.g. length, cross section, etc.) for effecting the movement of the arms 3801, 3802 as described herein. As can be seen in, for example, FIGS. 32B and 32D the second drive links 3910, 3911 are arranged so that the drive links 3910, 3911 cross one another. This crossed configuration, depending on the direction of rotation of drive axes T1, T2, may allow one of the drive links 3910, 3911 to push on a respective one of drive links T1A, T1B while the other one of the drive links 3910, 3911 rotates without imparting any substantial movement onto the other one of the respective drive links T1A, T1B as will be described in greater detail below. In alternate embodiments, the drive links 3910, 3911 may have any other suitable configuration and spatial relationship.

Figure 32D:
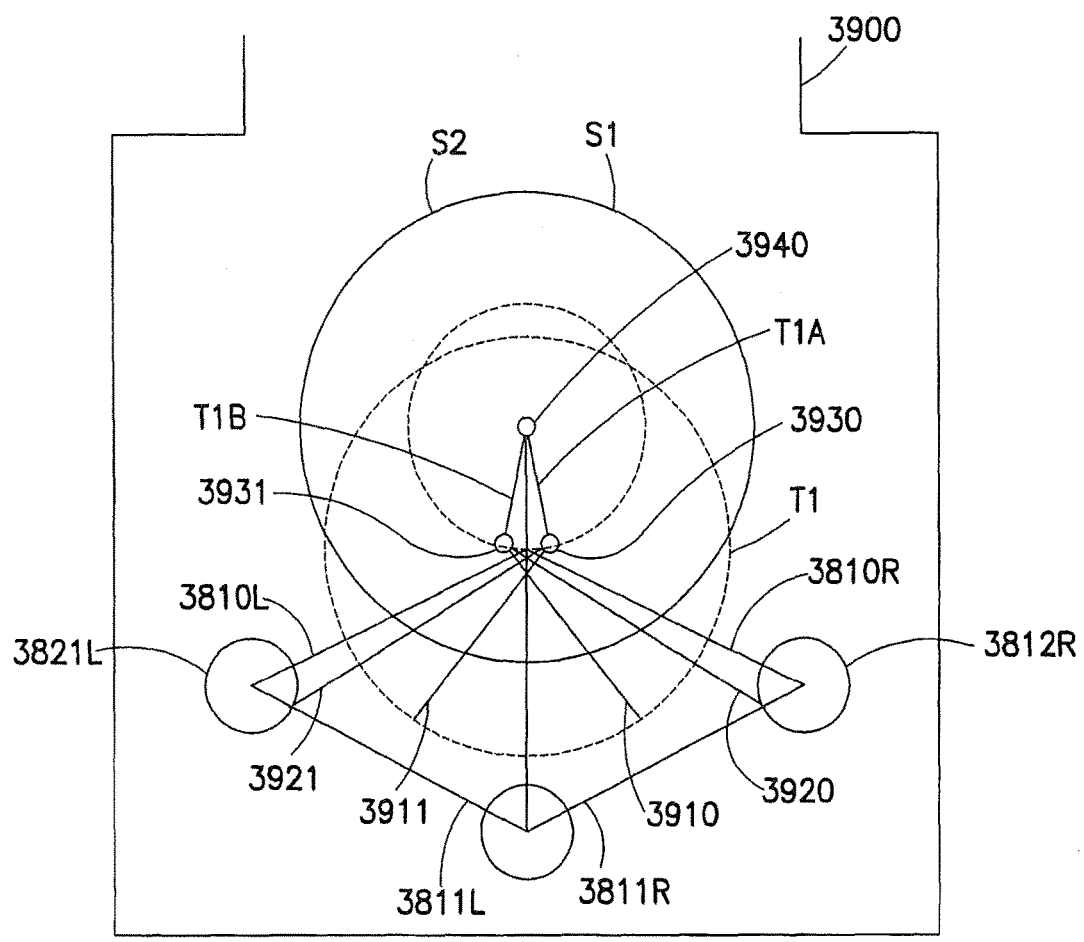
Figure 33A:
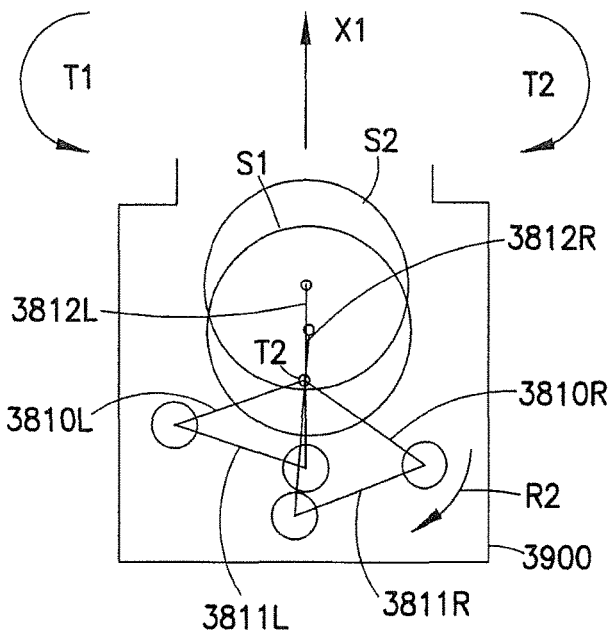
Figure 33B:
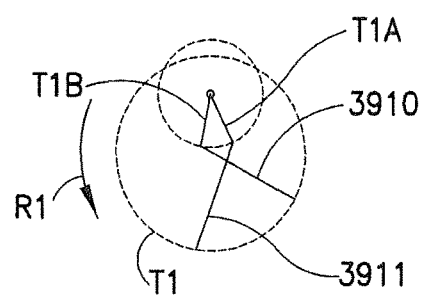
Figure 33C:
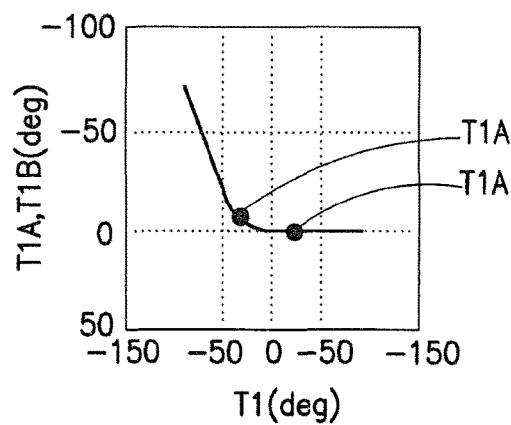
Figure 33D:
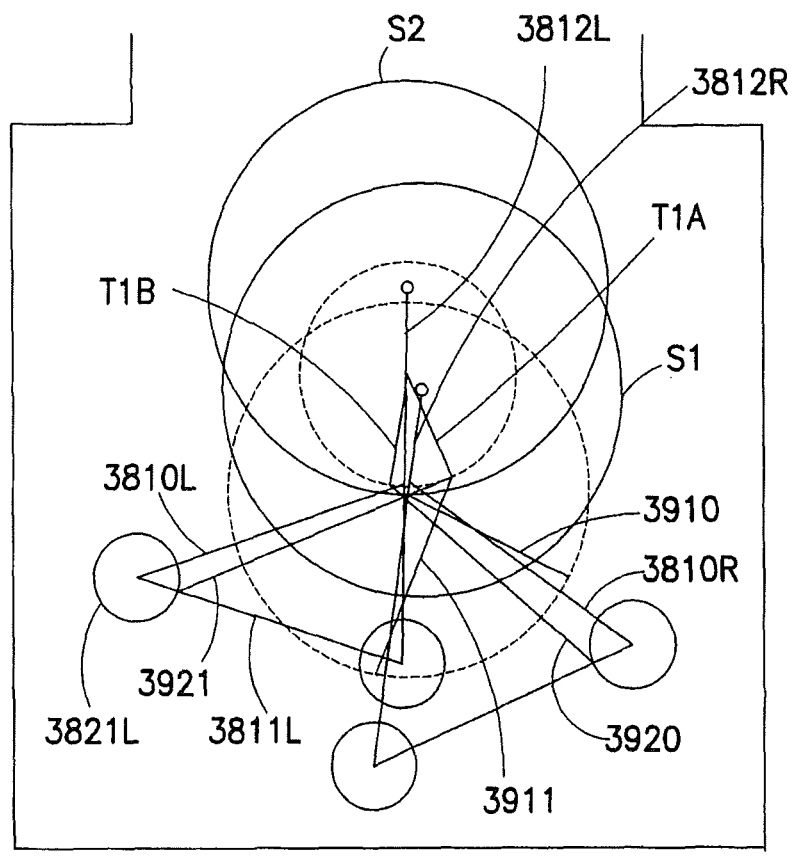
Figure 34A:
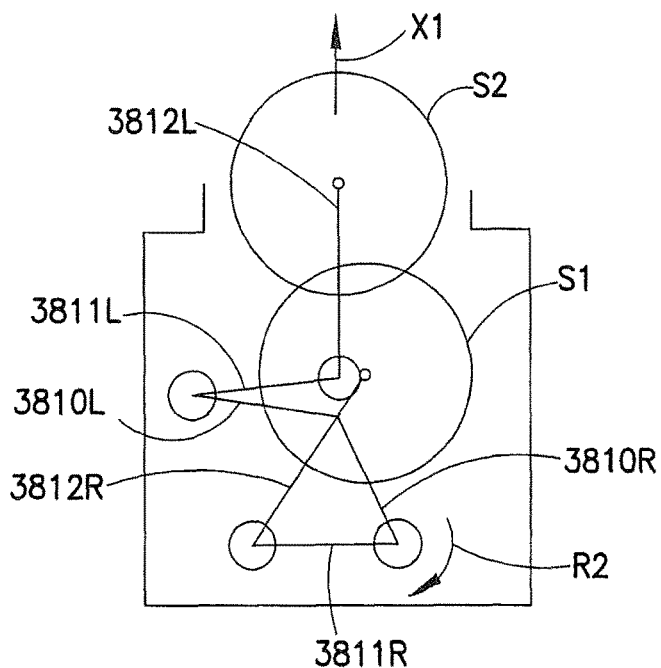
Figure 34B:
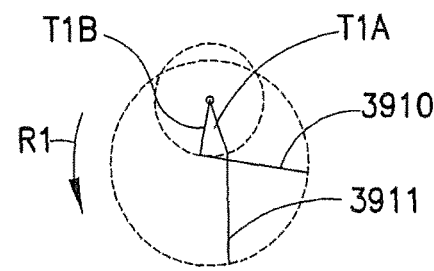
Figure 34C:
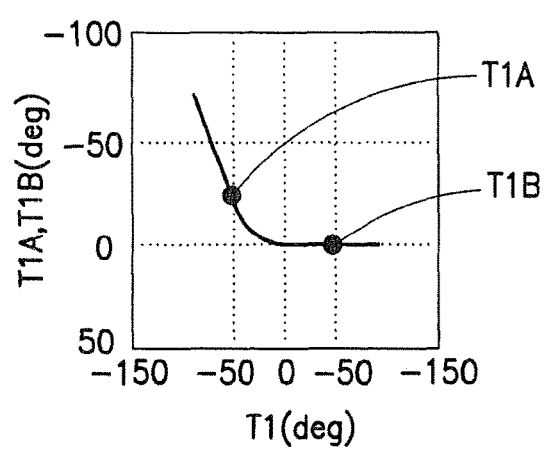
Figure 34D:
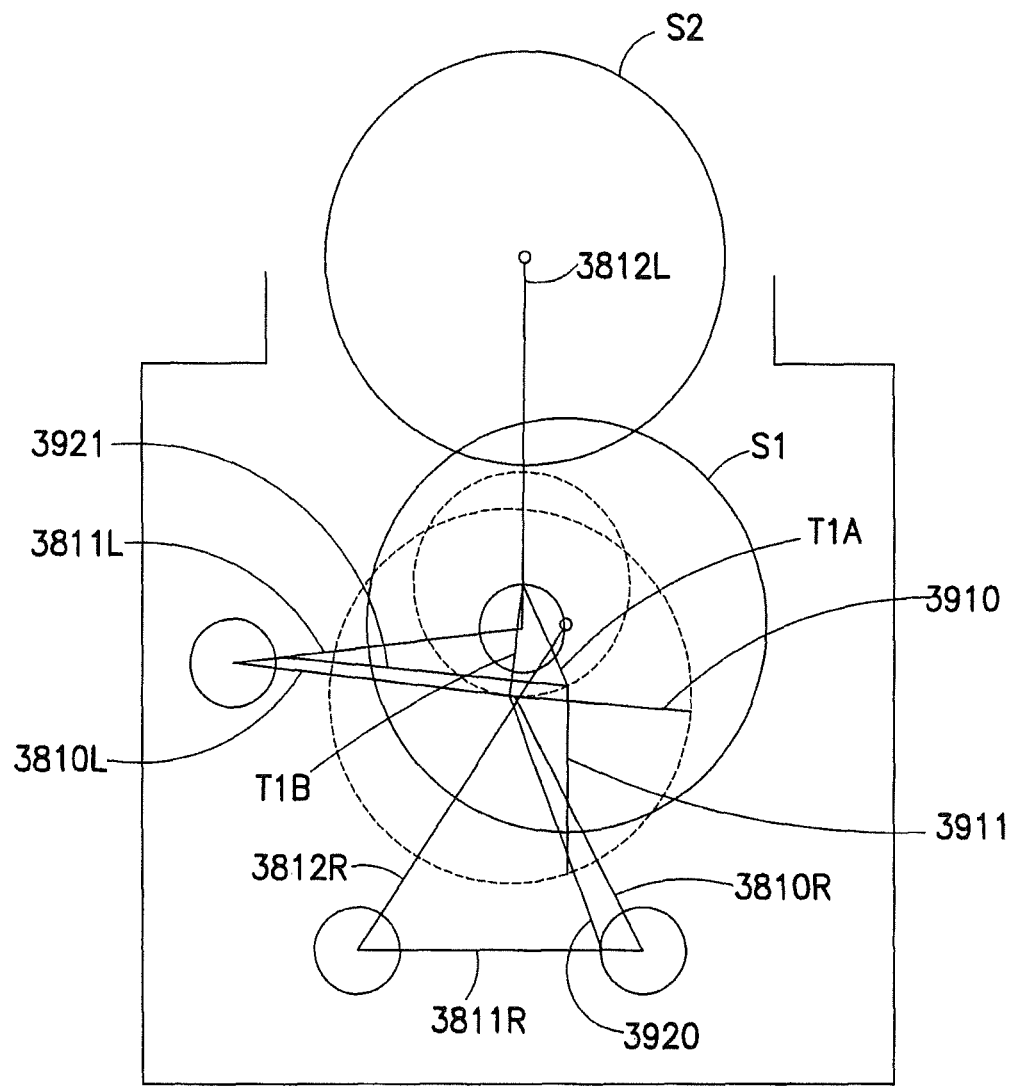
Figure 35D:
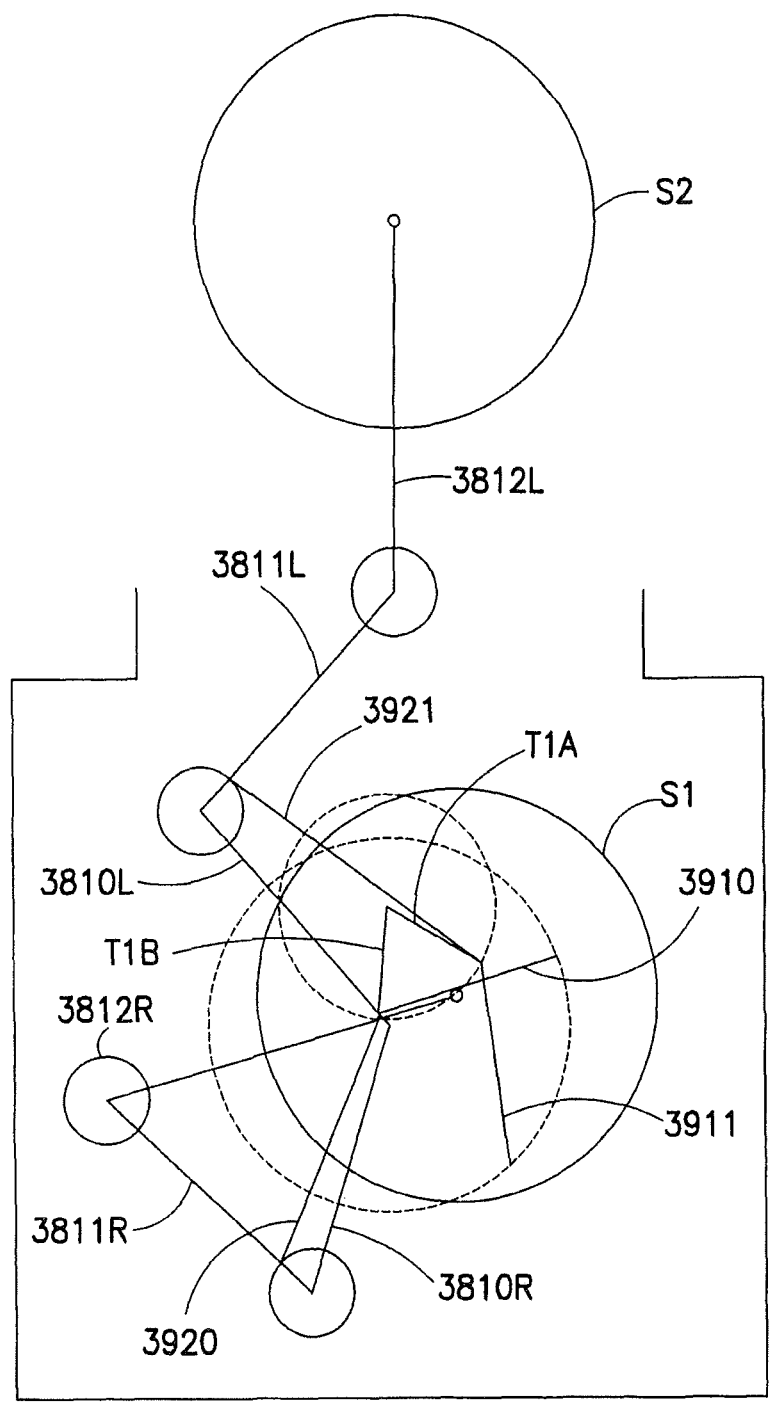
Figure 36A:
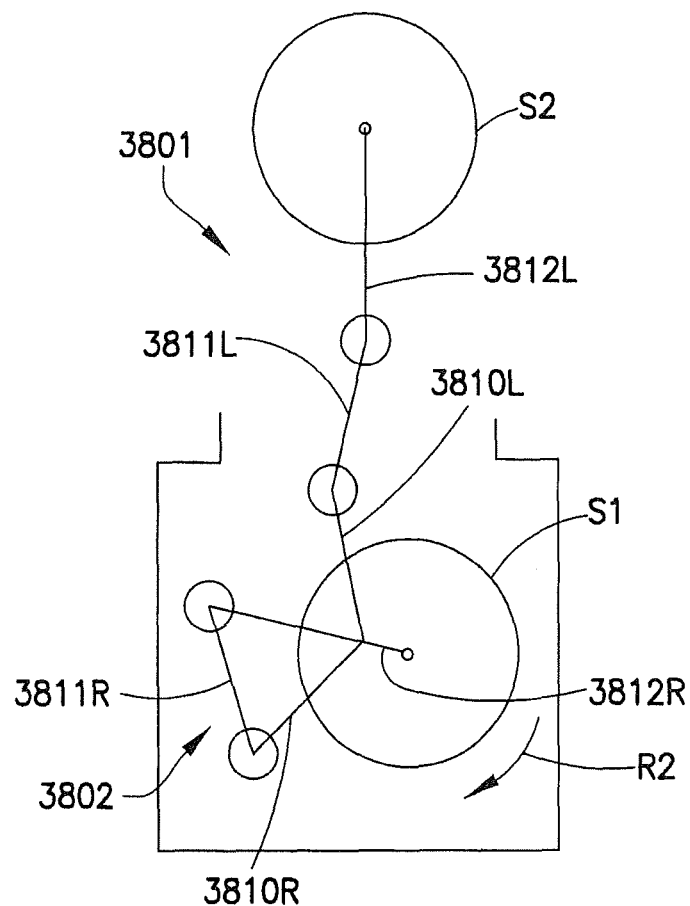
Figure 36B:
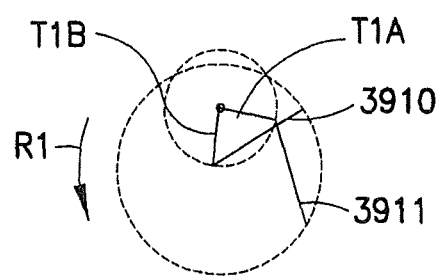
Figure 36C:
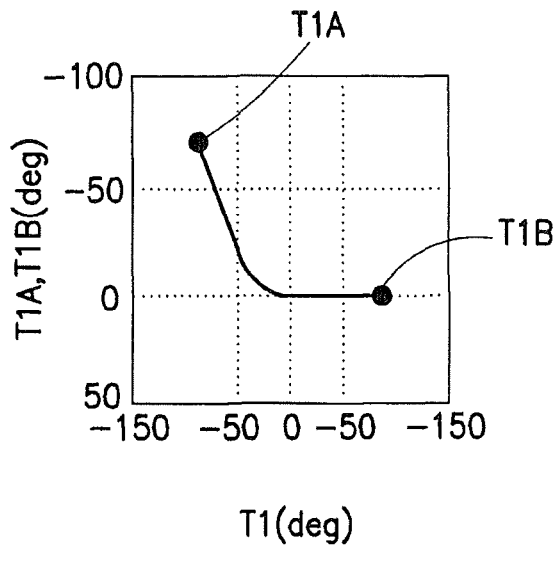

The drive links T1A, 3911, may be suitably connected to any suitable part of the arm 3801 in any suitable manner. In one exemplary embodiment, a connecting link 3921 may be pivotally joined at a first end to, for example, revolute joint 3930 while being pivotally joined at its second end to forearm 3811L as can be seen in FIG. 32D. Similarly drive links T1B, 3911 may be connected to arm 3802 through connecting link 3920. Connecting link 3920 may be pivotally joined at a first end to, for example, revolute joint 3931 while being pivotally joined at its second end to forearm 3811R. It is noted that the connections between the drive links T1A, 3910 and T1B, 3911 and their respective arms 3801, 3802 shown in the figures is merely exemplary in nature and that any suitable connecting links having any suitable shapes and sizes can be used. In alternate embodiments one or more the drive links T1A, T1B, 3910, 3911 may be connected to their respective arms in any suitable manner, such as by belts and pulleys.

Figure 29E:
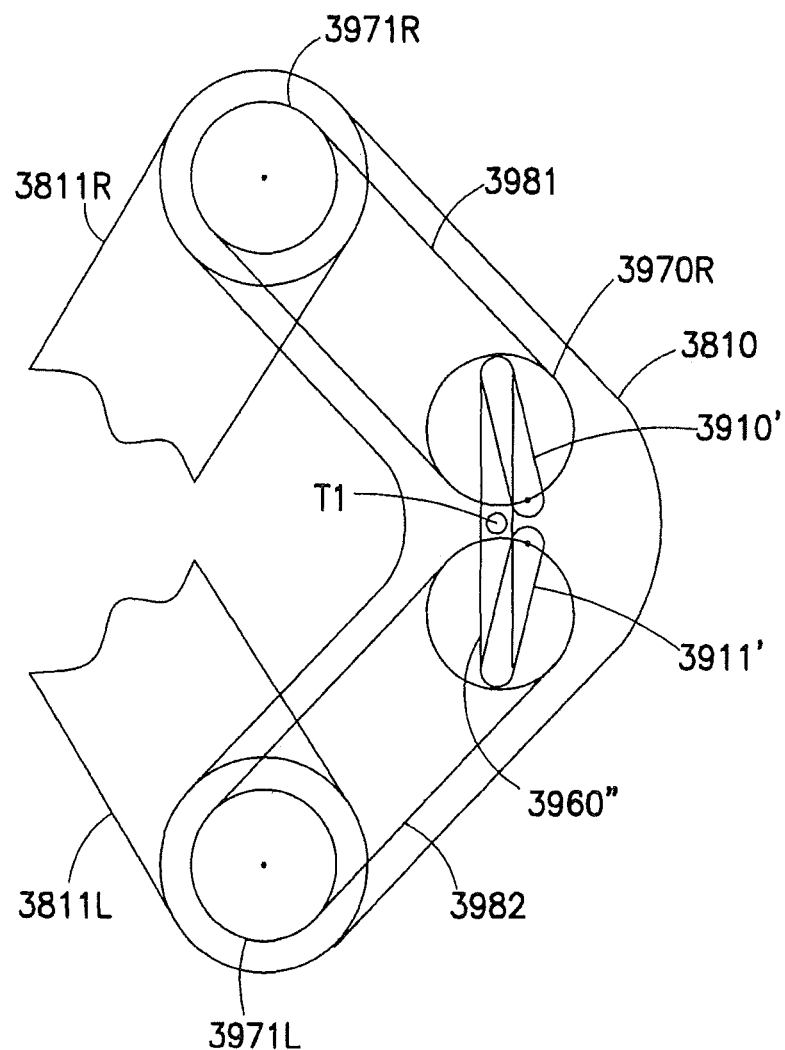
Figure 29F:
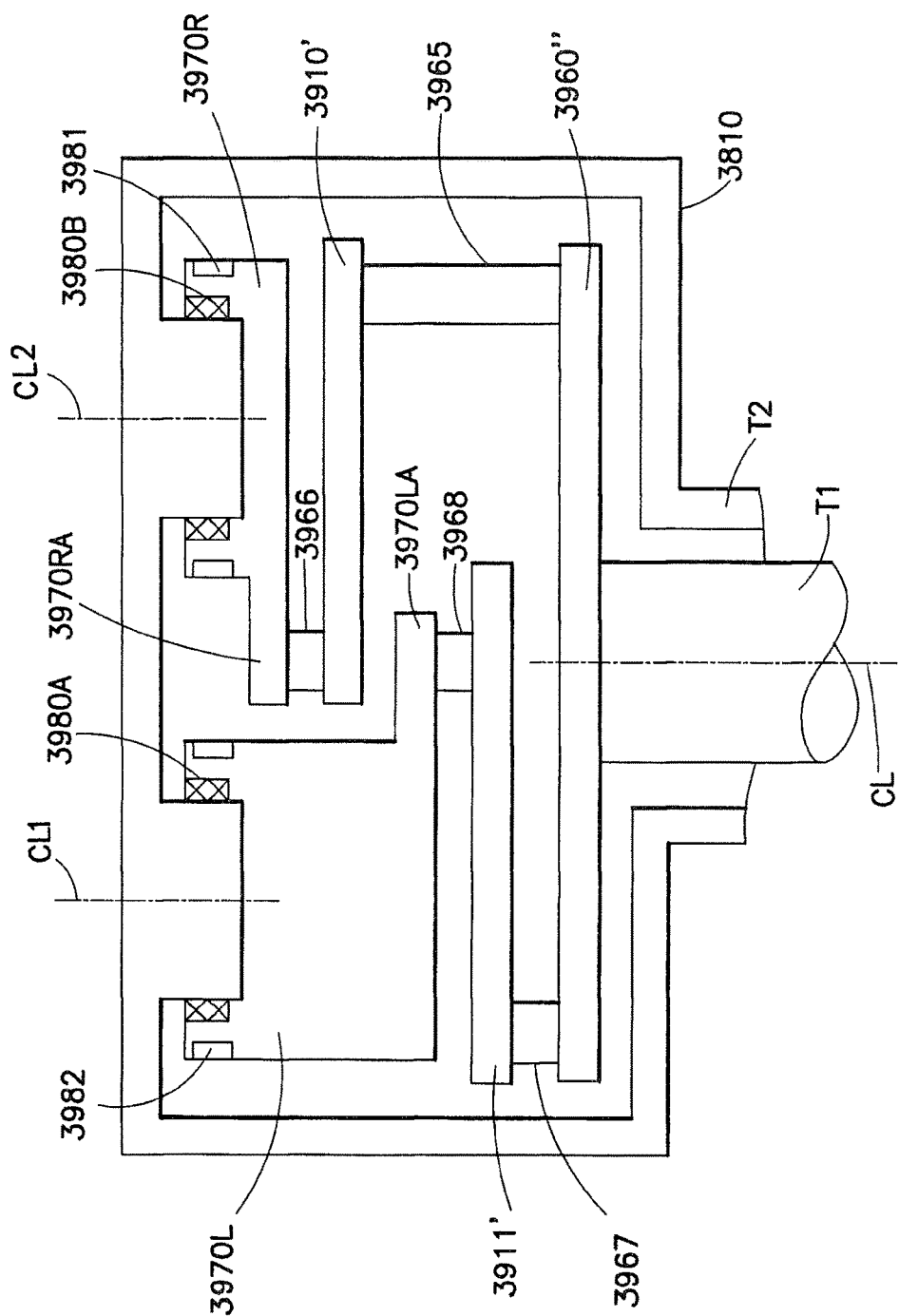

Referring to FIGS. 29E and 29F another exemplary mechanical motion switch will be described. In this example, the switch may be enclosed within the upper arm or housing 3810. The mechanical motion switch includes a drive platform 3960'' coupled to the drive axis T1 and drive links 3910', 3911'. Drive link 3910' may be rotatably coupled at a first end to a first end of the drive platform at revolute joint 3965. A second end of the drive link 3910' may be connected to forearm drive pulley 3970R in any suitable manner. For example, as can be seen in FIG. 29F the drive pulley 3970R may include an arm 3970RA that extends from the pulley such that drive link 3910' is coupled to the arm at revolute joint 3966. Drive link 3911' may be rotatably coupled at a first end to a first end of the drive platform at revolute joint 3967. A second end of the drive link 3911' may be connected to forearm drive pulley 3970L in any suitable manner. For example, as can be seen in FIG. 29F the drive pulley 3970L may also include an arm 3970LA that extends from the pulley such that drive link 3911' is coupled to the arm at revolute joint 3968. The forearm drive pulleys 3970R, 3970L may be rotatably supported within the upper arm 3810 in any suitable manner such as by bearings 3980A, 3980B about a respective axis CL1, CL2. The forearm drive pulleys 3970R, 3970L may be coupled to respective forearm pulleys 3971R, 3971L by belts/bands 3981, 3982 for driving the rotation of the forearms 3811R, 3811L. In alternate embodiments the pulleys 3970R, 3971R and 3970L, 3971L may be coupled in any suitable manner for driving the forearms.

Referring to FIG. 29G another exemplary mechanical motion switch is shown. In this example, the motion switch is substantially similar to that described above with respect to FIG. 29F but in this embodiment the forearm pulleys 3970R, 3970L are coupled directly to their respective forearms 3811R, 3811L through connecting members 3990R, 3990L. As can also be seen in FIG. 29G end effector pulleys 3995R, 3995L are connected to the upper arm 2810 for slavingly driving the end effectors as described above.

Referring now to FIGS. 32A-36D the operation of the transport 3800 will be described. As noted above, rotation of drive axes T1 and T2 in the same direction and at the same speed results in the transport 3800 rotating either clockwise or counter-clockwise as a unit about axis 3805 in the direction of arrow R. Rotating the drive axes T1, T2 in opposite directions as can be seen in FIG. 33A extends one of the two arms 3801, 3802. For example, the disclosed embodiments will be described with the extension of arm 3801 where T1 rotates counter-clockwise and T2 rotates clockwise. As may be realized, arm 3802 can be extended in a manner substantially similar to that described below where T2 rotates counter-clockwise and T1 rotates clockwise.

In the exemplary embodiments, T2 rotates in the direction of arrow R2 to correspondingly rotate the upper arm member 3810 about axis 3805. At the same time T1 rotates in the direction of arrow R1 so that the second ends of drive links 3910, 3911 rotate about axis 3805. As can be seen when comparing FIGS. 32B and 33B when T1 rotates the drive links T1A, T1B, 3910, 3911 are arranged such that drive link 3911 pushes on arm link T1A to rotate link T1A counter-clockwise about axis 3940. It is noted that during rotation of T1 in the direction R1, the drive links are further arranged so that drive link 3910 rotates about revolute joint 3931 so that link T1B remains substantially rotationally fixed with respect axis 3940 as can be seen when comparing FIGS. 32C, 33C, 34C, 35C and 36C. It is noted that two links (e.g. links T1B and 3920) of the three-link configuration formed by, for example, drive links T1B, 3910 and connecting link 3920 may at least partially constrain revolute joint 3931 to allow the drive link 3910 to rotate without imparting any substantial motion to links T1B and/or 3920.

FIGS. 32C, 33C, 34C, 35C and 36C graphically illustrate the angular rotation of the drive links T1A, T1B about axis 3940 with respect to the angular rotation of the drive axes T1, T2. As can be seen in FIGS. 32C, 33C, 34C, 35C and 36C the angular rotation of T1A and T1B is shown along the vertical axis of the graph and the angular rotation of T1 is shown along the horizontal axis. It is noted that the graph of FIGS. 32C, 33C, 34C, 35C and 36C is a "split" graph where values to the left of zero on the horizontal axis correspond to rotation of link T1A and the values to the right of zero correspond to the rotation of link T1B. The angular rotation of T1 and the links T1A, T1B may be measured from the position of T1, T1A, T1B when in the retracted position shown in FIGS. 32A and 32B. As the rotational angle of T1 increases (in the negative or counter-clockwise direction), the rotational angle of T1A also increases in the same direction. The rotational angle of T1B remains substantially zero as the rotational angle of T1 increases in the counter-clockwise direction as can be seen best when comparing FIGS. 32C, 33C, 34C, 35C and 36C.

Referring now to FIGS. 33A-D, the forearm 3811L is drivingly constrained by connecting link 3921 to links 3911, T1A as described above. As drive link 3911 pushes on drive link T1A, connecting link 3921 is caused to pull on forearm 3811L, which in turn causes forearm 3811L to rotate about the elbow joint 3821L. Connecting link 3921 continues to pull on forearm 3811L by virtue of the combined rotation of drive axes T1 and T2 until the forearm 3811L crosses over the upper arm portion 3810L, at which point the connecting link 3921 starts to push on the forearm 3811L as can be seen in FIGS. 34A-D. Drive axes T1, T2 continue to rotate in opposite directions R1, R2 respectively as can be seen in FIGS. 35A-D and 36A-D until the arm 3801 is extended such that the end effector 3812L is positioned at a predetermined location for picking or placing the substrate S2. As may be realized, because the end effector 3812L is slaved to the upper arm 3810 as described above, rotation of the upper arm 3810 in the direction R2 and the rotation of the forearm 3811L in an opposite counterclockwise direction causes the arm to extend while the end effector 3812L remains longitudinally aligned with the path of travel X1. For example, as the upper arm 3810 rotates clockwise in the direction of R2 and forearm 3811L rotates counterclockwise in the direction of R1, the pulley 4550L (which is fixedly connected to upper arm 3810) is seen as rotating clockwise with respect to the forearm 3811L. Pulley 4550L drivingly rotates pulley 4565L in a clockwise direction so that rotation of the end effector 3812L is substantially equal and opposite to the rotation of the forearm 3811L and the end effector remains longitudinally aligned with the path X1 during extension (and retraction).

Still referring to FIGS. 32A-36D, as the arm 3801 is extended the arm 3802 remains substantially retracted and is rotated about axis 3805. As described above, as the drive axis T1 rotates in the direction of arrow R1 the second end of drive link 3910 is caused to rotate in the same direction. In this exemplary embodiment, as can be seen in for example FIG. 32D, the drive link T1B is coupled to the forearm 3811R through connecting link 3920. This coupling between the forearm 3811R and link T1B formed by the connecting link 3920 may constrain revolute coupling 3931 so that the drive link 3910 rotates about the revolute coupling 3931 without substantially causing movement of the drive link T1B or revolute coupling 3931. As can be seen best in FIGS. 32D, 33D, 34D, 35D and 36D the links T1B, 3910, 3920 are configured such that the revolute coupling 3931 is located proximate the axis of rotation 3805 of the upper arm 3810 during the extension of arm 3801. Having the revolute coupling 3931 proximate the axis of rotation 3805 allows the arm 3802 to rotate about axis 3805 without any substantial retraction or extension movement as the arm 3801 extends and retracts.

Figure 37:
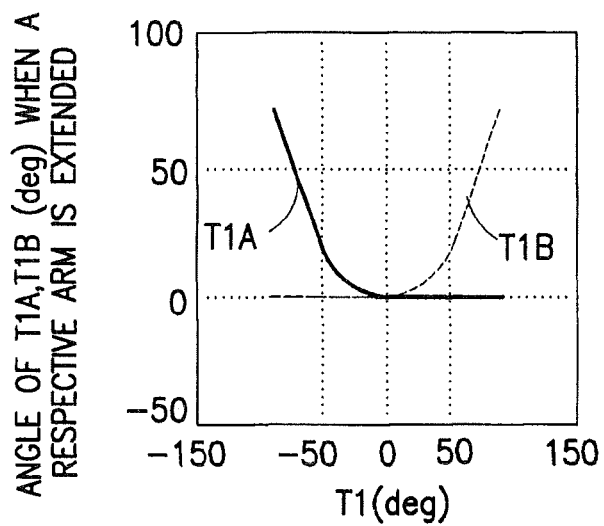
FIG. 37 is a graphical representation of the operation of a mechanical motion switch in accordance with an exemplary embodiment.
Figure 36D:
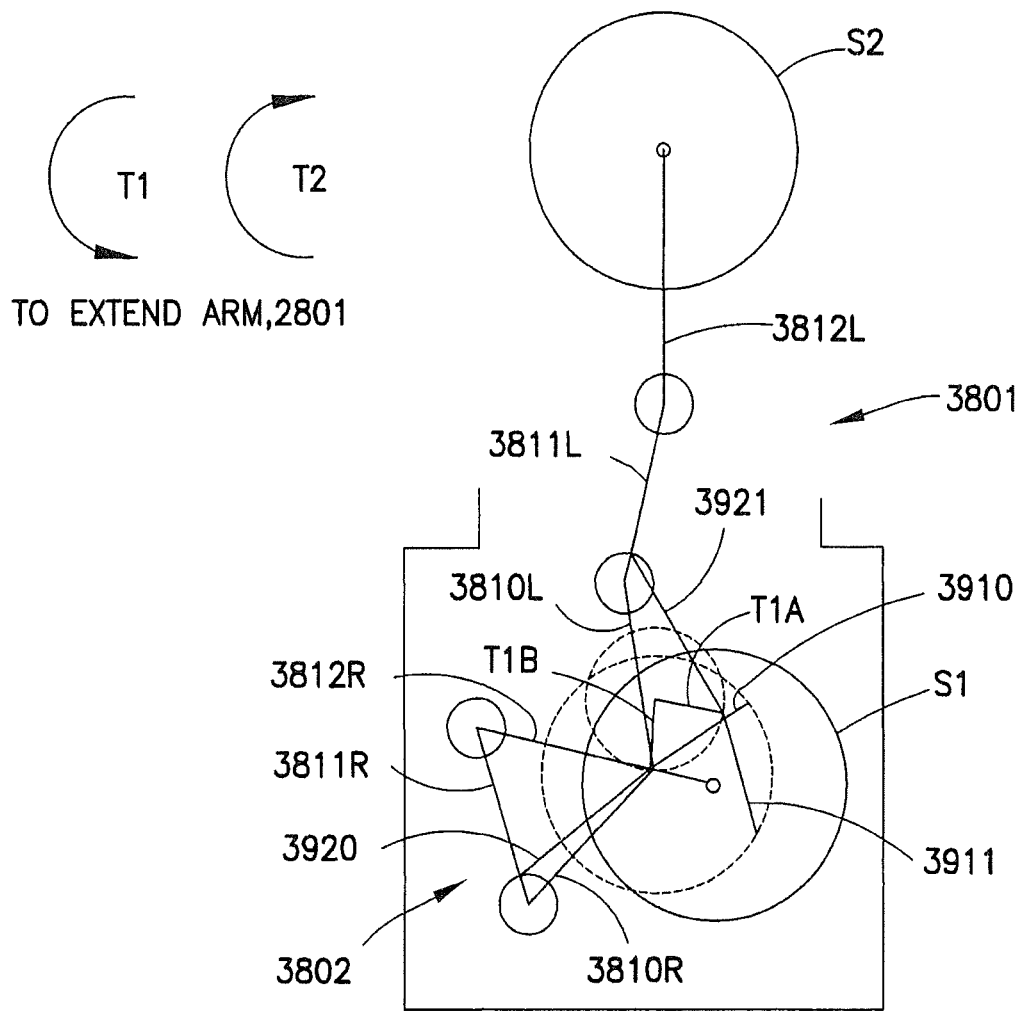

To effect extension of the second arm 3802 the first arm 3801 may be retracted in a manner substantially opposite to that described above with respect to the extension of the arm 3801. As the arm 3801 is retracted to a predetermined extent or position (e.g. the neutral position shown in FIGS. 29A, 30A and 32A) the mechanical switch switches motion of the drive system to arm 3802 so that the arm 3802 is extended while the arm 3801 remains in a substantially retracted configuration. The extension of arm 3802 occurs in a manner substantially similar to that described above with respect to arm 3801. As may be realized, the mechanical motion switch operates when the rotational angle of T1 passes substantially through zero degrees as can best be seen in FIG. 37. FIG. 37 illustrates the angular rotation of the links T1A, T1B versus the angular rotation of T1 when the arms 3801, 3802 are extended. It is noted that in FIG. 37 the value of the angular rotation of the links T1A, T1B is shown on the graph as a positive number when the arms 3801, 3802 are extended regardless of whether the rotation of the link T1A, T1B is clockwise or counter-clockwise.

Referring now to FIGS. 38A-38E, another exemplary embodiment of a transport 3800' will be described. The transport 3800' in this example may be substantially similar to the transport 3800 described above with respect to FIGS. 29A-37 except as otherwise noted. In this example transport 3800' has a double SCARA arm arrangement such that the upper arms 3810R', 3810L' of each arm are independently rotatable. The mechanical motion switch of the arm 3800' may be substantially similar to the switch described above with respect to transport 3800 in that the switch includes a includes a drive platform substantially similar to platform 3960, 3960' described above that is connected to, for example drive axis T1. Drive links 3910, 3911 are rotatably coupled to the drive platform at a first end and are rotatably coupled to a respective connecting link (not shown in the figures for clarity). In one embodiment the connecting link may be joined to a respective one of the upper arms 3810R', 3810L'. In alternate embodiments the connecting links may be rotatably or movably joined to a respective upper arm. The connecting links directly couple a second end of each of the drive links 3910, 3911 to a respective one of the upper arms 3810R', 38101'. As may be realized the connecting links may be rotatably or fixedly coupled to the respective upper arms at any suitable location. In alternate embodiments the connecting links may be of unitary construction with their respective upper arm. In other alternate embodiments, the mechanical switch may include any suitable number of links coupled to each other and/or to the transport arms in any suitable manner and/or configuration.

Figure 38A:
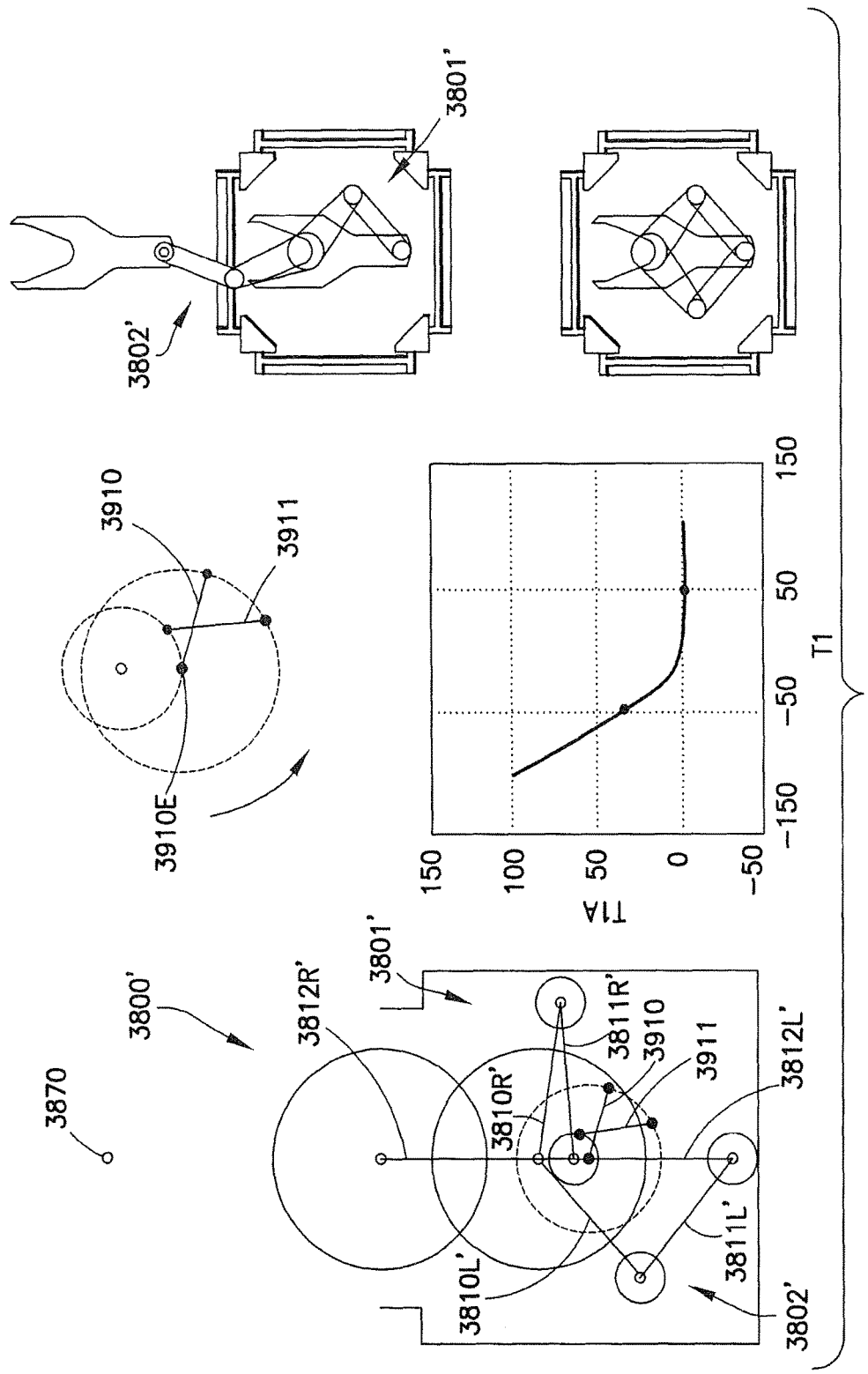
FIGS. 38A-38E show schematic illustrations of an exemplary operation of a transport apparatus in accordance with an exemplary embodiment.
Figure 38B:
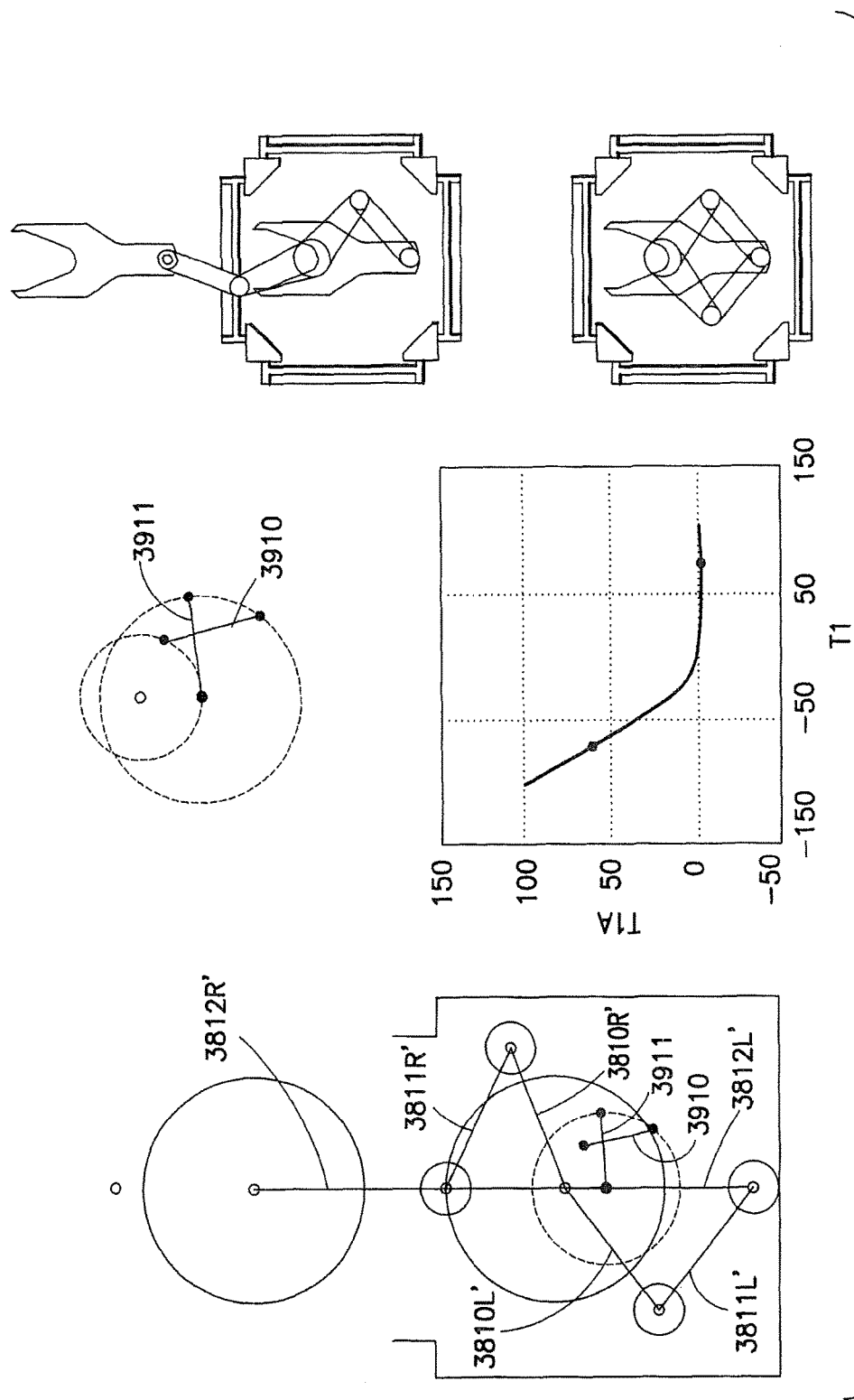
Figure 38C:
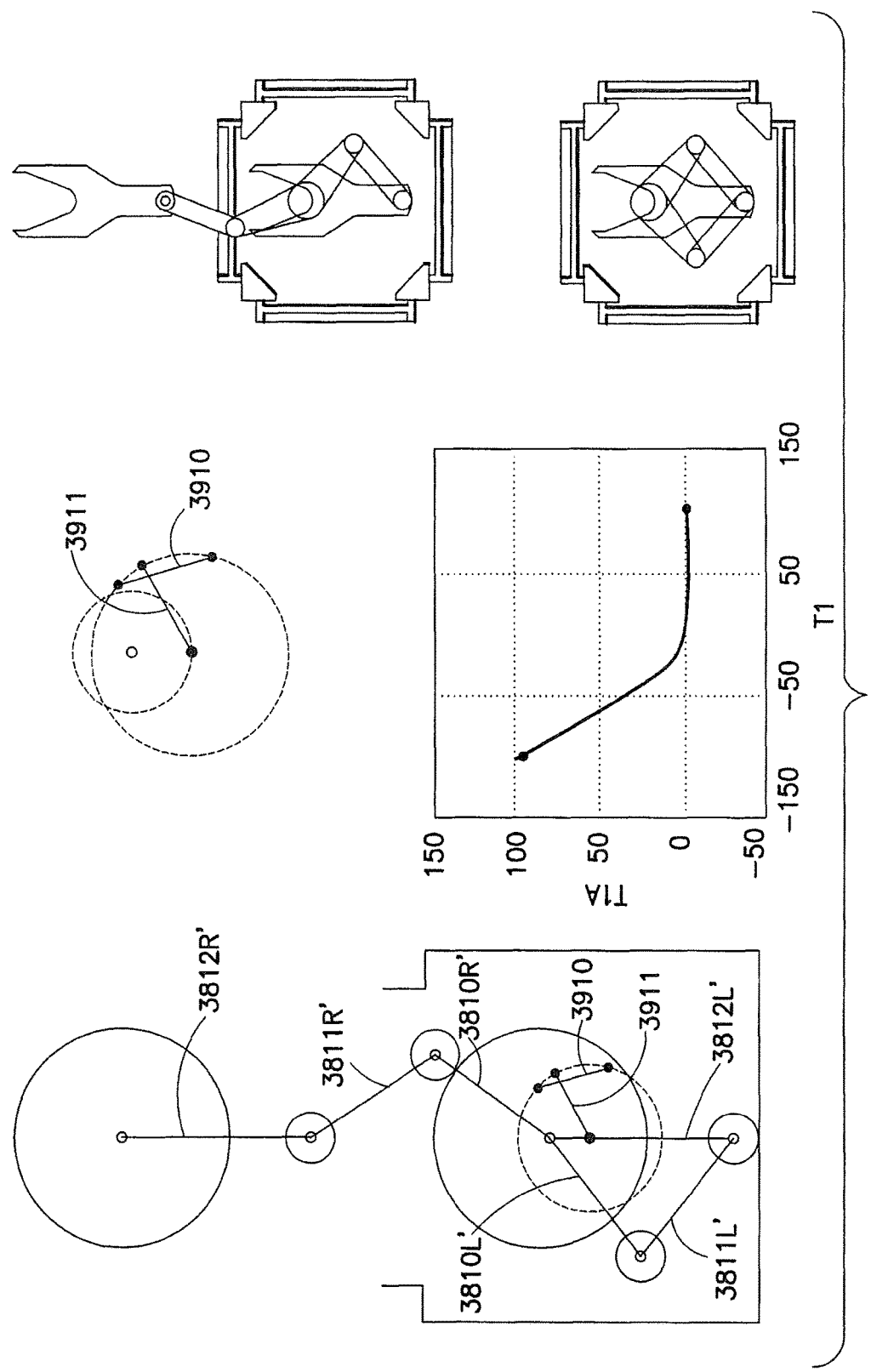
Figure 38D:
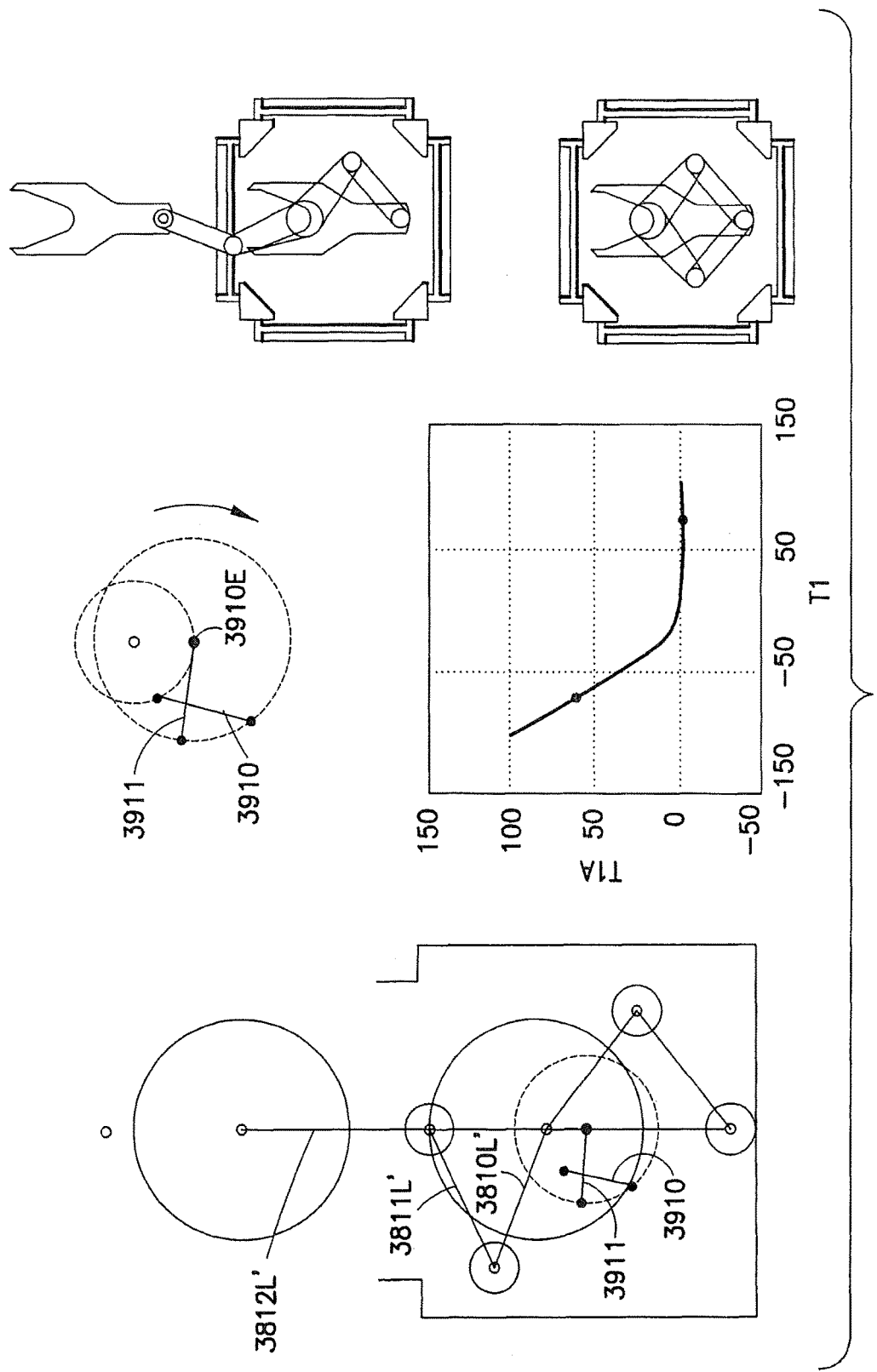
Figure 38E:
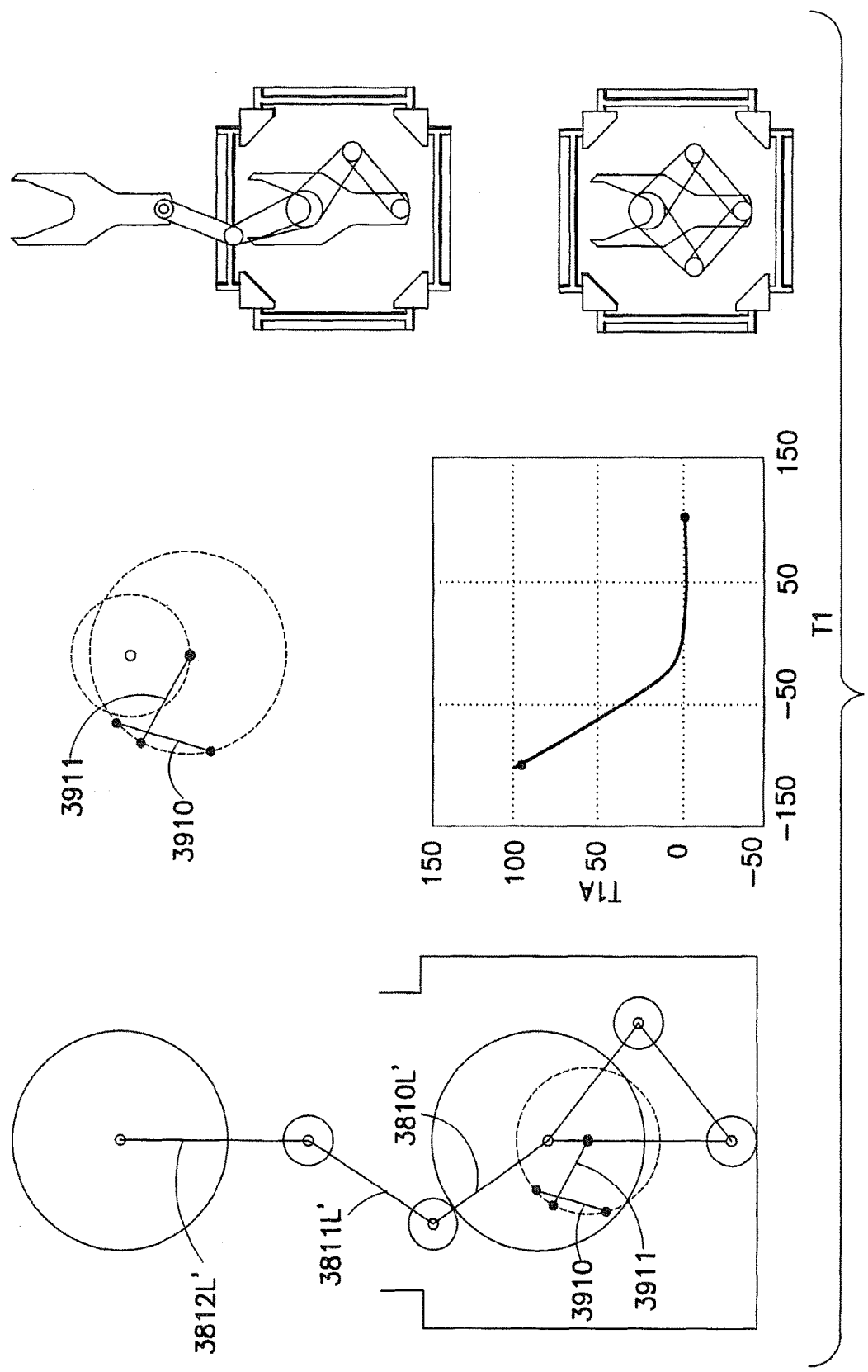

As can be seen in FIGS. 38A-38C, as drive axis T1 rotates the drive platform in a counterclockwise direction such that drive platform causes the first end of the drive links 3910, 3911 to travel in an arcuate path in the counterclockwise direction along with the drive platform. Drive link 3911 causes its connecting link to push on upper arm 3810R' causing the upper arm 3910R' to also rotate in the counterclockwise direction. In this example, the arm links may be slaved as described above so that as the upper arm 3910R' rotates counterclockwise, the forearm 3811R' rotates clockwise and a longitudinal axis of end effector 3812R' remains along the path of extension and retraction of the arm 3801'. As can also be seen in FIGS. 38A-38C, as drive axis T1 rotates counterclockwise, the drive link 3910 rotates such that its second end 3910E remains substantially stationary so that arm 3802' remains is a substantially retracted configuration while arm 3801' extends to pick/place a substrate at point 3870. As may be realized the retraction of the arm 3801' may occur in a substantially opposite manner to that described above with respect to the extension of the arm 3801'. As can be seen in FIGS. 38D and 38E, the arm 3802' is extended by, for example, rotating drive axis T1 in a clockwise direction such that drive platform causes the first end of the drive links 3910, 3911 to travel in an arcuate path in the clockwise direction along with the drive platform. Here the drive link 3910 causes its connecting link to push on upper arm 3810L' for rotating the upper arm 3810' in a clockwise direction. As described above, the links of arm 3802' may be slaved so that the forearm 3811L' rotates counterclockwise and a longitudinal axis of end effector 3812L' remains along a path of extension and retraction. As can also be seen in FIGS. 38D and 38E, as drive axis T1 rotates clockwise, the drive link 3910 rotates such that its second end 3910E remains substantially stationary so that arm 3801' remains is a substantially retracted configuration while arm 3802' extends to pick/place a substrate at point 3870. As may be realized the retraction of the arm 3802' may occur in a substantially opposite manner to that described above with respect to the extension of the arm 3802'.

Figure 39:
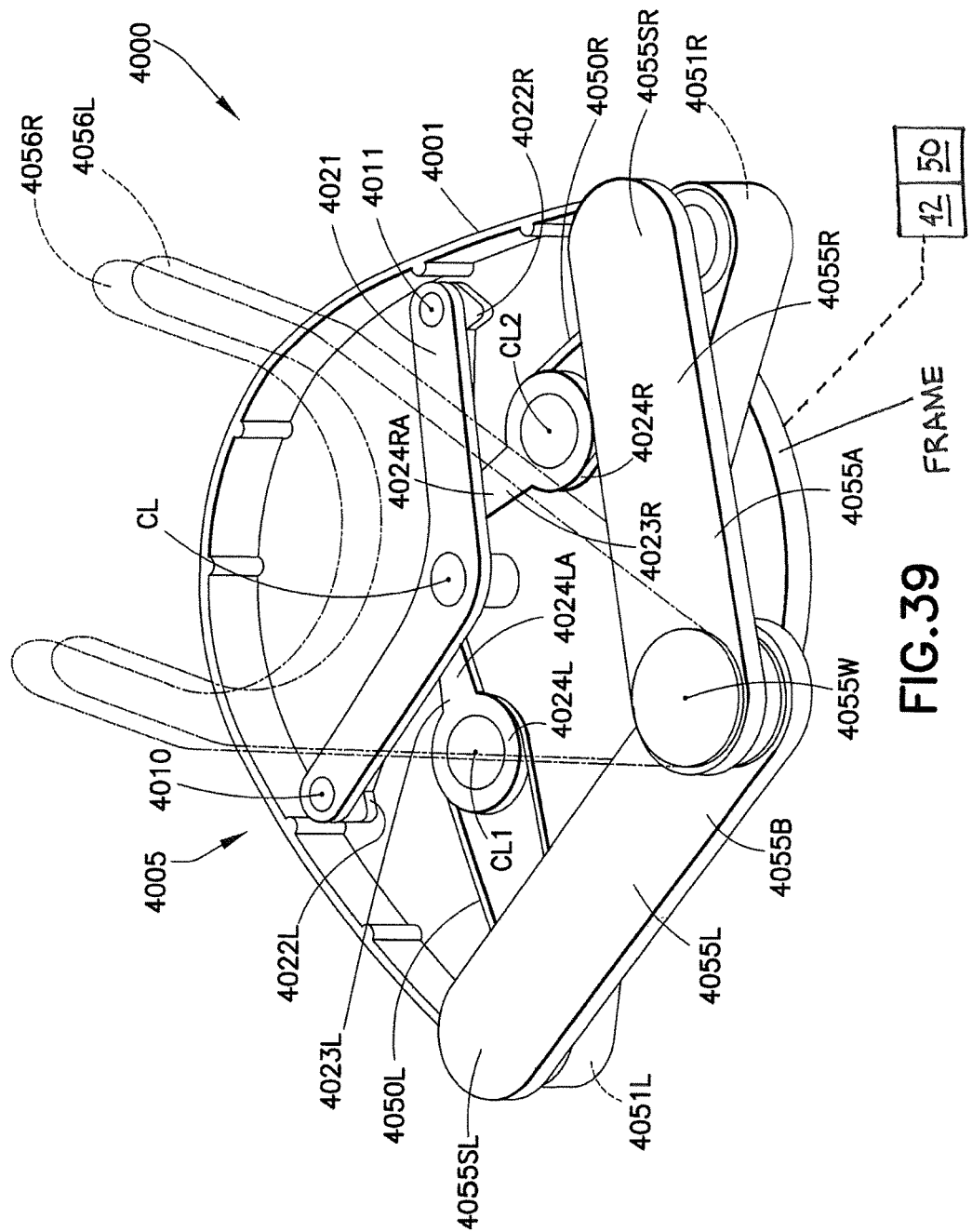
FIG. 39 is a schematic illustration of a portion of a transport apparatus in accordance with another exemplary embodiment.

Referring now to FIG. 39 another exemplary transport apparatus 4000 having a radius arm configuration and incorporating a mechanical motion switch will be described. In this exemplary embodiment the transport apparatus includes a side-by-side drive pulley arrangement which may result in a reduced or minimized height/thickness of the transport apparatus arm and shorter or minimized length belts/bands that drive the arm links of the transport apparatus. The minimized size of the arm and minimized length belts may provide for a corresponding reduction in the depth/volume of a vacuum/transport chamber in which the arm may be located and improved or maximized control, performance and speed of the arm due to, for example, improved structural properties of the transport apparatus.

In this example, the transport apparatus includes a housing or upper arm section 4001. The upper arm section 4001 may have any suitable configuration and size and is shown in the figures as housing the mechanical switch 4005. In alternate embodiments the upper arm section 4001 may not house the mechanical switch 4005 or house only a portion of the mechanical switch 4005. The upper arm section 4001 is also configured to support one or more transport arms 4055A, 4055B. In alternate embodiments the arms 4055A, 4055B may be supported in any suitable manner such as by, for example, an arm support that is separate from but connected to the housing 4000. Here there are two transport arms 4055A, 4055B shown but in alternate embodiments the transport apparatus 4000 may include any suitable number of transport arms. The upper arm section 4001 may be an assembly including a top and bottom (the bottom of which is shown in FIG. 39. In alternate embodiments the housing may have any suitable components and/or features (covers, doors, etc.) for allowing the assembly of the transport 4000 and access to the components of the transport 4000 that are located within the upper arm section 4001, such as, for example, the components of the mechanical switch 4005.

In this exemplary embodiment the transport apparatus 4000 may include any suitable drive section (not shown) such as, for example, the drive sections described above with respect to FIGS. 3-8 and 10. In one exemplary embodiment the drive section may be a coaxial drive section with, for example, two drive axes T1, T2. In alternate embodiments the drive section may have more or less than two drive axes. In other exemplary embodiments the drive section may also include a Z-axis drive for adjusting a height of the transport relative to, for example, substrate processing stations, load locks, or other substrate holding areas/apparatus that the transport apparatus 4000 serves. In this example the drive axis T1 may be coupled to the housing and drive axis T2 may be coupled to the mechanical motion switch 4005 for rotating the transport apparatus 4000 and arms as a unit and/or for extending and retracting the arms 4055A, 4055B as will be described in greater detail below.

As can be seen in FIGS. 39 and 40A-C, each the arms 4055A, 4055B includes a forearm 4055L, 4055R that is rotatably coupled to the upper arm section 4001 at one end via a respective shoulder joint 4055SR, 4055SL and rotatably coupled to a respective end effector 4056L, 4056R at the other opposite end at a respective wrist joint 4055W. It is noted that the distance LH between drive axis T2 and the shoulder joint 4055S is substantially equal to the length LA of the upper arm 4055R, 4055L from joint center to joint center (e.g. from the center of the shoulder joint to the center of the wrist joint) (see also FIG. 43C). In alternate embodiments the lengths LH, LA may be unequal and have any suitable lengths. The end effectors 4056L, 4056R may be slaved to the upper arm section 4001 so that a longitudinal axis of end effector 4056L, 4056R substantially follows a path of extension and retraction of its respective arm 4055A, 4055B. In alternate embodiments the end effectors may not be slaved to the upper arm section 4001 and may be rotatably driven in any suitable manner. The forearms 4055L, 4055R may be fixedly coupled to a respective pulley 4051L, 4051R for driving the forearms 4055L, 4055R as will be described below.

In the exemplary embodiments shown in FIGS. 39 and 40A-C the mechanical motion switch 4005 includes a pivoting platform 4021, two connecting links 4022L, 4022R and two drive links 4023L, 4023R. The pivoting platform 4021 is coupled to, for example, drive axis T2 of the drive section in any suitable manner including, but not limited to a direct coupling or a transmission coupling such as through a pulley system. The pivoting platform 4021 may have any suitable shape and is shown in the figures for exemplary purposes only as having a boomerang or substantially V-shaped configuration. In alternate embodiments the platform 4021 may have a substantially straight elongated shape, triangular shape, circular shape or any other shape suitable for causing the extension and retraction of the transport arms as described herein. In this example, the platform 4021 includes a first portion or side that extends away from its axis of rotation CL (which may be same as drive axis T2) in a first direction and a second portion or side that extends away from axis of rotation CL in a second direction that is different than the first direction. The first end of connecting link 4022L is rotatably coupled to the first portion at revolute joint 4010. A second end of connecting link 4022L is rotatably coupled to drive link 4023L at revolute joint 4012. In this example, the connecting link 4022L is shown as a substantially straight elongated link but in alternate embodiments the connecting link 4022L may have any suitable shape and/or configuration. The drive link 4023L may include a pulley portion 4024L that is rotatably coupled to, for example upper arm section 4001 at rotation axis CL1 in any suitable manner such as by suitable bearings and an arm portion 4024LA that extends from the pulley portion 4024L for coupling with the connecting link 4022L. In one embodiment the pulley portion 4024L and arm portion 4024LA of drive link 4023L may be of a unitary one-piece construction. In alternate embodiments the pulley portion 4024L and arm portion 4024LA may be an assembly or have any other suitable configuration so that arm portion 4024LA causes rotation of the pulley portion 4024L. In still other alternate embodiments the drive link may be rotatably coupled directly to the pulley 4024L. The drive link 4023L is coupled to the forearm pulley 4051L by, for example, a belt or band 4050L for drivingly rotating the pulley 4051L and the forearm 4055L. In alternate embodiments the drive link 4023L may be coupled to the forearm 4055L in any suitable manner. Similarly, the first end of connecting link 4022R is rotatably coupled to the second portion of the platform 4021 at revolute joint 4011. A second end of connecting link 4022R is rotatably coupled to drive link 4023R at revolute joint 4013. The connecting 4022R may be substantially similar to connecting link 4022L. The drive link 4023R may be substantially similar to drive link 4023L described above. For example, the drive link 4023R may include a pulley portion 4024R that is rotatably coupled to, for example upper arm section 4001 at rotation axis CL2 in any suitable manner such as with suitable bearings and an arm portion 4024RA that extends from the pulley portion 4024R for coupling with the connecting link 4022R. The drive link 4023R is coupled to the forearm pulley 4051R by, for example, a belt or band 4050R for drivingly rotating the pulley 4051R and the forearm 4055R. In alternate embodiments the drive link 4023R may be coupled to the forearm 4055R in any suitable manner. As can be seen in FIG. 39, the links 4022L, 4022R, 4023L, 4023R form a pair of four-bar mechanisms coupled through the pivoting platform 4021. As may be realized, the locations of the rotation axes CL, CL1, CL2 relative to each other are shown in the drawings for exemplary purposes only and in alternate embodiments the rotation axes CL, CL1, CL2 may have any suitable spatial relationship relative to each other.

Figure 40:
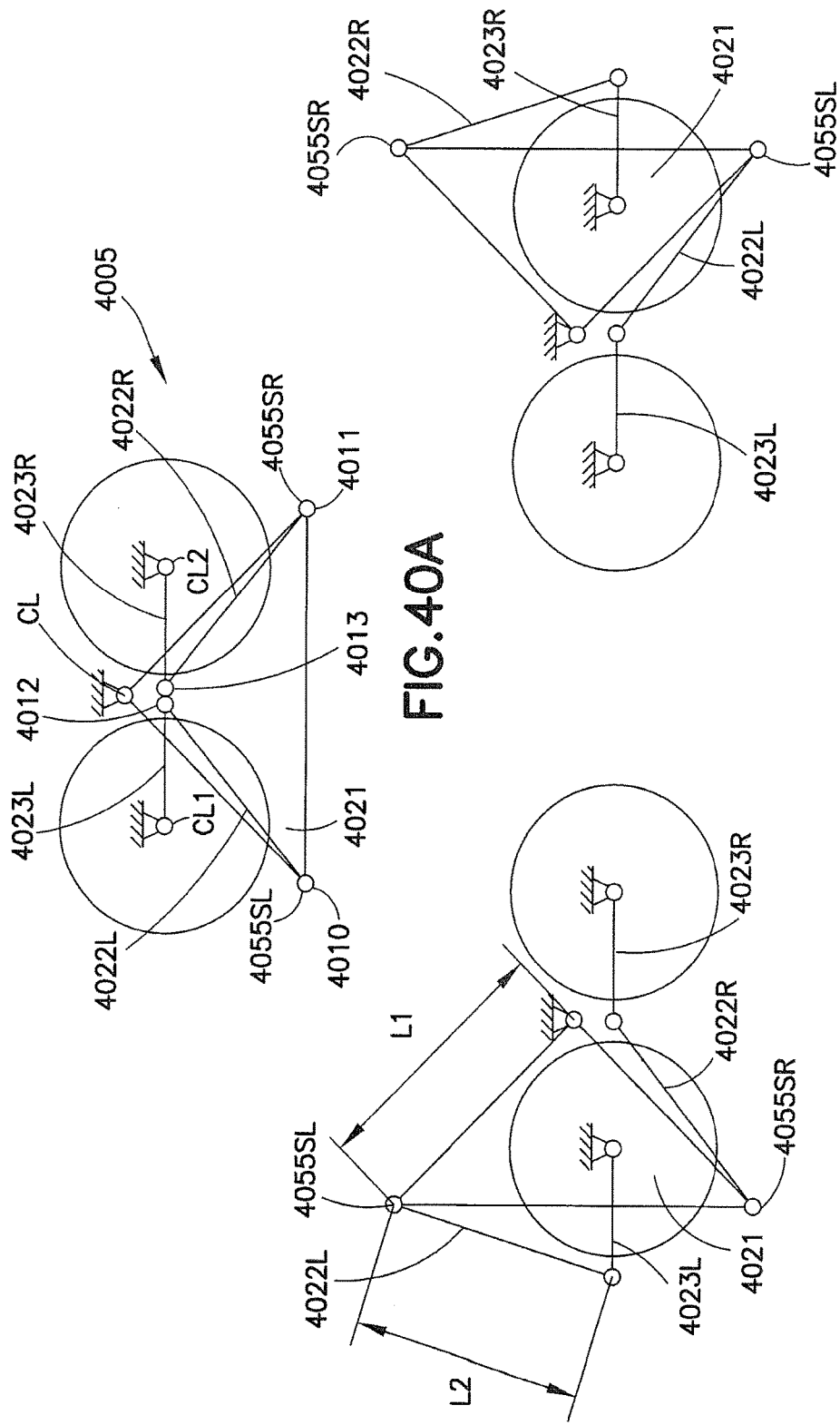
FIGS. 40A-40C is a graphical representation of a mechanical motion switch in accordance with an exemplary embodiment.

Referring now to FIGS. 40A-44 an exemplary operation of the transport apparatus 4000 will be described. As can be seen in FIGS. 40A-40C the mechanical switch mechanism 4005 is shown in greater detail. In this example, the axis of rotation CL of the platform 4021 is located on an opposite side of axes of rotation CL1, CL2 than the revolute joints 4010, 4011 when the switch 4005 is in a neutral or initial position/configuration as can be seen in FIG. 41A. The geometry of the links 4021, 4022L, 4022R, 40213L, 4023R may be selected so that rotation of the platform 4021 from the neutral position in the clockwise direction produces a change of the angular orientation of the link 4023L while the link 4023R remains substantially stationary in its retracted configuration as can be seen in FIG. 41B. In the example shown in FIGS. 41A-41C, the mechanical motion switch 4005 is configured so that about a ninety degree rotation of the platform 4021 produces about a one hundred eighty degree motion of the link 4023L (or 4024L depending on the direction of rotation of the platform 4021). In alternate embodiments the links 4021, 4022L, 4022R, 4023L, 4023R may be configured to produce any desired angular change of links 4023L, 4023R for any desired rotation angle of platform 4021. As may be realized when, for example, the platform 4021 is rotated in the counterclockwise direction the angular orientation of the link 4023R changes while the link 4023L remains substantially stationary in its retracted configuration as can be seen in FIG. 40C.

Figure 41:
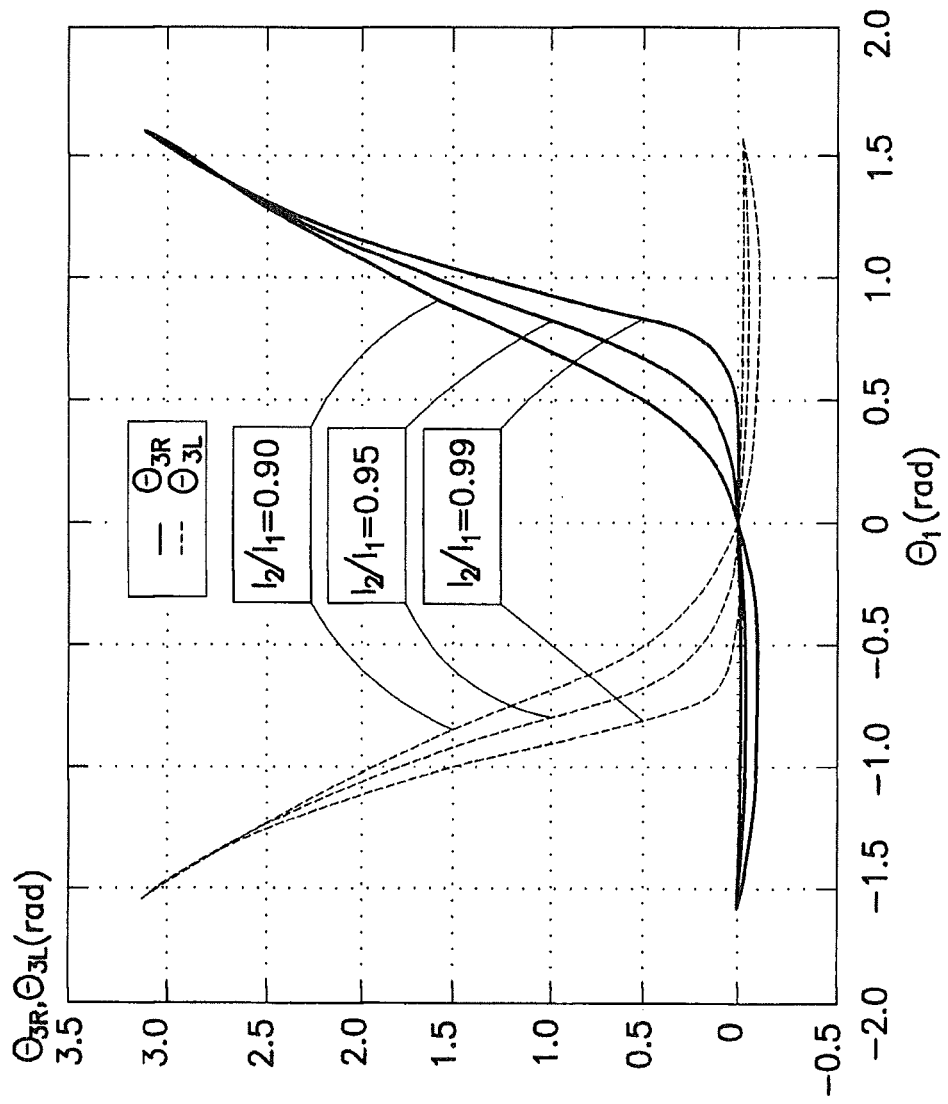
FIG. 41 illustrates an exemplary motion profile of a transport apparatus in accordance with an exemplary embodiment.

The angular orientations of the links 4023L, 4023R as a function of the angular position of the platform 4021 is graphed and shown in FIG. 41, where $\theta_1$ denotes an angular position of the platform 4021, $\theta_{3L}$ and $\theta_{3R}$ are respectively angular orientations of the links 4023L, 4023R. It is noted that the angles $\theta_1$, $\theta_{3L}$ and $\theta_{3R}$ are measured with respect to the initial configuration of links as shown in FIG. 40A with $\theta_1$ and $\theta_{3R}$ being positive in the counterclockwise direction and $\theta_{3L}$ being positive in the clockwise direction. The amount of residual motion by the stationary link 4023R, 4023L while the other one of the links 4023R, 4023L moves can be controlled by, for example, the ratio of L2 over L1 where L1 is the distance between the pivoting point (axis CL) of the platform 4021 and the revolute joints 4010, 4011 that couple the links 4022L, 4022R to the platform and L2 is the length of the links 4022L, 4022R from joint center to joint center as shown in FIG. 40B. As can be seen in FIG. 41, the amount of residual motion decreases as the ratio L2/L1 approaches the value of 1.

Figure 42A:
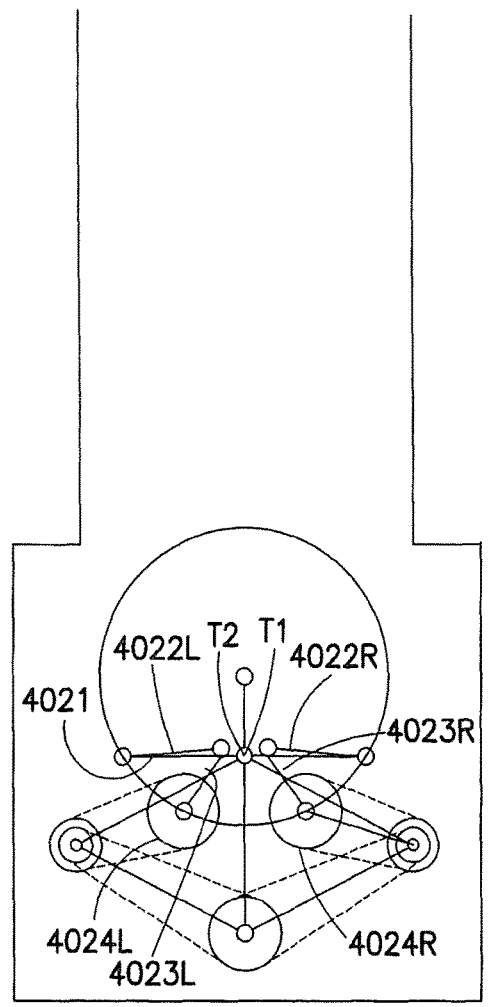
FIGS. 42A-42D, 43 and 44 show schematic illustrations of an exemplary operation of a transport apparatus in accordance with an exemplary embodiment.
Figure 42B:
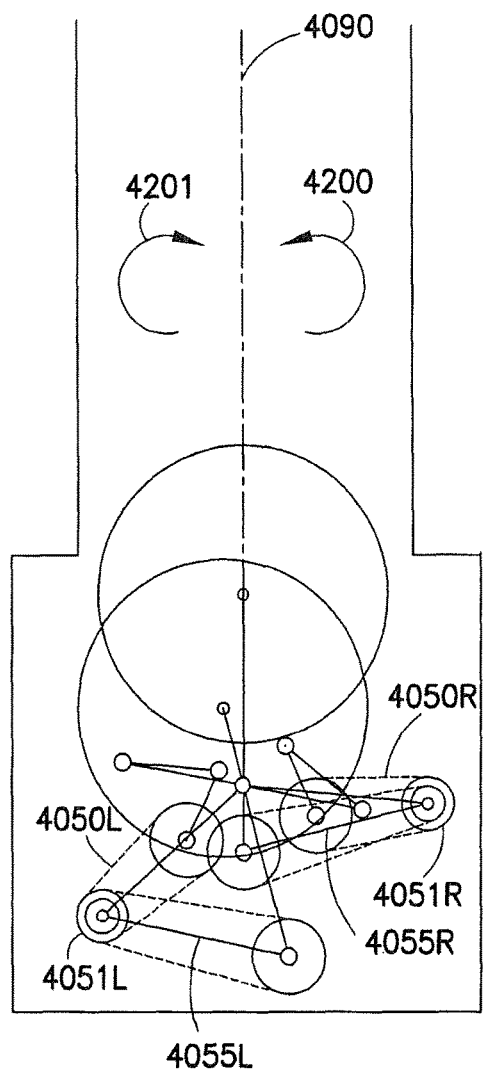
Figures 42C, 42D:
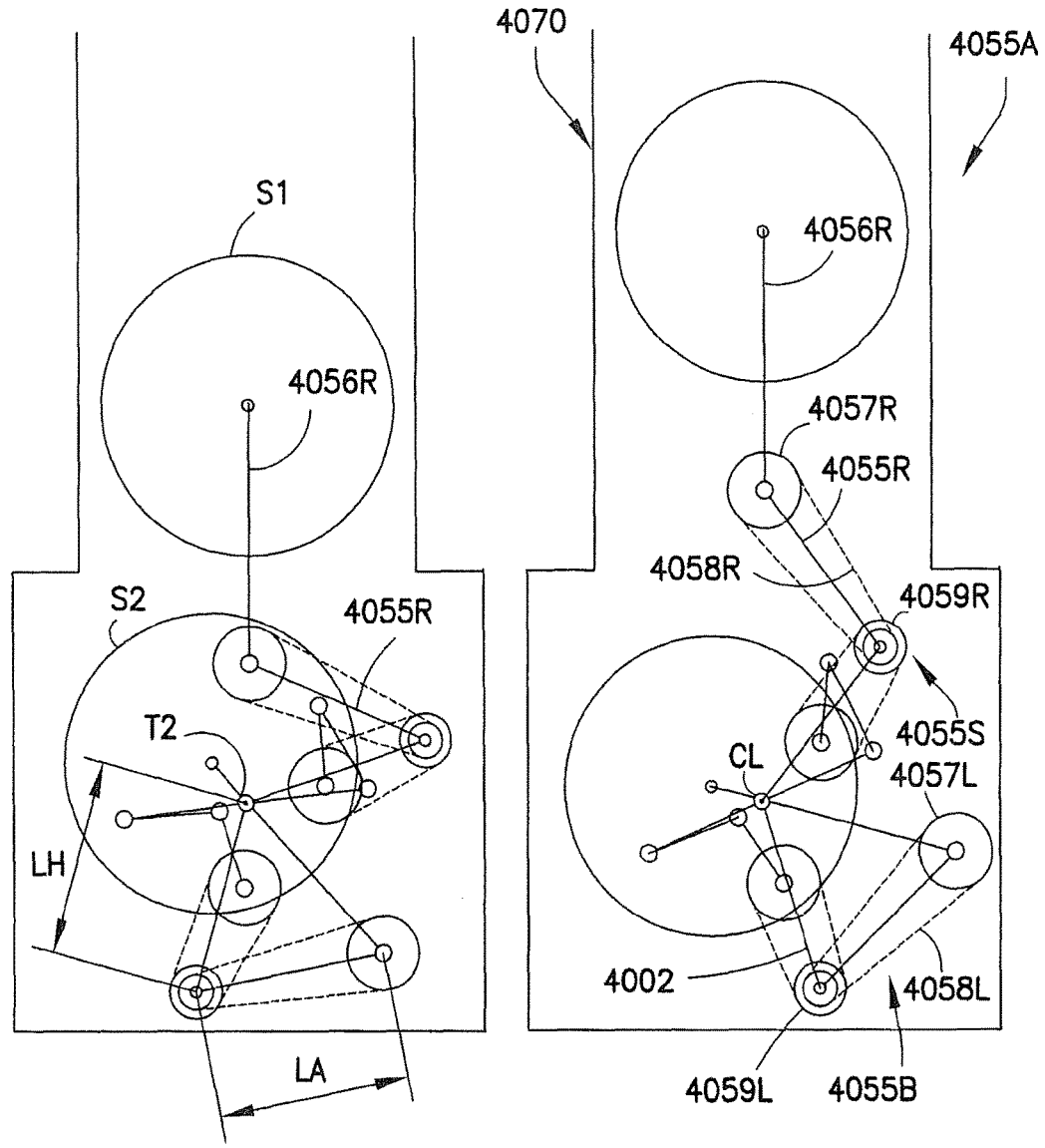
Figure 43:
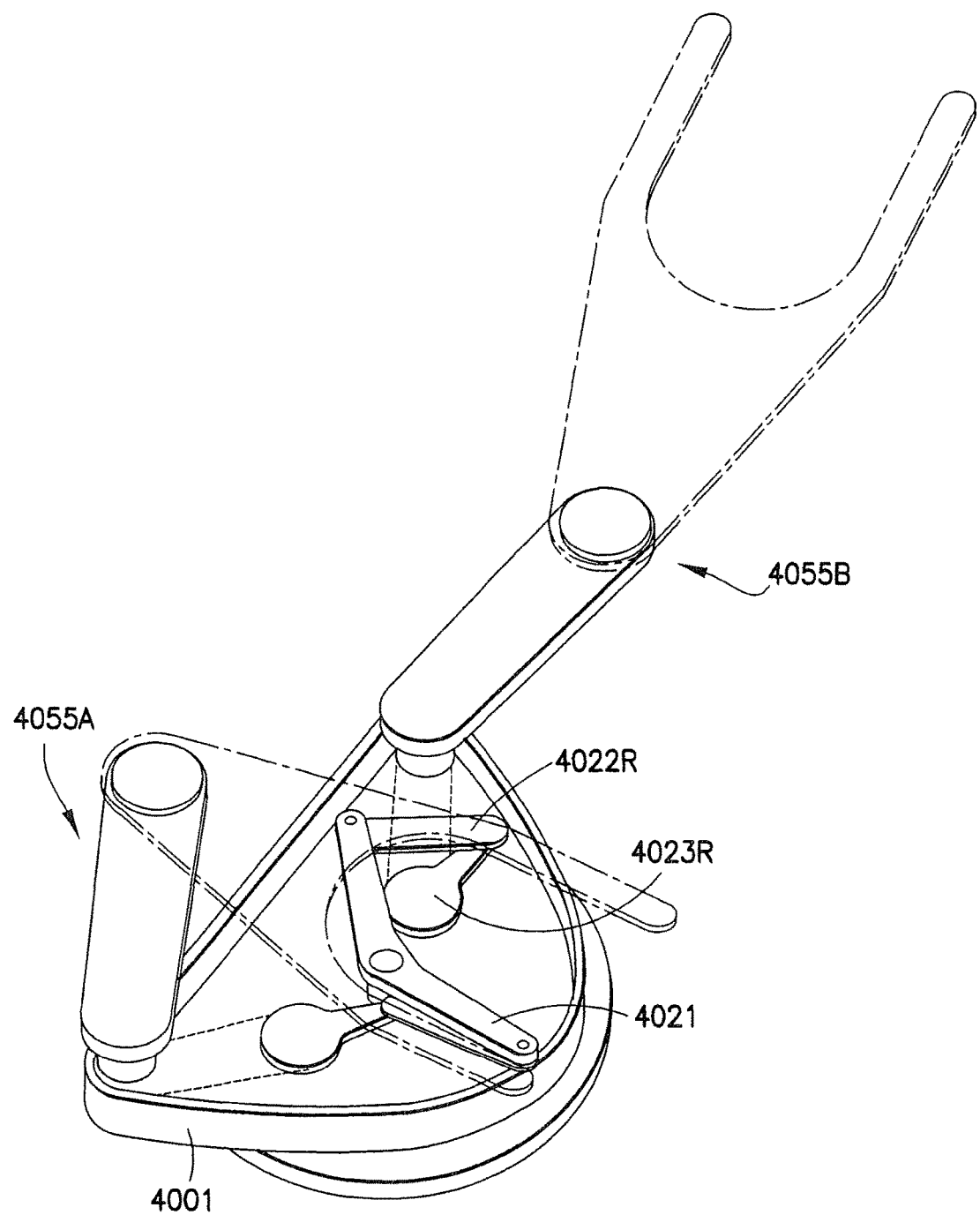
Figure 44:
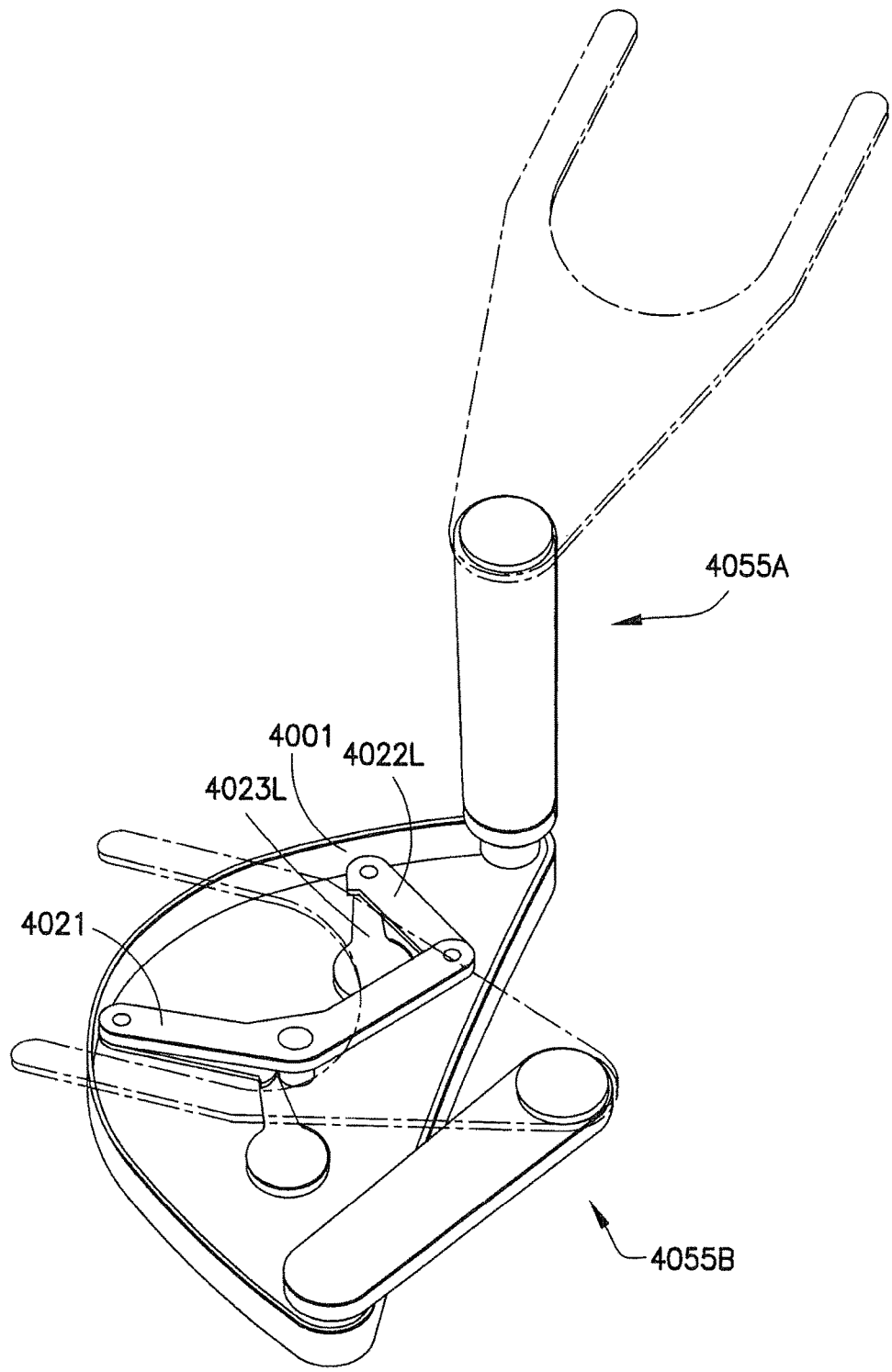

Referring to FIGS. 42A-42D, 43 and 44, generally, in a substrate exchange sequence an empty arm 4055B extends radially from a retracted position as shown in FIG. 39 (see also FIG. 42A) to, for example, a workstation, or other suitable substrate holding location (not shown) as can be seen in FIG. 43, picks a processed substrate S2 and retracts back to the folded position as shown in FIG. 39. The vertical position of the arm is adjusted (or the substrate holding position is adjusted where the transport apparatus does not have a Z-motion drive) so that the other arm 4055A is able to enter the workstation. As may be realized, in one example, the Z-motion drive may compensate for the end effectors 4056L, 4056R being located one above the other in different planes. In alternate embodiments the end effectors may be located side by side in the same plane. The arm 4055A extends radially, as shown in FIG. 44, carrying a fresh or unprocessed substrate S1, places the substrate at a workstation and returns to the retracted position shown in FIG. 39. The extension of arm 4055A is shown in FIGS. 42A-42D in greater detail. As can be seen in FIG. 42B, both the T1 and T2 drive axes may rotate at, for example different rates to cause relative movement between the arm support (not shown, which may be substantially similar to upper arm section 4001), carrying the arms 4055A, 4055B and the platform 4021 for causing an extension of one of the arms. In this example, to extend arm 4055A the platform 4021 and arm support are initially rotated in opposite directions (arm support is rotated counterclockwise in the direction of arrow 4200 and platform is rotated clockwise in the direction of arrow 4201) as shown in FIG. 42B but are later rotated in the same direction (in this example, counterclockwise in the direction of arrow 4200) as shown in FIGS. 42C and 42D. It is noted that rotation of drive axes T1, T2 in the same direction at substantially the same speed rotates the transport apparatus 4000 as a unit about, for example, axis CL. Here, rotation of the arm support moves the shoulder joint 4055S of arm 4055A along an arcuate path in a counterclockwise direction towards the workstation 4070. The rotation of the platform 4021 causes connecting link 4022R to pull on drive link 4023R so the drive link 4023R rotates clockwise. In alternate embodiments the platform 4021 may cause the connecting link to push on the drive link 4023R. In still other alternate embodiments the platform 4021 may cause the drive link 4021R to move in any suitable manner for extending the arm 4055A. Drive link 4023R causes a rotation of the forearm 4055R (via belt 4050R, drive pulley 4024R and upper arm pulley 4051R) in a clockwise direction to extend the arm 4055A. As described above, the end effectors 4056R, 4056L may be slaved to the arm support by, for example, any suitable transmission such as belts/bands and pulleys so that as the forearm 4055R rotates clockwise the end effector 4056R is longitudinally aligned with and is extended along path 4090. As may be realized retraction of the arm 4055A may occur in a substantially opposite manner as described above. As may also be realized the extension and retraction of arm 4055B may occur in a manner substantially similar to that described above with respect to arm 4055A. As can be seen in FIGS. 42A-42D, as arm 4055A is extended, the arm 4055B remains in a substantially retracted configuration while rotating about axis CL and vice versa. In this example, the mechanical motion switch 4005 allows for both connecting links 4022L, 4022R to be driven by a single motor to simplify the transport apparatus drive system by, for example, eliminating the cost and complexity of a motor encoder assembly and the corresponding electronics.

Figure 45A:
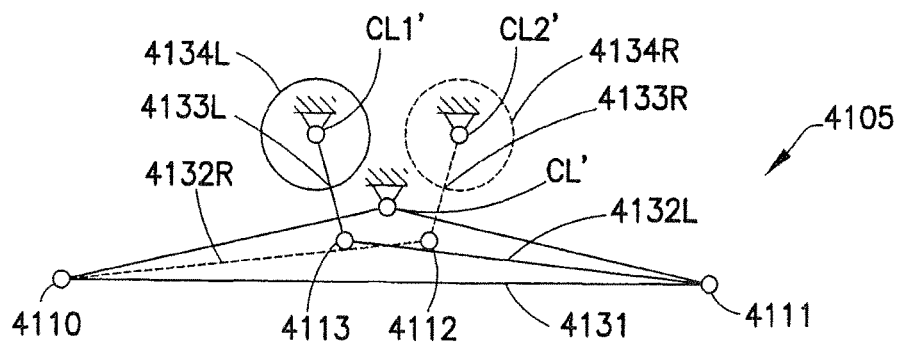
FIGS. 45A-45C is a graphical representation of a mechanical motion switch in accordance with an exemplary embodiment.
Figures 45B, 45C:
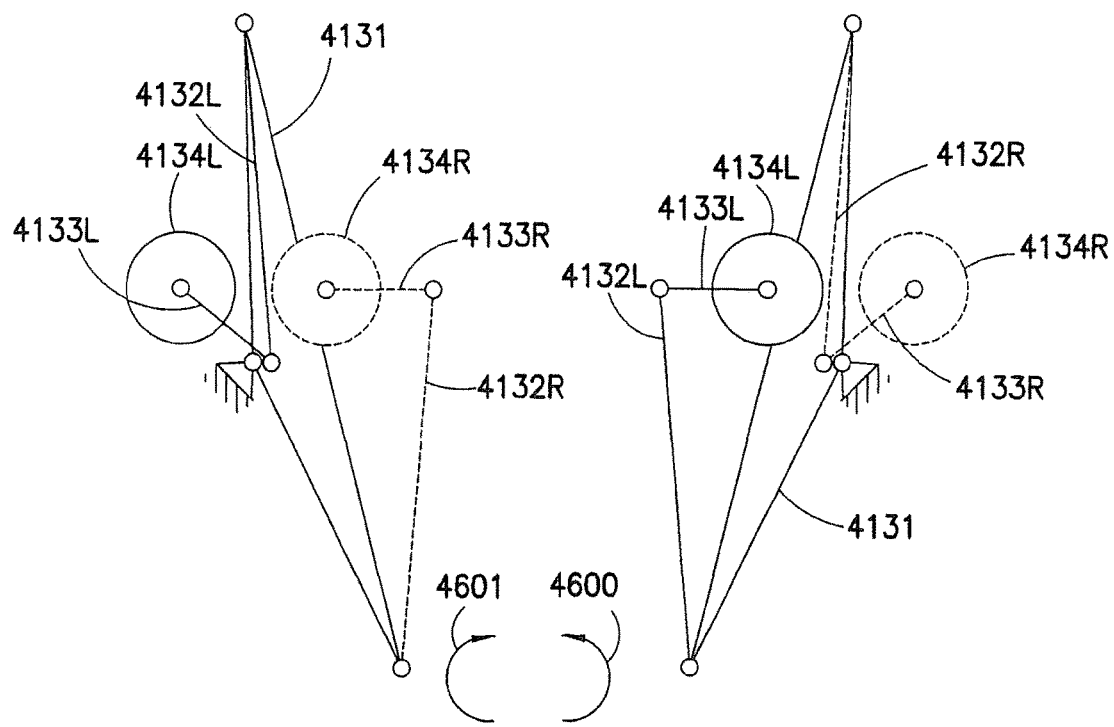
Figure 46A:
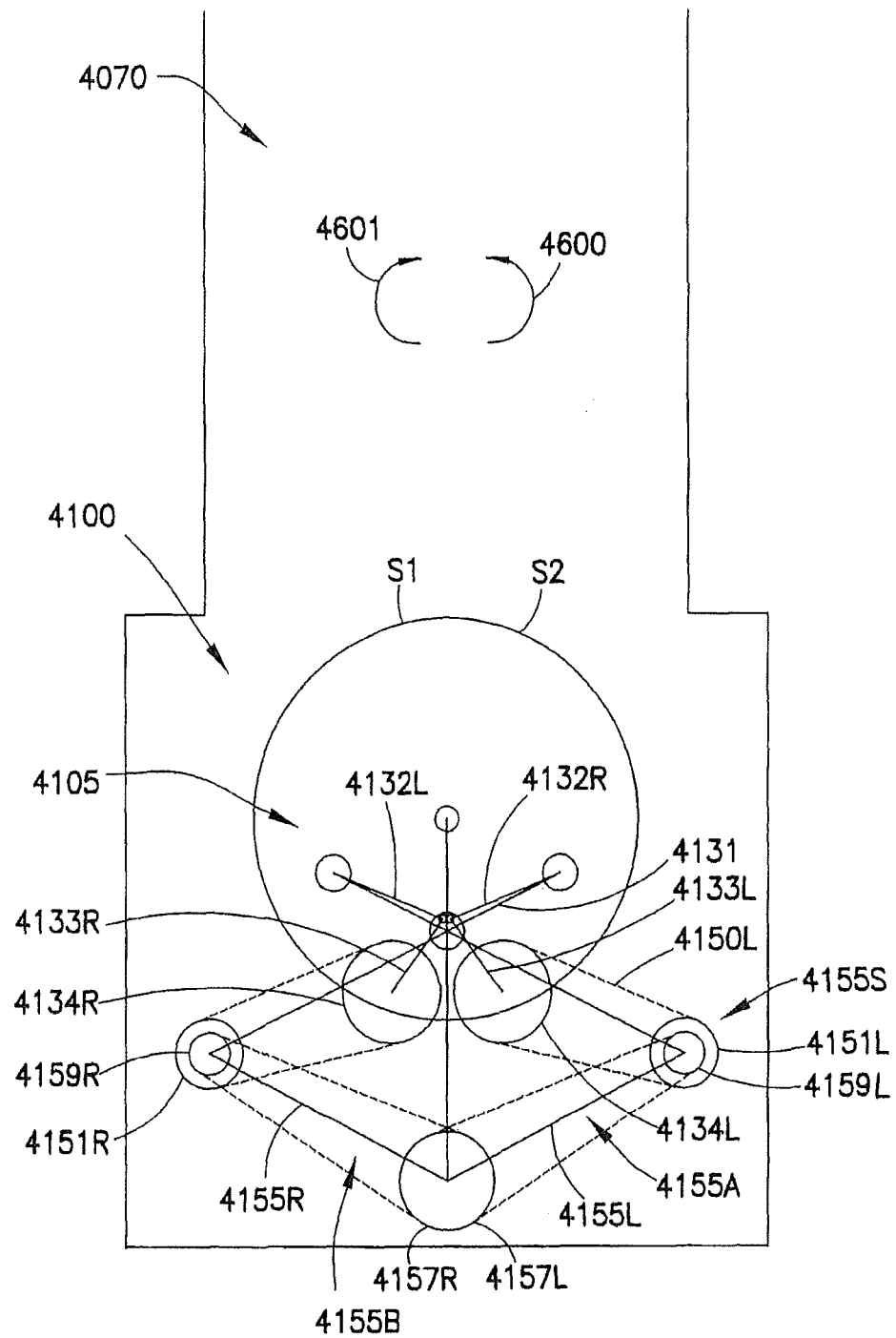
FIGS. 46A-46D show schematic illustrations of an exemplary operation of a transport apparatus in accordance with an exemplary embodiment.
Figure 46B:
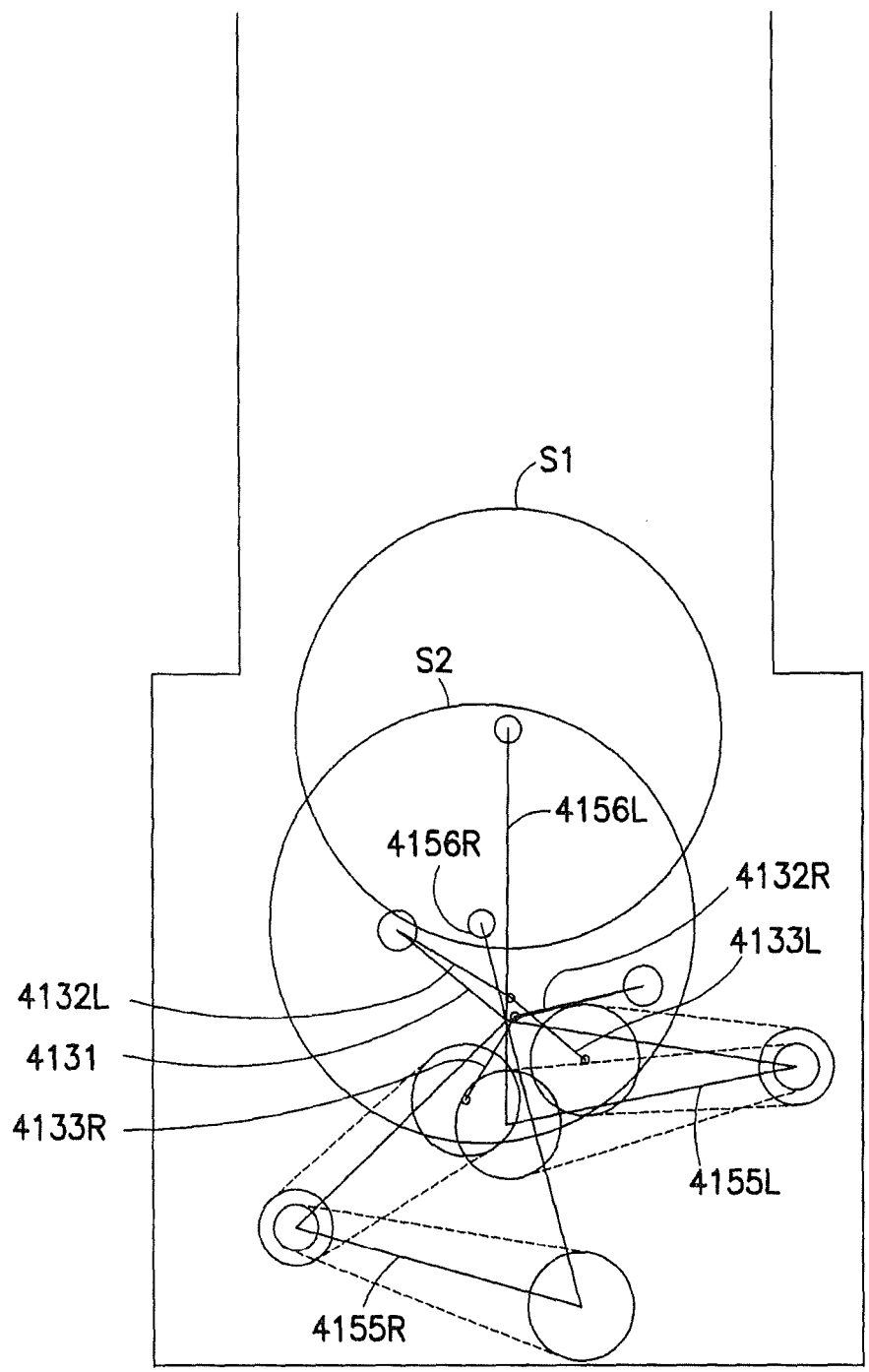
Figure 46C:
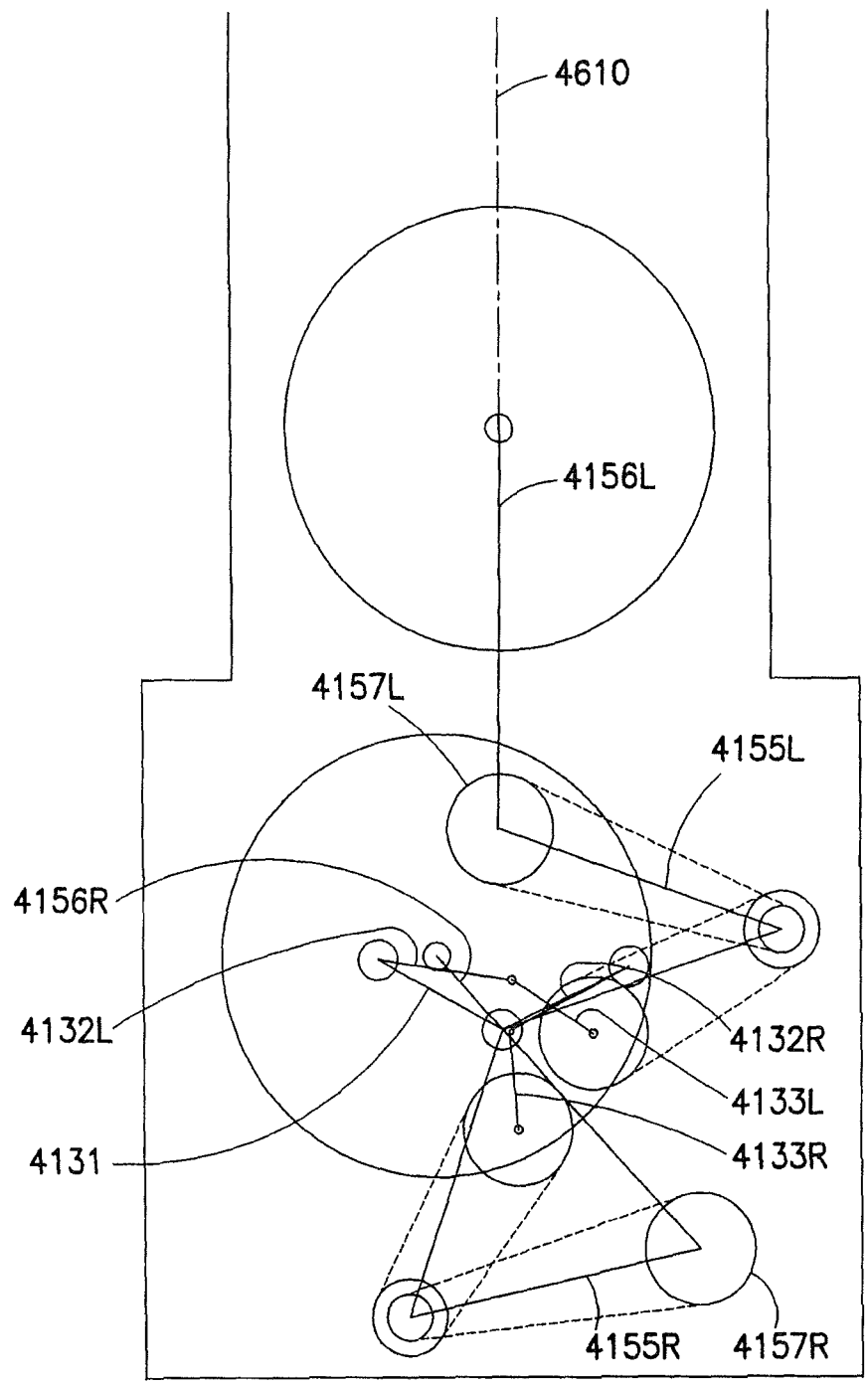
Figure 46D:
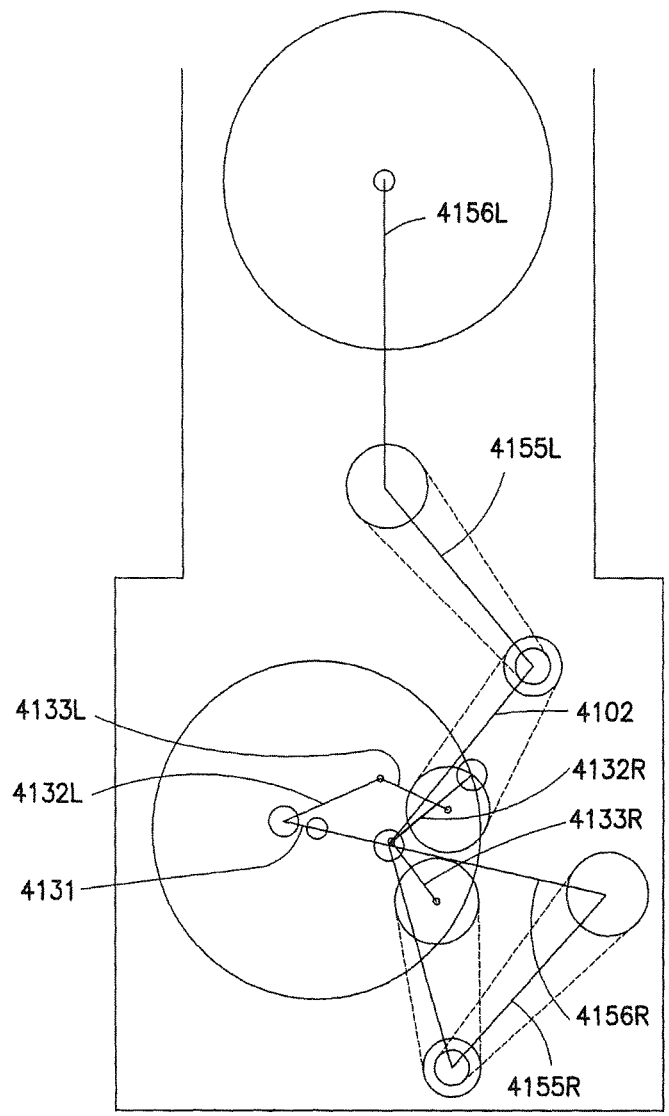

Referring now to FIGS. 45A-46D another exemplary transport apparatus 4100 will be described. The transport apparatus 4100 may be substantially similar to transport apparatus 4000 however, the mechanical motion switch 4105 has a different configuration as will be described below. As can be seen in FIG. 45A the axis of rotation CL' of the pivoting platform 4131 and revolute joints 4110, 4111 connecting the platform 4131 to connecting links 4132L, 4132R are located on the same side of axes CL1', CL2'. In this example, the platform 4131 may be coupled to drive axis T2 in a manner substantially similar to that shown in FIGS. 39 and 40 so that when drive axis T2 rotates the platform 4131 rotates with it. It is noted that in one example the drive axis T2 (and/or T1) may be coaxial with axis of rotation CL'. The platform 4131 has a first portion and a second portion each extending away from its axis of rotation CL' in a manner substantially similar to that described above with respect to platform 4021. The first portion of the platform 4131 is coupled to a first end of connecting link 4132L by revolute joint 4111 and the second portion of the platform 4131 is coupled to a first end of connecting link 4132R by revolute joint 4110. The second opposite end of connecting links 4132L, 4132R are respectively coupled to drive links 4133L, 4133R by revolute joints 4113, 4112. As can be seen in FIG. 45A the connecting links 4132L, 4132R cross over each other when the mechanical motion switch 4105 is in the initial or neutral position. The connecting links 4132L, 4132R may be substantially similar to connecting links 4022L, 4022R described above. The drive links 4133L, 4133R may also be substantially similar to drive links 4023L, 4023R described above with respect to FIGS. 39 and 40. For example, drive links 4133L, 4133R may each include a drive pulley 4134L, 4134R for driving a respective forearm pulley 4151L, 4151R for causing rotation of the forearms 4155L, 4155R. As described above with respect to FIGS. 39 and 40, the drive links 4133L, 4133R may be coupled to the forearm pulleys 4151L, 4151R by belts 4150L, 4150R. In alternate embodiments the drive links 4133L, 4133R may be drivingly connected to the forearms 4155L, 4155R in any suitable manner. As can be seen in FIG. 45B, as the platform 4131 is rotated in a counterclockwise direction (e.g. in the direction of arrow 4600), drive link 4133R also rotates in a counterclockwise direction while drive link 4133L remains substantially in the initial position shown in FIG. 45A. Similarly, as can be seen in FIG. 45C, as the platform 4131 rotates in a clockwise direction (e.g. in the direction of arrow 4601) the drive link 4133L also rotates in a clockwise direction while drive link 4133R remains substantially in the initial position shown in FIG. 45A. The motion profile of mechanical motion switch 4105 may be substantially similar to that shown in FIG. 41.

Referring now to FIGS. 46A-46D the extension of arm 4155A of transport apparatus 4100 will be described. In this example, to extend arm 4155A, drive axis may rotate the arm support (which may be substantially similar to upper arm section 4001 described above), in a counterclockwise direction (e.g. in the direction of arrow 4600). Here, rotation of the arm support moves the shoulder joint 4155S of arm 4155A along an arcuate path in a counterclockwise direction towards the workstation 4070. Drive axis T2 may rotate pivoting platform 4131 initially in a clockwise direction (e.g. in the direction of arrow 4601) and then in a counter-clockwise direction. Rotation of the platform 4131 relative to the arm support causes platform 4131 to push on the drive link 4133L via the connecting link 4132L for causing the forearm 4155L to rotate substantially in a clockwise direction for extending the arm 4155A as shown in FIGS. 46A-46D. In alternate embodiments the platform 4131 may cause a pulling on the drive link 4133L. In still other alternate embodiments the platform 4131 may cause the drive link 4131L to move in any suitable manner for extending the arm 4155A. It is noted that rotation of the drive axes T1, T2 in the same direction at substantially the same speed may rotate the transport apparatus 4100 as a unit to change the angular orientation of a path of radial extension and retraction of the transport apparatus 4100. In a manner substantially similar to that described above, the drive link pulley 4134L drives the forearm pulley 4151L via, for example, a belt/band 4150L. The end effector 4156L may be slaved to the arm support through, for example a suitable transmission such as belts and pulleys 4159L, 4157L in a manner substantially similar to that described above with respect to FIGS. 42A-42D so that a longitudinal axis of end effector 4156L remains substantially along an axis of extension and retraction 4610 (FIG. 46C) of the arm 4155A. As may be realized retraction of arm 4155A may occur in a manner substantially opposite that described above with respect to the extension of arm 4155A. As may also be realized the extension and retraction of arm 4155B (including forearm 4155R, end effector 4156R and pulleys 4151R, 4159R, 4157R) may be substantially similar to that described above with respect to arm 4155A.

In the examples shown in FIGS. 39-46D the forearms are driven by a respective drive link via belts and pulleys. However, in alternate embodiments, the transport apparatus may be configured so that the forearms are driven directly by a respective drive link in a manner substantially similar to that described above with respect to FIG. 29G.

In accordance with an exemplary embodiment a substrate transport apparatus is provided. The substrate transport apparatus includes a frame, a drive section connected to the frame and having a first motor driving a first axis of rotation and a second motor driving a second axis of rotation, a substantially rigid upper arm section rotatably connected to the frame, at least two forearms rotatably mounted to the substantially rigid upper arm section, each of the at least two forearms having at least one substrate support depending therefrom, a mechanical motion switch connecting the at least two forearms to the second motor so that the at least two forearms and the second motor are always connected and wherein the substantially rigid upper arm section is rotatably driven by the first motor and the at least two forearms are rotatably driven by the second motor via the mechanical motion switch which is configured such that the two motors driving but the first and second axes of rotation provide the substrate transport apparatus with at least three degrees of freedom.

In accordance with another exemplary embodiment a substrate transport apparatus is provided. The substrate transport apparatus includes a frame, at least two SCARA arms housed within the frame when the at least two SCARA arms are in a retracted configuration, each of the SCARA arms including at least one end effector for holding a substrate thereon, and a drive section having at least one independently controllable motor having a stator substantially linearly distributed arcuately around and proximate to a periphery of the frame, but one independently controllable motor of the at least one independently controllable motor being simultaneously connected to each of the at least two SCARA arms through a drive link, the but one independently controllable motor being configured to apply an eccentric driving force to rotate the drive link to extend and retract each of the at least two SCARA arms substantially independent of each other.

In accordance with yet another exemplary embodiment a substrate transport apparatus is provided. The substrate transport apparatus includes a drive section having at least two independently controllable motors, an articulated arm including a first SCARA arm being configured to extend in a first direction and a second SCARA arm being configured to extend in a second direction substantially opposite the first direction, each of the first and second SCARA arms having an end effector for holding a substrate thereon, and a coupling operably coupling each of the first and second SCARA arms to each other and to a respective one of the at least two independently controllable motors substantially continuously, the coupling being configured so that relative movement between the at least two independently controllable motors effects extension and retraction of a respective one of the first and second SCARA arms substantially independent of each other.

In accordance with still another exemplary embodiment a substrate transport apparatus is provided. The substrate transport apparatus includes a drive section having at least one independently controllable motor, an articulated arm operably connected to the at least one independently controllable motor, the articulated arm including a first pair of SCARA arms and a second pair of SCARA arms, each arm in the first and second pair of SCARA arms having an end effector for holding a substrate thereon, a coupling that couples each arm in the first and second pair of SCARA arms simultaneously and substantially continuously to the at least one independently controllable motor by a coupling, and the coupling being configured so that but one independently controllable motor of the at least one independently controllable motor effects a coordinated simultaneous extension and retraction of one arm in each of the first and second pair of arms substantially independent of the coordinated simultaneous extension and retraction of another different arm in each of the first and second pair of arms.

In accordance with another exemplary embodiment a substrate transport apparatus is provided. The substrate transport apparatus includes a drive section having at least a first and a second independently controllable motor, a first articulated arm having a first arm link and a first end effector connected to the first arm link for holding a substrate thereon, a second articulated arm having a second arm link and a second end effector connected to the second arm link for holding a substrate thereon, and each of the first and second arm links being rotatably joined to rotors of both of the first and second independently controllable motors such that simultaneous movement of the first and second independently controllable motors effects extension of one of the first and second articulated arms while the other one of the first and second articulated arms is rotated in a substantially retracted configuration.

In accordance with yet another exemplary embodiment a substrate transport apparatus is provided. The substrate transport apparatus includes a frame, a drive section connected to the frame including at least a first and a second independently controllable motors and an articulated arm including an arm link and an end effector for holding a substrate thereon, the arm link being rotatably joined at a first end of the arm link to a rotor of the first independently controllable motor and rotatably coupled at a second opposite end of the arm link to the end effector, and drivingly coupled at the first end of the arm link to the second independently controllable motor by a drive coupling.

The mechanical motion switch(es) described herein allows for a fast substrate swap capability with a minimized number of drives. The configuration of the mechanical motion switch also provides for a compact transport apparatus having a minimized containment for use in compact transport chambers while at the same time decreasing the cost of the transport and increasing its reliability.

It should be understood that the exemplary embodiments may be used individually or in any combination thereof. It should also be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A substrate transport apparatus comprising:
a drive section having coaxial drive shafts and at least a first and a second independently controllable motor coupled to a respective first and second drive shaft of the coaxial drive shafts;
a first articulated arm having a first arm link and a first end effector connected to the first arm link for holding a substrate thereon;
a second articulated arm having a second arm link and a second end effector connected to the second arm link for holding a substrate thereon; and
each of the first and second arm links being rotatably joined by the coaxial drive shafts to rotors of both of the first and second independently controllable motors such that simultaneous movement of the first and second independently controllable motors effects extension of an extension arm of the first and second articulated arms and rotation of a rotating retracted arm of the first and second articulated arms wherein the first articulated arm is respectively the extension arm while the second articulated arm is the rotating retracted arm and is the rotating retracted arm while the second articulated arm is the extension arm, so that each of the first arm link supporting the first end effector respectively become extension arm links as each of the second arm link supporting the second end effector respectively become rotating retracted arm links and so that each of the second arm link supporting the second end effector respectively become extension arm links as each of the first arm link supporting the first end effector respectively become rotating retracted arm links that are rotated in a substantially retracted configuration so that each of the rotating retracted arm links of the rotating retracted arm being rotated in the substantially retracted configuration, is maintained in a substantially constant position, with respect to each other rotating retracted arm link of the rotating retracted arm being rotated in the substantially retracted configuration, by a common drive shaft, of the coaxial drive shafts, rotating in a common direction relative to and substantially simultaneously with the rotating retracted arm effecting extension of the extension arm with rotation of the rotating retracted arm being rotated in the substantially retracted configuration.

2. The substrate transport apparatus of claim 1, wherein:
the first arm link is rotatably coupled to the first drive shaft of the first independently controllable motor and is connected to the second independently controllable motor through a first link member rotatably coupled at one end to the first arm link and rotatably coupled at the other opposite end to the second independently controllable motor; and
the second arm link is rotatably coupled to the first drive shaft of the first independently controllable motor and is connected to the second independently controllable motor through a second link member rotatably coupled at one end to the second arm link and rotatably coupled at the other opposite end to the second independently controllable motor.

3. The substrate transport apparatus of claim 2, wherein the first and second link members respectively cause rotation of the first arm link and second arm link about a respective coupling with the first drive shaft of the first independently controllable motor as one of the first and second arm links is extended.

4. The substrate transport apparatus of claim 1, wherein one of the first and second articulated arms extends while the other one of the first and second articulated arms is rotated in a substantially retracted configuration as the first and second independently controllable motors rotate the first and second drive shafts in opposite directions.

5. The substrate transport apparatus of claim 1, wherein one of the first and second articulated arms extends while the other one of the first and second articulated arms is rotated in a substantially retracted configuration as the first and second independently controllable motors rotate the first and second drive shafts in the same direction.

6. The substrate transport apparatus of claim 1, wherein the first and second end effectors are coupled to one of the coaxial first and second drive shafts of the first and second independently controllable motors such that as their respective articulated arm is extended the end effectors remain substantially longitudinally aligned with a path of extension.

7. The substrate transport apparatus of claim 1, further comprising a housing surrounding the first and second articulate arms when the first and second articulated arms are in a substantially retracted configuration, wherein each of the first and second independently controllable motor is integrated into the housing and include a stator substantially linearly distributed arcuately around and proximate to a periphery of the housing.

8. The substrate apparatus of claim 7, wherein the stators of the first and second independently controllable motors have a stacked arrangement.

9. A substrate transport apparatus comprising:
a drive section having coaxial drive shafts, including a common drive shaft, and at least a first and a second independently controllable motor coupled to a respective first and second drive shaft of the coaxial drive shafts;
a first articulated arm having a first arm link and a first end effector connected to the first arm link for holding a substrate thereon;
a second articulated arm having a second arm link and a second end effector connected to the second arm link for holding a substrate thereon; and
each of the first and second arm links being rotatably joined by the coaxial drive shafts to rotors of both the first and second independently controllable motors such that simultaneous movement of the first and second independently controllable motors effects extension of the first articulated arm while the second articulated arm is rotated in a substantially retracted configuration wherein the first articulated arm is an extension arm while the second articulated arm is a rotating retracted arm so that each of the first arm link supporting the first end effector respectively become extension arm links as each of the second arm link supporting the second end effector respectively become rotating retracted arm links that are rotated in the substantially retracted configuration so that each of the second arm link of the rotating retracted arm supporting the second end effector is maintained in a substantially constant position with respect to each other rotating retracted arm link of rotating retracted arm, by the common drive shaft, of the coaxial drive shafts, rotating in a common direction relative to and substantially simultaneously with the rotating retracted arm effecting extension of the extension arm with rotation of the rotating retracted arm being rotated in the substantially retracted configuration.

10. The substrate transport apparatus of claim 9, wherein:
the first arm link is rotatably coupled to the first drive shaft of the first independently controllable motor and is connected to the second independently controllable motor through a first link member rotatably coupled at one end to the first arm link and rotatably coupled at the other opposite end to the second independently controllable motor; and
the second arm link is rotatably coupled to the first drive shaft of the first independently controllable motor and is connected to the second independently controllable motor through a second link member rotatably coupled at one end to the second arm link and rotatably coupled at the other opposite end to the second independently controllable motor.

11. The substrate transport apparatus of claim 9, wherein the first and second link members respectively cause rotation of the first arm link and second arm link about a respective coupling with the first drive shaft of the first independently controllable motor as one of the first and second arm links is extended.

12. The substrate transport apparatus of claim 9, wherein one of the first and second articulated arms extends while the other one of the first and second articulated arms is rotated in a substantially retracted configuration as the first and second independently controllable motors rotate the first and second drive shafts in opposite directions.

13. The substrate transport apparatus of claim 9, wherein one of the first and second articulated arms extends while the other one of the first and second articulated arms is rotated in a substantially retracted configuration as the first and second independently controllable motors rotate the first and second drive shafts in the same direction.

14. The substrate transport apparatus of claim 9, wherein the first and second end effectors are coupled to one of the coaxial first and second drive shafts of the first and second independently controllable motors such that as their respective articulated arm is extended the end effectors remain substantially longitudinally aligned with a path of extension.

15. The substrate transport apparatus of claim 9, further comprising a housing surrounding the first and second articulate arms when the first and second articulated arms are in a substantially retracted configuration, wherein each of the first and second independently controllable motor is integrated into the housing and include a stator substantially linearly distributed arcuately around and proximate to a periphery of the housing.

16. The substrate apparatus of claim 9, wherein the stators of the first and second independently controllable motors have a stacked arrangement.

\* \* \* \* \*